(12) United States Patent
Lee et al.

(10) Patent No.: US 9,640,549 B2
(45) Date of Patent: May 2, 2017

(54) VERTICAL MEMORY DEVICE WITH GATE LINES AT THE SAME LEVEL CONNECTED

(71) Applicants: Seok-Won Lee, Yongin-si (KR);
Joon-Hee Lee, Seongnam-si (KR);
Dong-Seog Eun, Seongnam-si (KR);
Chang-Hyun Lee, Suwon-si (KR)

(72) Inventors: Seok-Won Lee, Yongin-si (KR);
Joon-Hee Lee, Seongnam-si (KR);
Dong-Seog Eun, Seongnam-si (KR);
Chang-Hyun Lee, Suwon-si (KR)

(73) Assignee: SAMSUNG ELECTRONICS CO., LTD., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/534,181

(22) Filed: Nov. 6, 2014

(65) Prior Publication Data
US 2015/0137216 A1 May 21, 2015

(30) Foreign Application Priority Data
Nov. 19, 2013 (KR) ........................ 10-2013-0140354

(51) Int. Cl.
| | |
|---|---|
| *H01L 27/115* | (2006.01) |
| *H01L 27/11582* | (2017.01) |
| *H01L 27/11556* | (2017.01) |
| *G11C 5/06* | (2006.01) |
| *H01L 27/11548* | (2017.01) |
| *H01L 27/11575* | (2017.01) |
| *G11C 8/14* | (2006.01) |
| *H01L 29/66* | (2006.01) |

(Continued)

(52) U.S. Cl.
CPC ........ *H01L 27/11582* (2013.01); *G11C 5/063* (2013.01); *G11C 8/14* (2013.01); *H01L 27/11548* (2013.01); *H01L 27/11556* (2013.01); *H01L 27/11575* (2013.01); *H01L 29/66825* (2013.01); *H01L 29/66833* (2013.01); *H01L 29/7889* (2013.01); *H01L 29/7926* (2013.01)

(58) Field of Classification Search
CPC ......... H01L 27/11582; H01L 27/11548; H01L 27/11556; H01L 27/11575; H01L 29/66825; H01L 29/66833; H01L 29/7889; H01L 29/7926; G11C 5/063; G11C 8/14
USPC ....................................... 257/329
See application file for complete search history.

(56) References Cited

U.S. PATENT DOCUMENTS

| | | |
|---|---|---|
| 7,910,979 B2 | 3/2011 | Matsuoka et al. |
| 7,960,844 B2 | 6/2011 | Jang et al. |

(Continued)

*Primary Examiner* — Peter Bradford
(74) *Attorney, Agent, or Firm* — Muir Patent Law, PLLC

(57) ABSTRACT

A vertical memory device includes a substrate, a channel, gate lines and a connecting portion. A plurality of the channels extend in a first direction which is vertical to a top surface of a substrate. A plurality of the gate lines are stacked in the first direction to be spaced apart from each other and extend in a second, lengthwise direction, each gate line intersecting a set of channels and surrounding outer sidewalls of each channel of the set of channels. The gate lines forms a stepped structure which includes a plurality of vertical levels. A connecting portion connects a group of gate lines of the plurality of gate lines located at the same vertical level, the connecting portion diverging from the second direction in which the gate lines of the group of gate lines extend.

19 Claims, 110 Drawing Sheets

(51) Int. Cl.
*H01L 29/788* (2006.01)
*H01L 29/792* (2006.01)

(56) References Cited

U.S. PATENT DOCUMENTS

| | | |
|---|---|---|
| 8,008,710 B2 | 8/2011 | Fukuzumi et al. |
| 8,133,784 B2 | 3/2012 | Chung et al. |
| 8,325,527 B2 | 12/2012 | Jin et al. |
| 8,344,385 B2 | 1/2013 | Kim et al. |
| 8,351,243 B2 | 1/2013 | Mihnea et al. |
| 8,431,969 B2 | 4/2013 | Kim et al. |
| 8,432,719 B2 | 4/2013 | Lue |
| 8,456,909 B2 | 6/2013 | Lee et al. |
| 2011/0227141 A1* | 9/2011 | Jeong ............... H01L 27/11578 257/324 |
| 2012/0147646 A1 | 6/2012 | Scheuerlein |
| 2012/0164821 A1* | 6/2012 | Kim .................. H01L 21/0273 438/588 |
| 2012/0224426 A1 | 9/2012 | Nam et al. |
| 2013/0121077 A1 | 5/2013 | Maejima |
| 2013/0130495 A1 | 5/2013 | Higashitani et al. |
| 2013/0138869 A1 | 5/2013 | Kwak |

\* cited by examiner

FIG. 1
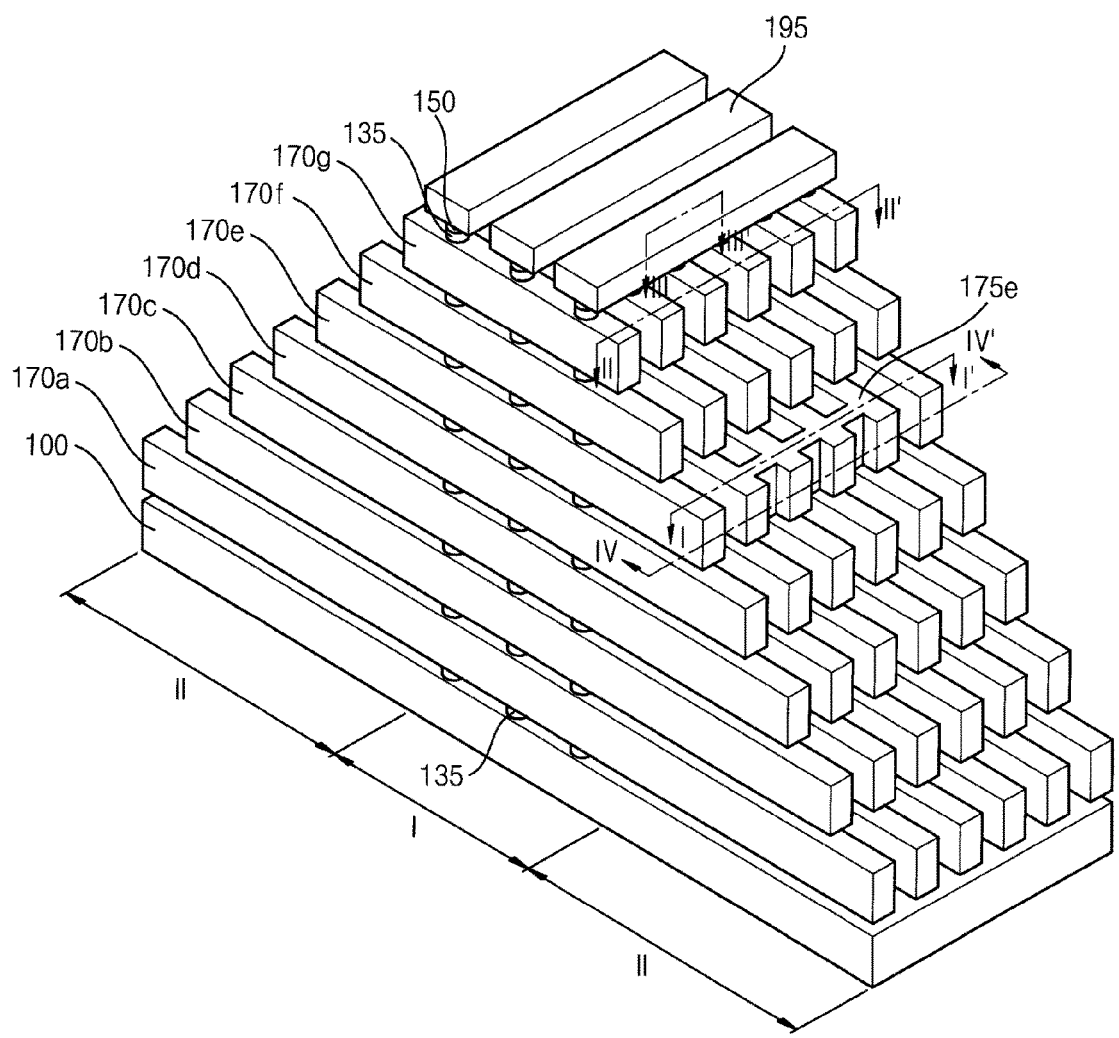
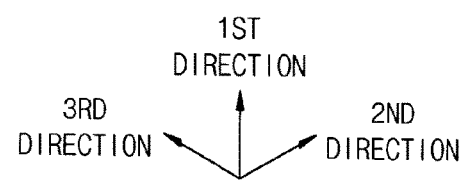

FIG. 2
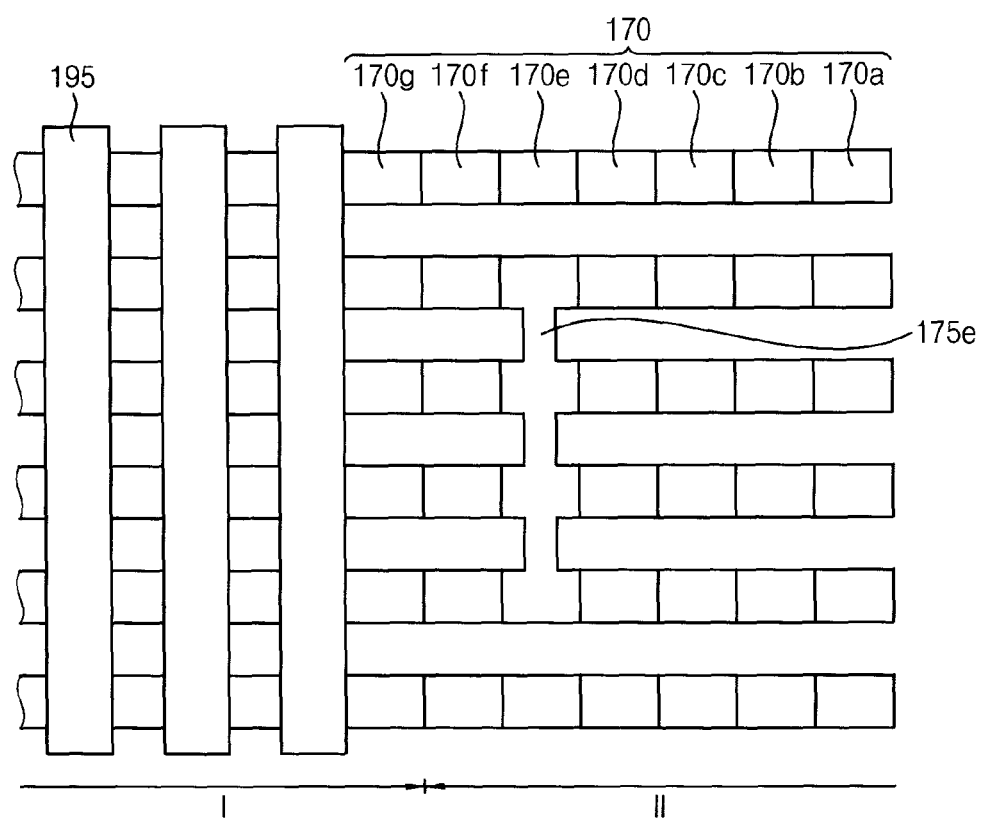
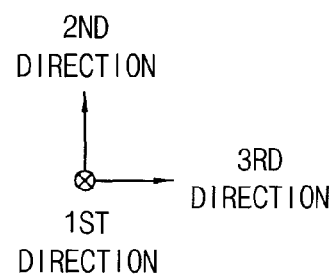

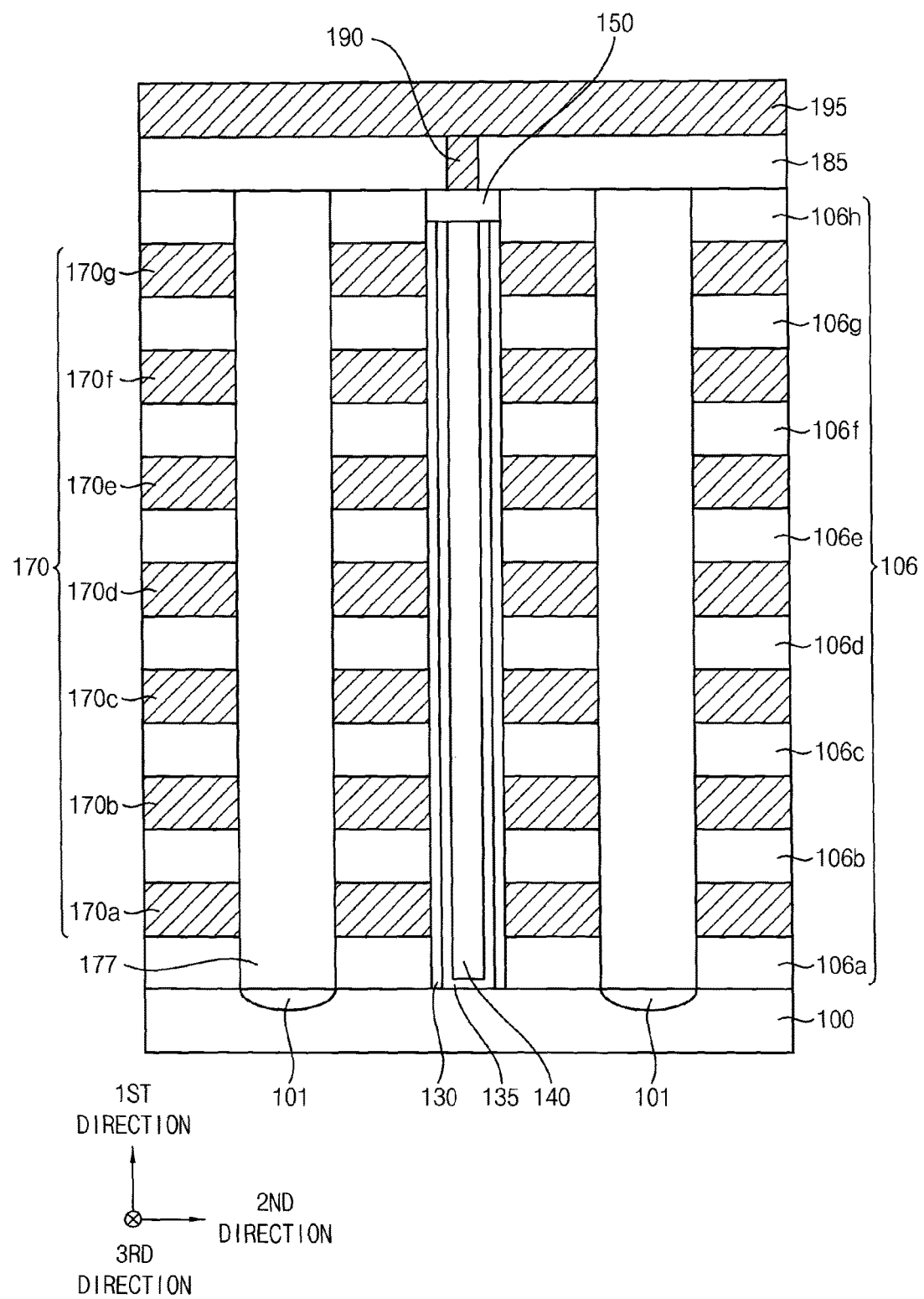

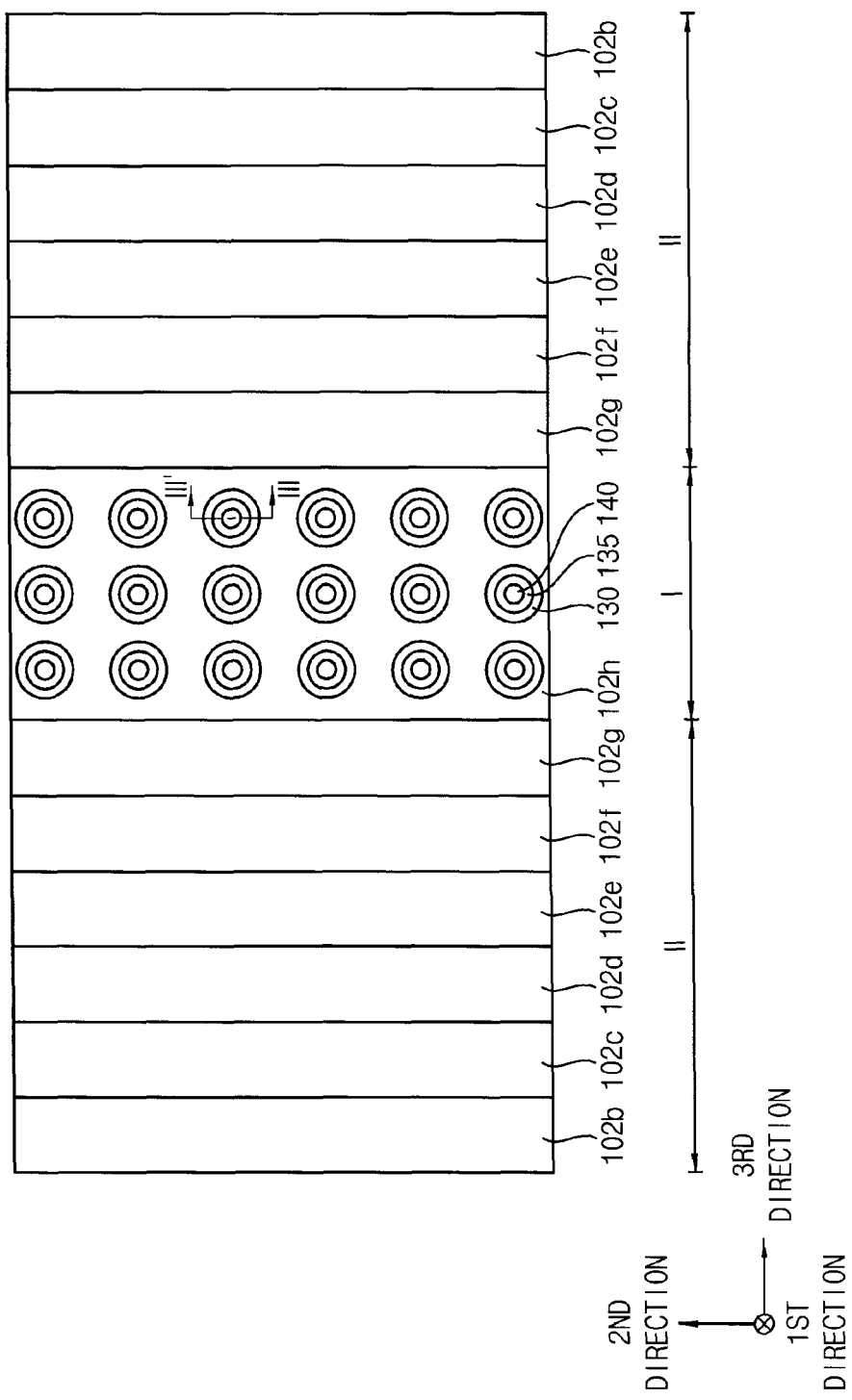

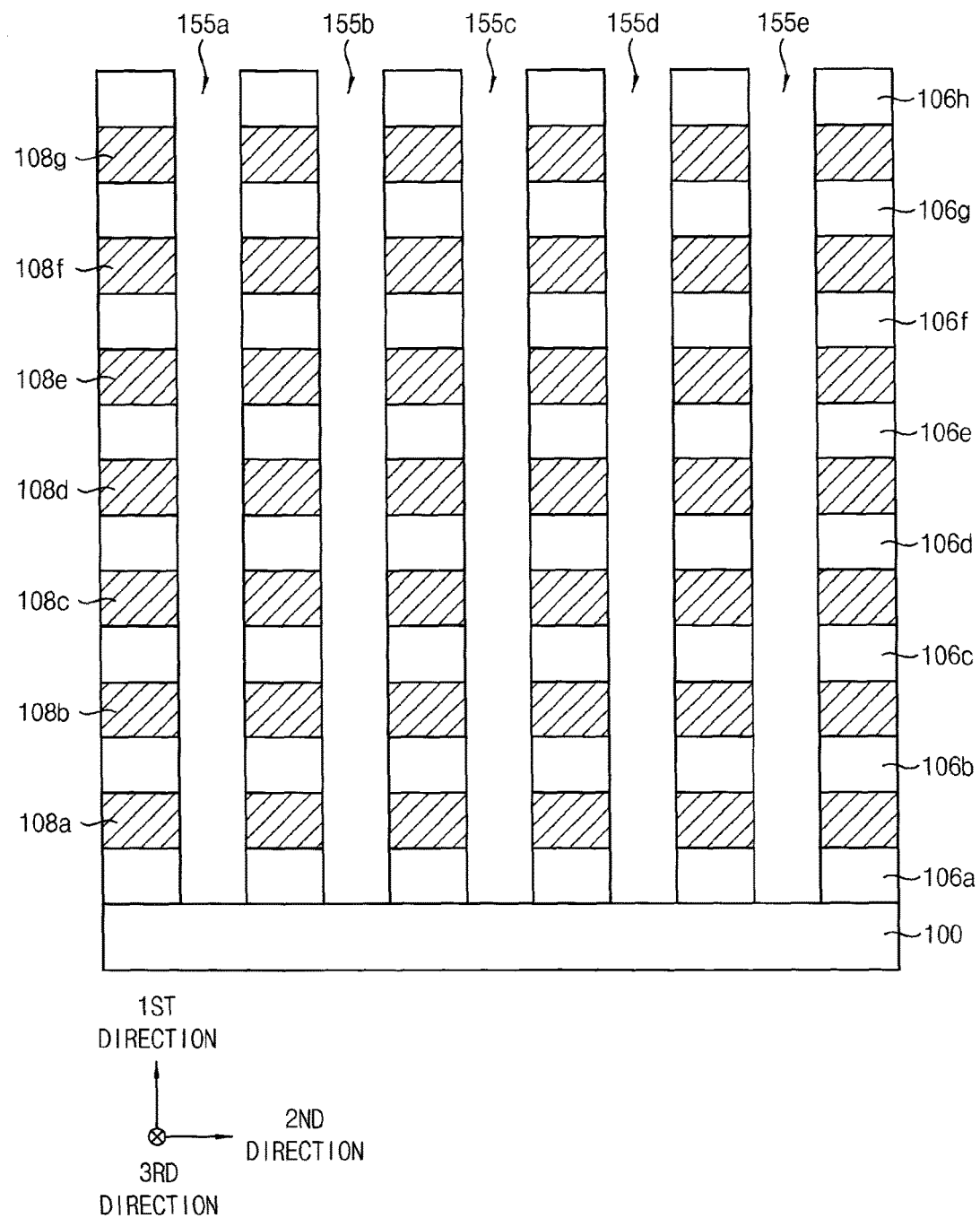

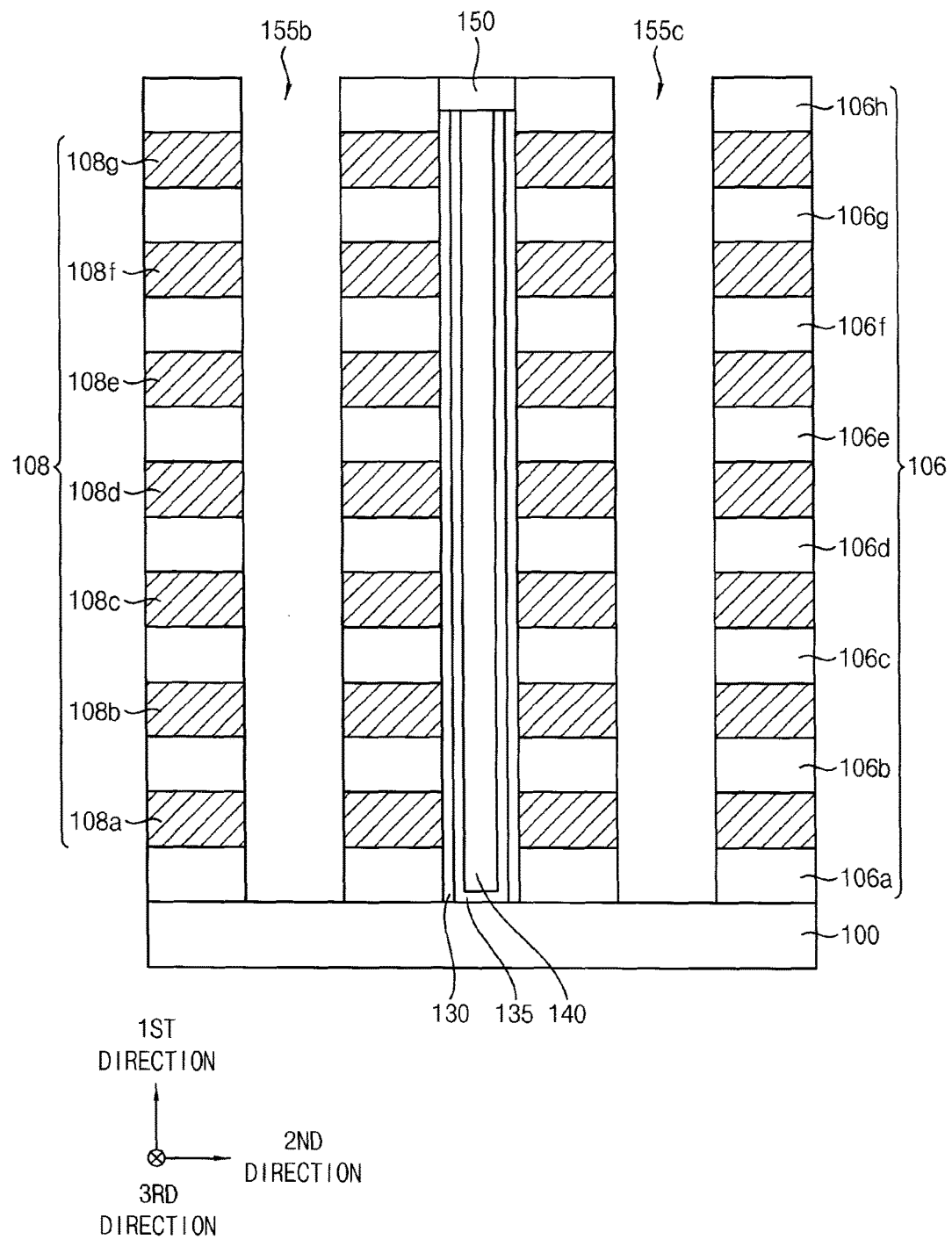

FIG. 16B
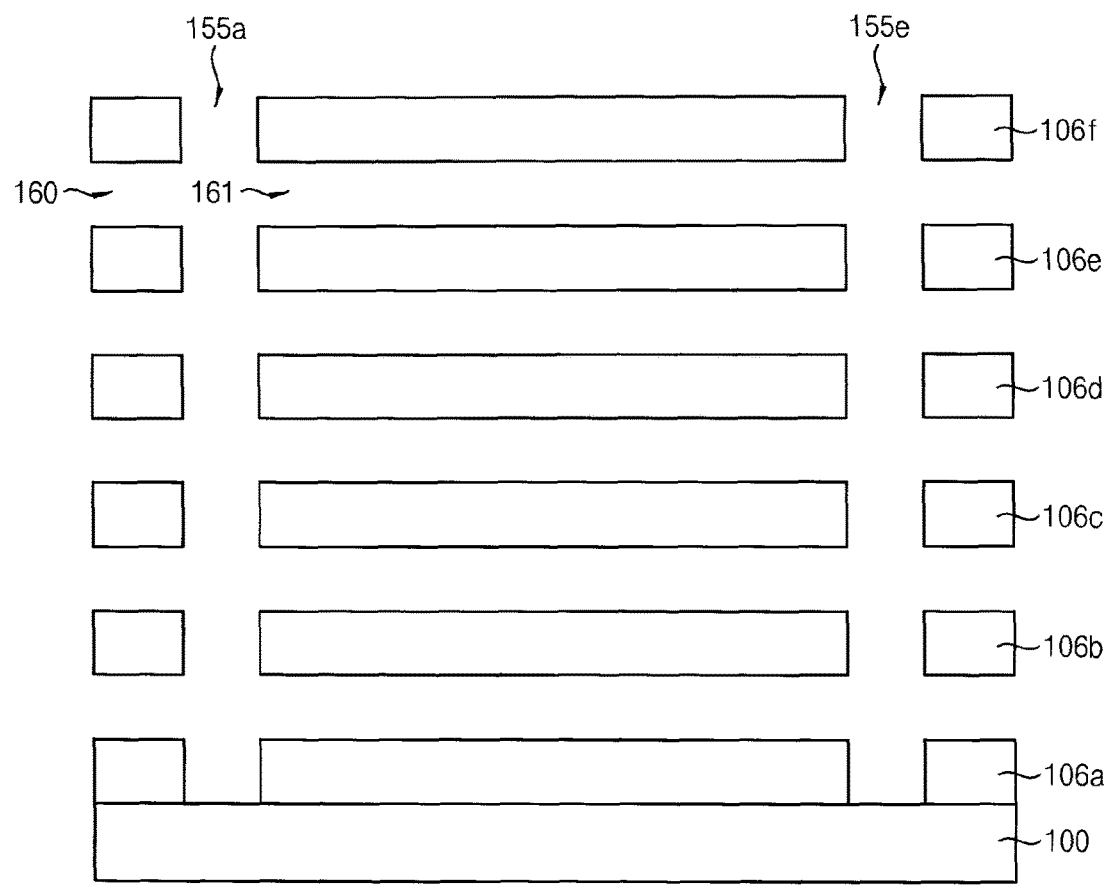
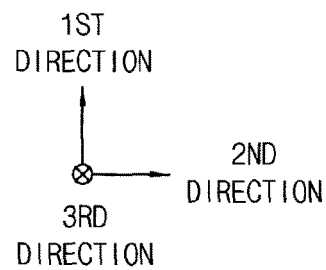

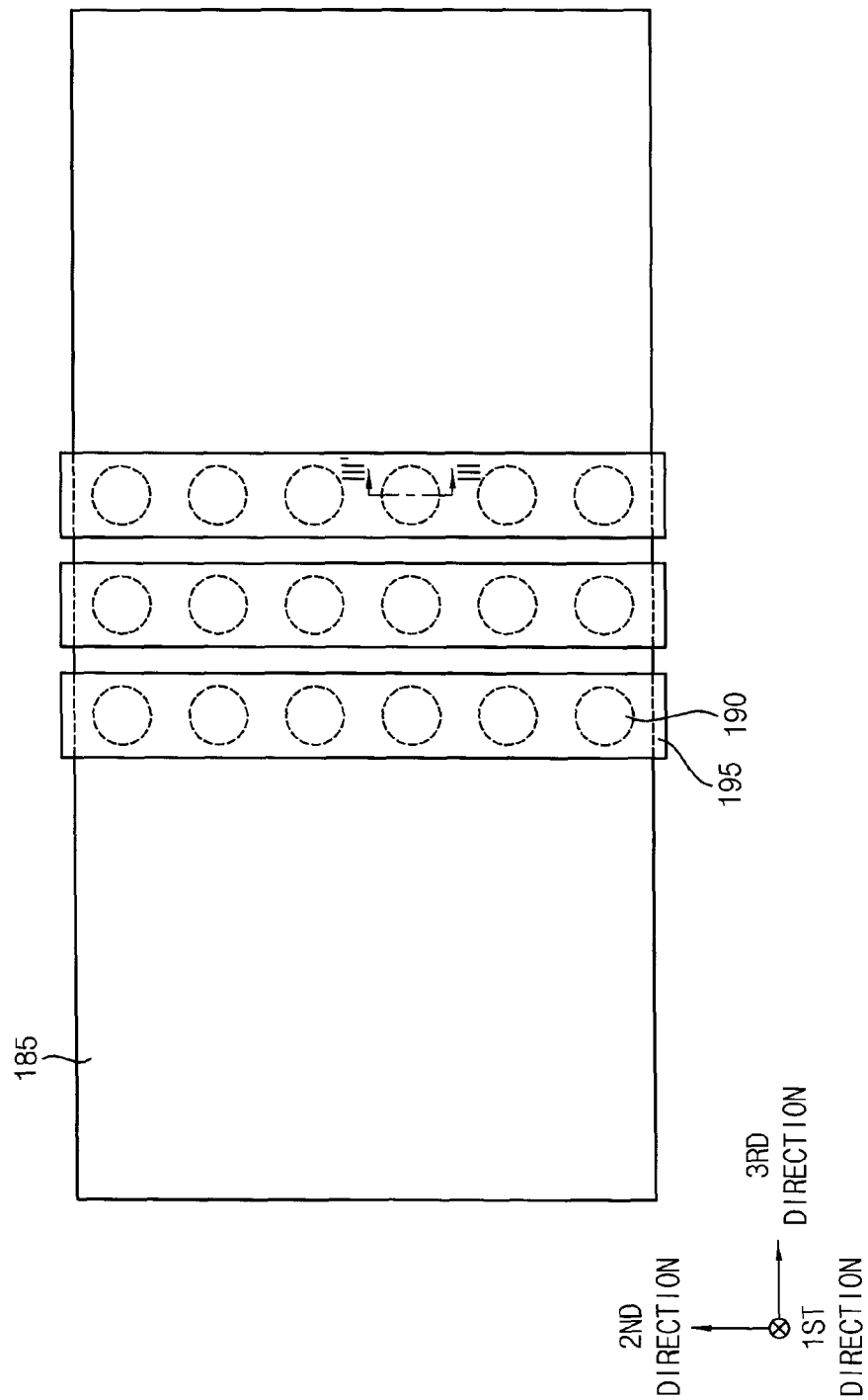

FIG. 31B
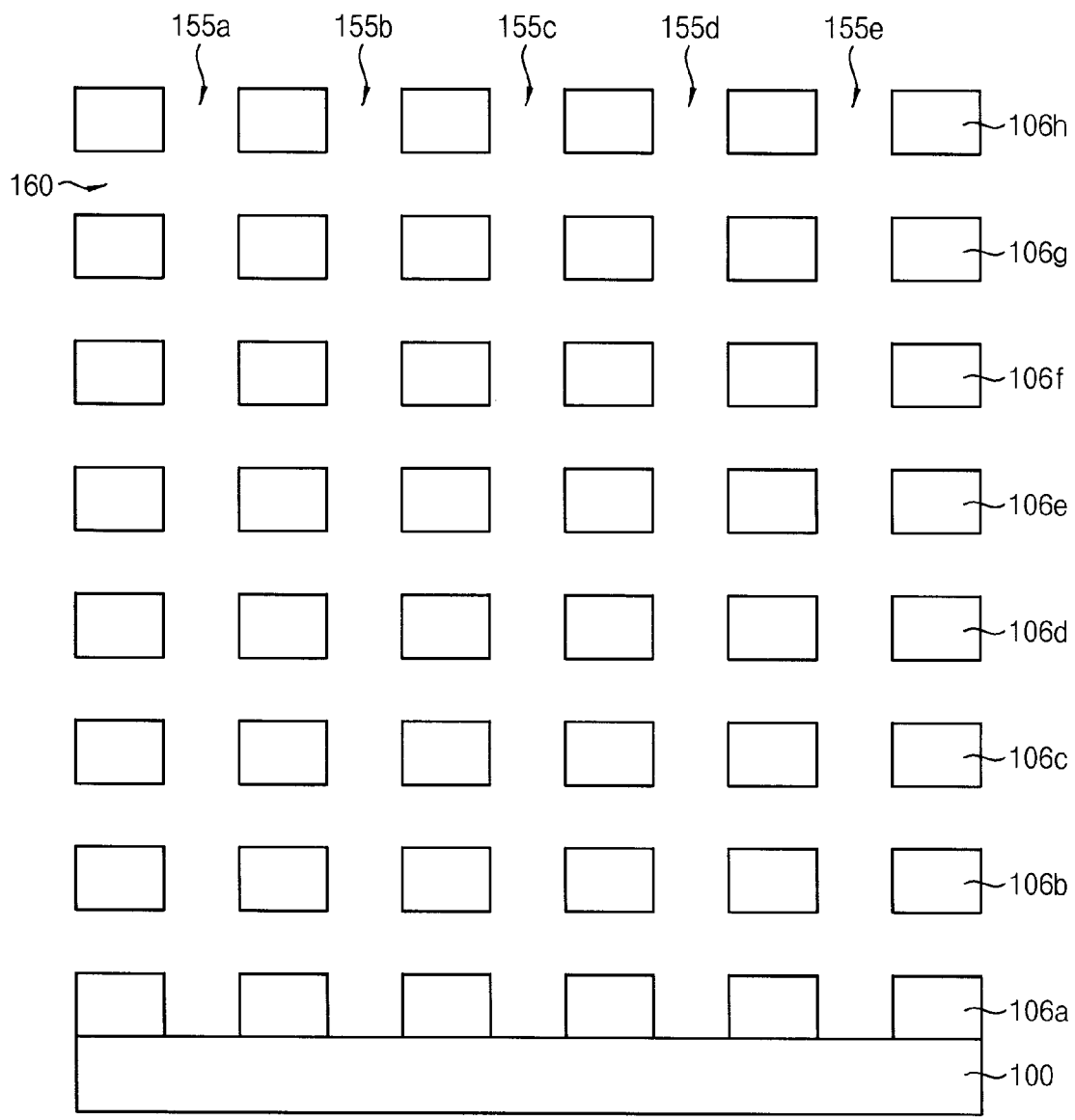
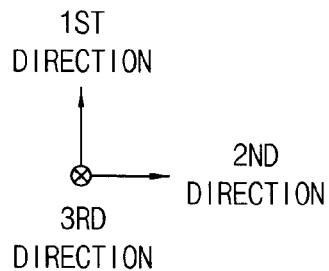

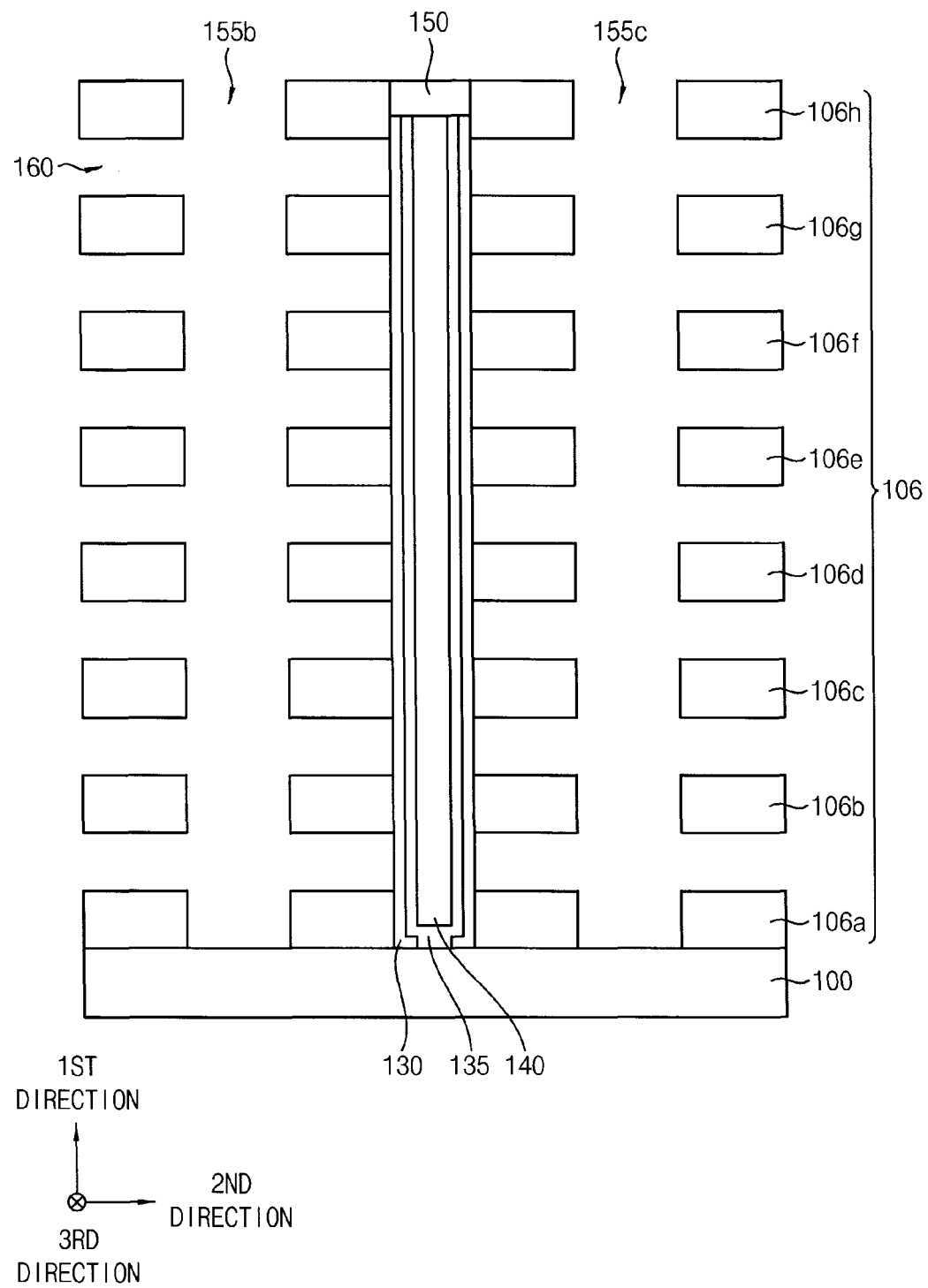

FIG. 41B
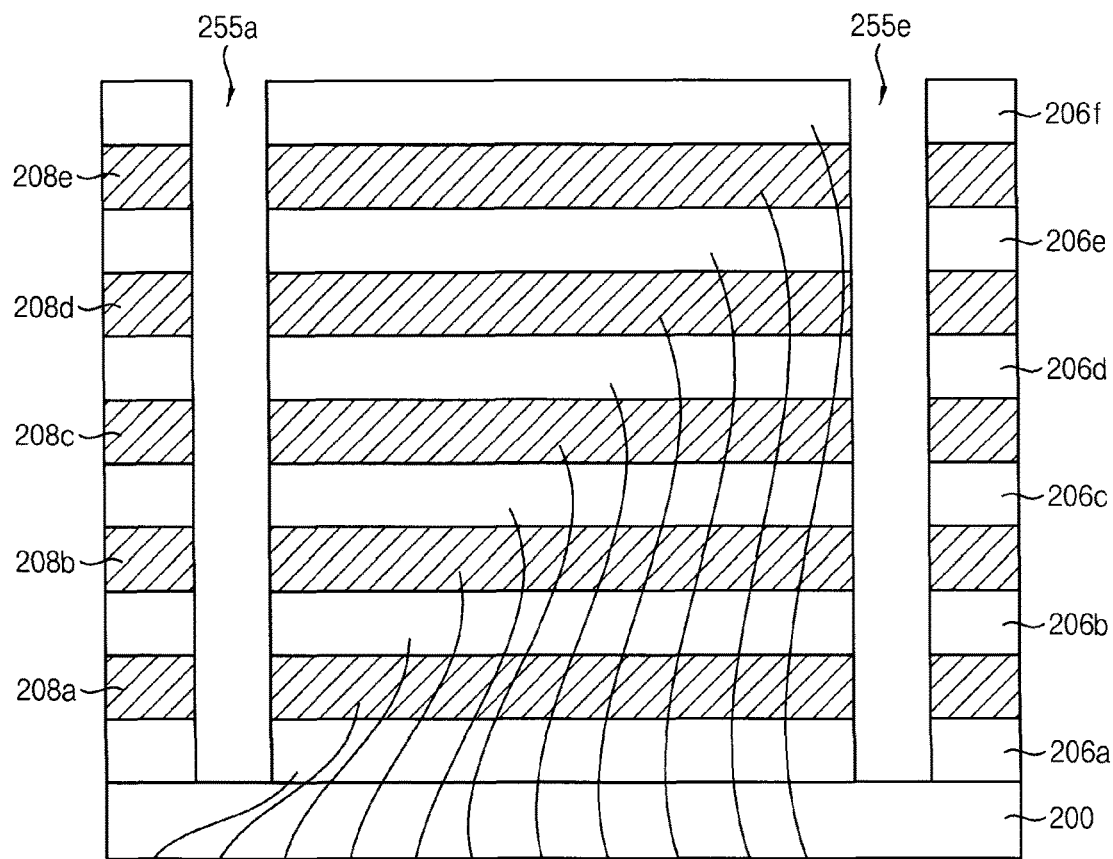
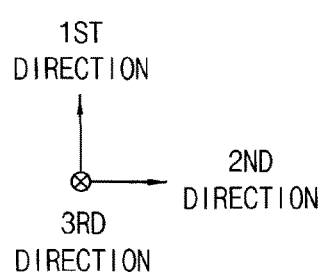

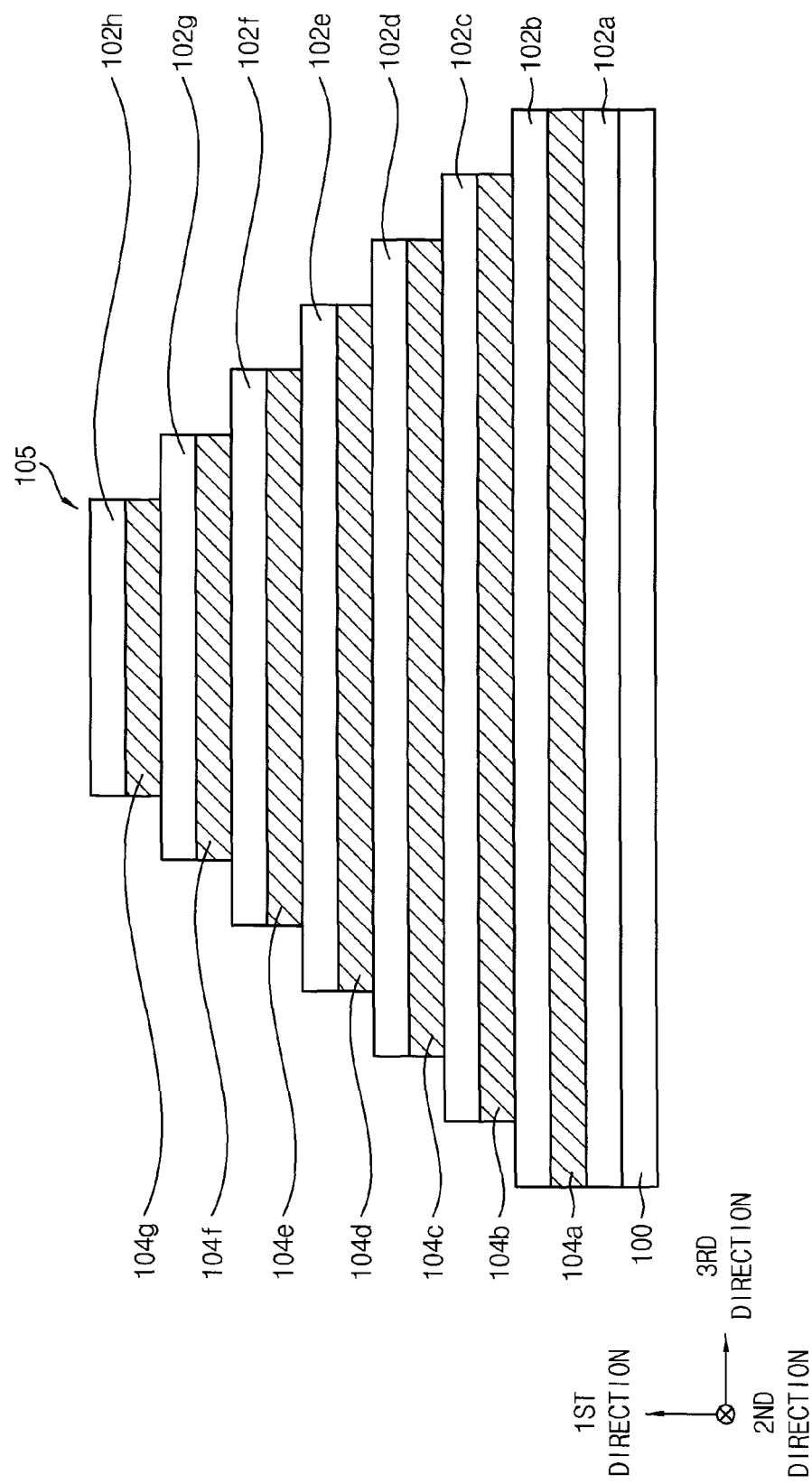

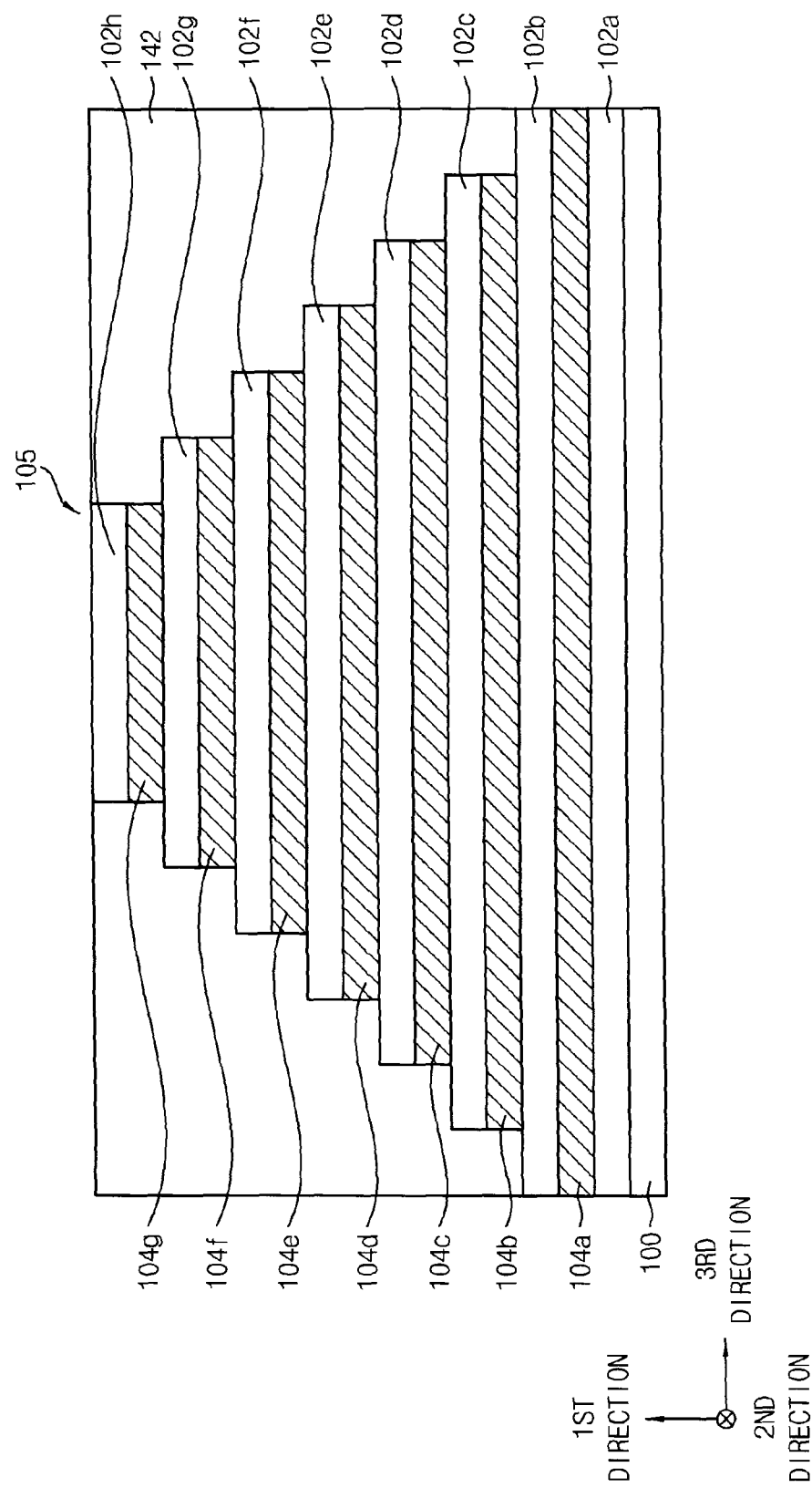

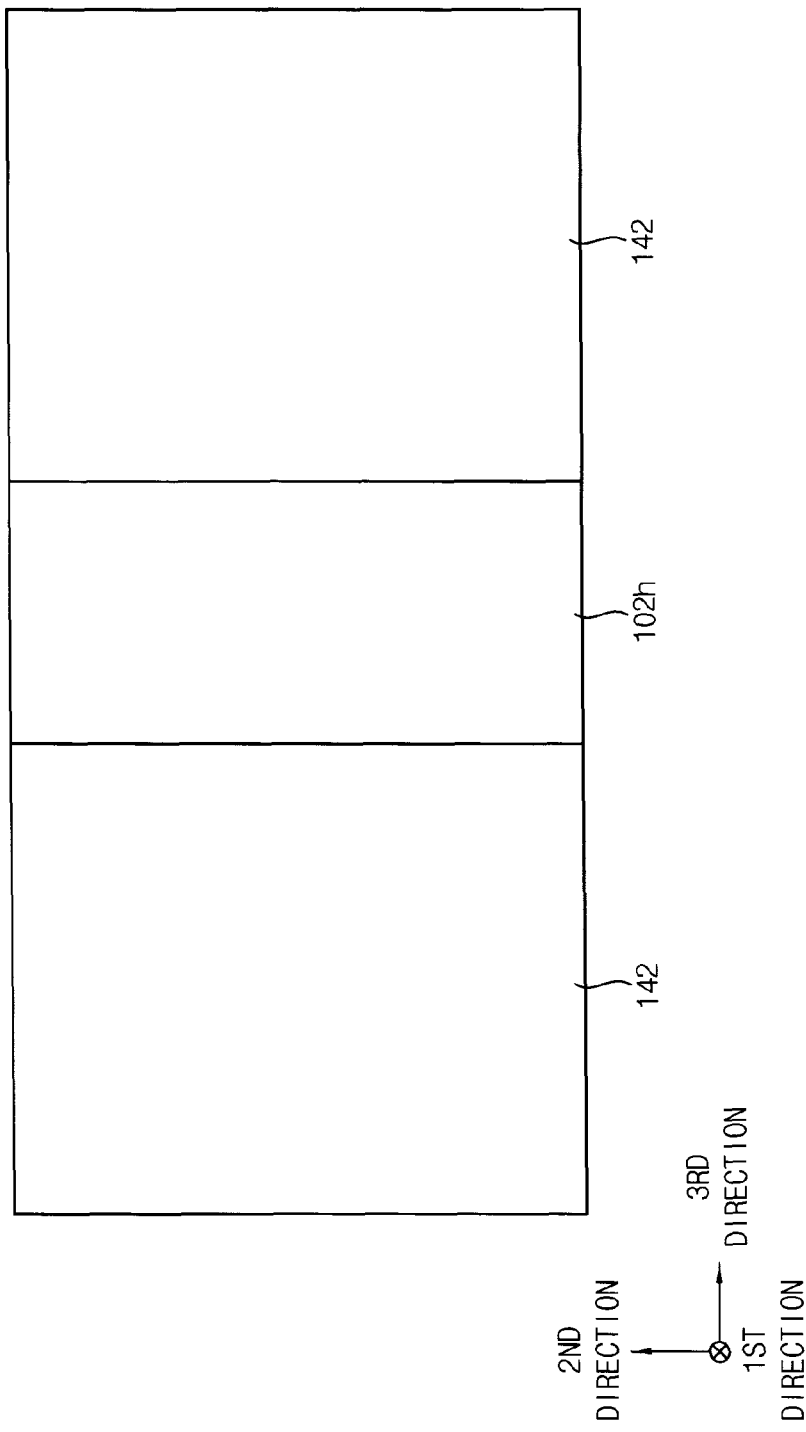

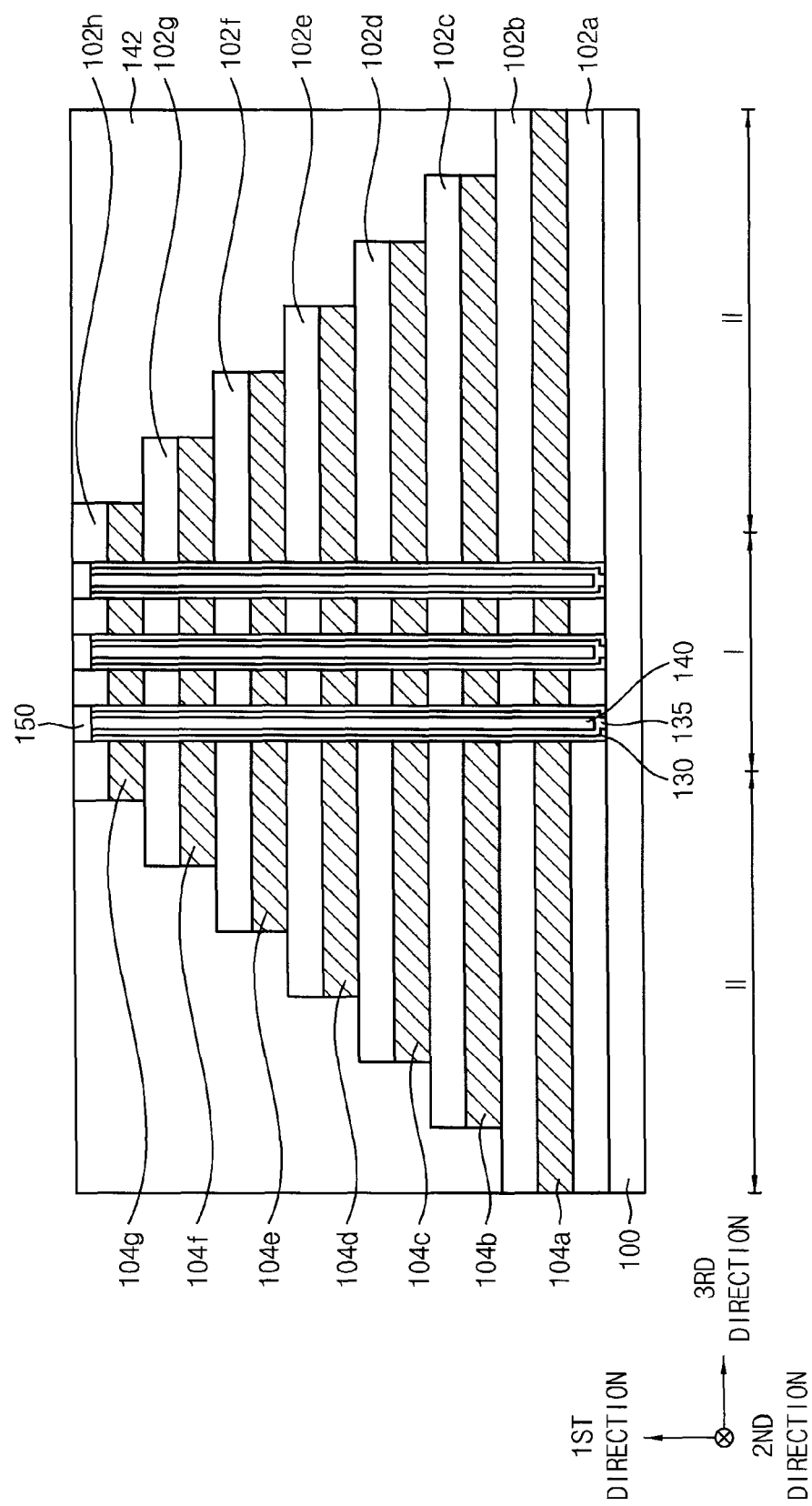

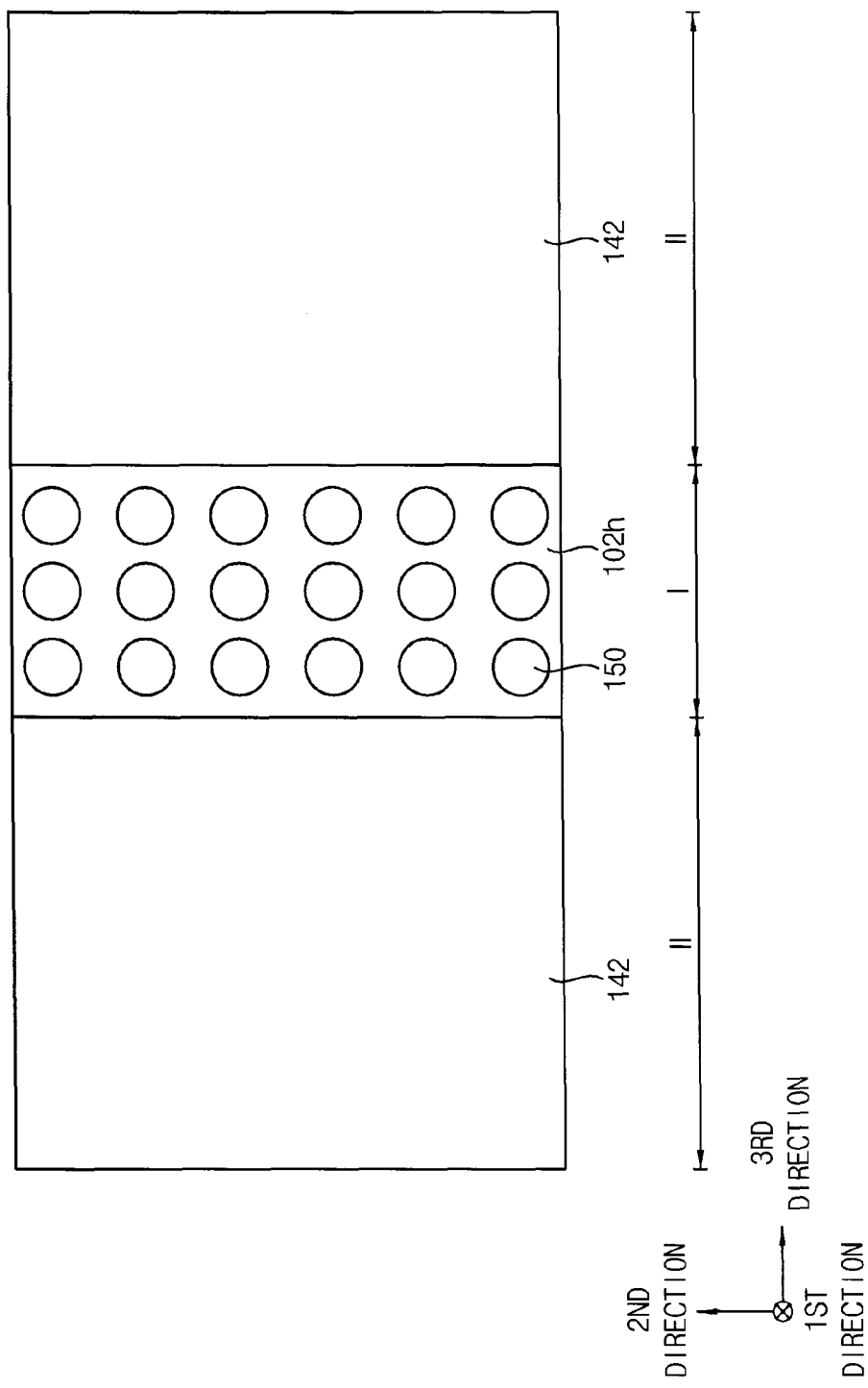

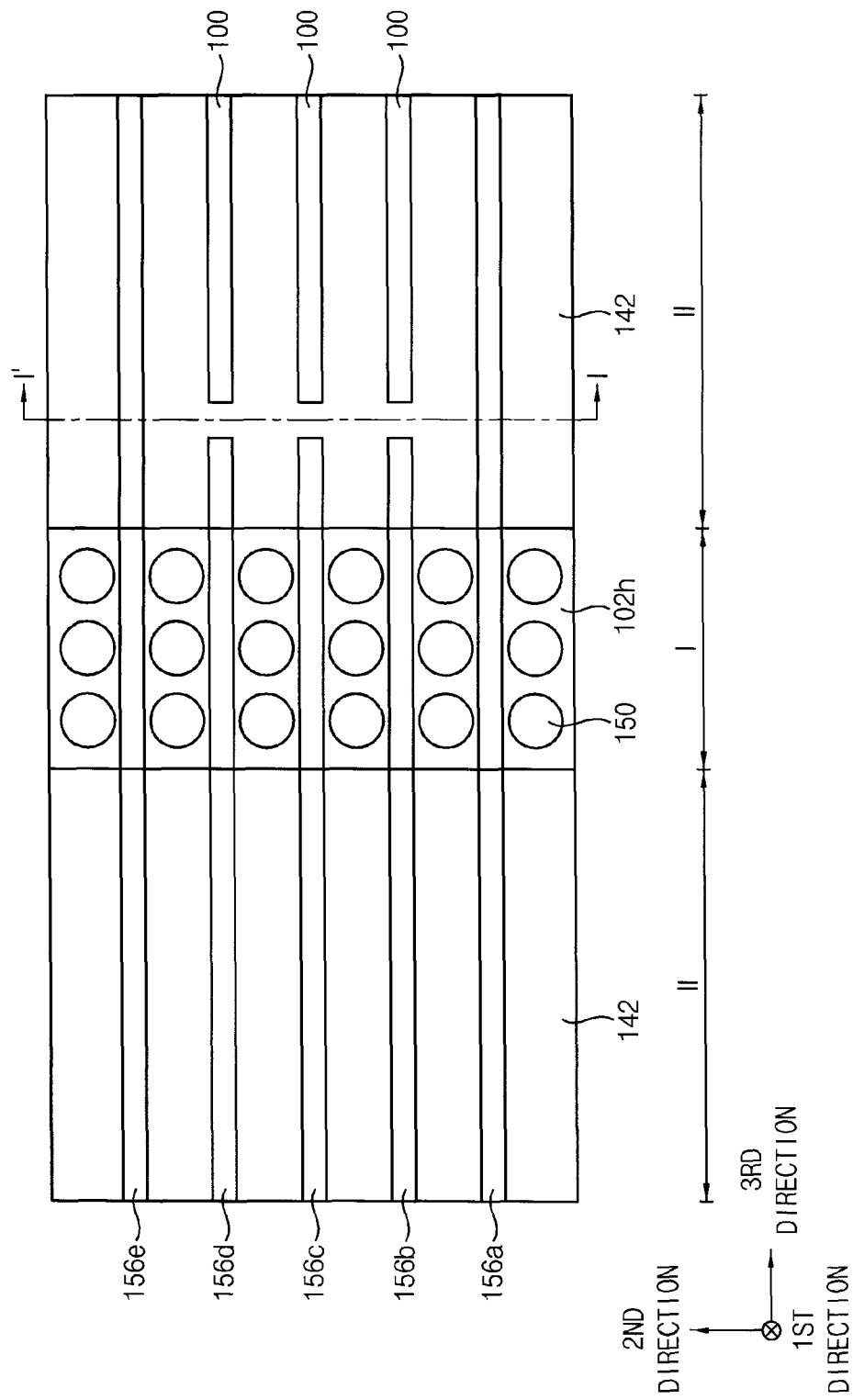

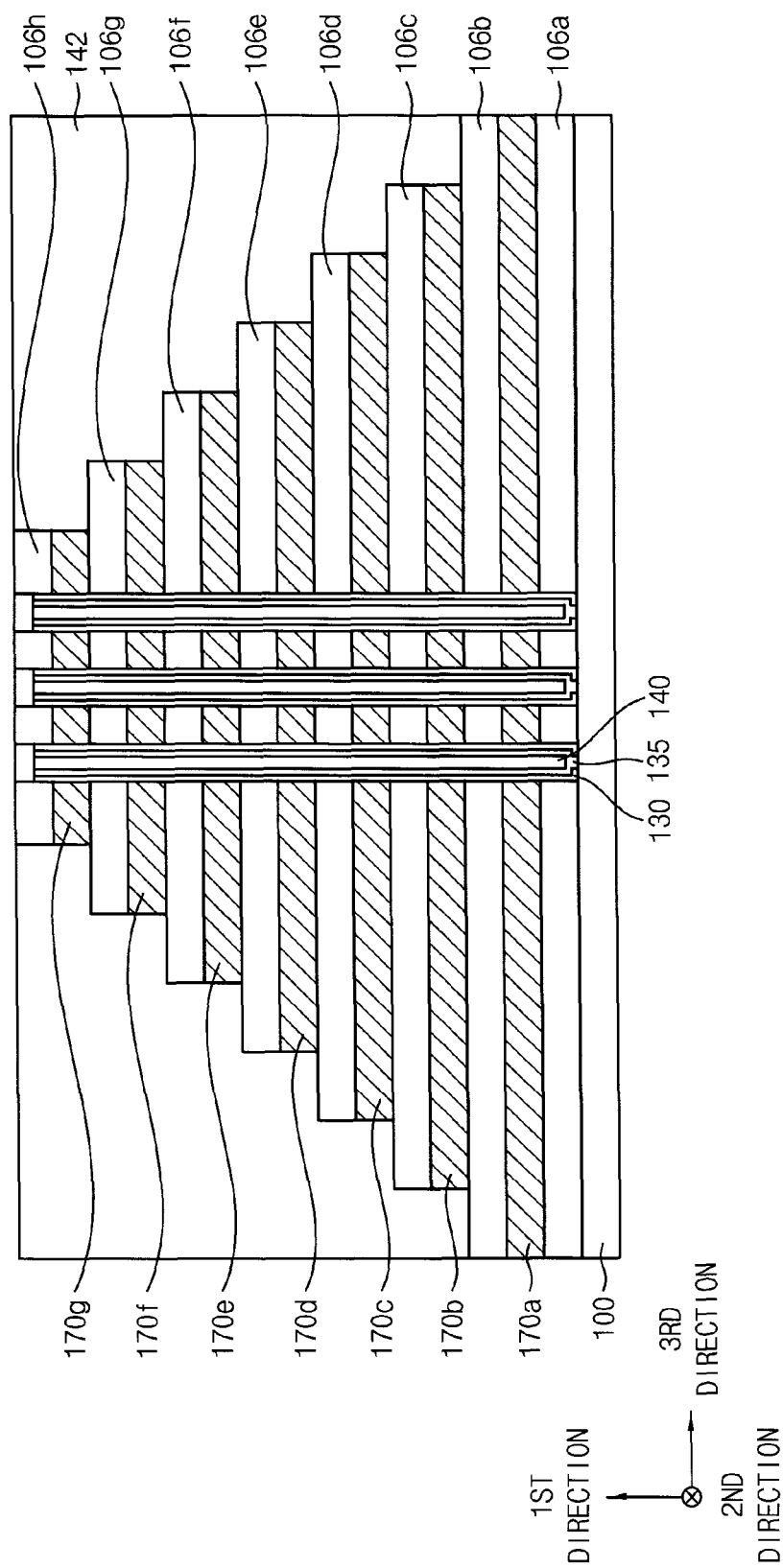

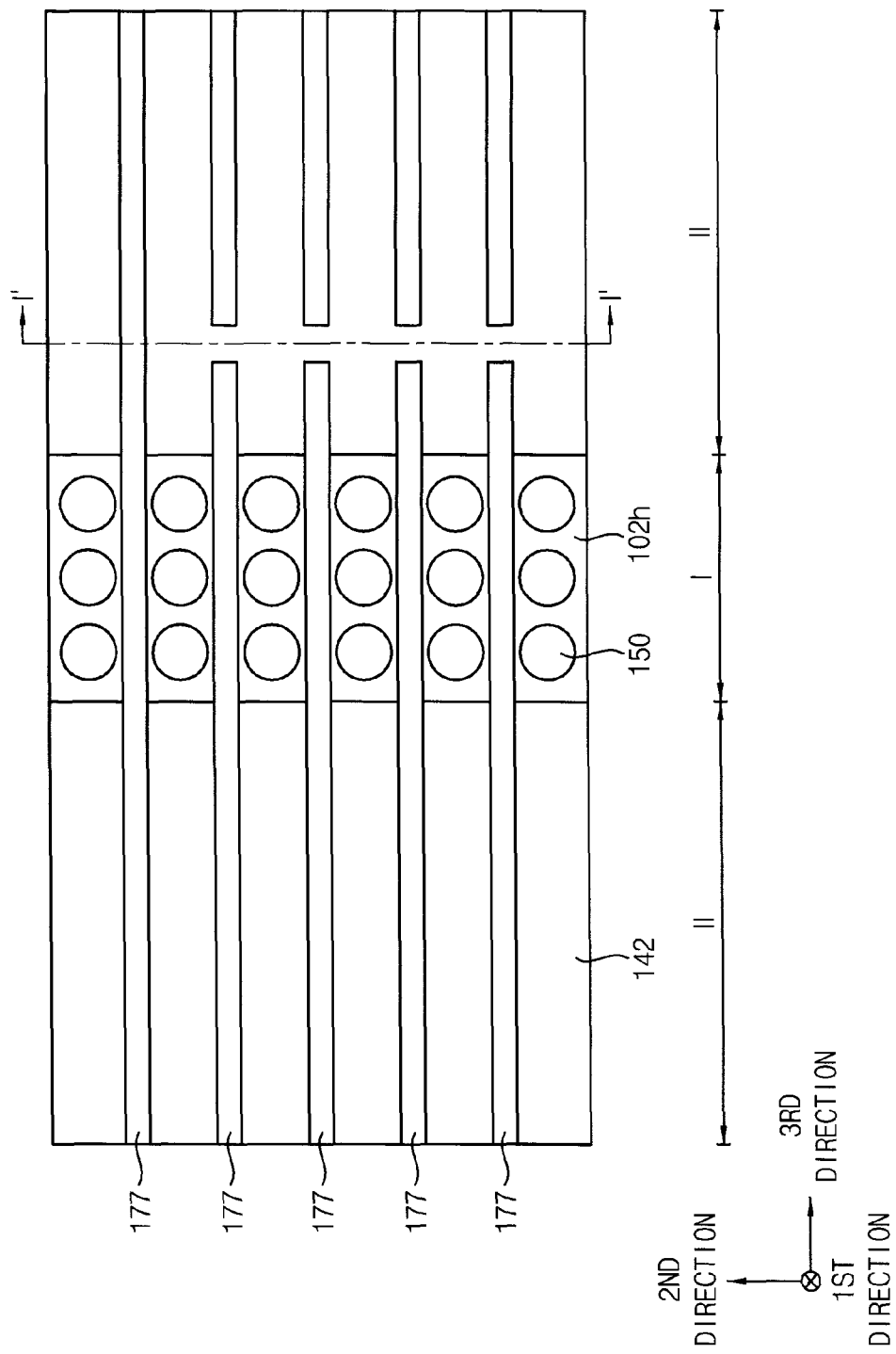

FIG. 50C
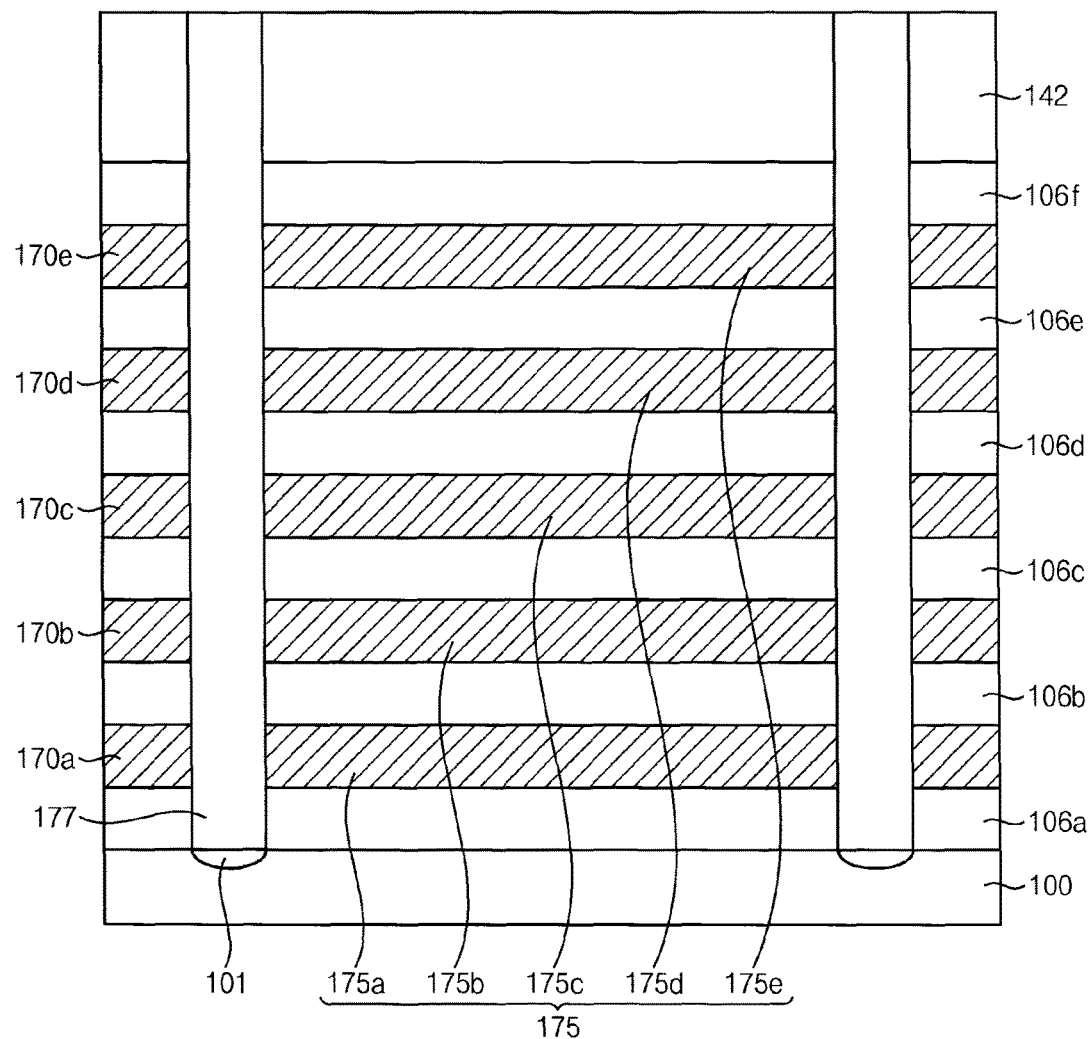
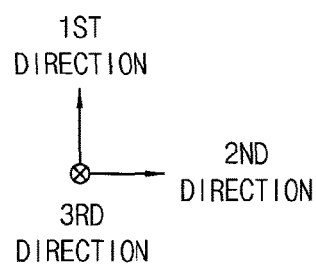

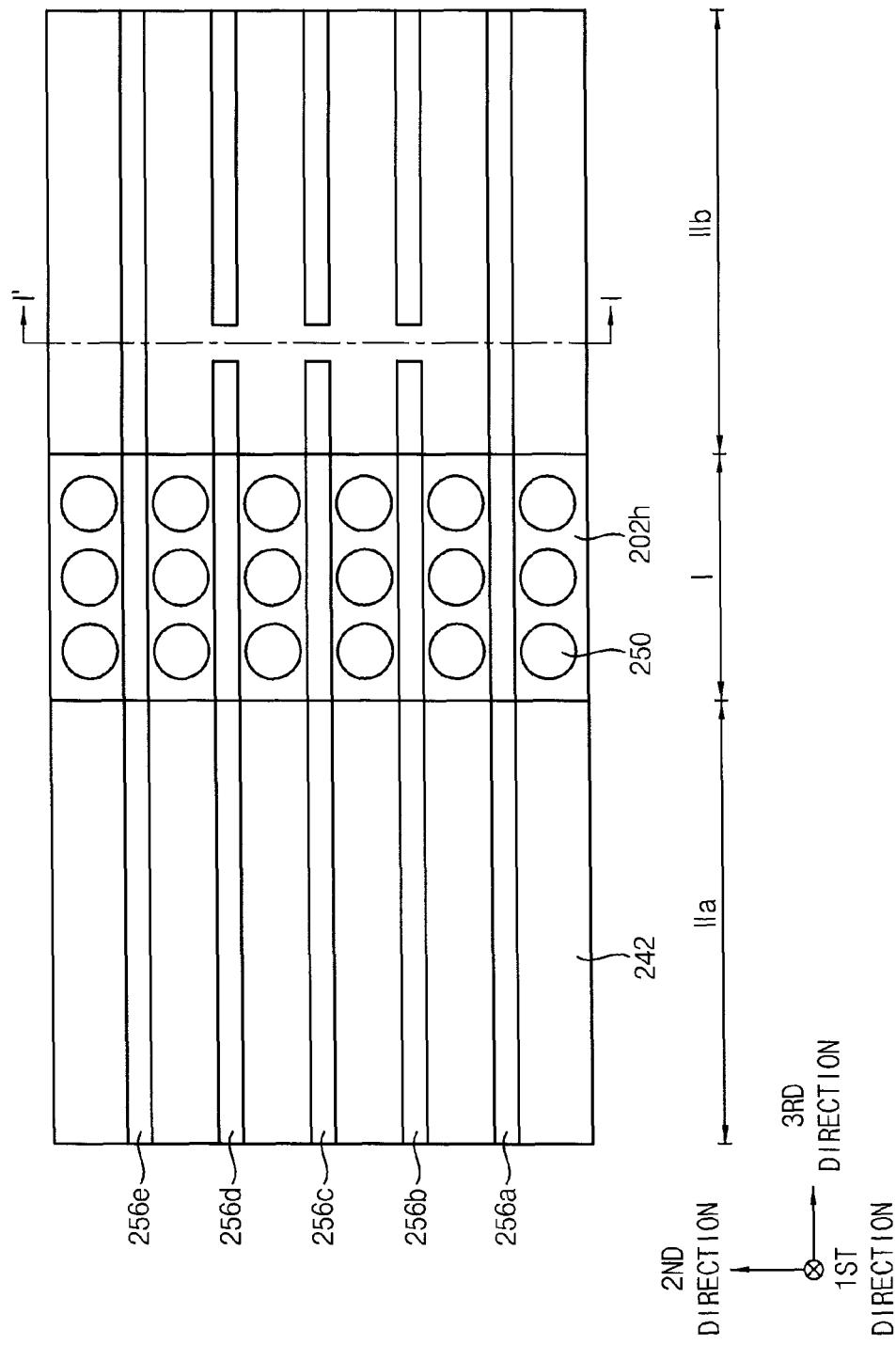

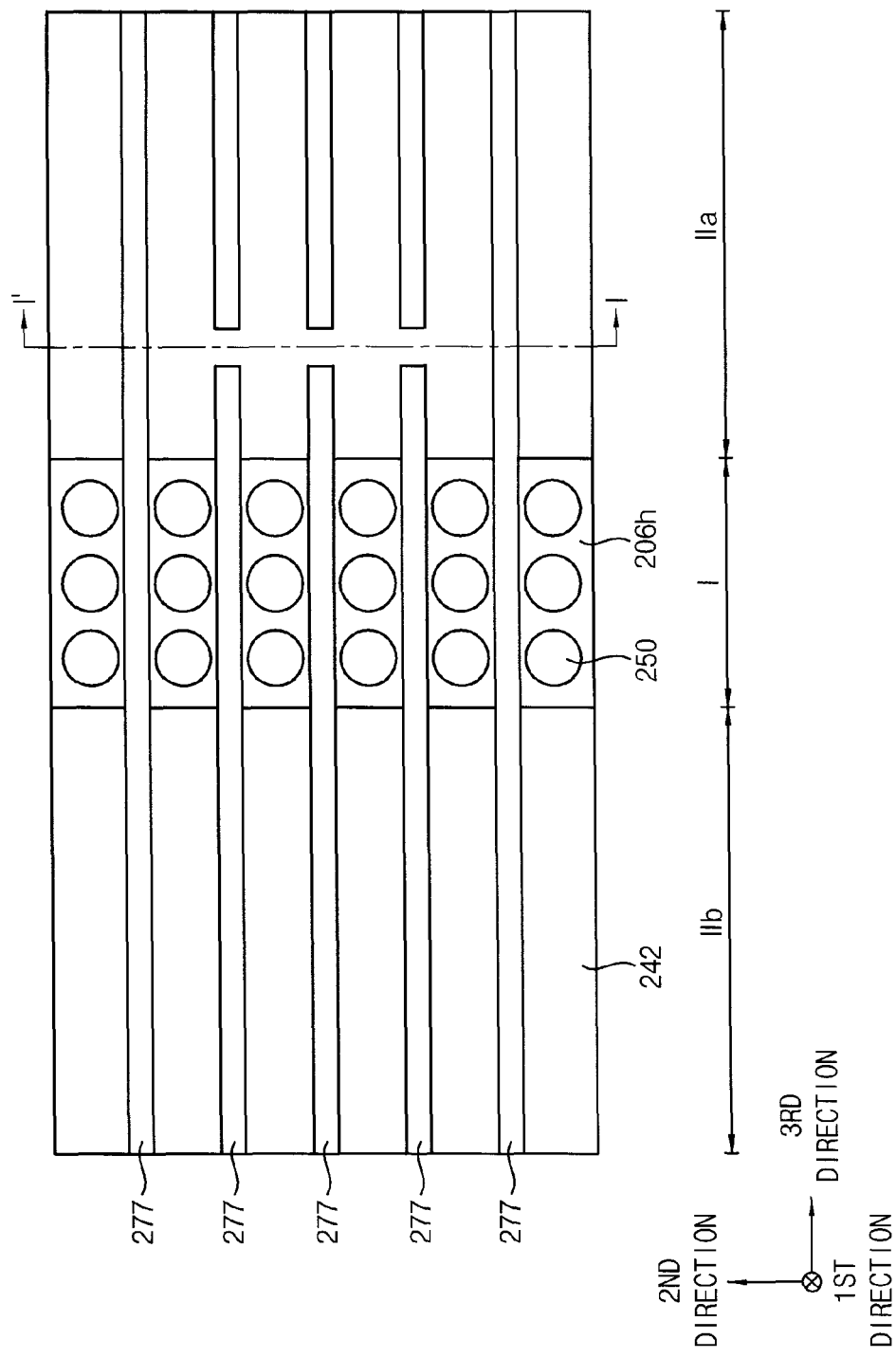

FIG. 57D
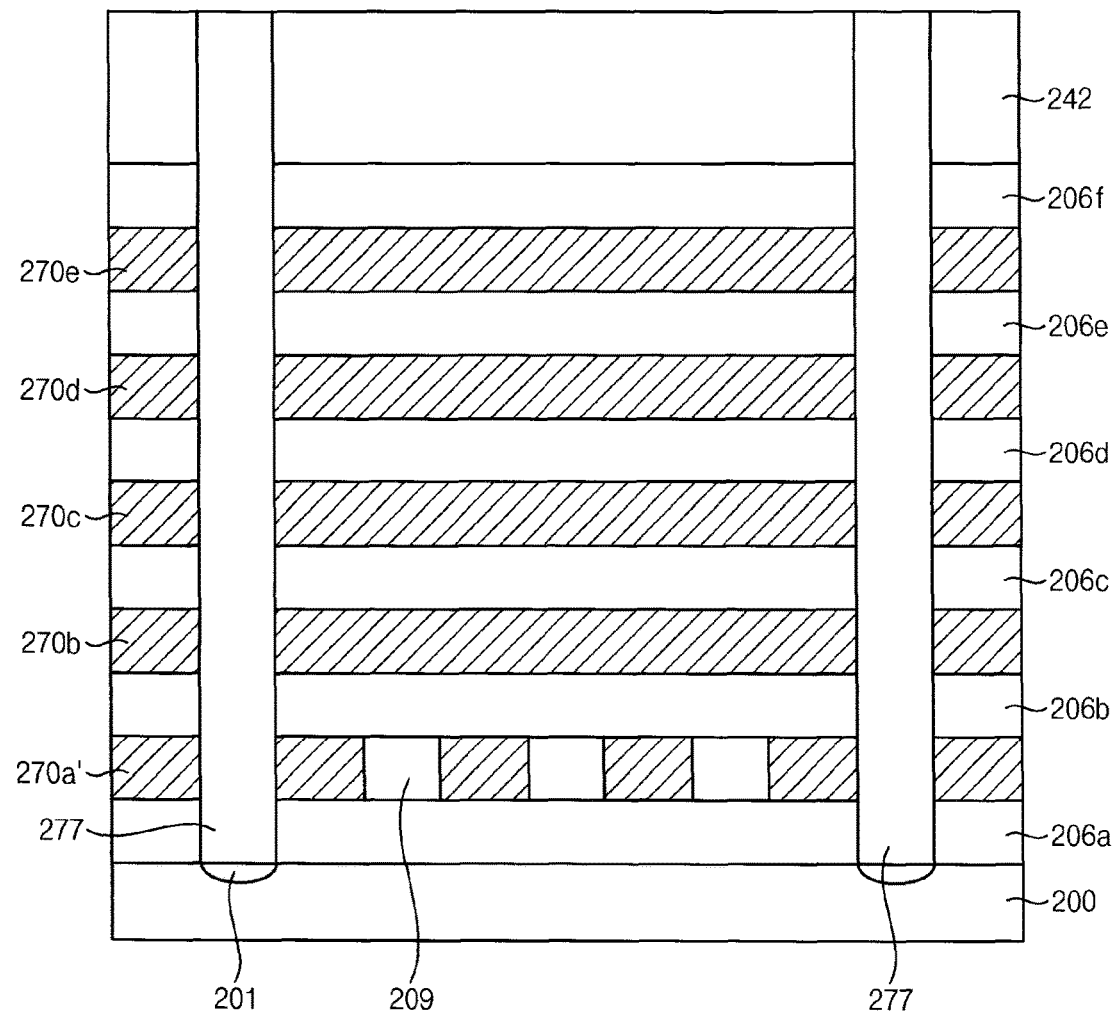
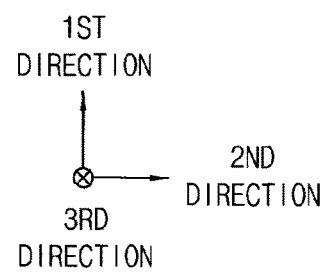

VERTICAL MEMORY DEVICE WITH GATE LINES AT THE SAME LEVEL CONNECTED

CROSS-REFERENCE TO RELATED APPLICATION

This application claims priority under 35 USC §119 to Korean Patent Application No. 10-2013-0140354, filed on Nov. 19, 2013 in the Korean Intellectual Property Office (KIPO), the contents of which are incorporated by reference herein in their entirety.

BACKGROUND

1. Field

Example embodiments relate to vertical memory devices and methods of manufacturing the same. More particularly, example embodiments relate to non-volatile memory devices including vertical channels and methods of manufacturing the same.

2. Description of the Related Art

Recently vertical memory devices including memory cells stacked vertically with respect to a surface of a substrate have been developed in order to realize a high degree of integration. In a vertical memory device, gate lines may be stacked vertically with respect to a top surface of the substrate, and contacts and/or wirings for applying electrical signals to the gate lines may be needed.

As the stacked number of the gate lines becomes larger, the number of the contacts and the wirings may be also increased. In this case, a circuit structure of the vertical memory device may become excessively complex, and a patterning process for a formation of the contacts and the wirings may not be easily performed due to a resolution limit of, e.g., an exposure apparatus.

SUMMARY

Example embodiments provide a vertical memory device having a high degree of integration.

Example embodiments provide a method of manufacturing a vertical memory device having a high degree of integration.

According to example embodiments, there is provided a vertical memory device. The vertical memory device includes a substrate, a channel, gate lines and a connecting portion. A plurality of the channels extends in a first direction which is vertical to a top surface of the substrate. A plurality of the gate lines are stacked in the first direction to be spaced apart from each other, and extend in a second, lengthwise direction, each gate line intersecting a set of channels and surrounding outer sidewalls of each channel of the set of channels. The gate lines forms a stepped structure which includes a plurality of vertical levels. A connecting portion connects a group of gate lines of the plurality of gate lines located at the same vertical level. The connecting portion diverges from the second direction in which the gate lines of the group of gate lines extend.

In example embodiments, the substrate may include a cell region and an extension region at a lateral portion of the cell region. The connecting portion may be disposed on the extension region.

In example embodiments, the gate line may include an extension portion protruding toward the extension region. The connecting portion of an uppermost level may be diverged from the extension portion of the gate line.

In example embodiments, a plurality of the connecting portions may be provided at different vertical levels and overlap each other in the first direction.

In example embodiments, the connecting portion is inside outermost ends of the gates lines of the group of gate lines in the second direction and is integral with the group of gate lines.

In example embodiments, the extension region may include a first extension region and a second extension region at both lateral portions of the cell region. The plurality of gate lines may be stacked in the first direction such that top surfaces of the plurality of gate lines may be exposed alternately on the first extension region and the second extension region.

In example embodiments, the connecting portion may be disposed on at least one of the first extension region and the second extension region.

In example embodiments, the vertical memory device may further include contacts electrically connected to the plurality of gate lines. The contacts may be arranged alternately on the first extension region and the second extension region in the first direction.

In example embodiments, the plurality of gate lines may include ground selection lines (GSLs), word lines and string selection lines (SSLs). The SSLs at the same level may be separated from each other, and the group of word lines at the same level may be connected or merged with each other by the connecting portion.

In example embodiments, the GSLs at the same level may be separated from each other by a separation layer pattern.

In example embodiments, the separation layer pattern may overlap the connecting portion in the first direction.

In example embodiments, the GSL may include a recessed portion accommodating the separation layer pattern.

In example embodiments, the GSL may include a protrusion in contact with the separation layer pattern.

In example embodiments, the vertical memory device may further include a GSL contact, a word line contact and an SSL contact electrically connected to the GSL, the word line and the SSL, respectively. The number of the word line contacts at one level may be smaller than the number of the GSL contacts at one level or the number of the SSL contacts at one level.

In example embodiments, a GSL contact and an SSL contact may be provided on each individual GSL and each individual SSL, respectively. The gate lines connected by the connecting portion at one level may form a word line group. The word line contact may be provided for each word line group.

In example embodiments, the word line contact may be provided on the connecting portion.

In example embodiments, a plurality of the channels may be arranged in the second direction to form a channel row. A plurality of the channel rows may be arranged in a third direction perpendicular to the second direction. A gate line may surround channels of the channel row, and the connecting portion may connect the group of gate lines arranged in the second direction at the same vertical level.

According to example embodiments, a vertical memory device includes: a substrate; a plurality of channels extending in a first direction which is vertical to a top surface of the substrate; and a plurality of sets of gate lines stacked in the first direction, each set of gate lines including a group of gate lines at a same vertical level and extending in a second direction perpendicular to the first direction, the group of gates lines parallel to each other and separated from each other in a third direction perpendicular to the first direction and different from the second direction. Each gate line of each group of gate lines intersects a plurality of channels, and a plurality of sets of gate lines form a stepped structure which includes a plurality of vertical levels. The vertical memory device further includes at least a first connecting portion connecting gate lines of a first gate line group of the plurality of groups of gate lines, the connecting portion integrally formed to connect the gate lines of the first gate line group and extending in an extension direction different from the second direction.

According to example embodiments, the plurality of channels are formed at a central region of the vertical memory device; and the first connecting portion is formed in an outer region of the vertical memory device where the channels are not formed.

According to example embodiments, the gate lines of the first gate line group extend in the second direction from the central region to the outer region and end at a location in the outer region; and the connecting portion is located between the end of the gate lines of the first gate line group and the central region, with respect to the second direction.

According to example embodiments, the vertical memory device further includes at least a second connecting portion connecting gate lines of a second gate line group of the plurality of groups of gate lines, second gate line group at a different vertical level as the first gate line group, the second connecting portion integrally formed to connect the gate lines of the second gate line group and extending in the extension direction different from the second direction. The second connecting portion vertically overlaps the first connecting portion.

The vertical memory device may further include a word line contact shared among the the gate lines of the first gate line group.

According to example embodiments, a vertical memory device includes a substrate and a plurality of cell blocks on the substrate. The substrate includes a cell region, and a first extension region and a second extension region at opposite lateral portions of the cell region. Each cell block of the plurality of cell blocks includes a plurality of channels, a plurality of gate lines and a connecting portion. The channels extend in a first direction which is vertical to a top surface of the substrate. Each gate lines surrounds outer sidewalls of a set of channels of the plurality of channels and extending in a second, lengthwise direction perpendicular to the first direction, the plurality of gate lines including at least two groups of gate lines of the plurality of gate lines, the groups stacked in the first direction to be spaced apart from each other. The connecting portion connects the gate lines located at the same level, and protrudes from the gate line in a third direction different from the lengthwise direction.

In example embodiments, the cell blocks may be arranged in the third direction which is parallel to the top surface of the substrate. The first extension region and the second extension region may face each other with respect to a cell region in the second direction. The second direction may be parallel to the top surface of the substrate and perpendicular to the third direction.

In example embodiments, the connection portions of the cell blocks may be arranged alternately on the first extension region and the second extension region in the third direction.

In example embodiments, the vertical memory device may further include a contact electrically connected to the gate lines which are connected to or merged with each other by the connecting portion. A plurality of the contacts may be arranged alternately on the first extension region and the second extension region in the third direction.

BRIEF DESCRIPTION OF THE DRAWINGS

Example embodiments will be more clearly understood from the following detailed description taken in conjunction with the accompanying drawings. FIGS. 1 to 59 represent non-limiting, example embodiments as described herein.

FIG. 1 is a perspective view illustrating a vertical memory device in accordance with example embodiments;

FIG. 2 is an exemplary top plan view illustrating the vertical memory device of FIG. 1, according to one embodiment;

FIGS. 3 to 5 are exemplary cross-sectional views taken along lines I-I', II-II' and III-III' of FIG. 1, respectively, according to certain embodiments;

FIGS. 7 to 20B are perspective views, top plan views and cross-sectional views illustrating a method of manufacturing a vertical memory device in accordance with example embodiments;

FIGS. 46 to 52 are cross-sectional views and top plan views illustrating a method of manufacturing vertical memory devices in accordance with example embodiments;

FIG. 59 is a top plan view illustrating a vertical memory device in accordance with example embodiments.

DESCRIPTION OF EMBODIMENTS

Figure 3:
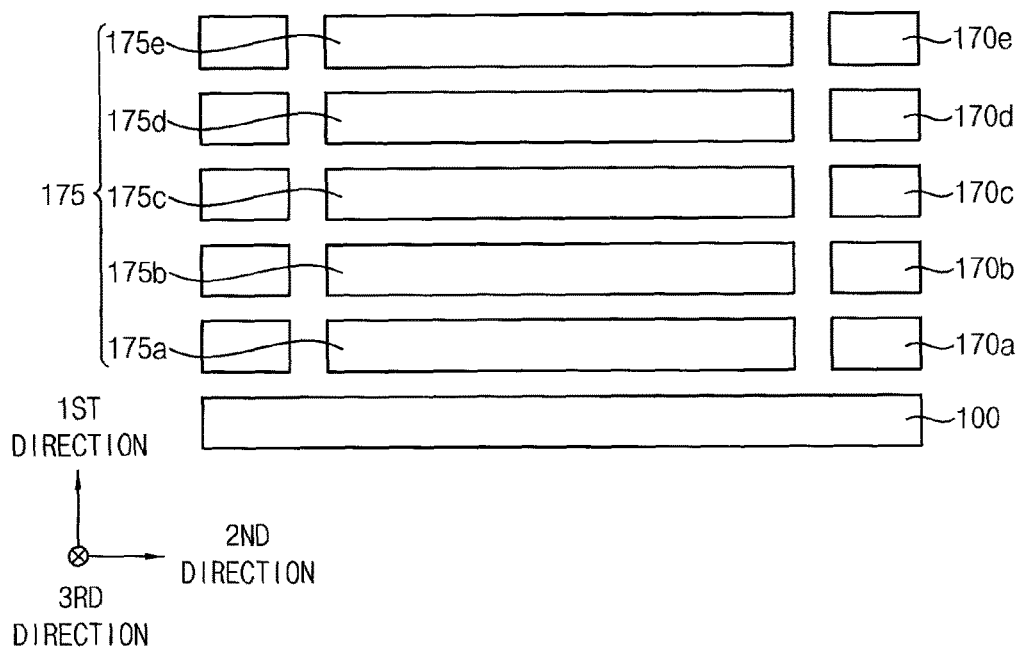

Various example embodiments will be described more fully hereinafter with reference to the accompanying drawings, in which some example embodiments are shown. The present inventive concept may, however, be embodied in many different forms and should not be construed as limited to the example embodiments set forth herein. In the drawings, the sizes and relative sizes of layers and regions may be exaggerated for clarity. Like numerals refer to like elements throughout. As used herein, the term "and/or" includes any and all combinations of one or more of the associated listed items.

It will be understood that when an element or layer is referred to as being "on," "connected to" or "coupled to" another element or layer, it can be directly on, connected or coupled to the other element or layer or intervening elements or layers may be present. In contrast, when an element is referred to as "contacting," or being "directly on," "directly connected to" or "directly coupled to" another element or layer, there are no intervening elements or layers present.

It will be understood that, although the terms first, second, third, fourth etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another region, layer or section, for example as a naming convention. Thus, a first element, component, region, layer or section discussed below could be termed a second element, component, region, layer or section without departing from the teachings of the present inventive concept. For example, an element referred to as a "first" element in the specification may be referred to as a "second" element in the claims, and vice versa.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to limit the scope of the present inventive concept.

Terms such as "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 4:
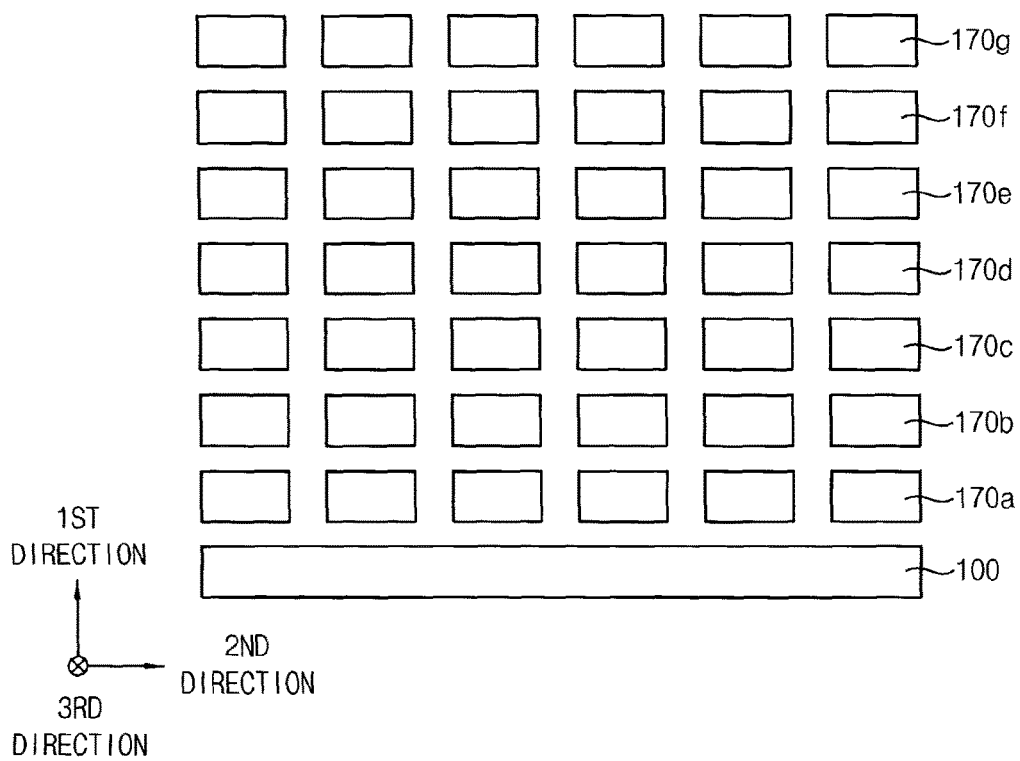
Figure 6A:
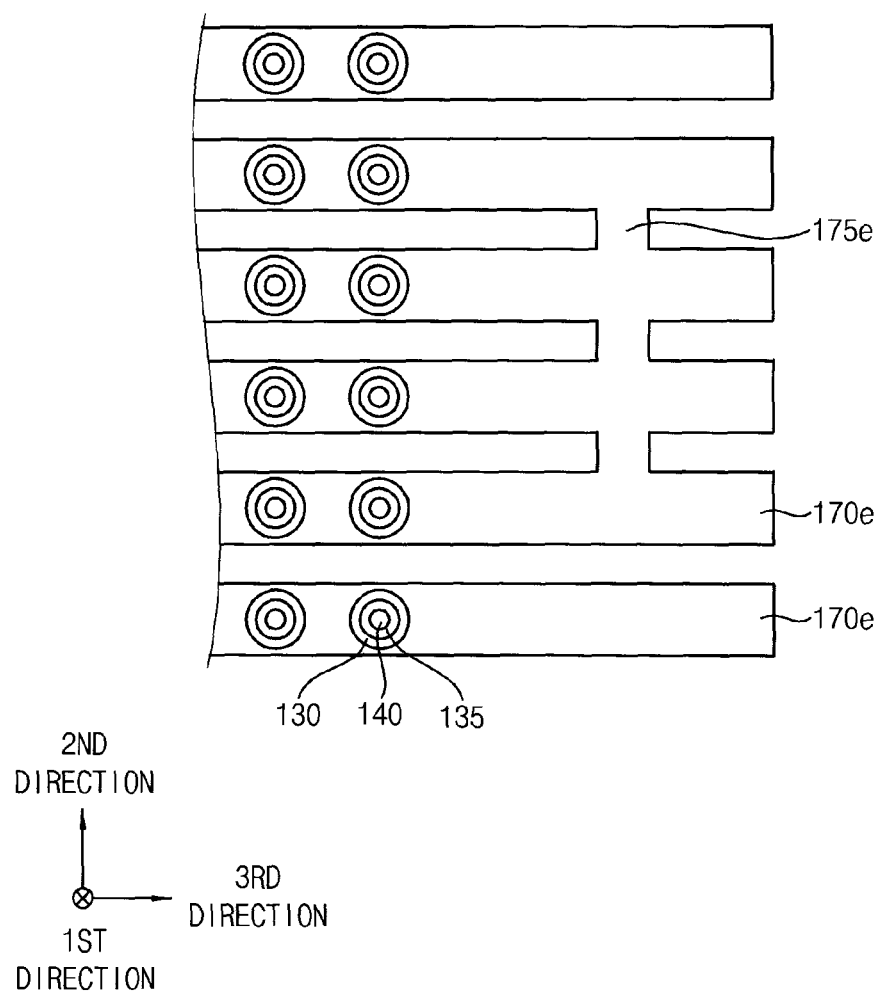
FIGS. 6A and 6B are exemplary cross-sectional views taken along a line IV-IV' of FIG. 1, according to certain embodiments.
Figure 6B:
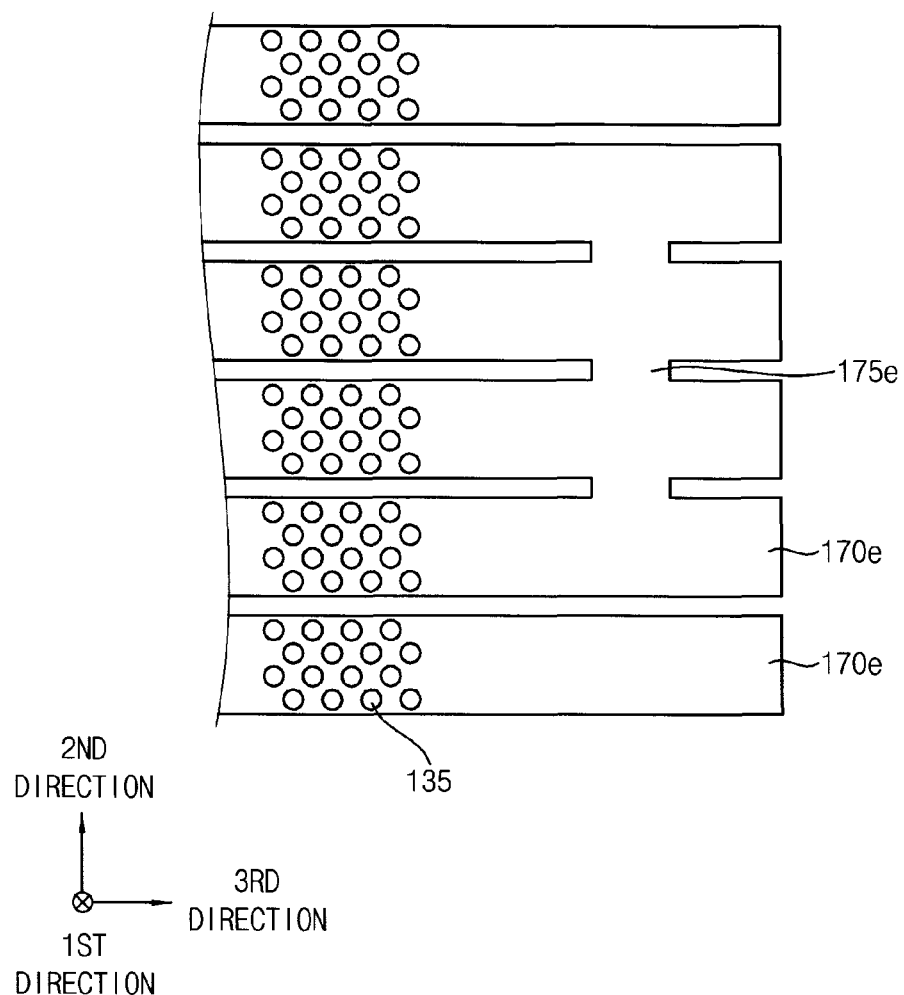

FIGS. 1 to 6B are a perspective view, a top plan view and cross-sectional views illustrating a vertical memory device in accordance with example embodiments. Specifically, FIG. 1 is a perspective view illustrating the vertical memory device. FIG. 2 is a top plan view illustrating the vertical memory device of FIG. 1. FIGS. 3 to 5 are cross-sectional views taken along lines I-I', II-II' and of FIG. 1, respectively. FIGS. 6A and 6B are cross-sectional views taken along a line IV-IV' of FIG. 1.

For the convenience of explanation, FIGS. 1 to 4, and FIGS. 6A and 6B do not show all elements of the vertical semiconductor device, but only show some elements thereof, e.g., a substrate, a channel, a gate line, a pad and a bit line.

In all figures in this specification, a direction substantially perpendicular to a top surface of the substrate is referred to as a first direction, and two directions substantially parallel to the top surface of the substrate and crossing each other are referred to as a second direction and a third direction. For example, the second and third directions may be substantially perpendicular to each other. Additionally, a direction indicated by an arrow in the figures and a reverse direction thereto are considered as the same direction.

Referring to FIGS. 1 to 6B, the vertical memory device may include a channel 135 protruding vertically from a top surface of the substrate 100, a dielectric structure 130 surrounding an outer sidewall of the channel 135, and gate lines 170 surrounding the channel 135 and spaced apart from each other in the first direction. A pad 150 may be disposed on the channel 135. The vertical memory device may further include a bit line contact 190 in contact with the pad 150, and a bit line 195 electrically connected to the bit line contact 190.

The substrate 100 may include a semiconductor material, e.g., single crystalline silicon or germanium. In example embodiments, the substrate 100 may include a cell region I and an extension region II. These regions may also be referred to as inner region, or central region, and outer regions, or side regions.

The channel 135 may be disposed on the cell region I of the substrate 100, and may be in contact with the top surface of the substrate 100. In certain embodiments, the channel 135 may have a substantially hollow cylindrical shape or a substantially cup shape. A plurality of the channels 135 may be arranged along the third direction to form a channel row. A plurality of the channel rows may be arranged along the second direction to form a channel array. The channel 135 may include, for example, polysilicon or single crystalline silicon. Each channel 135 may pass through a plurality of gate lines 170 in a vertical direction.

FIG. 1 illustrates that three channels 135 are included in one channel row and six channel rows are arranged in the second direction. However, the number of the channels 135 included in the one channel row, and the number of the channel rows are not specifically limited.

As illustrated in FIG. 5, a first filling layer pattern 140 having a substantially pillar shape or a substantially solid cylindrical shape may be formed in the channel 135. The first filling layer pattern 140 may include an insulation material such as silicon oxide, for example.

In one example embodiment, the channel 135 may have a substantially pillar shape or a substantially solid cylindrical shape. In this case, the first filling layer pattern 140 may be omitted.

The dielectric layer structure 130 may be formed on the outer sidewall of the channel 135. The dielectric layer structure 130 may have a cup shape of which a central bottom is opened or straw shape.

The dielectric layer structure 130 may include a plurality of layers stacked in the third direction from the outer sidewall of the channel 135. In example embodiments, the dielectric layer structure 130 may include a tunnel insulation layer pattern, a charge storage layer pattern and a blocking layer pattern.

In example embodiments, the blocking layer pattern may include an oxide such as silicon oxide, the charge storage layer pattern may include a nitride such as silicon nitride or a metal oxide, and the tunnel insulation layer pattern may include an oxide such as silicon oxide. In one example embodiment, the dielectric layer structure 130 may have an oxide-nitride-oxide (ONO) layer structure.

The pad 150 may be formed on the first filling layer pattern 140, the channel 135 and the dielectric layer structure 130 to be electrically connected to the bit line 195 via the bit line contact 190. The pad 150 may serve as a source/drain region through which charges are moved or transferred to the channel 135. The pad 150 may include, for example, polysilicon or single crystalline silicon. The pad 150 may further include impurities, e.g., n-type impurities such as phosphorus (P) or arsenic (As).

The gate lines 170 may be disposed on an outer sidewall of the dielectric layer structure 130 to be spaced apart from each other in the first direction. In example embodiments, each gate line 170 may surround the channels 135 included in the channel row at the height at which the gate line is located, and may extend in the third direction. As illustrated in FIG. 6A, each gate line 170 may surround channels at the same vertical level of the gate lines and in one channel row.

In one example embodiment, each gate line 170 may surround a plurality of the channel rows at the same vertical level of the gate lines. In this case, a channel row group including the plurality of the channel rows may be defined by the gate line 170. For example, each gate line 170 may surround four channel rows as illustrated in FIG. 6B. For the convenience of explanation, the dielectric layer structure 130 and the first filling layer pattern 140 adjacent to the channel 135 are omitted in FIG. 6B.

Hereinafter, detailed descriptions are provided using the case illustrated in FIG. 6A.

A width or a length of the gate lines 170 at each level may decrease from the top surface of the substrate along the first direction. In example embodiments, the gate lines 170 may be stacked in the first direction to form a substantially pyramidal structure or a stepped structure.

A plurality of the gate lines 170 may be also arranged in the second direction at each level or at each layer.

FIG. 1 illustrates that the gate lines 170 are formed at 7 levels, and six gate lines 170 are arranged in the second direction at each level. However, the number of the levels and the number of the gate lines 170 at each level may be properly adjusted in consideration of, e.g., an integration degree and a circuit design of the vertical memory device.

Each gate line 170 may include a metal or a metal nitride. For example, the gate lines 170 may include the metal or the metal nitride having a low electrical resistance such as tungsten (W), tungsten nitride, titanium (Ti), titanium nitride, tantalum (Ta), tantalum nitride, platinum (Pt), etc. In one example embodiment, each gate line 170 may have a multi-layered structure including a barrier layer formed of the metal nitride, and a metal layer.

A lowermost gate line 170a may serve as ground selection line (GSL), four gate lines 170b, 170b, 170d and 170e on the GSL may serve as word lines, and two gate lines 170f and 170g on the word lines may serve as string selection line (SSLs).

Hereinafter, two uppermost gate lines 170 are referred to as a first SSL 170g and a second SSL 170f. The four gate lines 170 between the SSL and the GSL are referred to as a first word line 170e, a second word line 170d, a third word line 170c and a fourth word line 170b.

As described above, the GSL, the word lines and the SSLs may be formed at a single level, 4 levels and 2 levels, respectively. However, the numbers of the levels at which the GSL, the word lines and the SSLs are formed are not specifically limited. For example, the GSLs may be formed at 2 levels, and the SSL may be formed at a single level. The word lines may be formed at 2 levels. In some example embodiments, the word lines may be formed at $2^n$ (n is a positive integer) levels, e.g., 8 levels or 16 levels. The stacked number of the gate lines 170 may be determined in consideration of, e.g., the integration degree and the circuit design of the vertical memory device.

In example embodiments, a portion of the substrate 100 overlapping the first SSL 170g may be defined as the cell region I. Lateral regions of the substrate 100 at both ends of the cell region I may be defined as the extension regions II. In example embodiments, portions of the gate lines 170 formed at both extension regions II may be symmetrical with respect to the cell region I.

In example embodiments, a portion of the gate line 170 at one level which does not overlap the gate line 170 of an upper level or which is not covered by the gate line 170 of an upper level (e.g., a next upper level) may be defined as an extension portion. For example, a portion of the first word line 170e which is formed on the extension region II and protrudes in the third direction from a lateral face of the second SSL 170f may be defined as the extension portion of the first word line 170e. Thus, the extension portion of the first word line 170e extends beyond ends of the first word line 170f in the third direction. As illustrated in FIGS. 1 and 2, the extension portion of each level may form a step or a stair of the pyramidal or stepped structure.

In example embodiments of the present invention, a word line, such as 170b, 170c, 170d, or 170e, may refer to any of the lines at a particular vertical level that extend in a third direction. For example, FIG. 1 shows six word lines at each vertical level, and any of those word lines may be referred to herein by using the label 170b, 170c, 170d, or 170e. Certain word lines disposed at the same level may be connected to each other in the second direction. For example, certain of the first word lines 170e, the second word lines 170d, the third word lines 170c and the fourth word lines 170b may be connected to each other by a first connecting portion 175e, a second connecting portion 175d, a third connecting portion 175c and a fourth connecting portion 175b, respectively. The GSLs 170a may be also connected to each other by a fifth connecting portion 175a, as illustrated in FIG. 3.

In example embodiments, the connecting portion 175 may diverge from the gate line 170. For example, if the gate lines extend in a lengthwise direction (e.g., the third direction shown in FIG. 1), the connecting portion may extend in between the gate lines, to fill in spaces between the gate lines, and may extend in a different direction from the gate lines at the same vertical level of the gate lines (e.g., in the second direction). In this case, the connecting portion 175 may be integral (i.e., integrally formed) with the gate line 170 to form a unitary or a single member with the gate line 170. In example embodiments, the first SSLs 170g and the second SSLs 170f may be physically separated from each other in the second direction at each level. The gate lines 170 connected to each other by one connecting portion 175 may form a gate line group or a word line group. Certain gate lines 170 at a particular vertical level may not be connected to the gate line group, however, and may be electrically separated as a separate gate line.

In example embodiments, the first connection portion 175e may be formed at the extension portion of the first word line 170e. As illustrated in FIG. 3, the first to fifth connecting portions 175e, 175d, 175c, 175b and 175a may substantially overlap each other in the first direction.

FIGS. 1 to 3 illustrate that four gate lines 170 are connected to each other by the one connecting portion 175 to form the gate line group or the word line group. However, the number of the gate lines 170 included in one gate line group or one word line group is not specifically limited, and may be adjusted in consideration of a circuit construction of the vertical memory device.

As illustrated in FIG. 5, insulating interlayer patterns 106 may be disposed between the gate lines 170 neighboring in the first direction. In certain embodiments, the insulating interlayer patterns 106 may include a silicon oxide based material, e.g., silicon dioxide ($SiO_2$), silicon carbooxide (SiOC) or silicon fluorooxide (SiOF). The gate lines 170 included in one cell string may be insulated from each other by the insulating interlayer patterns 106.

An impurity region 101 may be formed at an upper portion of the substrate 100 between the adjacent channel rows or cell strings. The impurity region 101 may extend in the third direction and may serve as a common source line (CSL) of the vertical memory device. The impurity region 101 may include impurities, e.g., n-type impurities such as phosphorous or arsenic. In one example embodiment, a metal silicide pattern, e.g., a cobalt silicide pattern or a nickel silicide pattern (not illustrated) may be further formed on the impurity region 101.

A second filling layer pattern 177 may be formed on the impurity region 101. For example, the second filling layer pattern 177 may be disposed between the neighboring cell strings. The second filling layer pattern 177 may include an insulation material, e.g., silicon oxide. The neighboring cell strings may be insulated from each other by the second filling layer pattern 177.

An upper insulation layer 185 may be formed on the uppermost insulating interlayer pattern 106h, the pad 150 and the second filling layer pattern 177. The bit line contact 190 may contact the pad 150 through the upper insulation layer 185. The bit line 195 may be electrically connected to the bit line contact 190 on the upper insulation layer 185. In example embodiments, a plurality of the bit line contacts 190 may form an array comparable to an arrangement of the channels 135 or the pads 150. Each bit line 195 may extend in the second direction, and a plurality of the bit lines 195 may be disposed along the third direction.

The upper insulation layer 185 may include an insulation material, e.g., silicon oxide. The bit line contact 190 and the bit line 195 may include a conductive material, e.g., a metal, a metal nitride or doped polysilicon.

According to example embodiments, a set of the word lines formed at the same vertical level may be physically connected to each other by the connecting portion 175. Thus, the number of word line contacts and/or wirings for merging and/or connecting the word lines 170 may be decreased. Accordingly, a free space capable of accommodating another structure may be achieved in the vertical memory device, and thus additional gate lines 170 may be stacked. In particular, if the connecting portion is formed inside the end surfaces of the gate lines 170 in the third direction (e.g., the lengthwise direction in which each gate line 170 extends), additional space can be saved by avoiding the need to form connecting conductive elements outside of the ends of the gate lines 170. Therefore, a capacity or an integration degree of the vertical memory device may be improved.

FIGS. 7 to 20B are perspective views, top plan views and cross-sectional views illustrating a method of manufacturing a vertical memory device in accordance with example embodiments.

Figure 7:
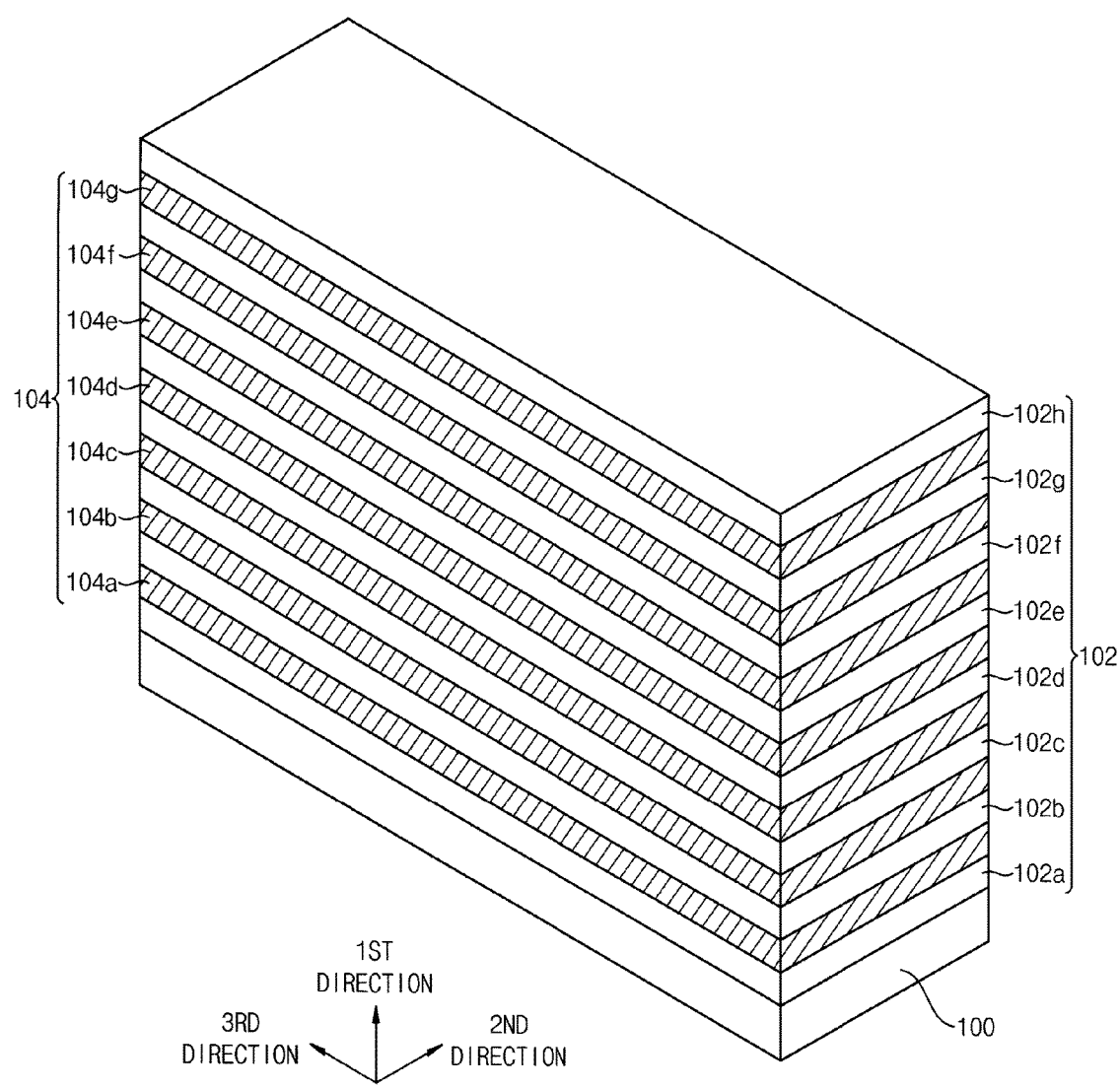
Figure 8:
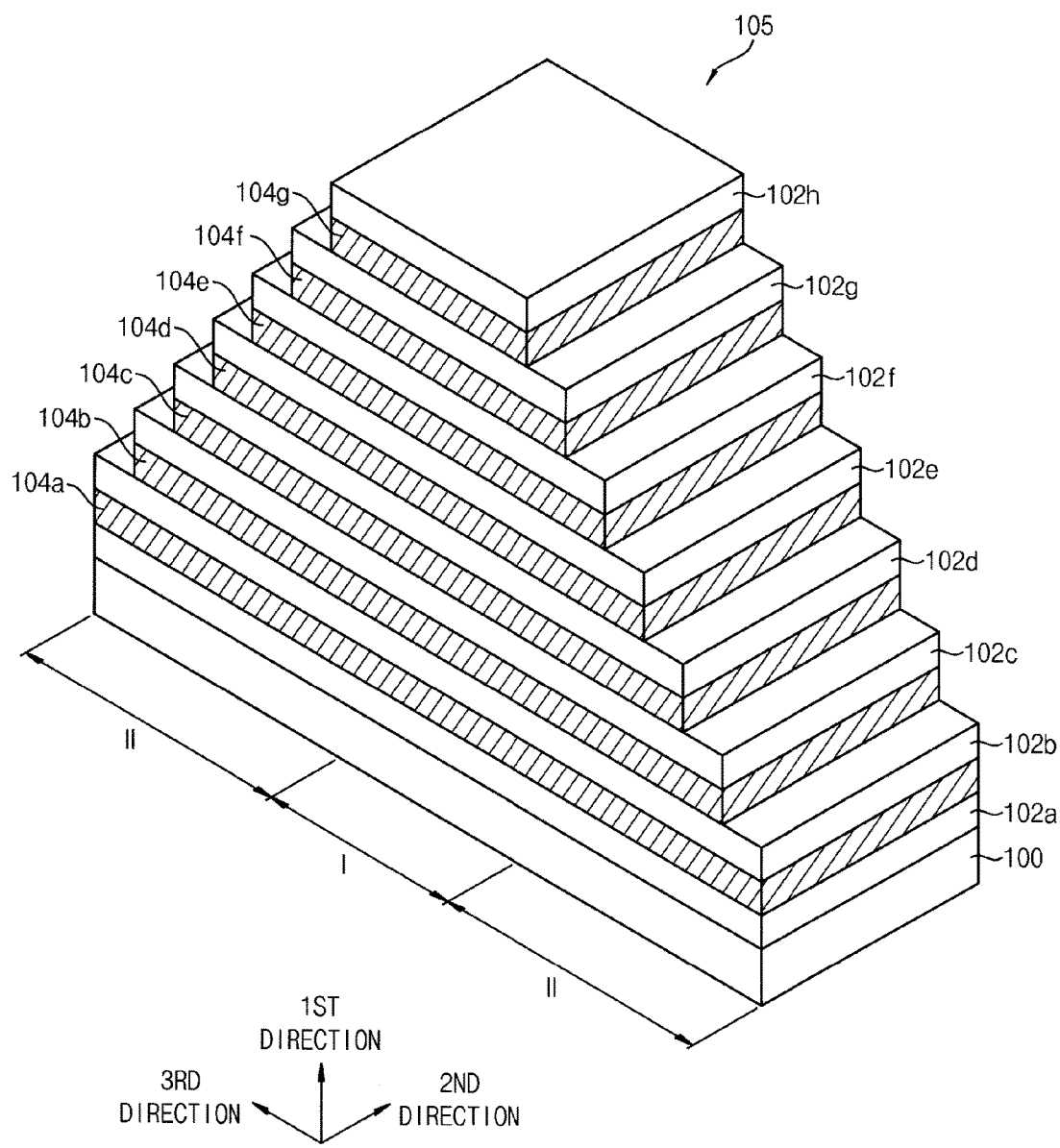
Figure 9A:
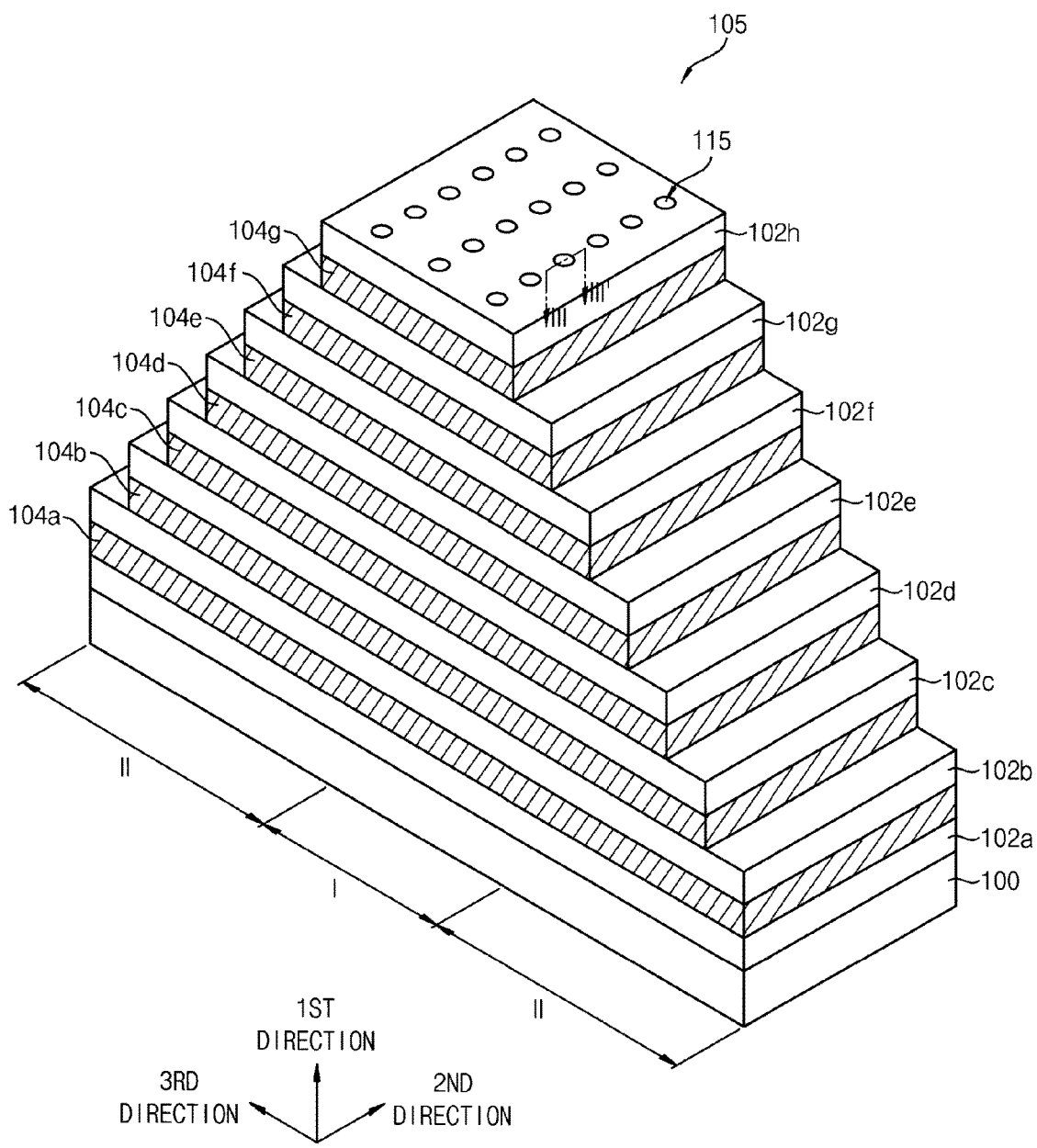
Figure 18A:
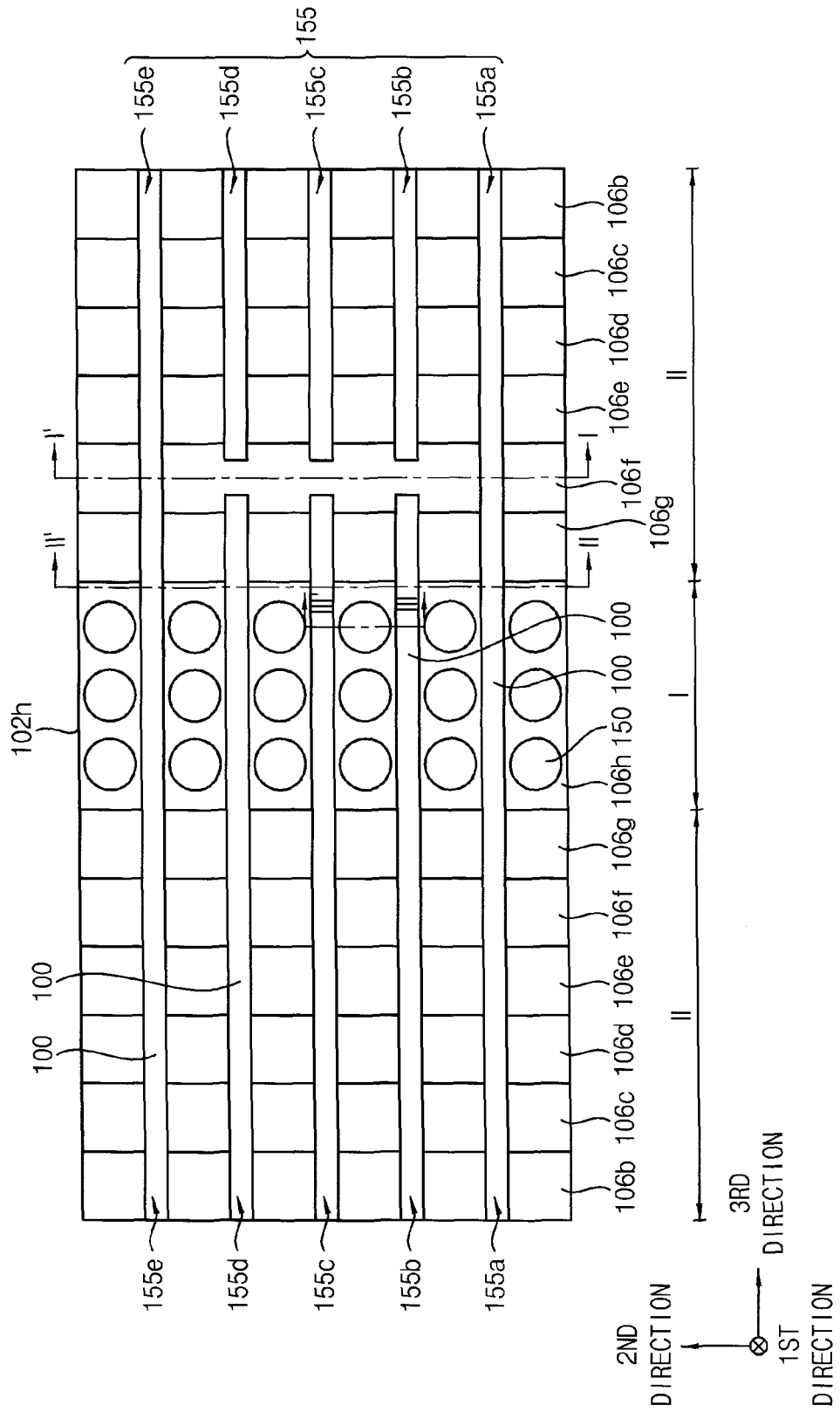
Figure 18B:
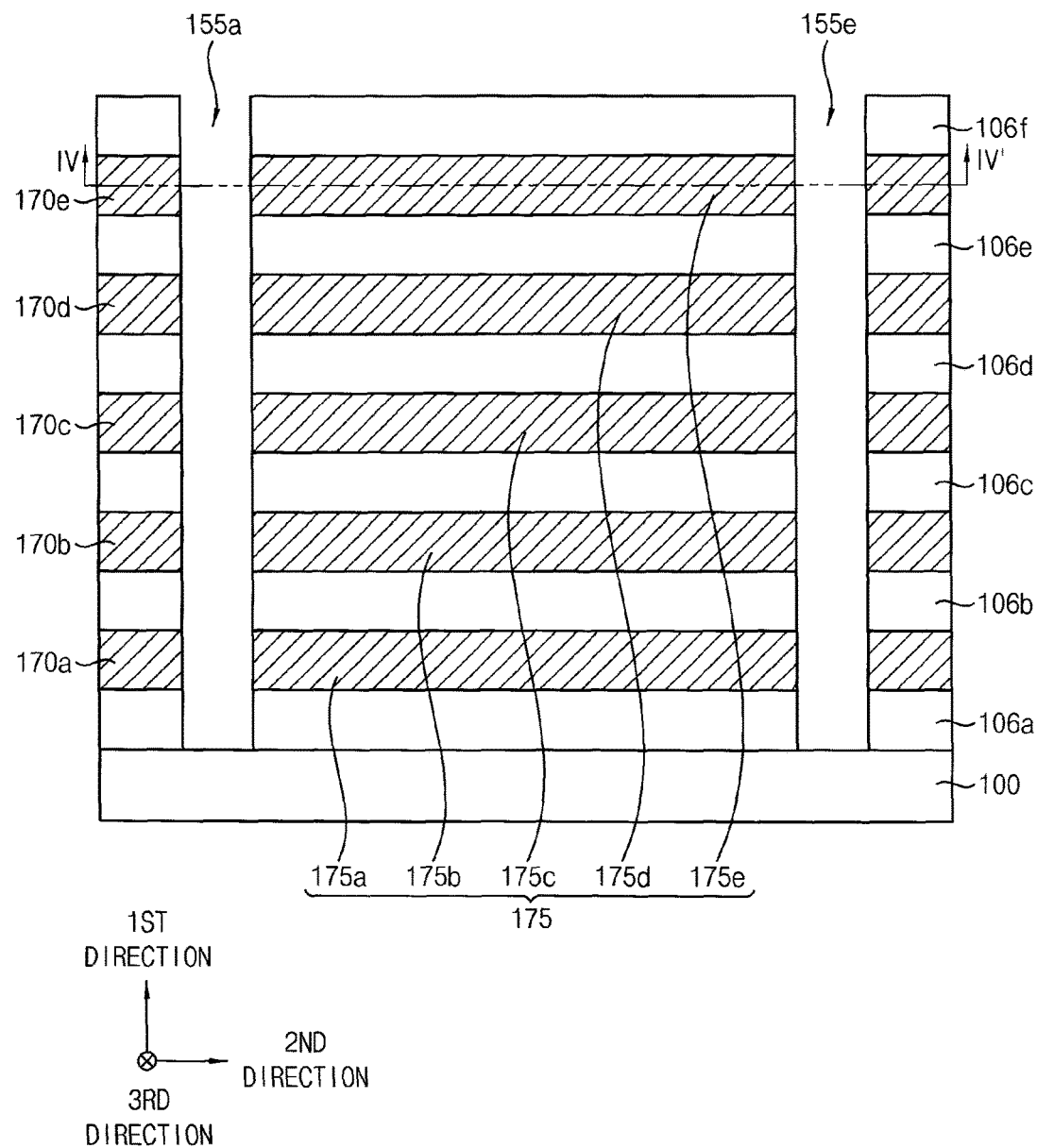
Figure 18C:
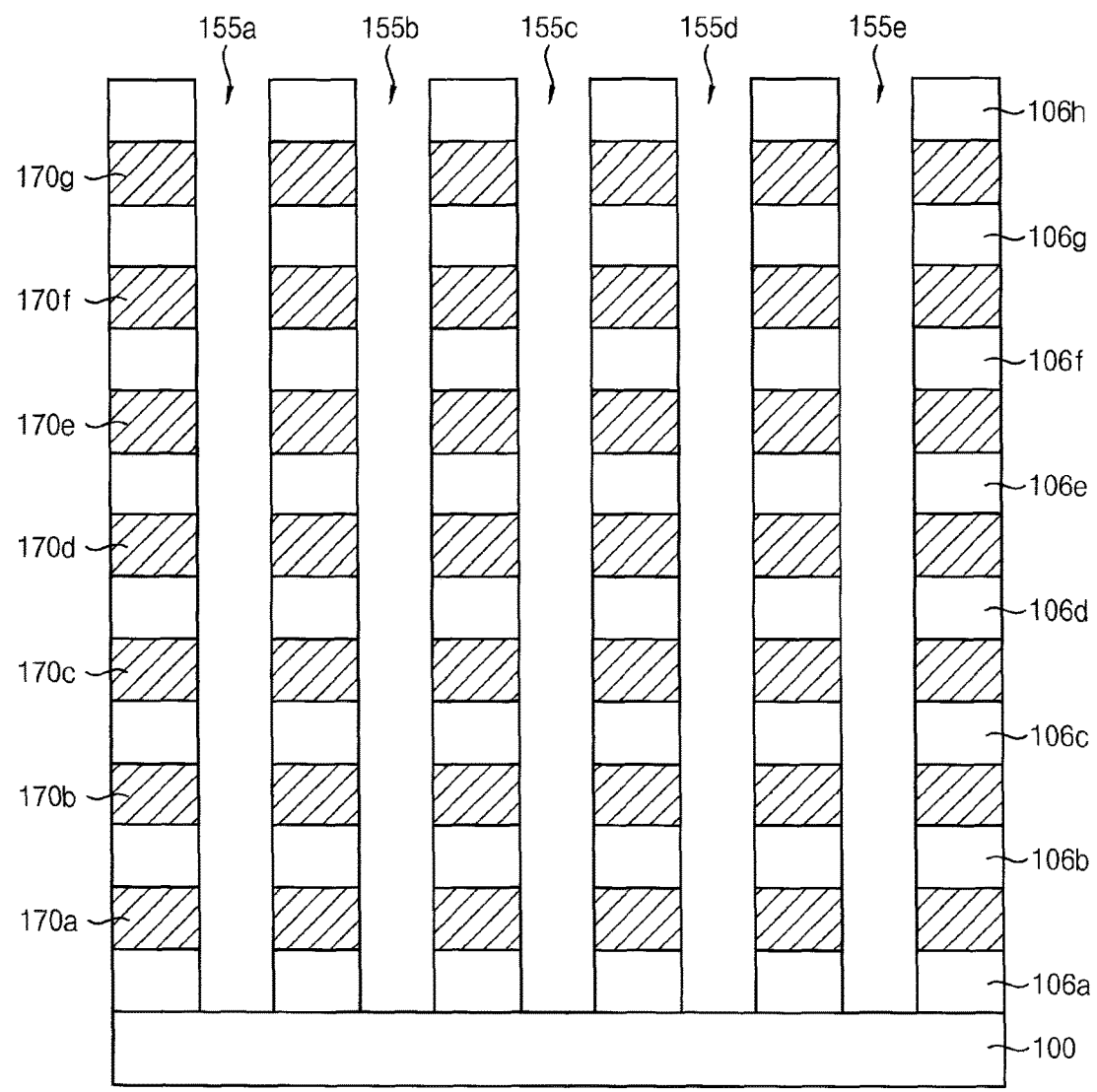
Figure 18D:
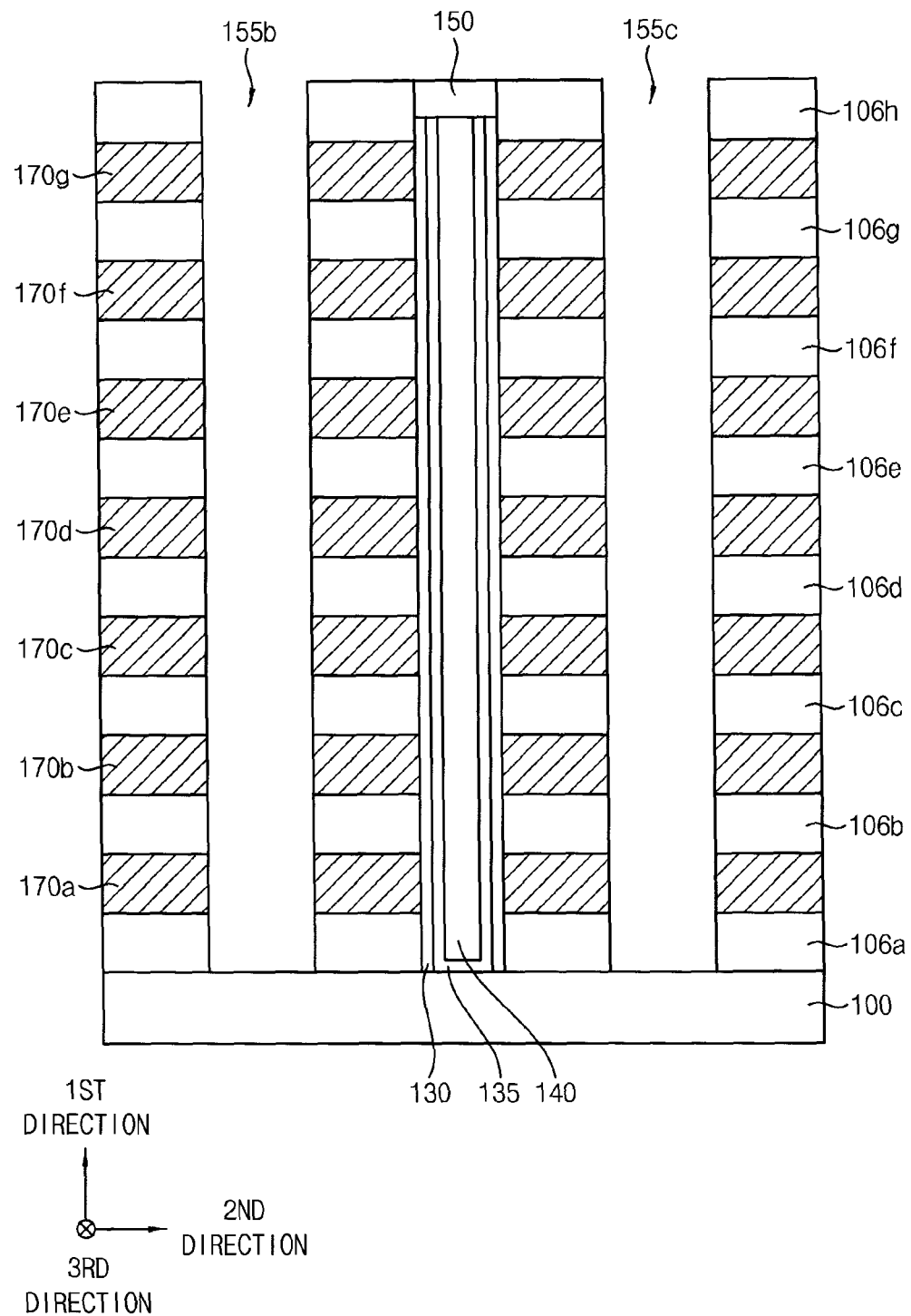
Figure 18E:
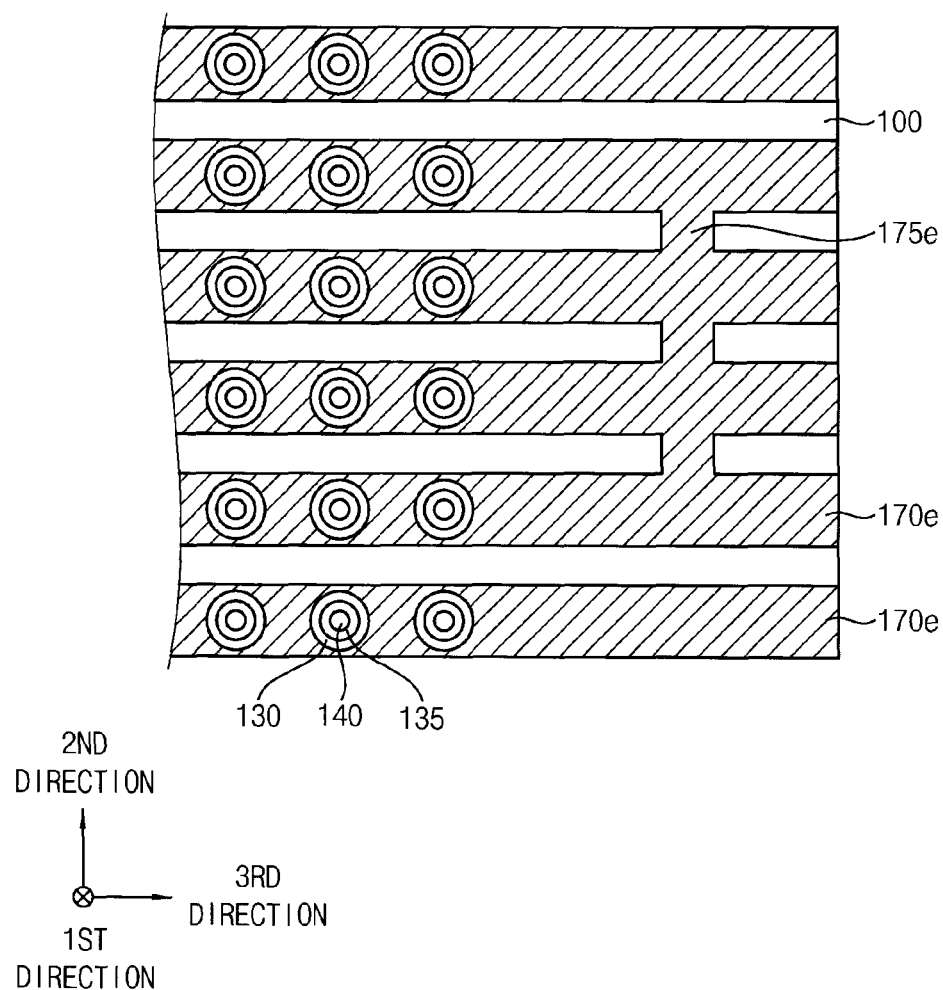

Specifically, FIGS. 7, 8 and 9A are perspective views illustrating the method of manufacturing the vertical memory device. FIGS. 13A, 14A, 15A, 16A, 17A, 18A, 19A and 20A are top plan views illustrating the method of manufacturing the vertical memory device. FIGS. 15B, 16B, 17B, 18B and 19B are cross-sectional views taken along a line I-I' in the first direction. FIGS. 15C, 16C, 17C, 18C and 19C are cross-sectional views taken along a line II-II' in the first direction. FIGS. 9B, 10, 11, 12, 13B, 14B, 15D, 16D, 17D, 18D, 19D and 20B are cross-sectional views taken along a line III-III' in the first direction. FIG. 18E is a cross-sectional view taken along a line IV-IV' in the third direction.

Referring to FIG. 7, a plurality of insulating interlayers 102 and sacrificial layers 104 are alternately and repeatedly formed on a substrate 100.

The substrate 100 may include a semiconductor material, e.g., single crystalline silicon and/or germanium.

In example embodiments, the insulating interlayer 102 may be formed using a silicon oxide based material, e.g., silicon dioxide, silicon carbooxide or silicon fluorooxide. The sacrificial layer 104 may be formed using a material that has an etching selectivity with respect to the insulating interlayer 102 and may be easily removed by a wet etching process. For example, the sacrificial layer 104 may be formed using a silicon nitride or silicon boronitride (SiBN).

The insulating interlayer 102 and the sacrificial layer 104 may be formed by a chemical vapor deposition (CVD) process, a plasma enhanced chemical vapor deposition (PECVD) process, an atomic layer deposition (ALD) process, a spin coating process, etc. A lowermost insulating interlayer 102a may be formed by performing a thermal oxidation process on the substrate 100.

The sacrificial layers 104 may be removed in a subsequent process to provide spaces for a GSL, a word line and an SSL. Thus, the number of the insulating interlayers 102 and the sacrificial layers 104 may be adjusted in consideration of the number of the GSL, the word line and the SSL. In example embodiments, the GSL may be formed at a single level, and the word line may be formed at 4 levels on the GSL. The SSL may be formed at 2 levels on the word line. Accordingly, the sacrificial layers 104 may be formed at 7 levels, and the insulating interlayers 102 may be formed at 8 levels. In one example embodiment, each of the GSL and the SSL may be formed at a single level, and the word line may be formed at 2, 8 or 16 levels. In this case, the sacrificial layers 104 may be formed at 4, 10 or 18 levels, and the insulating interlayers 102 may be formed at 5, 11 or 19 levels. However, the number of the GSL, the SSL and the word lines is not limited herein.

Referring to FIG. 8, the insulating interlayers 102 and the sacrificial layers 104 may be partially etched to form a mold structure 105 having a plurality of steps or stairs.

In example embodiments, a photoresist pattern (not illustrated) partially covering an uppermost insulating interlayer 102h may be formed. Both ends of the insulating interlayers 102 (e.g., 102h, 102g, 102f, 102e, 102d and 102c) and the sacrificial layers 104 (e.g., 104g, 104f, 104e, 104d, 104c and 104b) may be etched using the photoresist pattern as an etching mask. Both ends of the photoresist pattern may then be removed so that a width of the photoresist pattern is reduced. Next, both ends of the insulating interlayers 102h, 102g, 102f, 102e, and 102d, and the sacrificial layers 104g, 104f, 104e, 104d, and 104c may be etched using the photoresist pattern as the etching mask again. Etching processes may be repeated in a similar manner as described above to obtain the mold structure 105 illustrated in FIG. 8.

In example embodiments, a portion of the substrate 100 substantially overlapping the uppermost insulating interlayer 102h may be defined as a cell region I. Portions of the substrate 100 at both lateral portions of the cell region I may be defined as an extension region II. For example, portions of the mold structure 105 on two extension regions II may be symmetrical with respect to the cell region I.

In one example embodiment, a mold protection layer (not illustrated) may be formed to cover lateral portions or the steps of the mold structure 105. For example, an insulation layer covering the mold structure 105 may be formed using, e.g., silicon oxide by a CVD process. An upper portion of the insulation layer may be planarized until the uppermost insulating interlayer 102h is exposed to form the mold protection layer. The planarization process may include a chemical mechanical polish (CMP) process and/or an etch-back process. Hereinafter, the mold protection layer is omitted in the figures for the convenience of explanation.

Figure 9B:
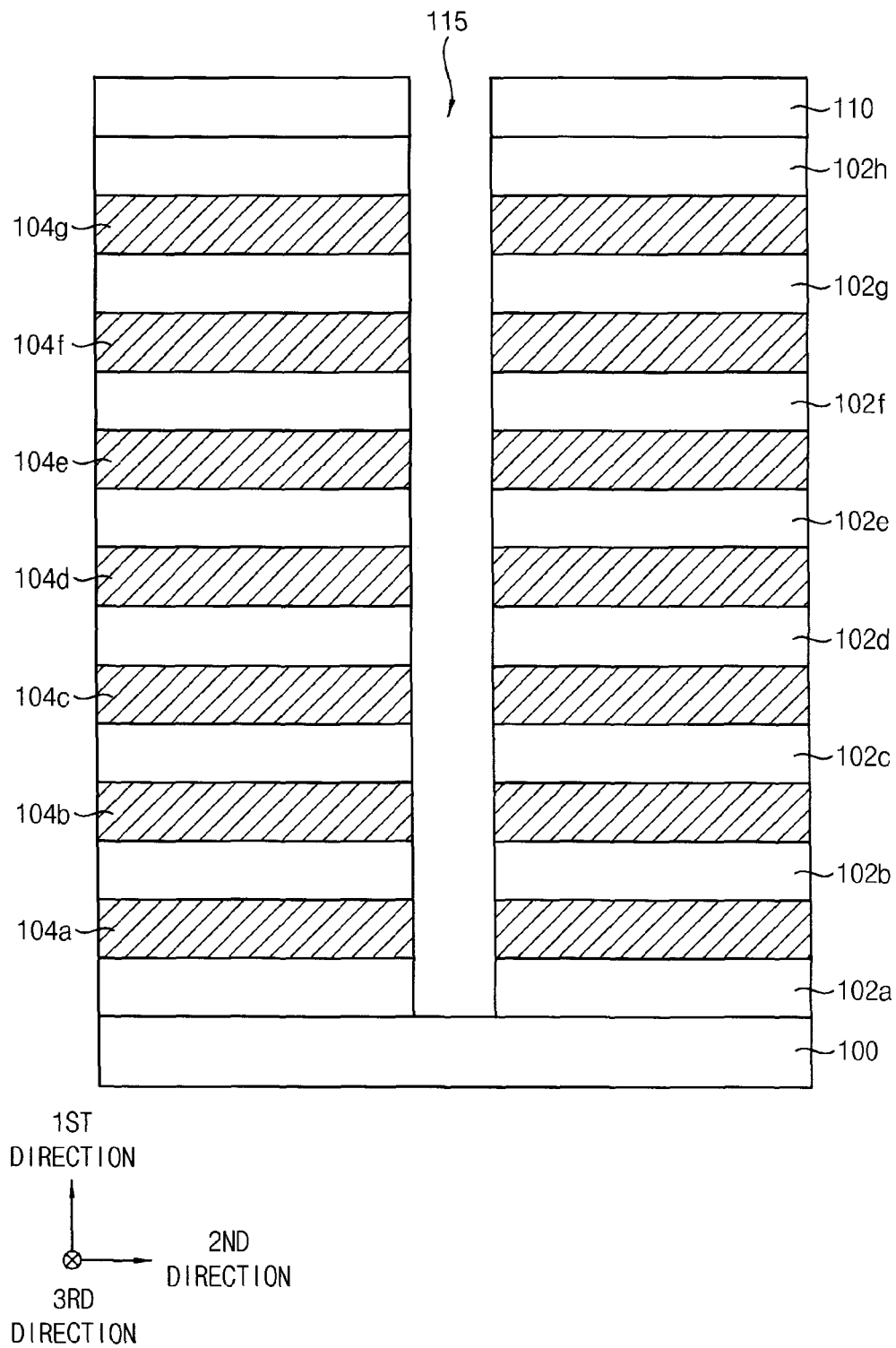

Referring to FIGS. 9A and 9B, a plurality of channel holes 115 may be formed through the insulating interlayers 102 and the sacrificial layers 104.

In example embodiments, a hard mask 110 may be formed on the uppermost insulating interlayer 102h. The insulating interlayers 102 and the sacrificial layers 104 may be sequentially etched by a dry etching process using the hard mask 110 as an etching mask to form the channel holes 115. The top surface of the substrate 100 may be partially exposed by the channel holes 115. The channel holes 115 may extend in the first direction from the top surface of the substrate 100.

In example embodiments, the hard mask 110 may be formed using a material that has an etching selectivity with respect to the insulating interlayers 102 and the sacrificial layers 104. For example, the hard mask 110 may be formed using polysilicon or amorphous silicon.

A channel 135 (see FIG. 13A) may be formed in the channel hole 115. Thus, the plurality of the channel holes 115 may be formed according to an arrangement of the channels 135 on the cell region I of the substrate 100. For example, the channel holes 115 may be regularly formed in the second and third directions.

Figure 10:
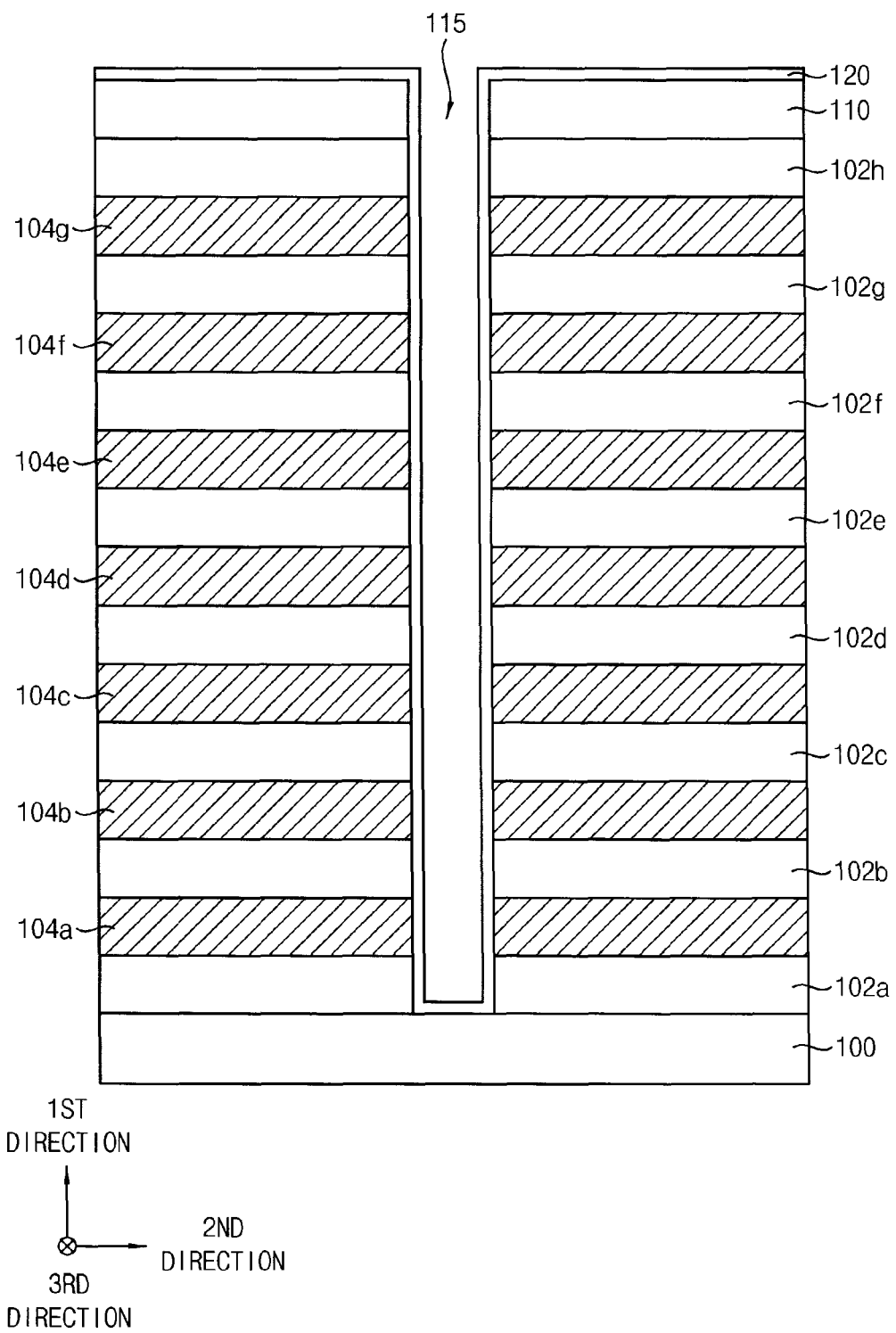

Referring to FIG. 10, a dielectric layer 120 may be formed on a sidewall and a bottom of the channel hole 115 (e.g., the dielectric layer 120 may be conformally formed on these surfaces). The dielectric layer 120 may be also formed on a top surface of the hard mask 110. The dielectric layer 120 may be obtained, for example, by sequentially forming a blocking layer, a charge storage layer and a tunnel insulation layer.

In example embodiments, the first blocking layer may be formed using an oxide, e.g., silicon oxide, the charge storage layer may be formed using silicon nitride or a metal oxide, and the tunnel insulation layer may be formed using an oxide, e.g., silicon oxide. In one example embodiment, the dielectric layer 120 may have an oxide-nitride-oxide (ONO) layer structure. The first blocking layer, the charge storage layer and the tunnel insulation layer may be formed by a CVD process, a PECVD process, an ALD process, etc.

Figure 11:
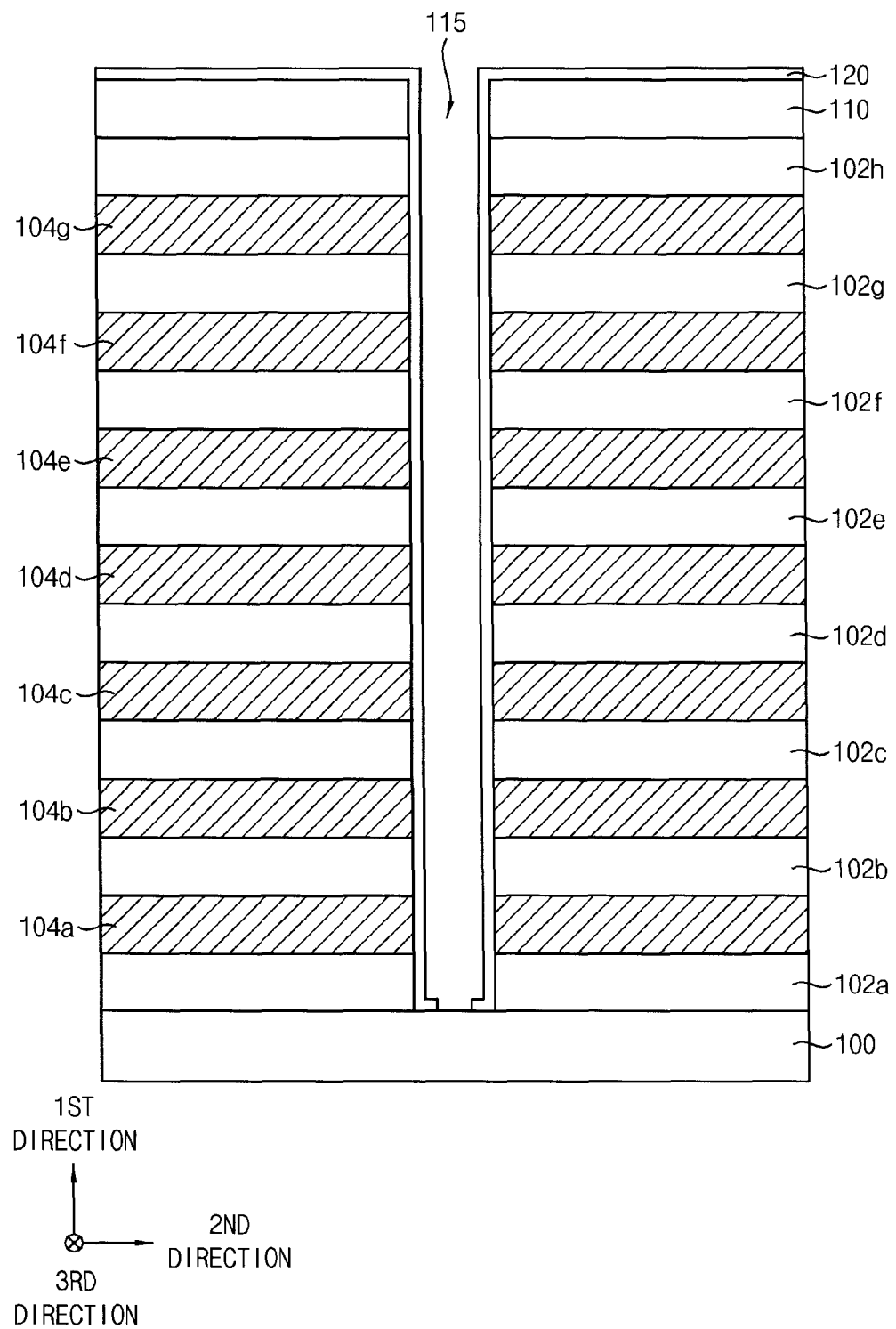

Referring to FIG. 11, a portion of the dielectric layer 120 which is formed on the bottom of the first hole 115 may be partially etched to expose the top surface of the substrate 100. Accordingly, a central bottom of the dielectric layer 120 may be opened in the channel hole 115.

Figure 12:
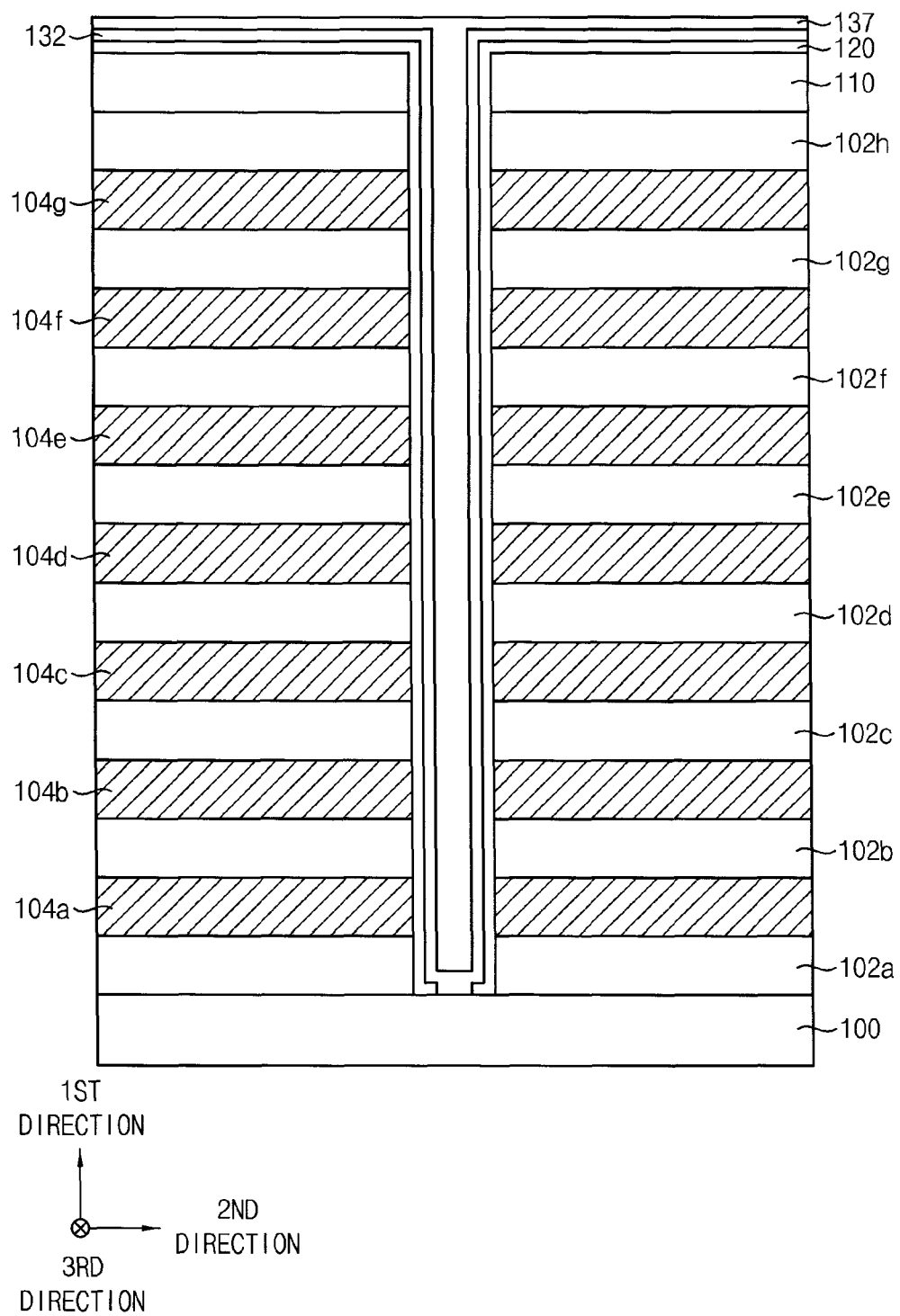

Referring to FIG. 12, a channel layer 132 may be formed on the dielectric layer 120 and the exposed top surface of the substrate 100, and then a first filling layer 137 may be formed on the channel layer 132 to sufficiently fill a remaining portion of the channel hole 115. The channel layer 132 may be formed using polysilicon or amorphous silicon which is optionally doped with impurities. In one embodiment, the channel layer 132 may be conformally formed on the inner surfaces of the dielectric layer 120 and exposed surface of the substrate 100. In one example embodiment, a heat treatment or a laser beam irradiation may be further performed on the channel layer 132. In this case, the channel layer 132 may include single crystalline silicon and defects in the channel layer 132 may be cured. The first filling layer 137 may be formed using an insulation material, e.g., silicon oxide or silicon nitride.

The channel layer 132 and the first filling layer 137 may be formed by a CVD process, a PECVD process, an ALD process, etc.

In one example embodiment, the channel layer 132 may be formed to fully fill the channel hole 115. In this case, the formation of the filling layer 137 may be omitted.

Figure 13B:
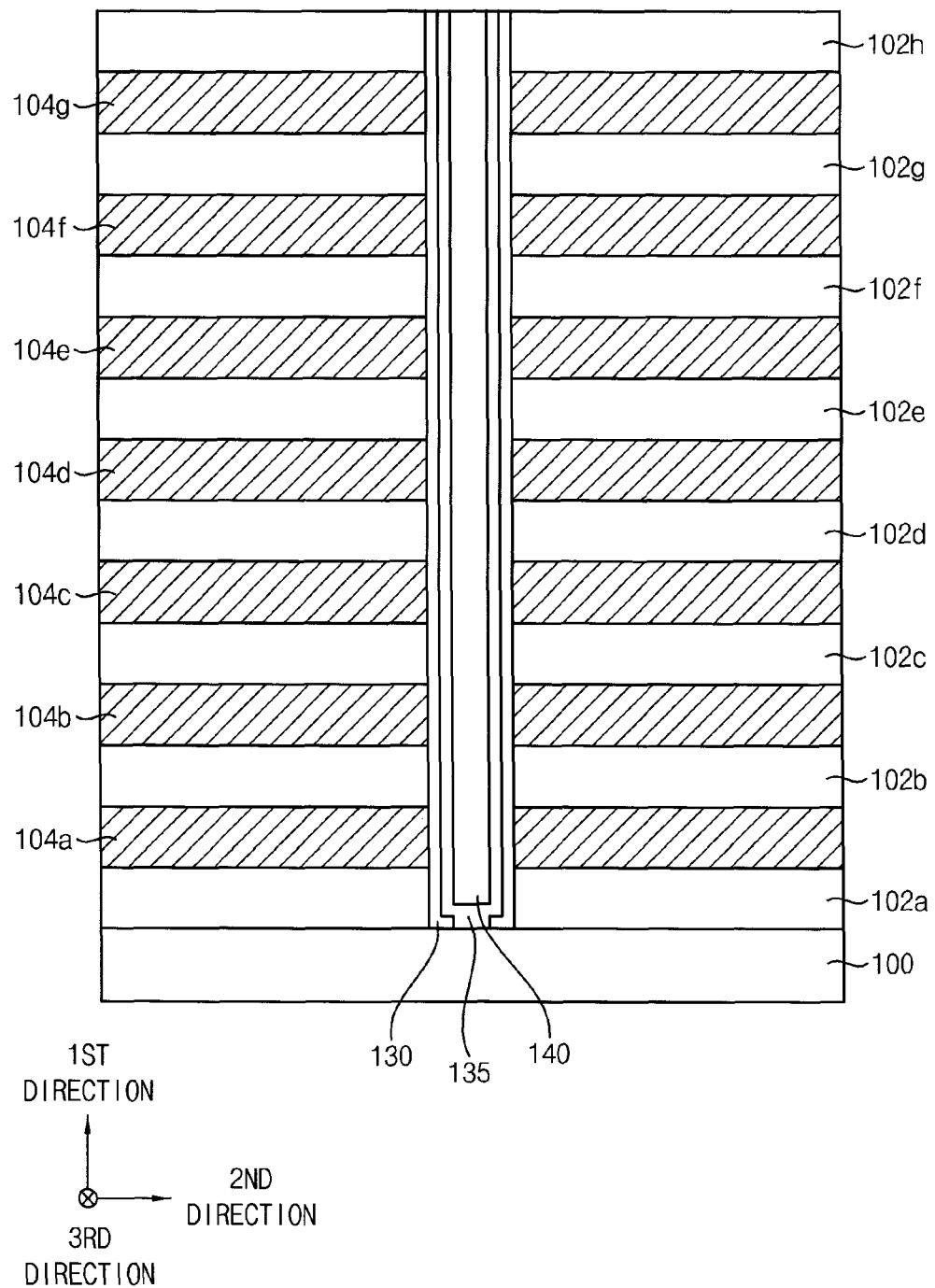

Referring to FIGS. 13A and 13B, the first filling layer 137, the channel layer 132, the dielectric layer 120 and the hard mask 110 may be planarized until the uppermost insulating interlayer 102h is exposed to form a dielectric layer structure 130, the channel 135 and a filling layer pattern 140 sequentially stacked in the channel hole 115. The planarization process may include an etch-back process or a CMP process.

In example embodiments, the dielectric layer structure 130 may have a substantially hollow cylindrical shape or a straw shape. The channel 135 may have substantially a cup shape. The filling layer pattern 140 may have a substantially solid cylindrical shape or a substantially pillar shape.

In the case that the channel layer 132 fully fills the channel hole 115, the first filling layer pattern 140 may be omitted and the channel 135 may have a substantially solid cylindrical shape or a substantially pillar shape.

The channels 135 may form an array comparable to an arrangement of the channel holes 115. In example embodiments, a plurality of the channels 135 may be arranged in the third direction to form a channel row, and a plurality of the channel rows may be arranged in the second direction.

Figure 14A:
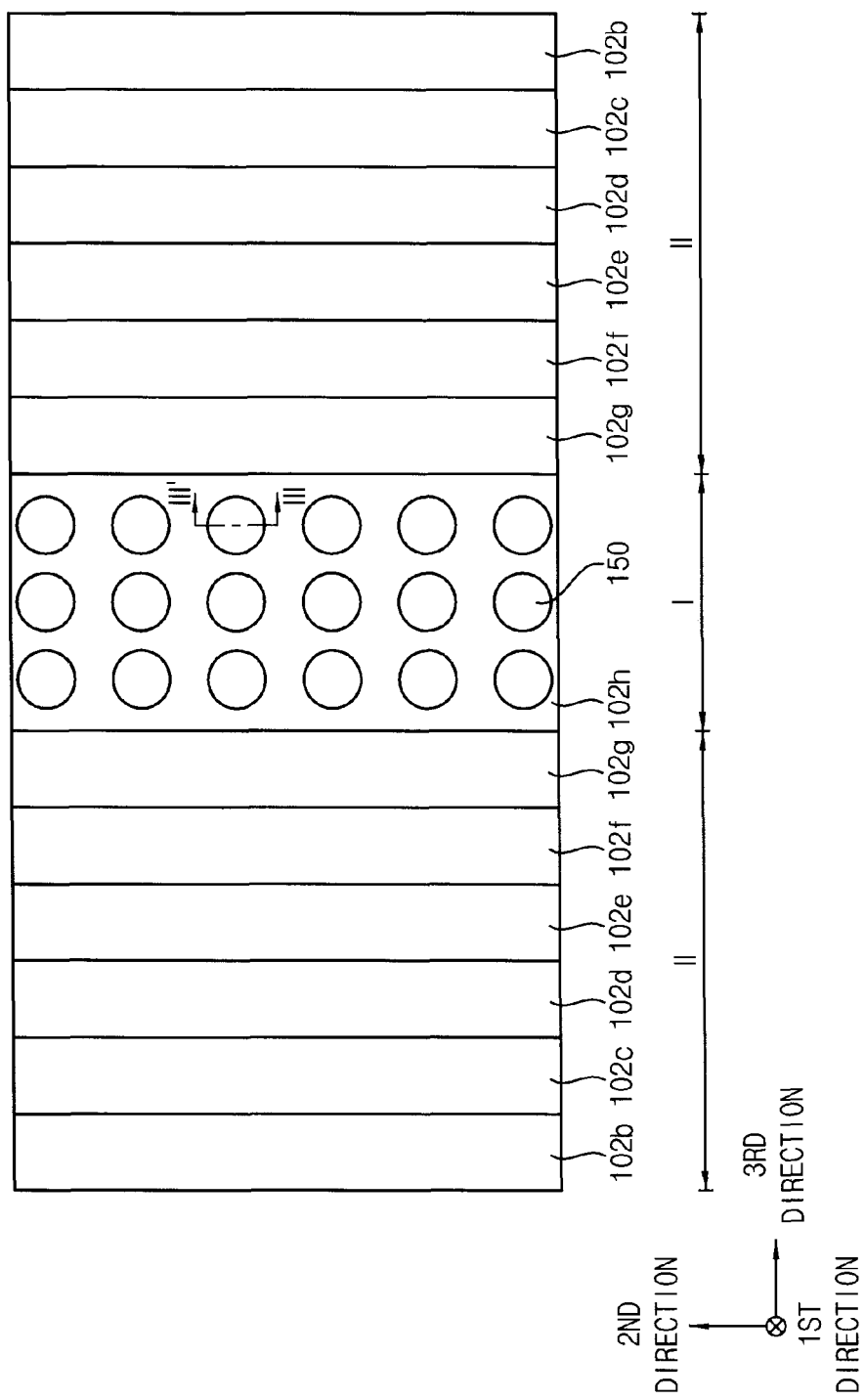
Figure 14B:
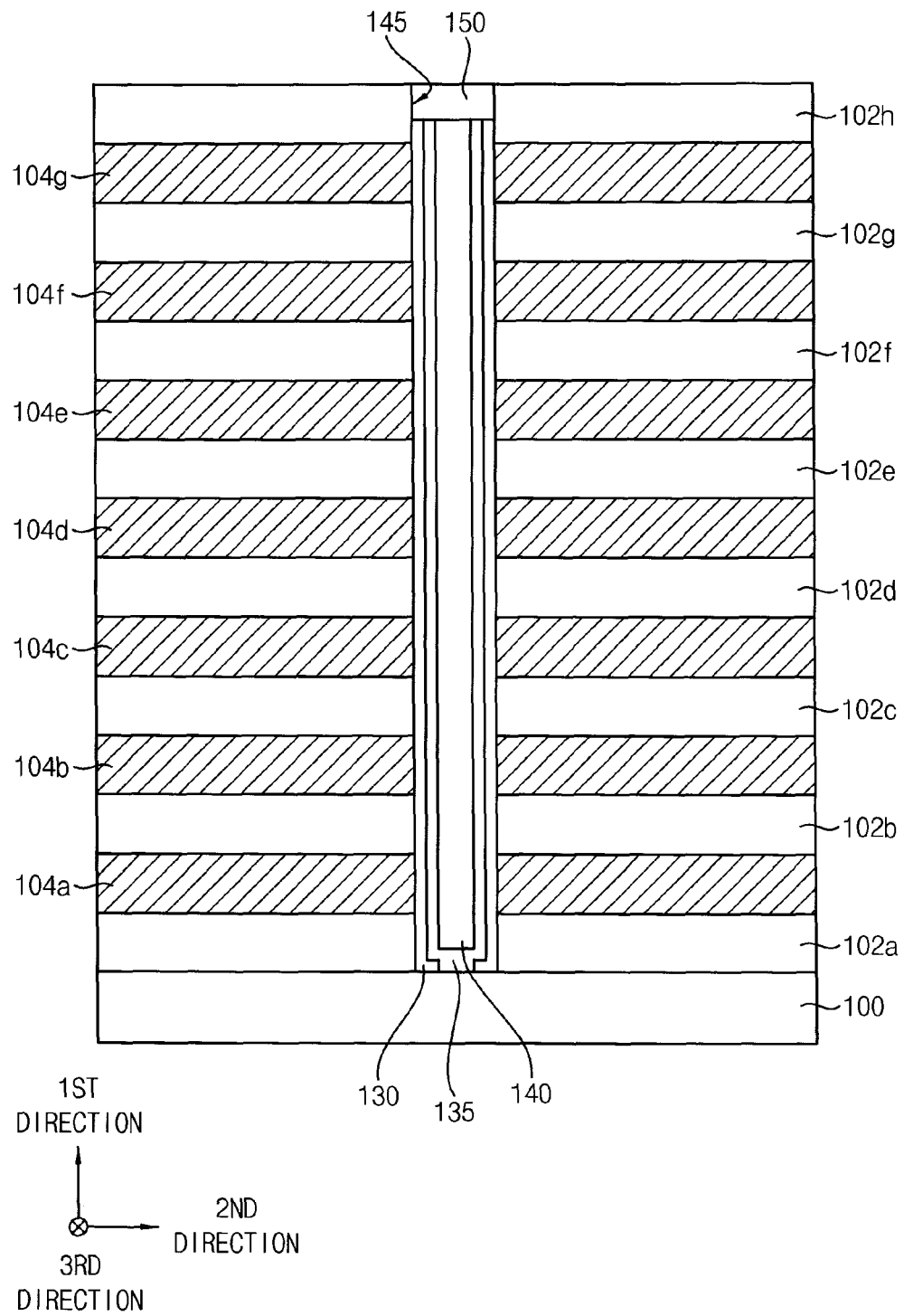

Referring to FIGS. 14A and 14B, upper portions of the dielectric layer structure 130, the channel 135 and the first filling layer pattern 140 may be partially removed to form a recess 145, and then a pad 150 capping the recess 145 may be formed.

In example embodiments, the upper portions of the dielectric layer structure 130, the channel 135 and the first filling layer pattern 140 may be removed by an etch-back process to form the recess 145. A pad layer sufficiently filling the recess 145 may be formed on the dielectric layer structure 130, the channel 135, the first filling layer pattern 140 and the uppermost insulating interlayer 102h. An upper portion of the pad layer may be planarized until the top surface of the uppermost insulating interlayer 102h is exposed to obtain the pad 150. In example embodiments, the pad layer may be formed using polysilicon or doped polysilicon. In one example embodiment, a preliminary pad layer may be formed using amorphous silicon, and then a crystallization process may be performed thereon to form the pad layer. The planarization process may include a CMP process.

Referring to FIGS. 15A to 15D, a plurality of openings 155 may be formed through the insulating interlayers 102 and the sacrificial layers 104.

In example embodiments, a mask pattern (not illustrated) covering the pads 150 may be formed on the mold structure 105 and the above mentioned mold protection layer. A dry etching process may be performed using the mask pattern as an etching mask, such that portions of the insulating interlayers 102 and the sacrificial layers 104 between the neighboring channel rows may be removed to form the openings 155.

In example embodiments, the mask pattern may include opening portions extending in the third direction, through which the mold structure 105 and the mold protection layer are partially exposed. The mask pattern may also include an extension portion extending in the second direction and blocking the opening portions. The extension portion of the mask pattern may be superimposed over a portion of a sixth insulating interlayer pattern 106f in the extension region II.

The insulating interlayers 102 and the sacrificial layers 104 may be changed into insulating interlayer patterns 106 and sacrificial layer patterns 108 by the formation of the openings 155. The insulating interlayer pattern 106 and the sacrificial layer pattern 108 of each level may extend in the third direction.

Figure 15A:
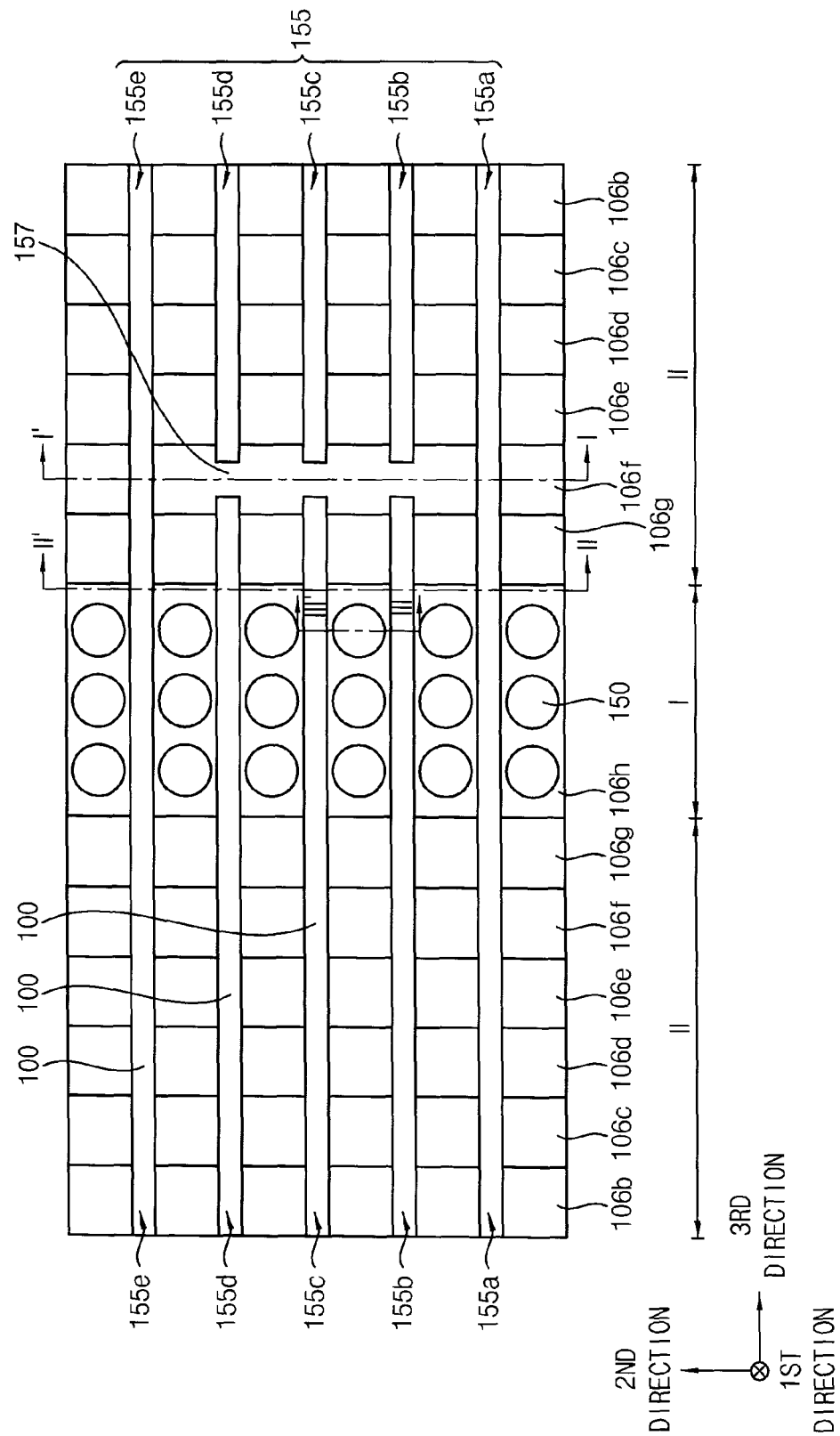
Figure 15B:
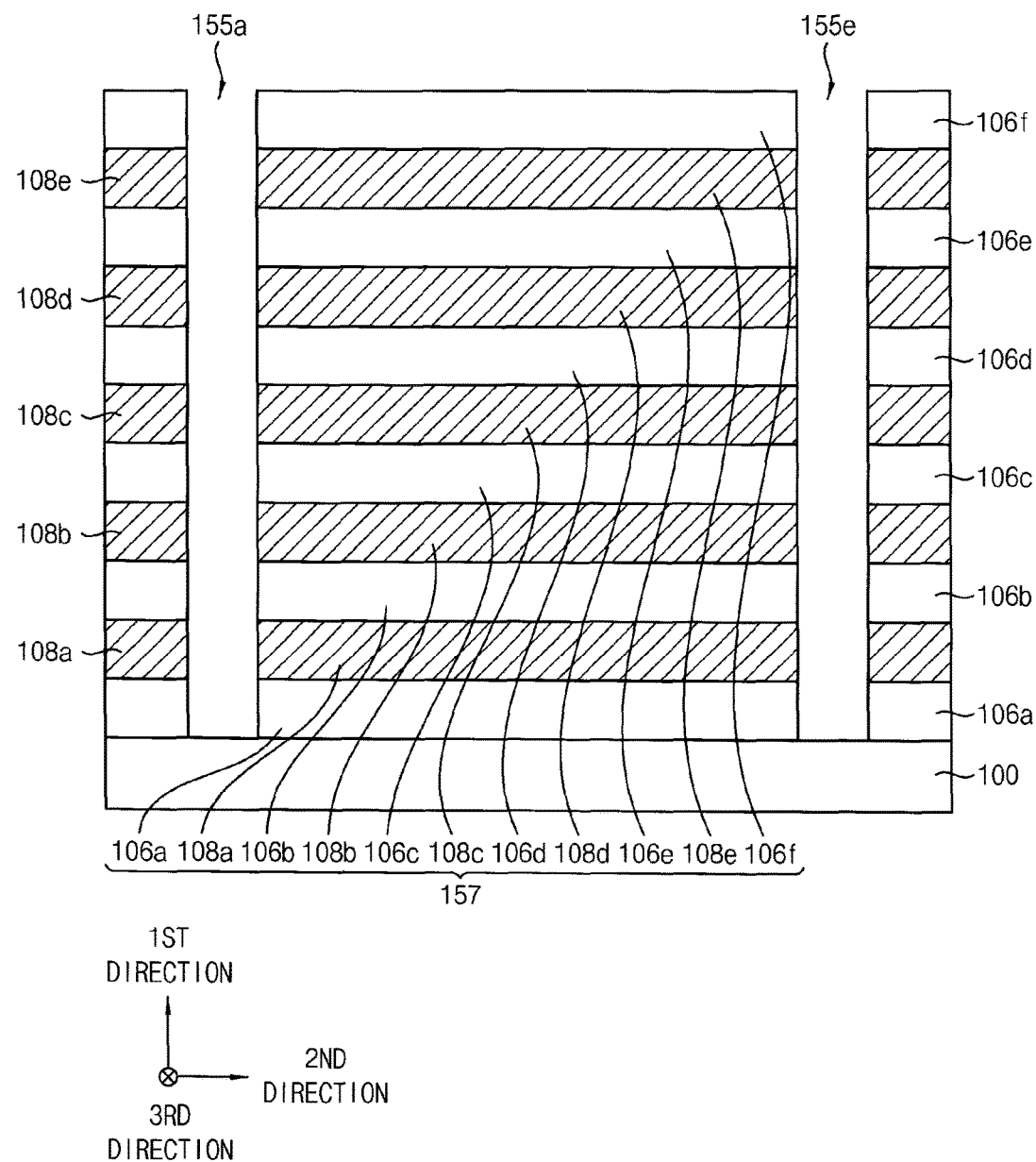
Figure 16A:
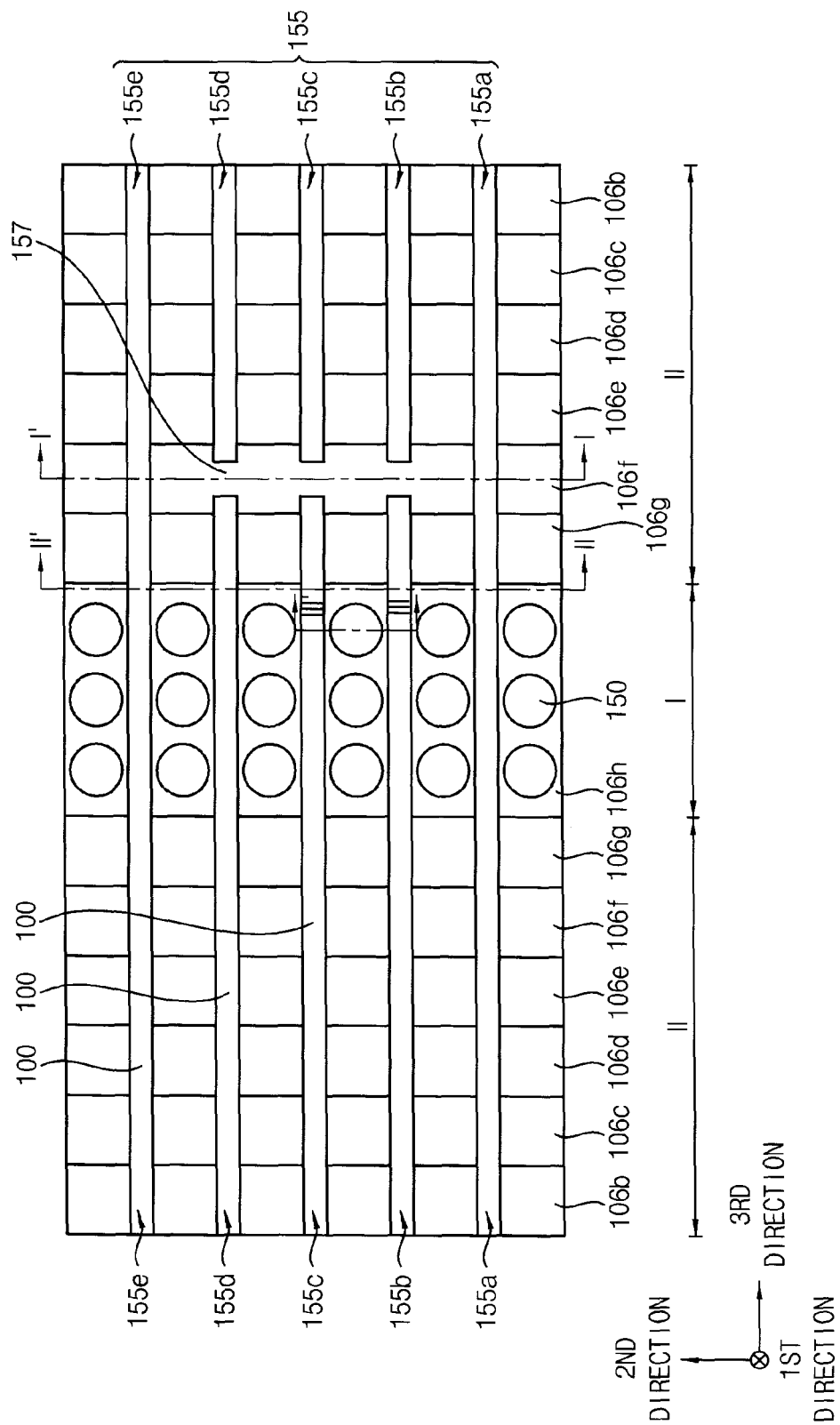
Figure 16C:
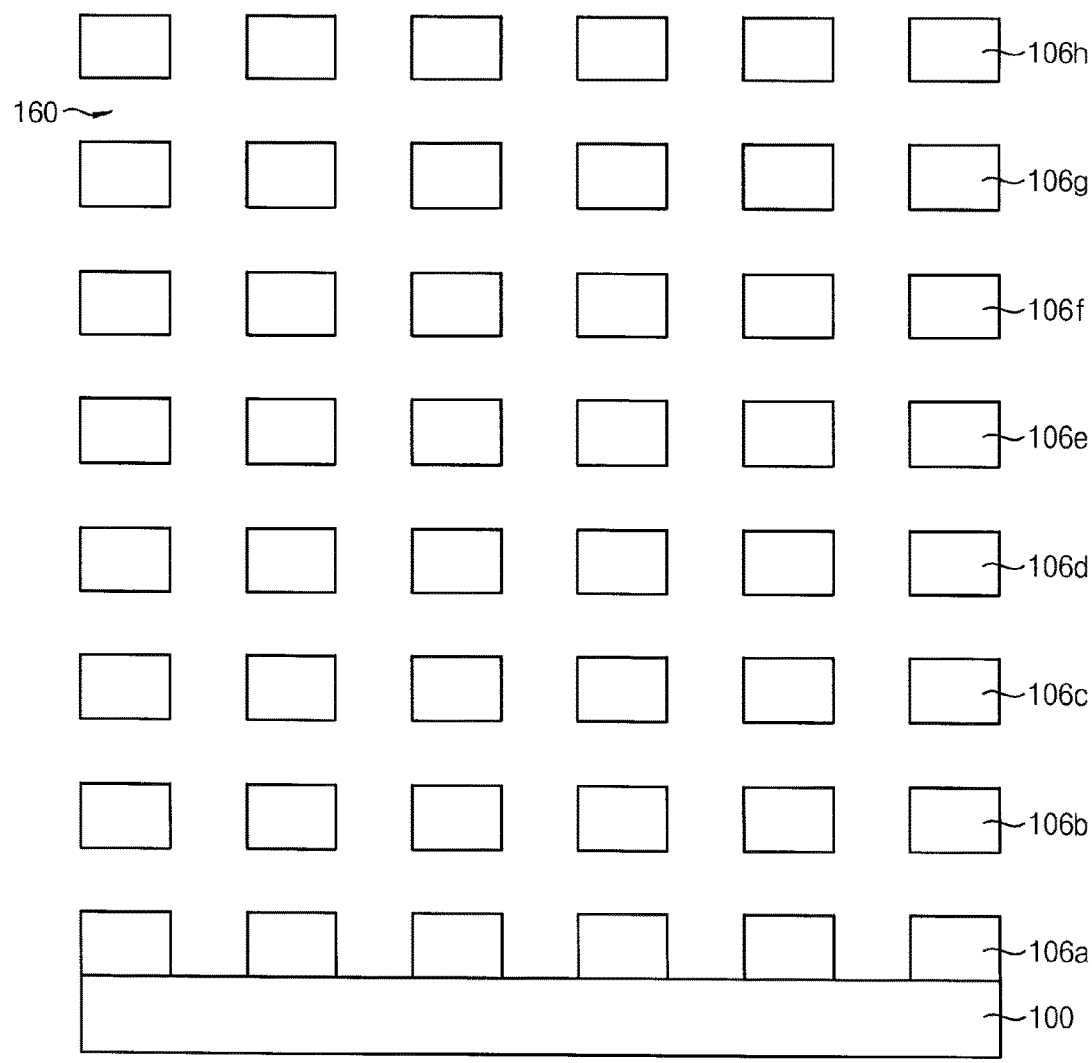
Figure 16D:
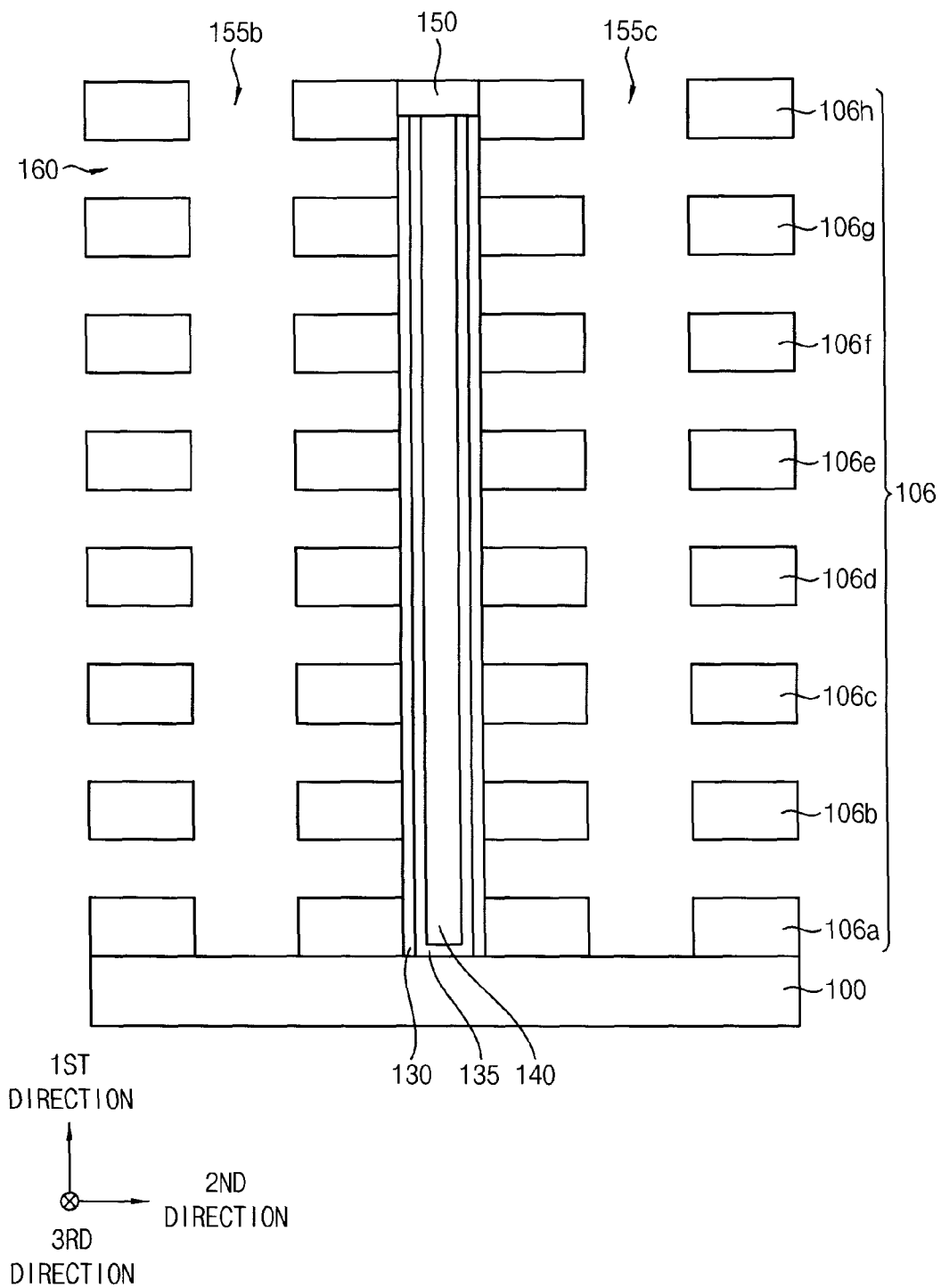
Figure 17A:
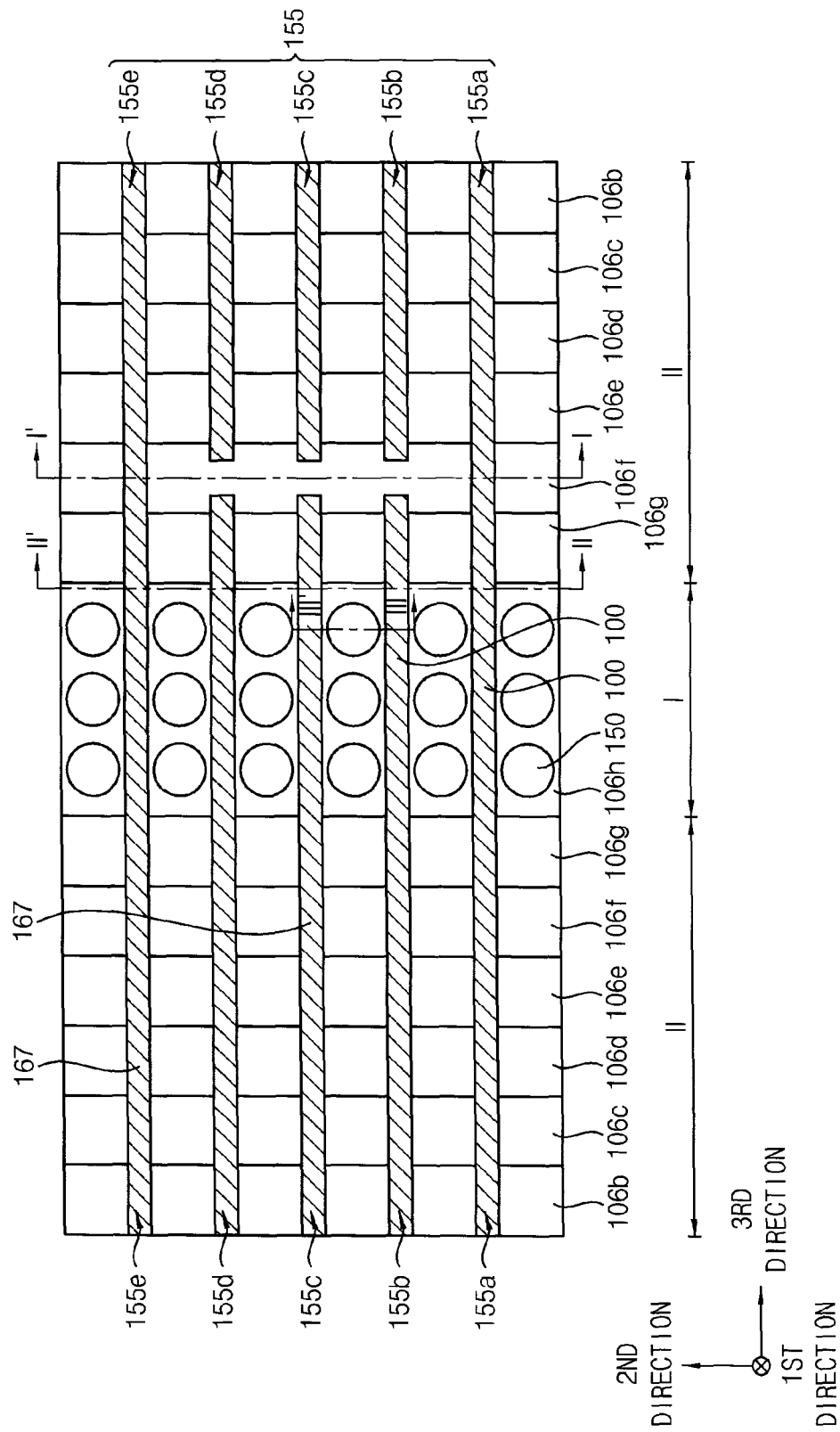
Figure 17B:
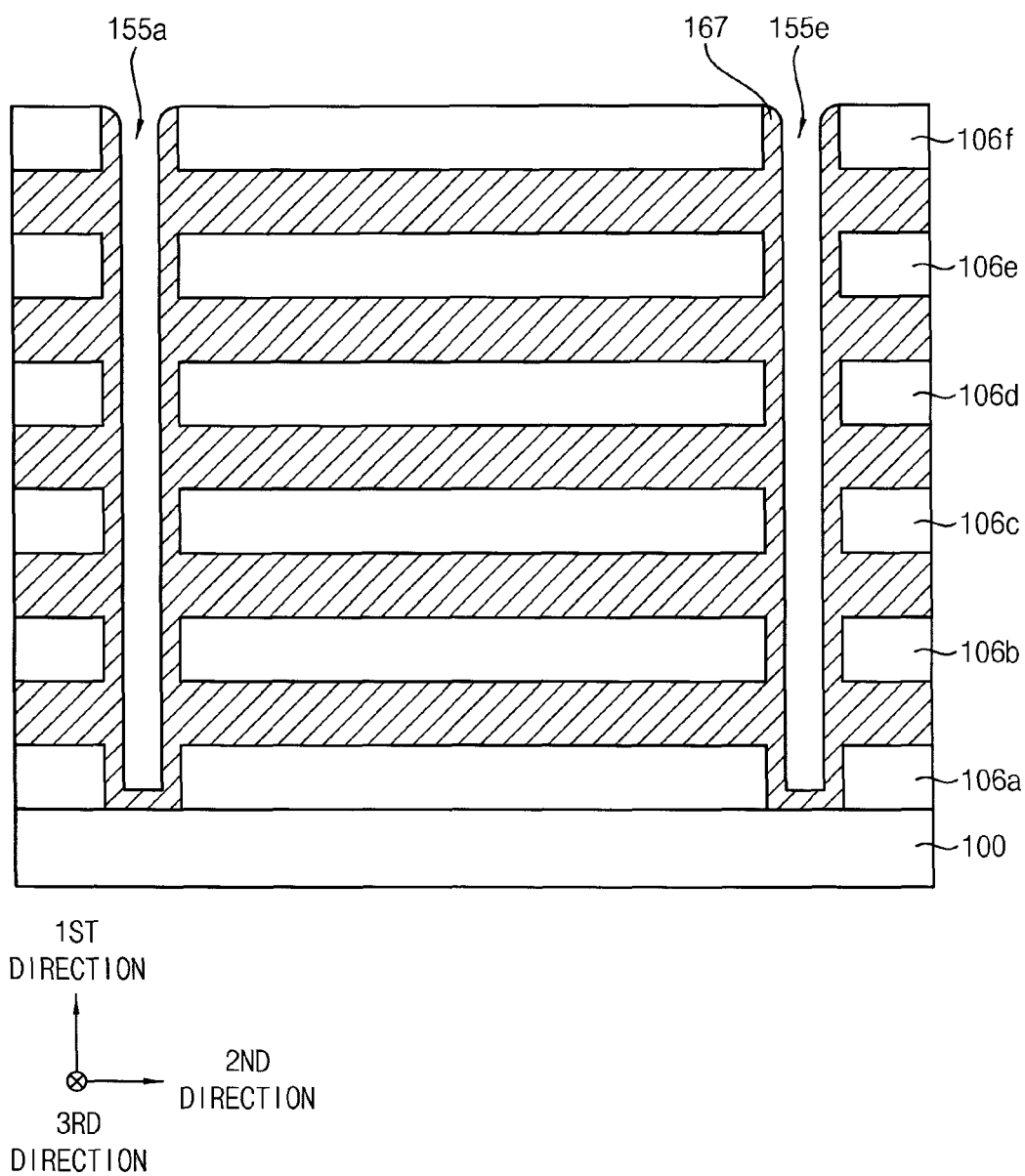
Figure 17C:
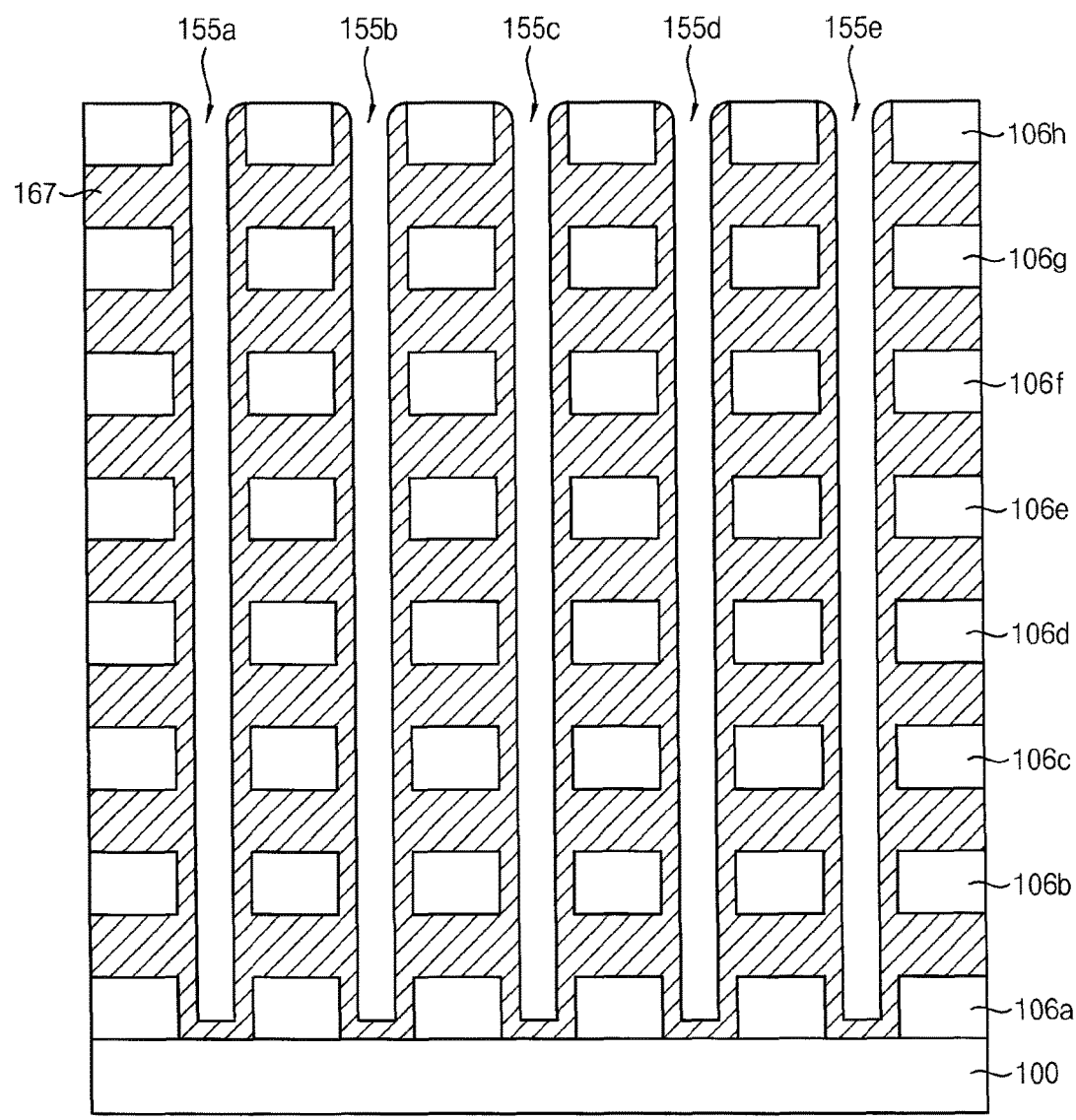
Figure 17D:
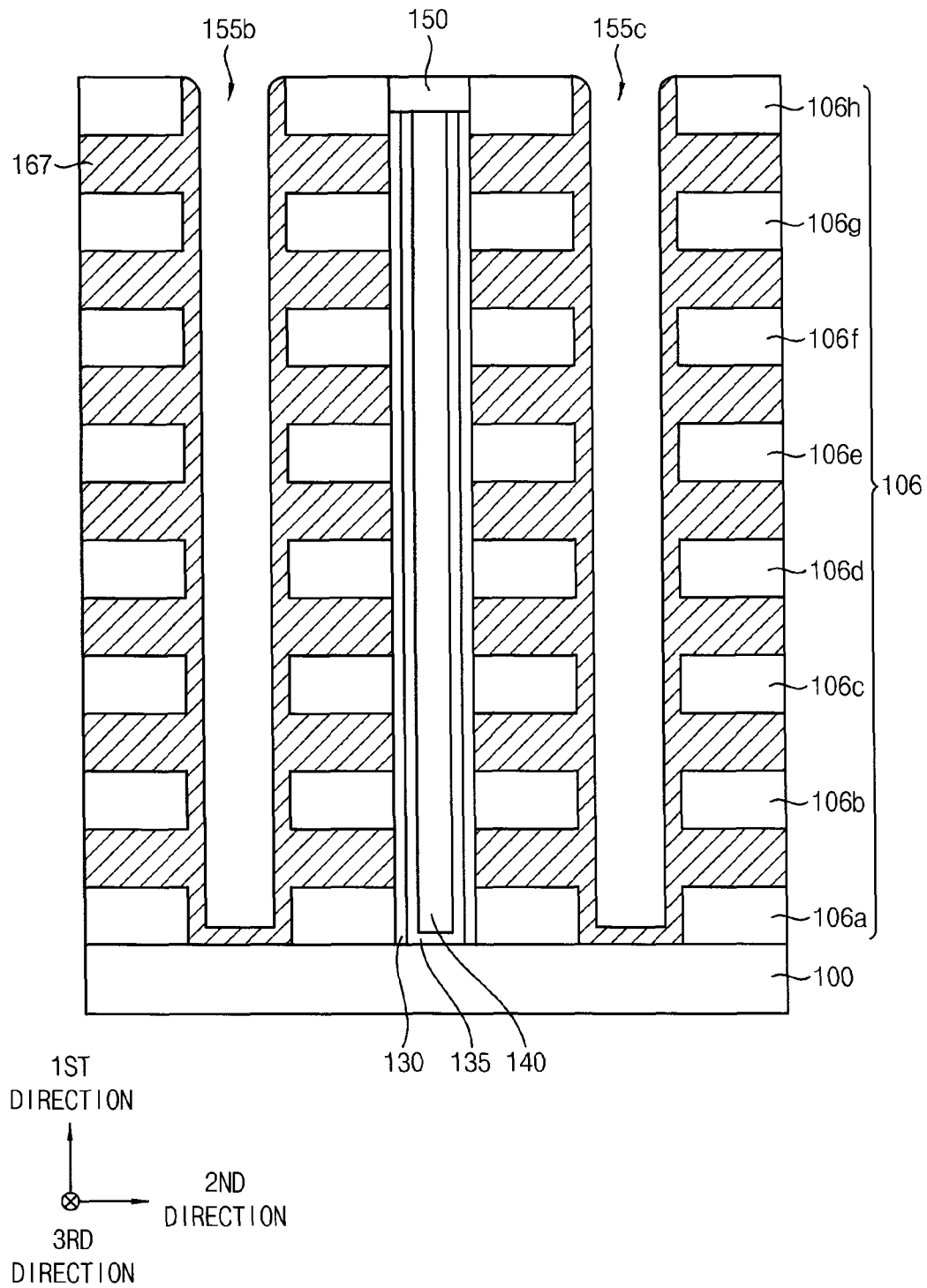

In example embodiments, the opening 155 may extend in the third direction and the top surface of the substrate 100 may be partially exposed by the opening 155. For the convenience of explanation, a first opening 155a, a second opening 155b, a third opening 155c, a fourth opening 155d and a fifth opening 155e are illustrated in FIG. 15A.

The first and fifth openings 155a and 155e may extend continuously in the second direction. The second, third and fourth openings 155b, 155c and 155d may be extend discontinuously and may be cut or blocked in-between by a fence structure 157 formed in the extension region II.

The fence structure 157 may be defined due to a discontinuous formation of the second, third and fourth openings 155b, 155c and 155d in the third direction. In example embodiments, the fence structure 157 may be formed on the extension region II of the substrate 100 and protrude from the top surface of the substrate 100 in the first direction. The fence structure 157 may have a wall shape extending in the second direction. The fence structure 157 may include the insulating interlayer patterns 106a, 106b, 106c, 106d, 106e and 106f and the sacrificial layer patterns 108a, 108b, 108c, 108d and 108e, alternately stacked from the top surface of the substrate 100.

Some of the insulating interlayer patterns 106 and the sacrificial layer patterns 108 at an upper portion of the mold structure 105 may be completely separated by the openings 155 in the second direction. In example embodiments, the sacrificial layer patterns 108f and 108g which are replaced with the SSLs 170f and 170g (see FIGS. 18C and 18D) may be completely separated in the second direction by the openings 155.

Referring to FIG. 16A to 16D, the sacrificial layer patterns 108, sidewalls of which are exposed by the openings 155 may be removed. For example, the sacrificial layer patterns 108 may be removed by a wet etching process using, e.g., phosphoric acid and/or sulfuric acid as an etching solution.

By the removal of the sacrificial layer patterns 108, first gaps 160 may be defined between the insulating interlayer patterns 106 adjacent in the first direction. An outer sidewall of the dielectric layer structure 130 may be partially exposed by the first gap 160. As illustrated in FIG. 16B, second gaps 161 may be defined at regions of the fence structure 157 from which the sacrificial layer patterns 108 are removed.

Referring to FIGS. 17A to 17D, a gate electrode layer 167 may be formed on the outer sidewall of the dielectric layer structure 130, innerwalls of the first and second gaps 160 and 161, surfaces of the insulating interlayer patterns 106, and the exposed top surface of the substrate 100. In one example embodiment, a blocking layer may be further formed before forming the gate electrode layer 167.

The gate electrode layer 167 may completely fill the first and second gaps 160 and 161, and may partially fill the openings 155.

In certain embodiments, the gate electrode layer 167 may be formed using a metal or a metal nitride. For example, the gate electrode layer 167 may be formed using tungsten, tungsten nitride, titanium, titanium nitride, tantalum, tantalum nitride, platinum, etc. In one example embodiment, the gate electrode layer 167 may be formed as a multi-layered structure including a barrier layer formed of the metal nitride, and a metal layer.

The gate electrode layer 167 may be formed by. e.g., a CVD process, a PECVD process, an ALD process or a sputtering process.

Referring to FIGS. 18A to 18E, the gate electrode layer 167 may be partially removed to form a gate line 170 in the first gap 160 of each level and a connecting portion 175 in the second gap 161 of each level.

In example embodiments, a portion of the gate electrode layer 167 formed in the openings 155 may be etched to form the gate lines 170. The gate electrode layer 167 may be etched by a dry etching process. The top surface of the substrate 100 may be exposed again by the etching process.

The gate lines 170 may include the GSL, the word line and the SSL sequentially stacked and spaced apart from one another in the first direction. For example, a lower gate line 170a may serve as the GSL. Four gate lines 170b, 170c, 170d and 170e on the GSL may serve as the word lines. Two gate lines 170f and 170g on the word lines may serve as the SSLs.

The portion of the gate electrode layer 167 remaining in the second gap 161 may be defined as the connecting portion 175. Thus, the connection portion 175 may be formed simultaneously with the gate line 170 without an additional patterning process.

In example embodiments, the SSLs 170g and 170f at each level may be separated from each other in the second direction. Each of the SSLs 170g and 170f may extend in the third direction. The word lines 170e, 170d, 170c and 170b may extend in the third direction at each level and may be connected to or merged with each other in the second direction on the extension region II by the connecting portions 175e, 175d, 175c and 175b. The GSLs 170a may be also connected to or merged with each other by the connecting portion 175a.

In example embodiments, the uppermost connecting portion 175e may be connected to the extension portions of the uppermost word lines 170e which protrude from sidewalls of the SSLs 170f in the third direction. Other connecting portions 175d, 175c, 175b and 175a may overlap the uppermost connecting portion 175e in the first direction.

As illustrated in FIG. 18E, four word lines 170 may be connected to each other by the connecting portion 175 at each level. However, the number of the gate lines 170 connected by the connecting portion 175 may be adjusted in consideration of a circuit design and an integration degree of the vertical memory device.

Referring to FIGS. 19A to 19D, an impurity region 101 may be formed at an upper portion of the substrate 100 exposed by the opening 155, and a second filling layer pattern 177 may be formed in the opening 155.

N-type impurities such as phosphorous or arsenic may be implanted onto the substrate 100 through the opening 155 to form the impurity region 101. In one example embodiment, a metal silicide pattern (not illustrated) such as a nickel silicide pattern or a cobalt silicide pattern may be further formed on the impurity region 101.

In example embodiments, the impurity region 101 may extend in the third direction and serve as a CSL of the vertical memory device.

A second filling layer may be formed on the substrate 100, the uppermost insulating interlayer pattern 106h and the pad 150 to sufficiently fill the openings 155. An upper portion of the second filling layer may be planarized by, e.g., a CMP process or an etch-back process until the uppermost insulating interlayer pattern 106h is exposed to form the second filling layer pattern 177. The second filling layer may be formed using an insulating material, e.g., silicon oxide by, e.g., a CVD process.

Figure 20B:
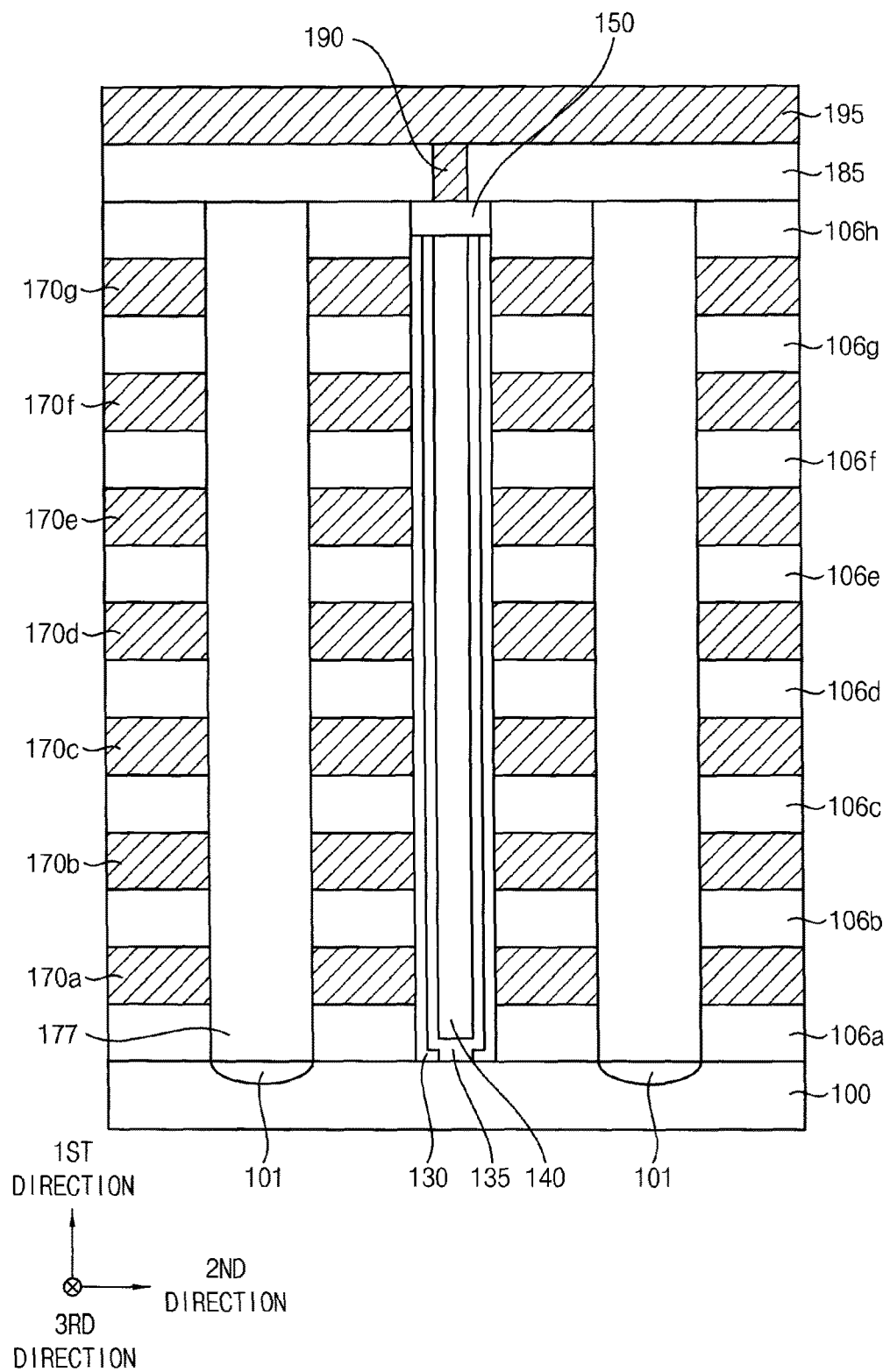

Referring to FIGS. 20A and 20B, an upper insulation layer 185 may be formed on the insulating interlayer pattern 106, the second filling layer pattern 177 and the pad 150. The upper insulation layer 185 may be formed using an insulation material, e.g., silicon oxide by, e.g., a CVD process.

A bit line contact 190 may be formed through the upper insulation layer 185 to contact the pad 150. The bit line contact 190 may be formed using a metal, a metal nitride or a doped polysilicon, for example. A plurality of the bit line contacts 190 may form an array comparable to the arrangement of the channels 135 or the pads 150.

A bit line 195 may be formed on the upper insulation layer 185 to be electrically connected to the bit line contact 190.

The bit line 195 may be formed using a metal, a metal nitride or a doped polysilicon by, e.g., an ALD process or a sputtering process. As illustrated in FIG. 20A, the bit line 195 may extend in the second direction and may be electrically connected to the plurality of the bit line contacts 190 on the cell region I. A plurality of the bit lines 195 may be arranged in the third direction.

FIG. 20B illustrates that the upper insulation layer 185 may be formed on the second filling layer pattern 177. However, the upper insulation layer 185 and the second filling layer pattern 177 may be merged with or integral with each other. In this case, the second filling layer may be formed to sufficiently fill the openings 155 and cover the insulating interlayer pattern 106 and the pad 150. An upper portion of the second filling layer may be planarized by, e.g., a CMP process to form the second filling layer pattern 177 together with the upper insulation layer 185.

Figure 21:
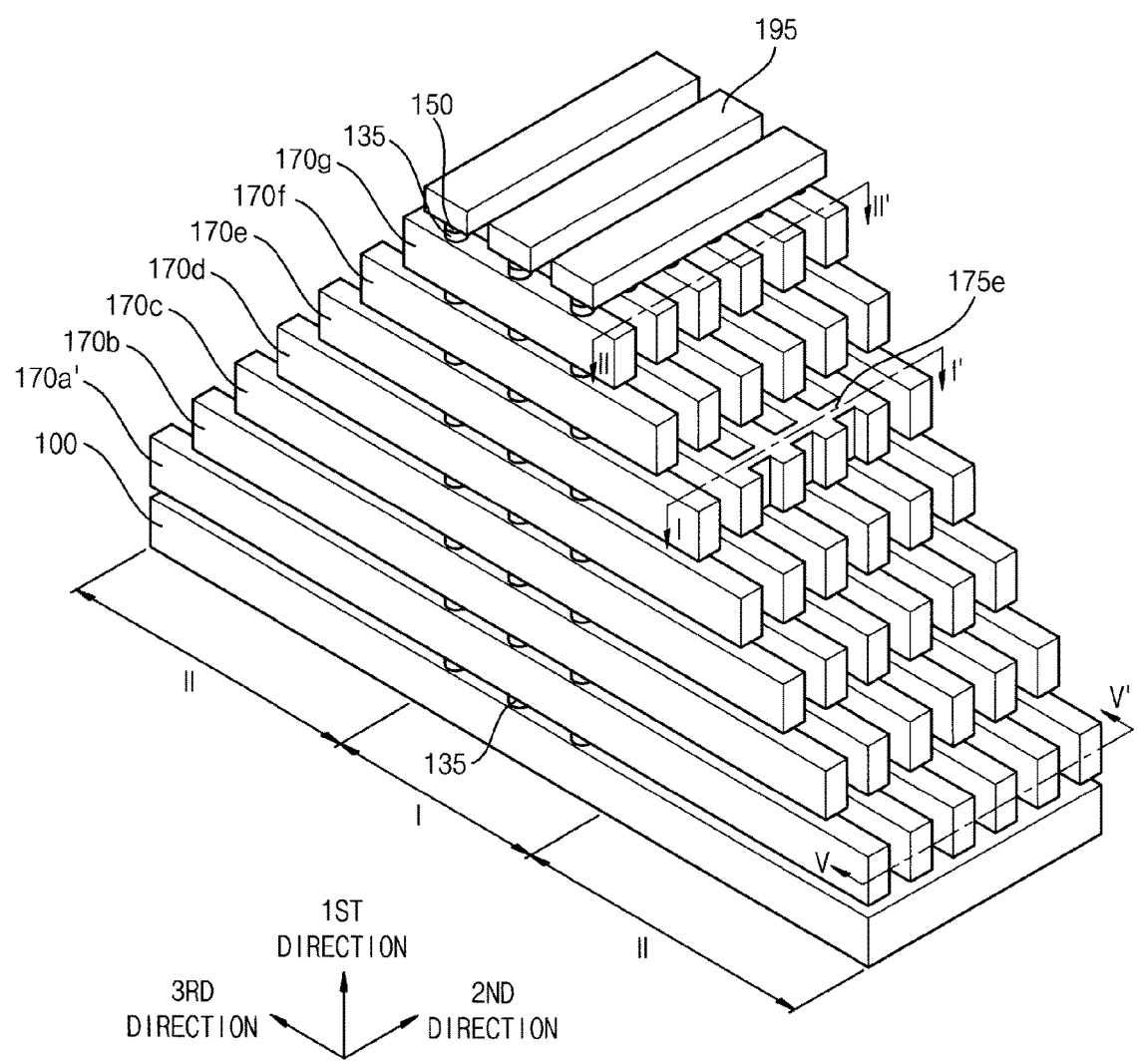
FIG. 21 is a perspective view illustrating a vertical memory device in accordance with example embodiments.
Figure 22:
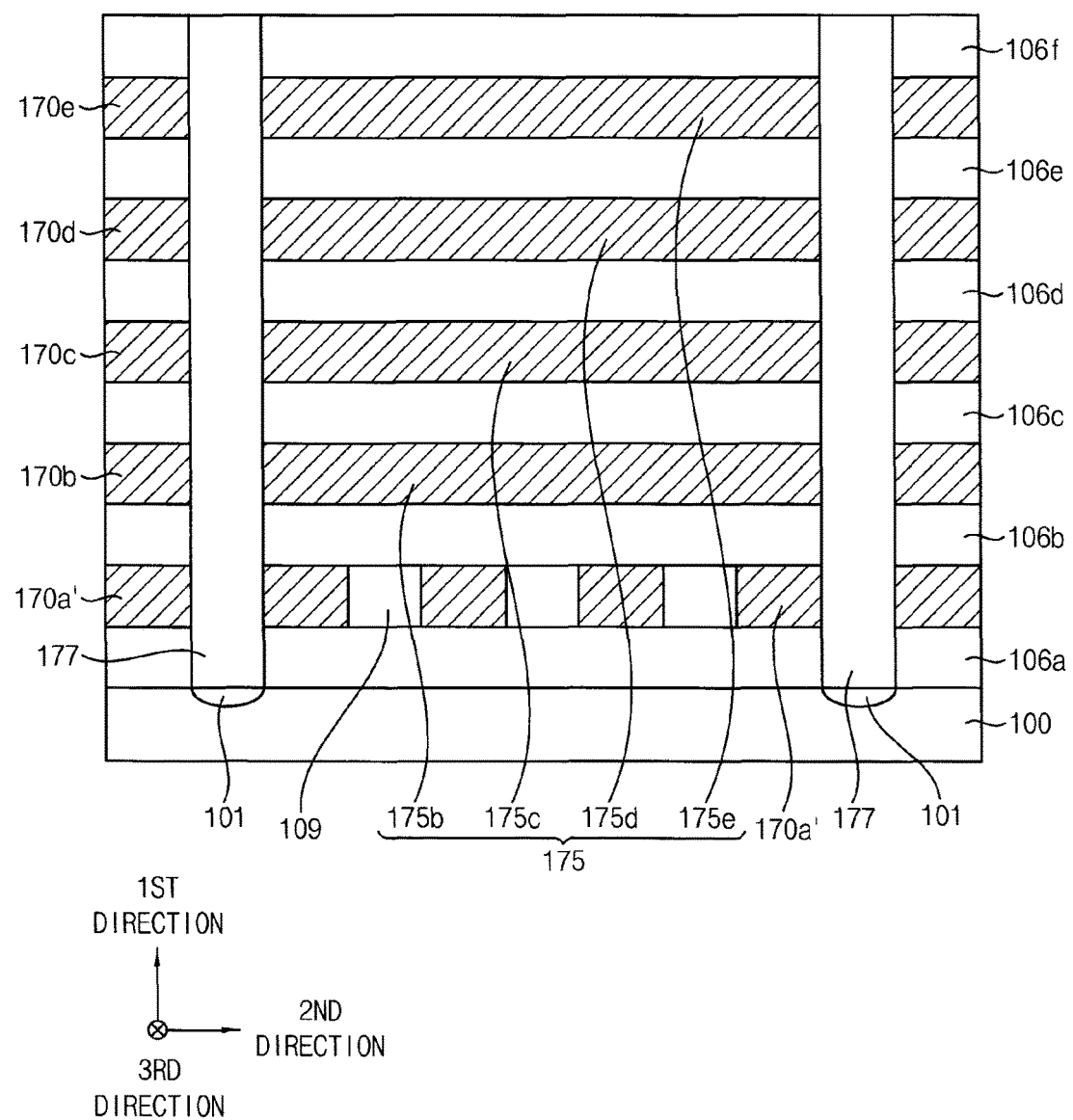
FIGS. 22 and 23 are exemplary cross-sectional views taken along lines I-I' and II-II' of FIG. 21, respectively, according to certain embodiments.
Figure 23:
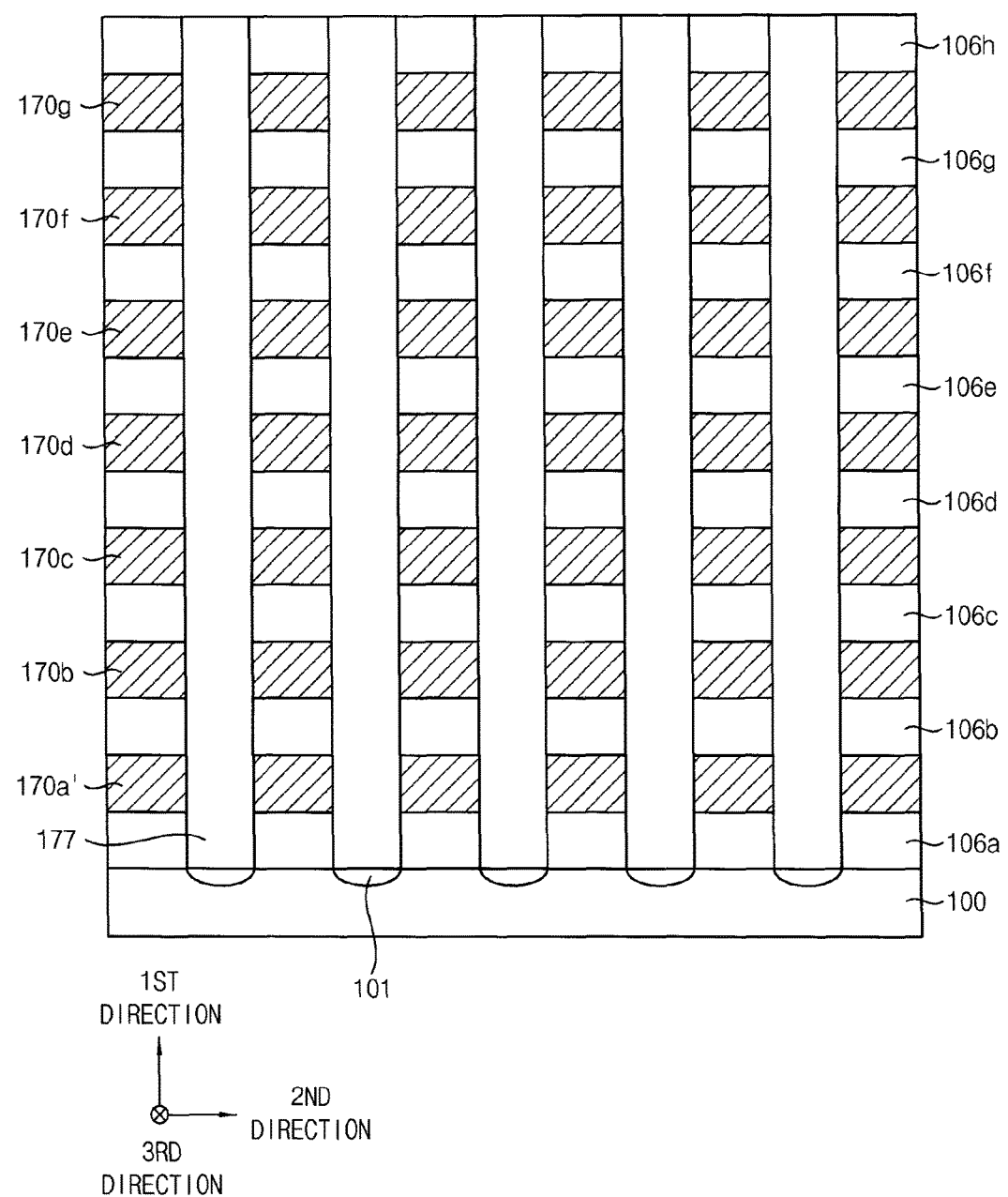
Figure 24A:
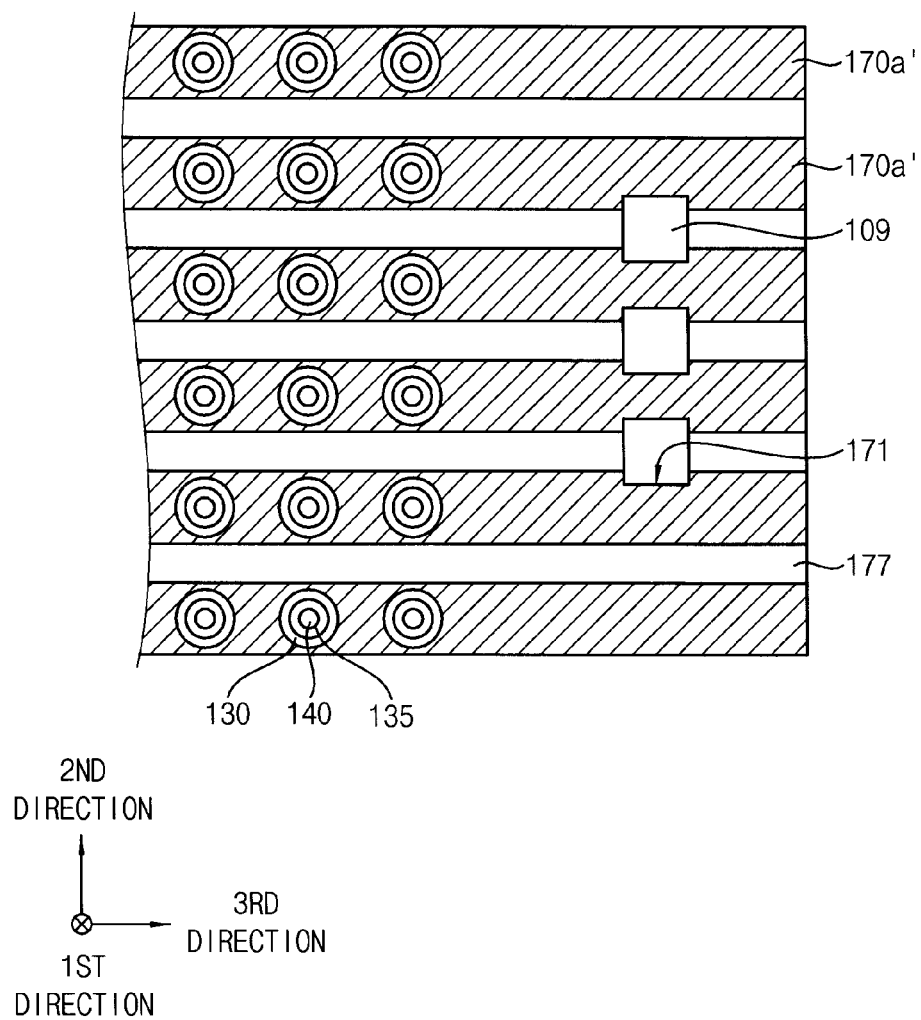
FIGS. 24A and 24B are exemplary cross-sectional views taken along a line V-V' of FIG. 20, according to certain embodiments.
Figure 24B:
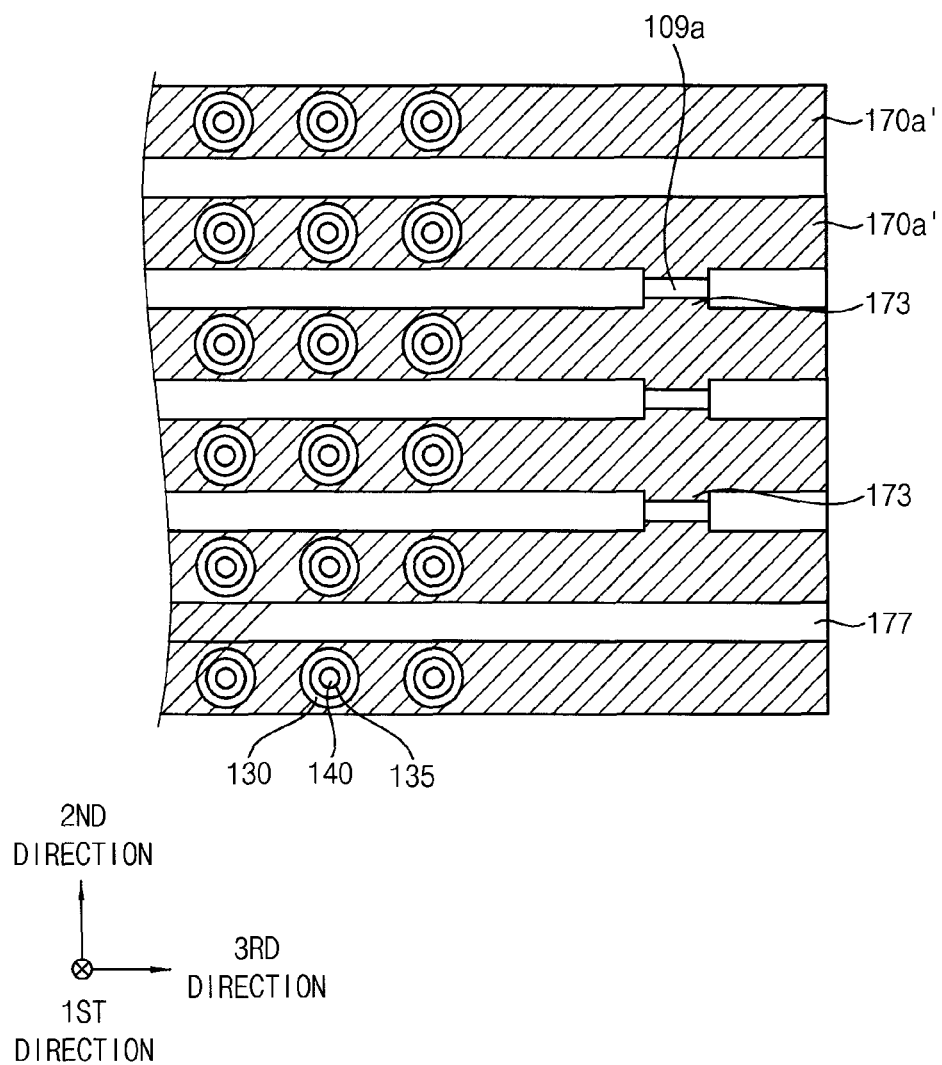

FIGS. 21 to 24B are perspective views and cross-sectional views illustrating a vertical memory device in accordance with example embodiments. Specifically, FIG. 21 is a perspective view illustrating the vertical memory device. FIGS. 22 and 23 are cross-sectional views taken along lines I-I' and II-II' of FIG. 21, respectively. FIGS. 24A and 24B are cross-sectional views taken along a line V-V' of FIG. 20;

For the convenience of explanation, FIG. 21 does not show all elements of the vertical semiconductor device, but only shows some elements thereof, e.g., a substrate, a channel, a gate line, a pad and a bit line.

Detailed description on elements and/or constructions substantially the same as or similar to those illustrated with reference to FIGS. 1 to 6B are omitted. Like reference numerals are used to indicate like elements.

Referring to FIGS. 21 to 24B, the vertical memory device may have a structure substantially the same as or similar to that illustrated in FIGS. 1 to 6B except for a lowermost gate line 170a serving as a GSL.

The GSLs 170a of the vertical memory device illustrated in FIGS. 1 to 6B may be connected to each other in a similar manner to that of the word lines 170b, 170c, 170d and 170e. However, GSLs 170a' of the vertical memory device of FIGS. 24A to 24B may be completely separated from each other in the second direction to extend in the third direction.

As illustrated in FIG. 22, a separation layer pattern 109 may be disposed between the GSLs 170a' neighboring in the second direction to separate the GSLs 170a'. In example embodiments, the separation layer pattern 109 may vertically overlap connecting portions 175b, 175c, 175d and 175e. The separation layer pattern 109 may be disposed between two lowermost insulating interlayer patterns 106, e.g., a first insulating interlayer pattern 106a and a second insulating interlayer pattern 106b. In one example embodiment, the separation layer pattern 109 may be merged or integral with the second insulating interlayer pattern 106b.

The separation layer pattern 109 may include a material having an etching selectivity with respect to the sacrificial layer or sacrificial layer pattern described above. For example, the separation layer pattern 109 may include silicon oxide, silicon carbooxide or silicon fluorooxide.

In example embodiments, the separation layer pattern 109 may have a top plan dimension or a cross-sectional dimension larger than those of the connecting portions 175b, 175c, 175d and 175e. In this case, the GSL 170a' may include a recessed portion 171 at a region adjacent to the separation layer pattern 109 as illustrated in FIG. 24A. The separation layer pattern 109 may be accommodated in a pair of the recessed portions 171.

In one example embodiment, a separation layer pattern 109a may have a top plan dimension or a cross-sectional dimension smaller than those of the connecting portions 175b, 175c, 175d and 175e. In this case, the GSL 170a' may include a protrusion 173 at a region adjacent to the separation layer pattern 109a as illustrated in FIG. 24B. The separation layer pattern 109a may be sandwiched by a pair of the protrusions 173.

Selection lines of the vertical memory device including SSLs 170f and 170g, and the GSL 170a' may be physically separated at each level. Word lines 170b, 170c, 170d and 170e may be connected to or merged with each other by the connecting portions 175b, 175c, 175d and 175e on an extension region II at each level.

Therefore, a reliability of a cell selection may be increased while grouping the predetermined number of the word lines 170b, 170c, 170d and 170e by the connecting portions 175b, 175c, 175d and 175e.

FIGS. 25 to 32F are perspective views, a top plan view and cross-sectional views illustrating a method of manufacturing a vertical memory device in accordance with example embodiments.

Figure 30A:
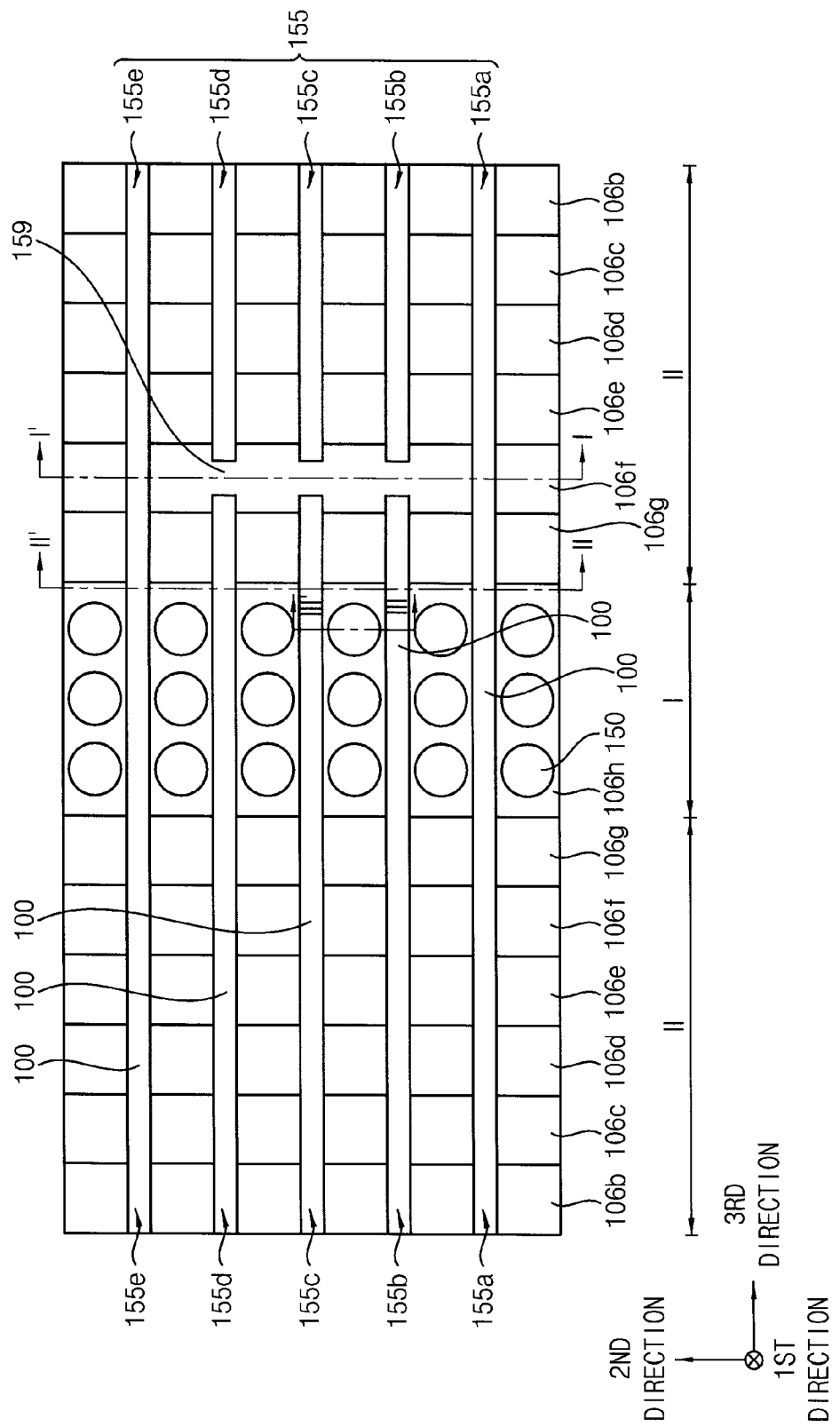
Figure 30B:
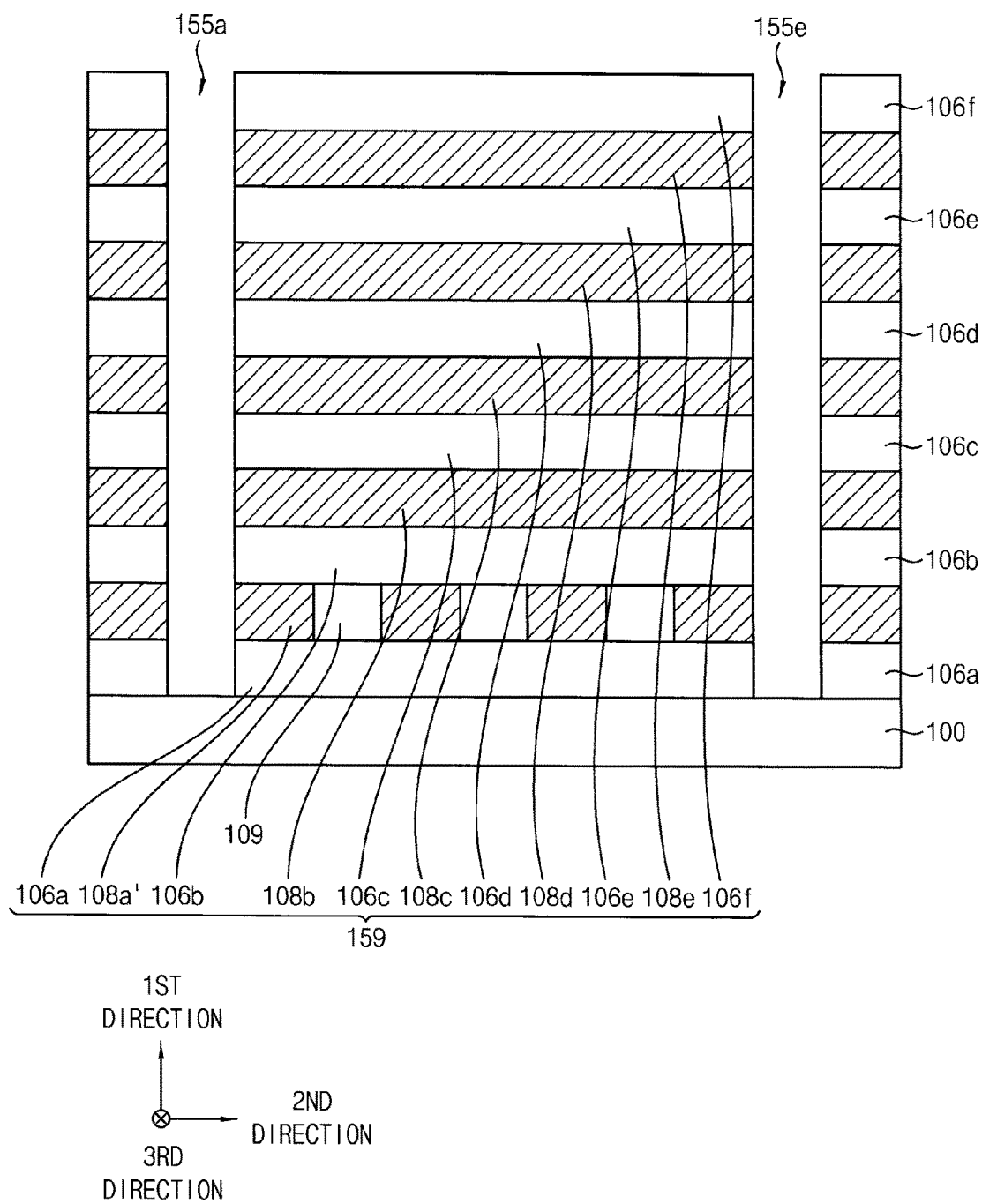
Figure 30C:
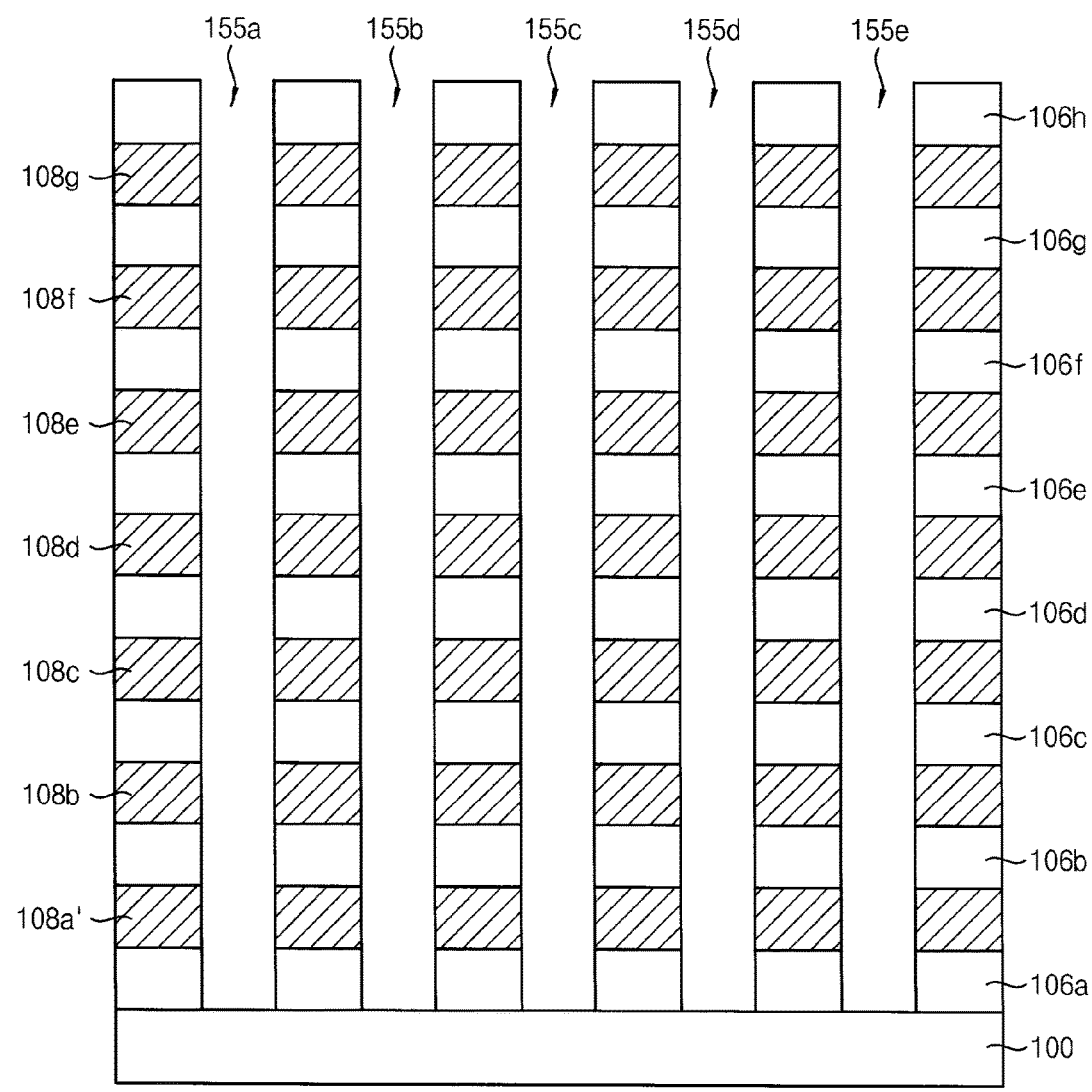
Figure 31A:
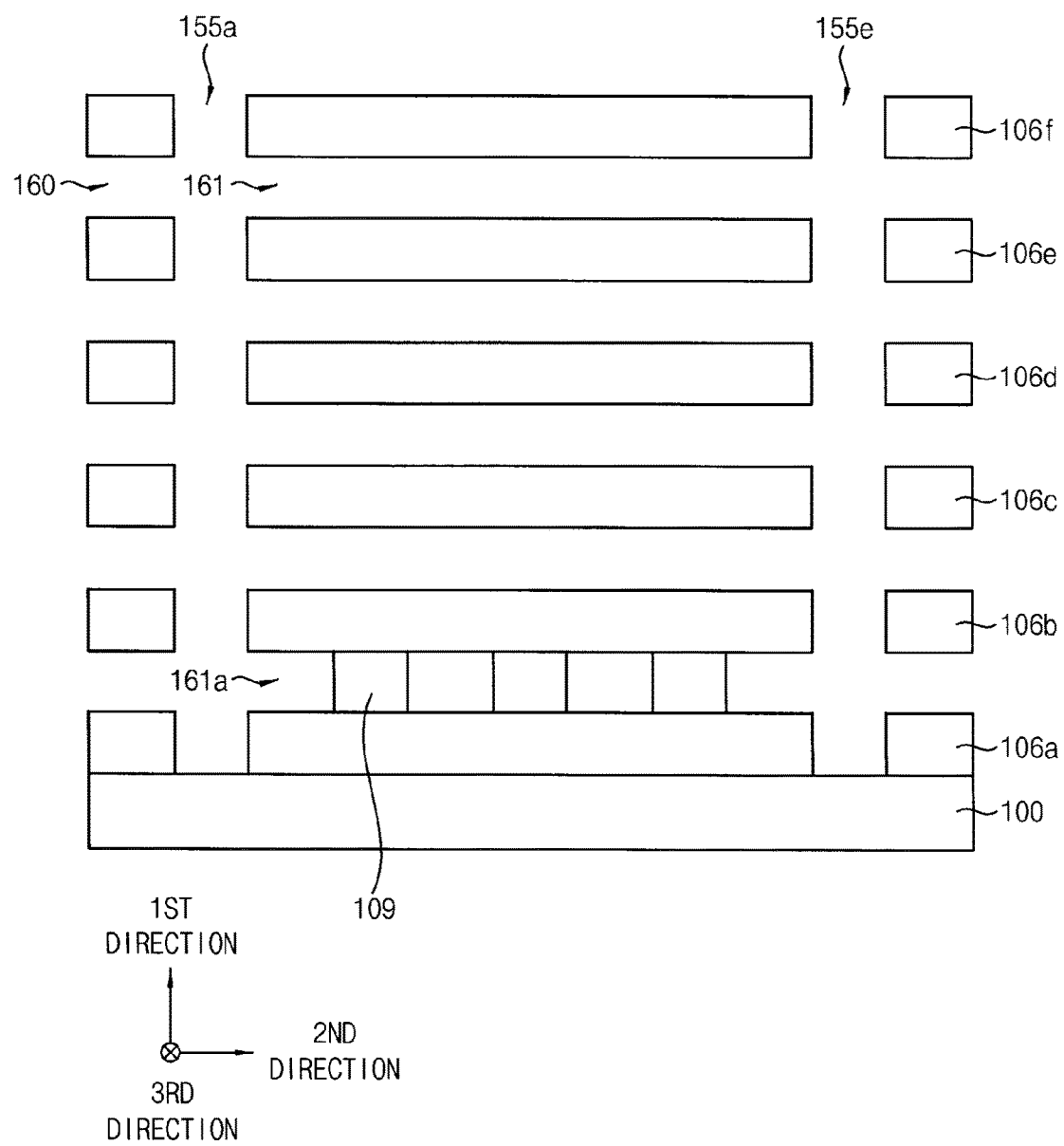
Figure 32A:
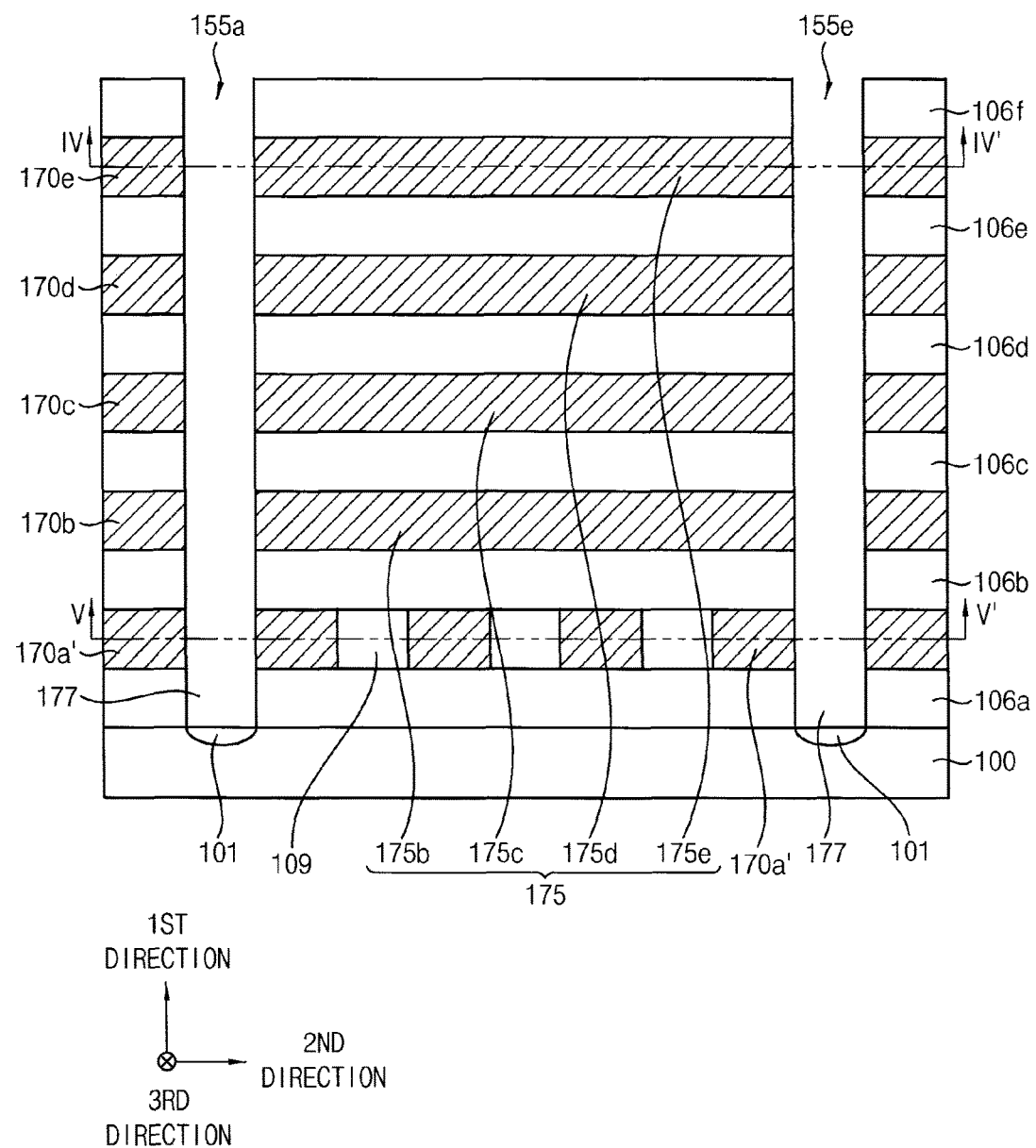
Figure 32B:
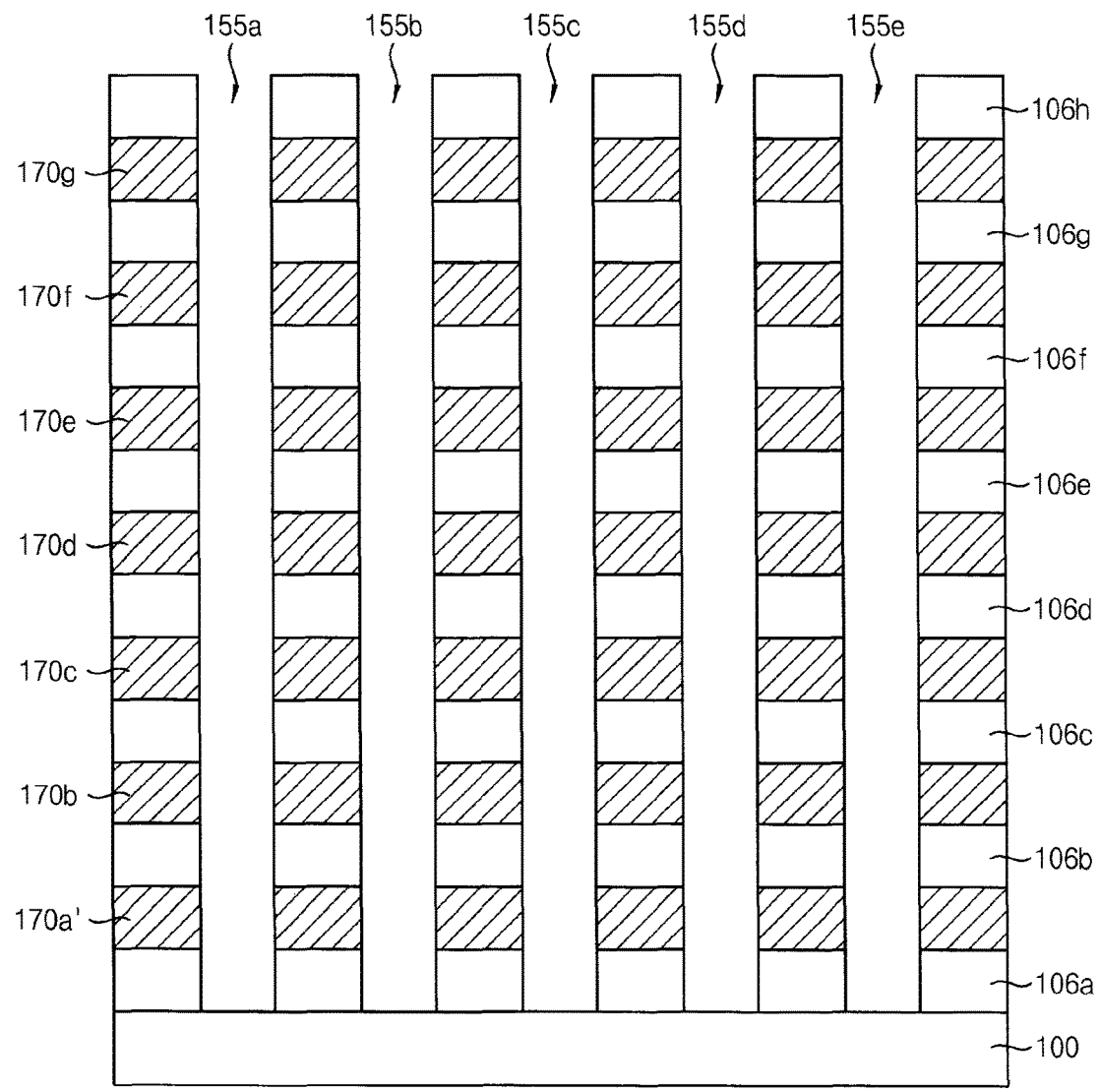
Figure 32C:
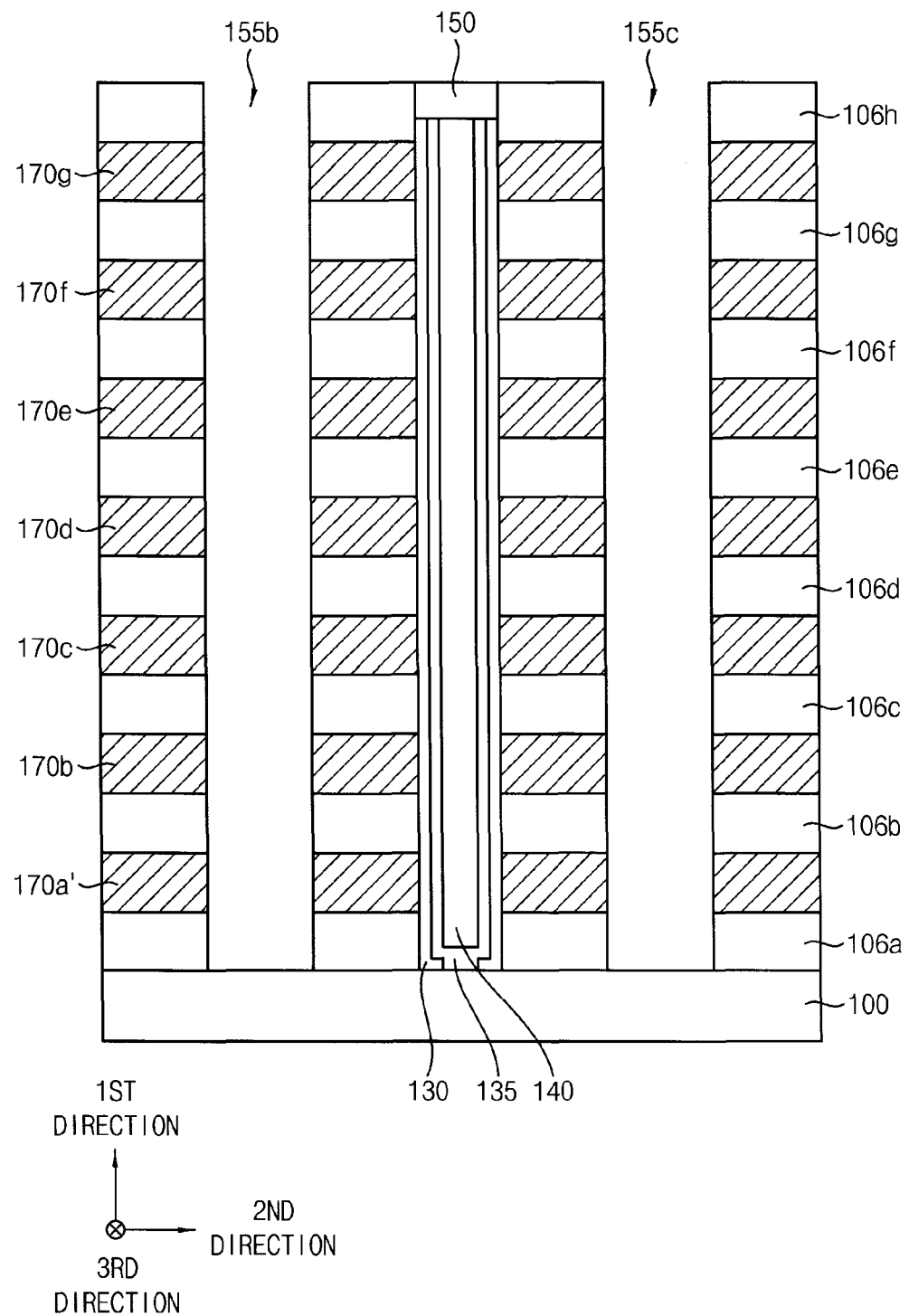
Figure 32D:
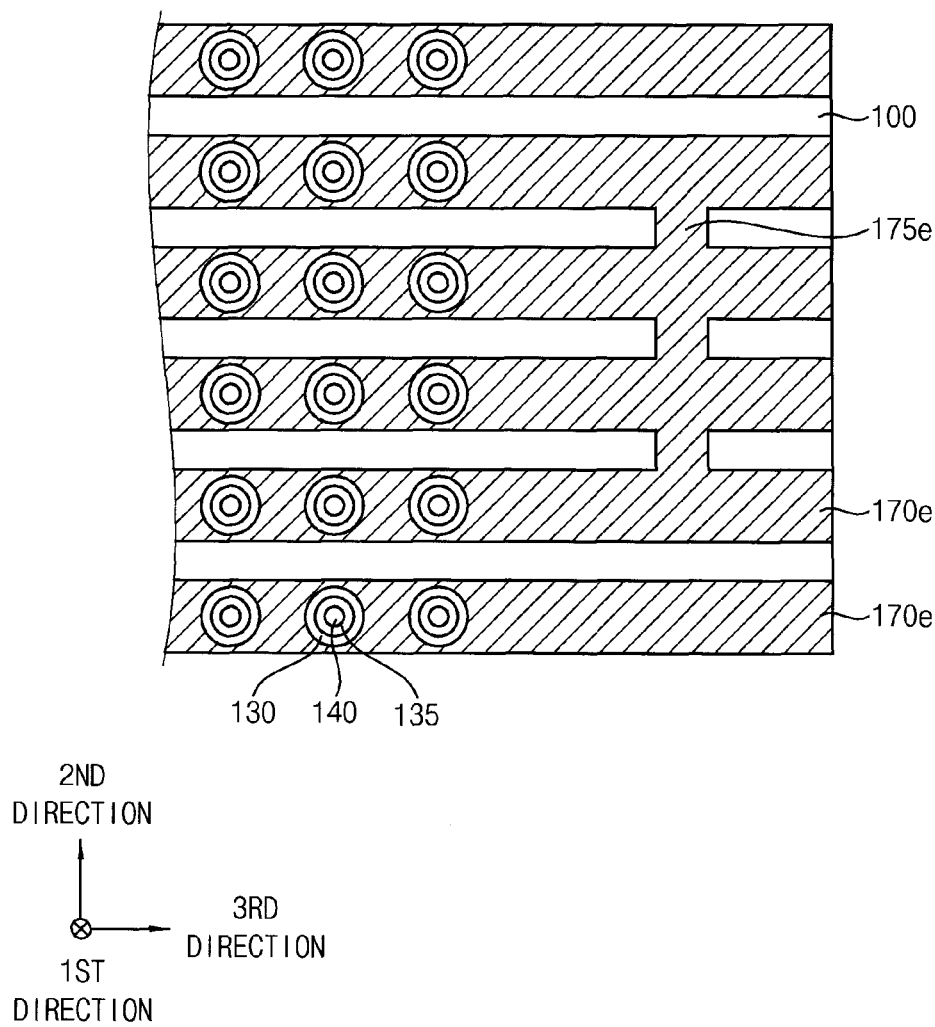
Figure 32E:
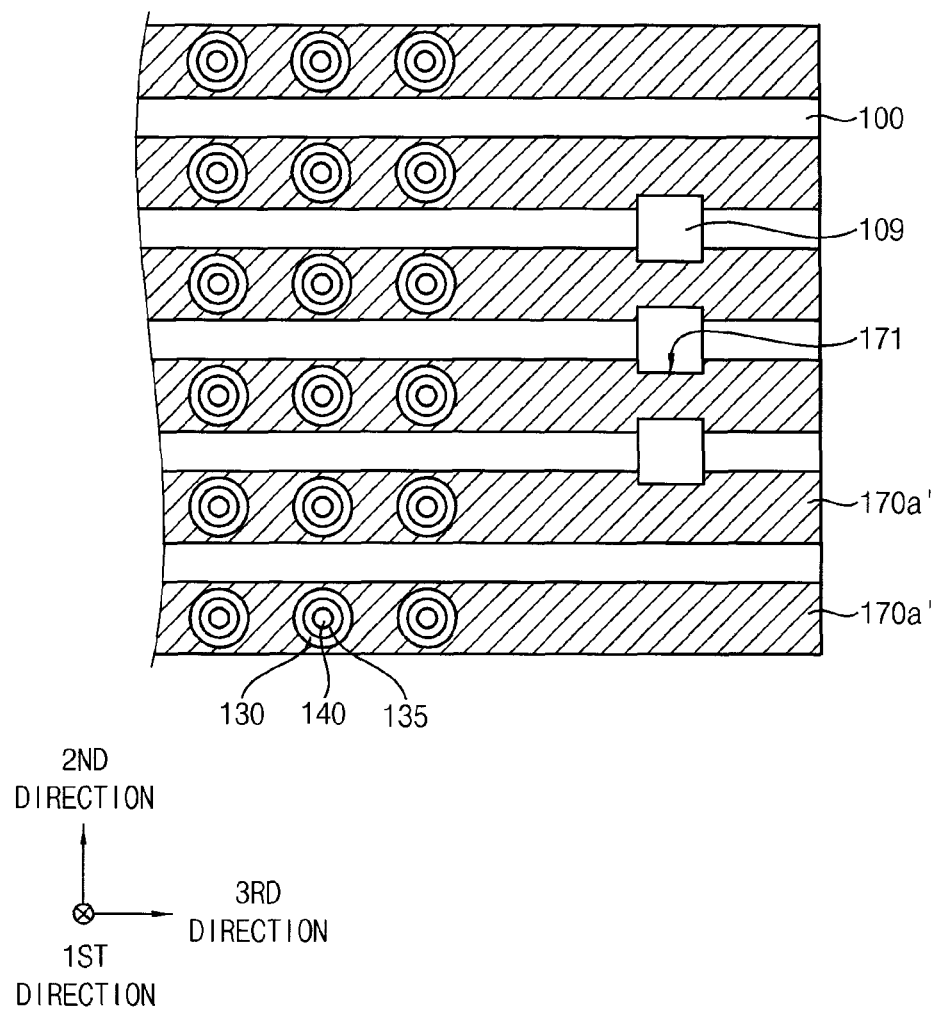
Figure 32F:
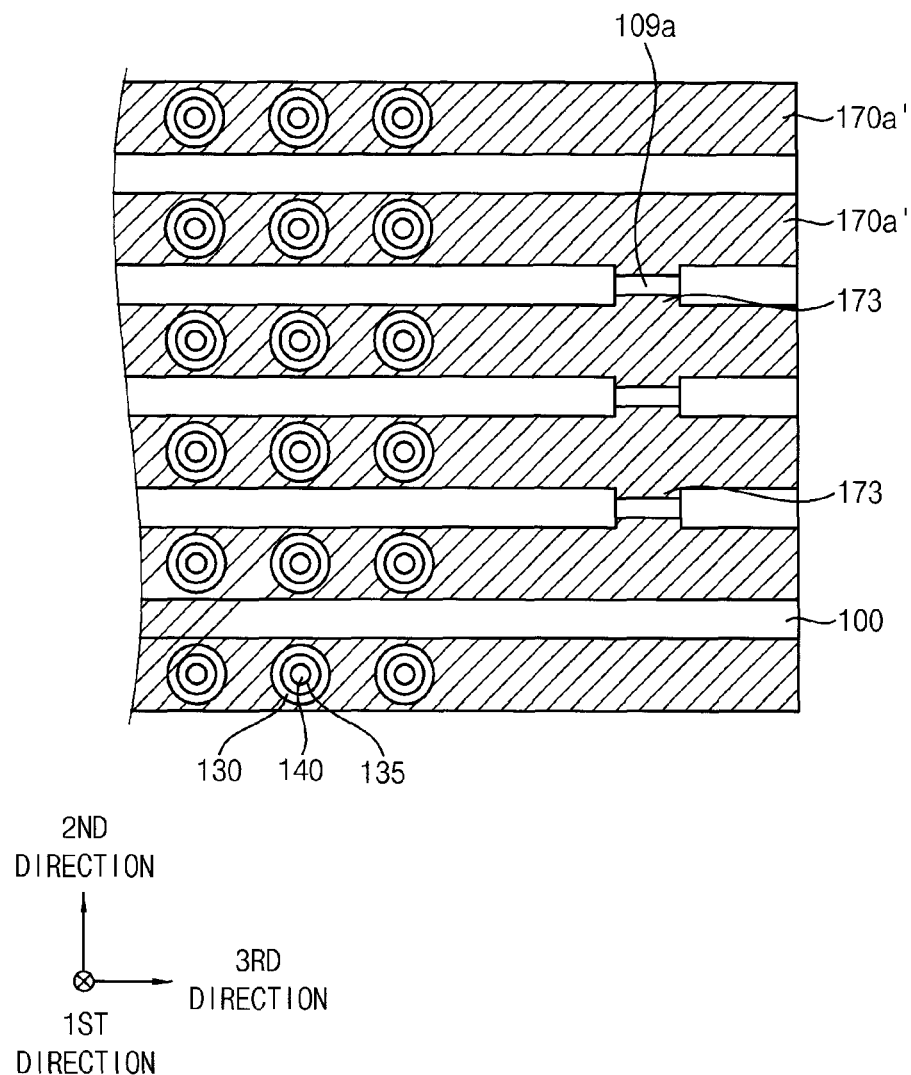

Specifically, FIGS. 25 to 28 and 29A are perspective views illustrating the method of manufacturing the vertical memory device. FIG. 30A is a top plan view illustrating the method of manufacturing the vertical memory device. FIGS. 30B, 31A and 32A are cross-sectional views taken along a line I-I' in the first direction. FIGS. 30C, 31B and 32B are cross-sectional views taken along a line II-II' in the first direction. FIGS. 29B, 31C and 32C are cross-sectional views taken along a line in the first direction. FIG. 32D is a cross-sectional view taken along a line IV-IV' of FIG. 32A in the third direction. FIGS. 32E and 32F are cross-sectional views taken along a line V-V' of FIG. 32A in the third direction.

Detailed descriptions on processes and/or materials substantially the same as or similar to those illustrated with reference to FIGS. 7 to 20B are omitted.

Figure 25:
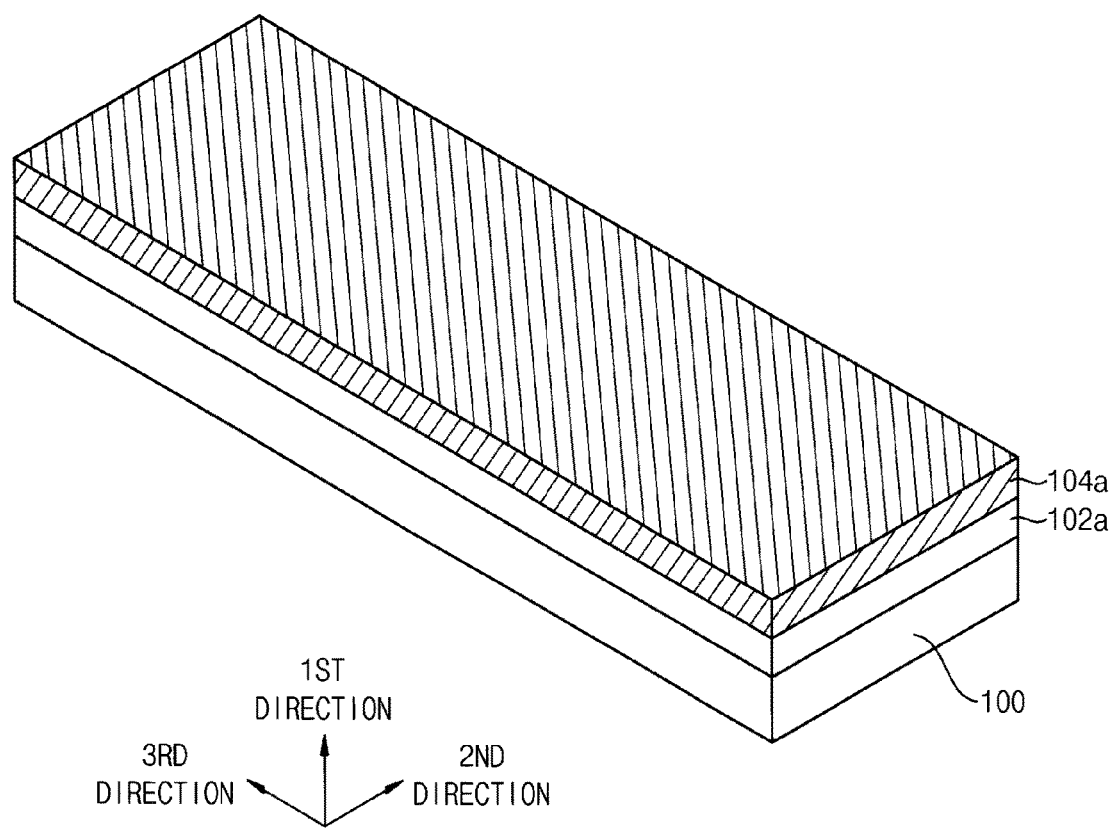
FIGS. 25 to 32F are perspective views, a top plan view and cross-sectional views illustrating a method of manufacturing a vertical memory device in accordance with example embodiments.

Referring to FIG. 25, a first insulating interlayer 102a and a first sacrificial layer 104a are sequentially formed on a substrate 100. The first sacrificial layer 104a may be removed by a subsequent process to provide a space for a formation of a GSL 170a' (see FIGS. 32A to 32C).

Figure 26:
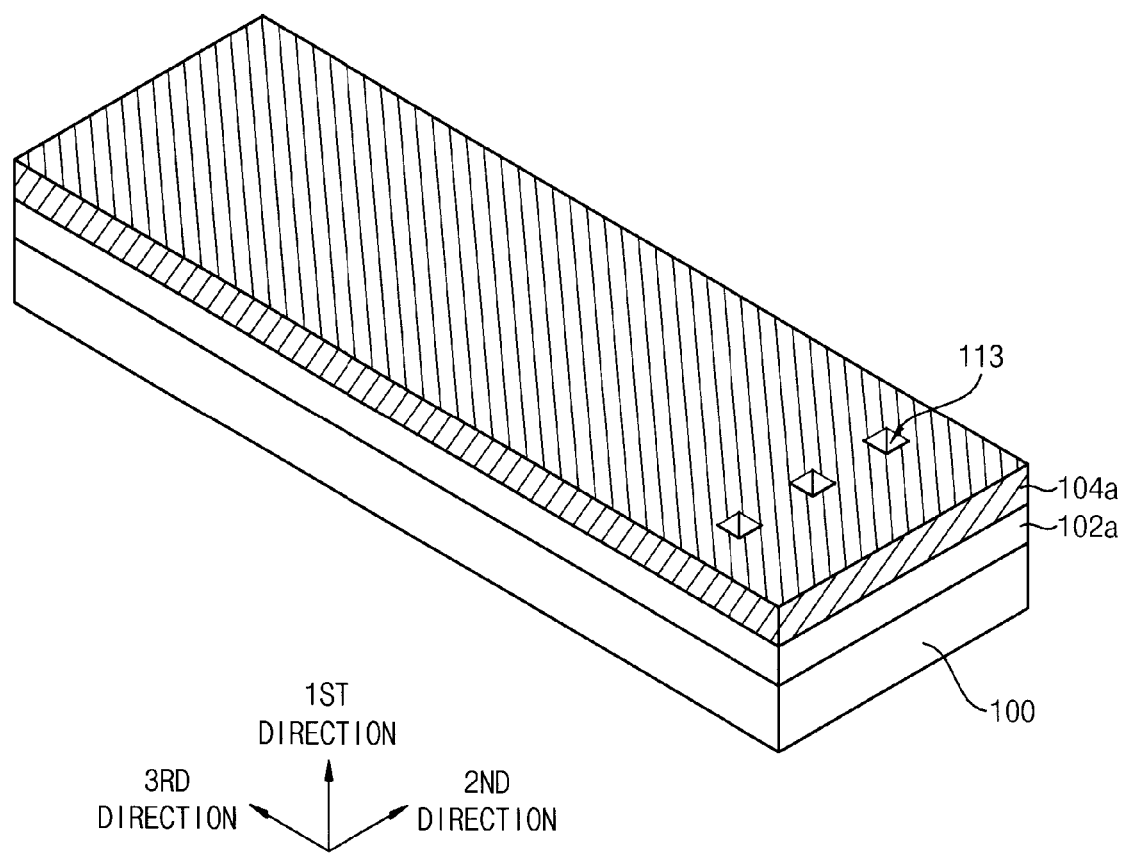

Referring to FIG. 26, the first sacrificial layer 104a is partially removed to form a separation hole 113. In example embodiments, a mask pattern (not illustrated) may be formed on the first sacrificial layer 104a. The separation hole 113 may be formed, for example, by a wet etching process using the mask pattern as an etching mask. A top surface of the first insulating interlayer 102a may be partially exposed by the separation hole 113. The mask pattern may be removed by an ashing and/or a strip process after forming the separation hole 113.

In example embodiments, a plurality of the separation holes 113 may be formed in the second direction. The separation hole 113 may be formed at a predetermined region of the first sacrificial layer 104a in consideration of locations of connecting portions 175b, 175c, 175d and 175e (see FIG. 32A). Accordingly, the separation hole 113 may substantially overlap the connecting portions 175 in the first direction. In one example embodiment, the separation hole 113 may have a top plan dimension or a cross-section dimension larger than that of the connecting portion 175 at each level. In one example embodiment, the separation hole 113 may have a top plan dimension or a cross-section dimension smaller than that of the connecting portion 175 at each level.

Figure 27:
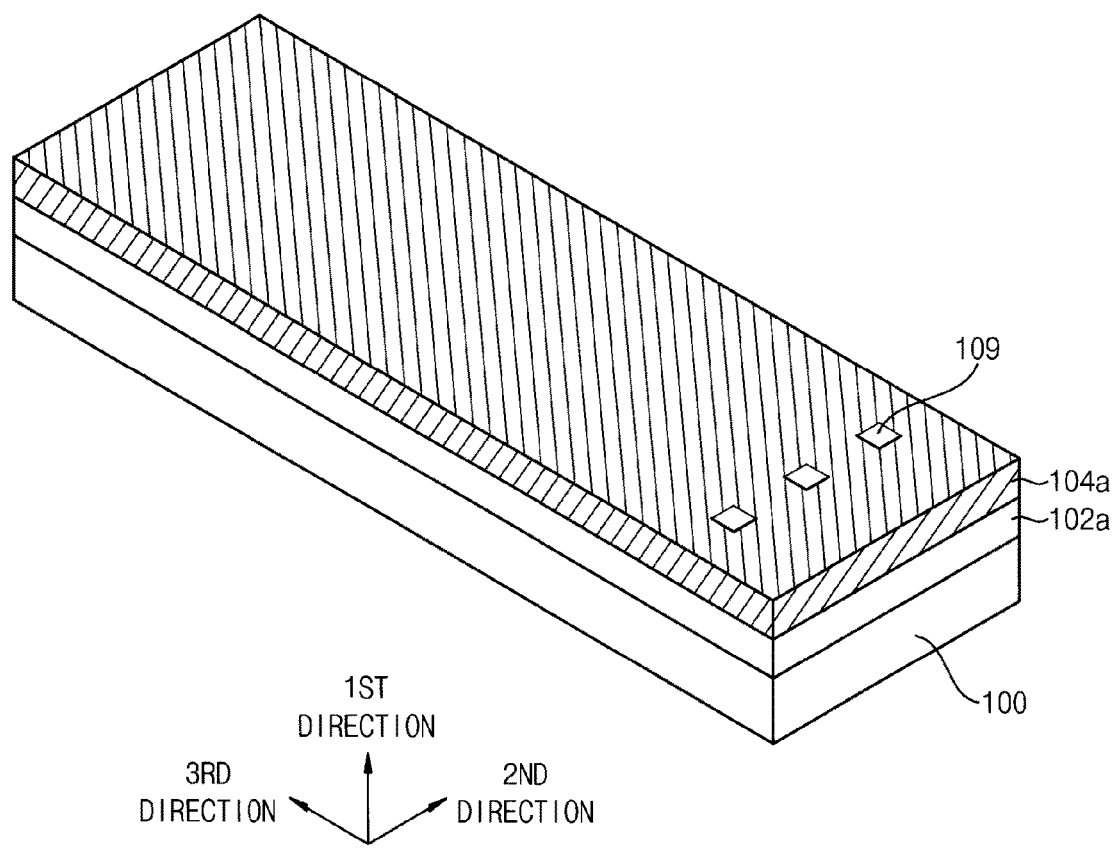

Referring to FIG. 27, a separation layer pattern 109 filling the separation hole 113 may be formed.

In example embodiments, a separation layer sufficiently filling the separation holes 113 may be formed on the first sacrificial layer 104a. An upper portion of the separation layer may be planarized until a top surface of the first sacrificial layer 104a is exposed to form the separation layer pattern 109. The separation layer may be formed using a material that may have an etching selectivity with respect to the first sacrificial layer 104a, e.g., silicon oxide, silicon carbooxide or silicon fluorooxide. The separation layer may be formed by, e.g., a CVD process, a PECVD process or a spin-coating process.

Figure 28:
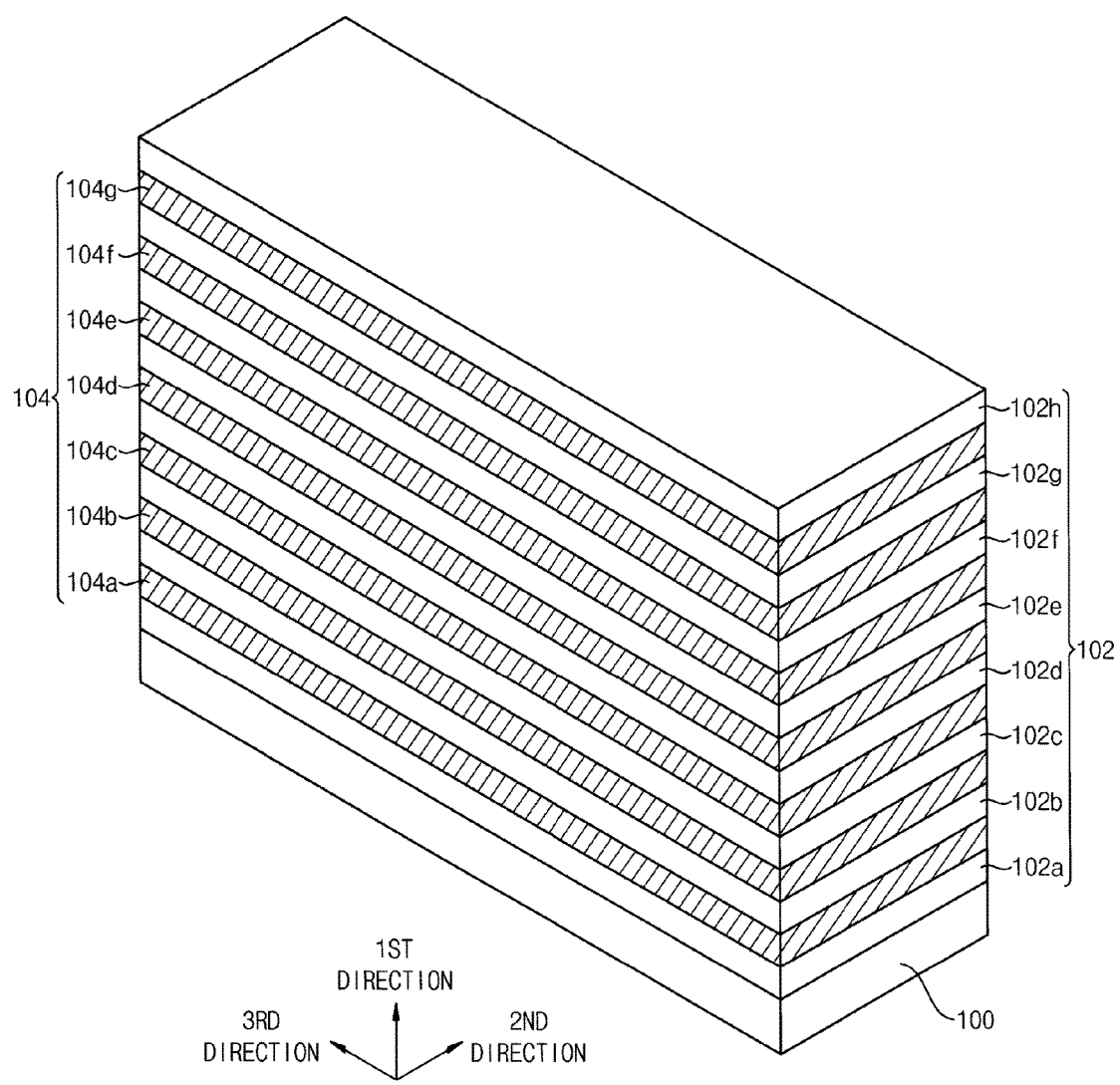

Referring to FIG. 28, a second insulating interlayer 102b and a second sacrificial layer 104b may be sequentially formed on the first sacrificial layer 104a and the separation layer pattern 109. Likewise, insulating interlayers 102c, 102d, 102e, 102f, 102g and 102h, and sacrificial layers 104c, 104d, 104e, 104f and 104g may be alternately and repeatedly formed.

In one example embodiment, the second insulating interlayer 102b may fill the separation holes 113 while being formed on the first sacrificial layer 104a. In this case, a formation of the separation layer may be omitted, and the separation layer pattern 109 and the second insulating interlayer 102b may be merged with or integral with each other.

Figure 29A:
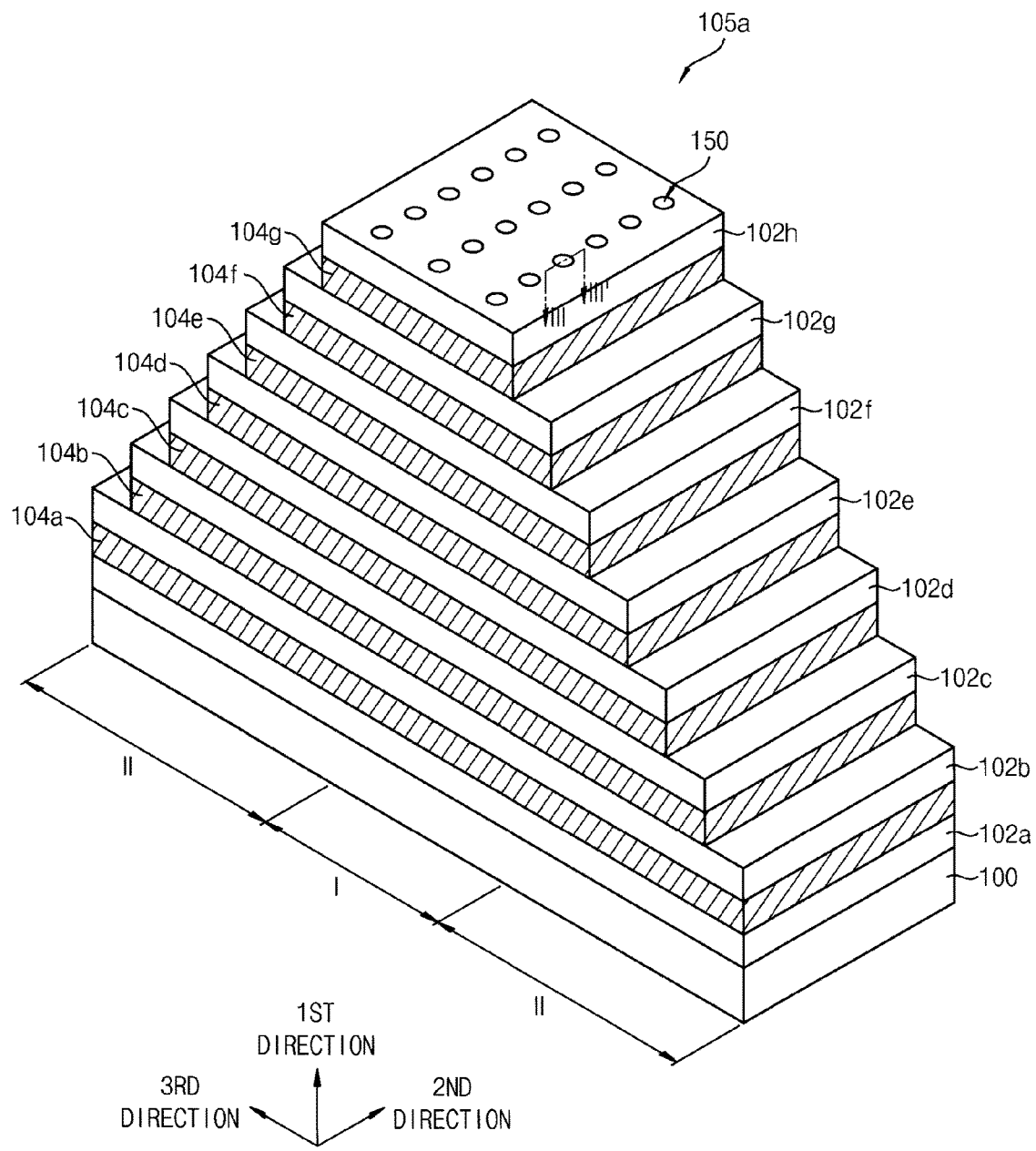
Figure 29B:
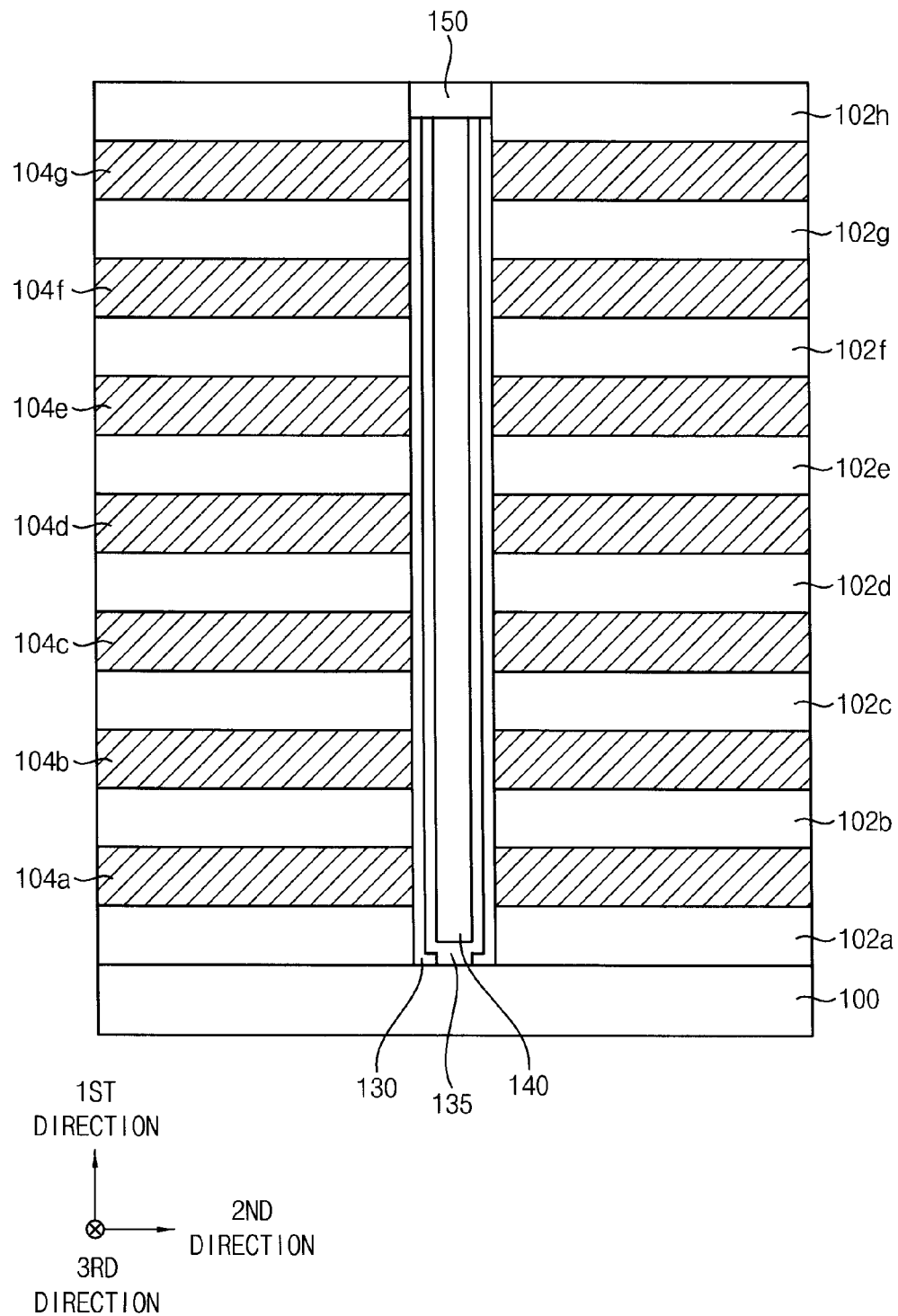

Referring to FIGS. 29A and 29B, processes substantially the same as or similar to those illustrated with reference to FIGS. 8 to 14B may be performed. Accordingly, a mold structure 105a including steps or stairs may be obtained, and a dielectric layer structure 130, a channel 135 and a first filling layer pattern 140 may be formed through the mold structure 105a on a cell region I. A pad 150 may be formed on the dielectric layer structure 130, the channel 135 and the first filling layer pattern 140. A top surface of the pad 150 may be substantially coplanar with a top surface of the uppermost insulating interlayer 102h.

Referring to FIGS. 30A to 30C, a process substantially the same as or similar to that illustrated with reference to FIGS. 15A to 15D may be performed.

Accordingly, the insulating interlayers 102 and the sacrificial layers 104 may be partially etched to form openings 155 between channel rows adjacent in the second direction. The insulating interlayers 102 and the sacrificial layers 104 may be changed into insulating interlayer patterns 106 and sacrificial layer patterns 108, respectively, by forming the openings 155. A fence structure 159 may be formed on an extension region II of the substrate 100 to cut or block the openings 155b, 155c and 155d in-between.

As illustrated in FIG. 30B, the fence structure 159 may include the insulating interlayer patterns 106a, 106b, 106c, 106d, 106e and 106f, and the sacrificial layer patterns 108a', 108b, 108c, 108d, 108e, alternately stacked on each other. The fence structure 159 may further include the separation layer patterns 109 between the two lowermost insulating interlayer patterns 106a and 106b. FIG. 30B illustrates that the fence structure 159 includes three separation layer patterns 109 because three openings 155b, 155c and 155d are cut or blocked by the fence structure 159. However, the number of the separation layer patterns 109 included in the fence structure 159 is not specifically limited.

Referring to FIGS. 31A to 31C, processes substantially the same as or similar to those illustrated with reference to FIGS. 16A to 16D may be performed to remove the sacrificial layer patterns 108 exposed by the openings 155.

Accordingly, first gaps 160 may be defined between the insulation layer patterns 106 adjacent in the first direction, and an outer sidewall of the dielectric layer structure 130 may be partially exposed by the first gaps 160. The sacrificial layer patterns 108 may be also removed from the fence structure 159 such that second gaps 161 may be defined. Additionally, a third gap 161a may be defined between the two lowermost insulating interlayer patterns 106a and 106b included in the fence structure 159. Sidewalls of the separation layer patterns 109 may be exposed by the third gap 161a.

Referring to FIGS. 32A to 32F, processes substantially the same as or similar to those illustrated with reference to FIGS. 17A to 18E may be performed. For example, a gate electrode layer filling the openings 155, the first gaps 160, the second gaps 161 and the third gap 161a may be formed. A portion of the gate electrode layer formed in the openings 155 may be etched to form gate lines 170 in the first gaps 160, the second gaps 161 and the third gap 161a.

Accordingly, SSLs 170g and 170f may be formed in the first gaps 160 of uppermost two levels. Word lines 170e, 170d, 170c and 170b may be formed in the first gaps 160 of 4 levels under the SSLs 170g and 170f. Word lines 170e, 170d, 170c and 170b formed in the second gaps 161 may be connected to or merged with each other by the connecting portions 175e, 175d, 175c and 175b at each level.

The GSL 170a' may be formed in the lowermost first gap 160 and the third gap 161a. The GSLs 170a' formed in the third gap 161a may be physically separated from each other in the second direction by the separation layer patterns 109.

As illustrate in FIG. 32E, a recessed portion 171 may be formed at a region of the GSL 170a' adjacent to the separation layer pattern 109 in the case that the separation layer pattern 109 has a top plan dimension or a cross-section dimension larger than those of the connecting portions 175b, 175c, 175d and 175e.

In one example embodiment, the separation pattern 109a may be formed to have a top plan dimension or a cross-section dimension smaller than those of the connecting portions 175b, 175c, 175d and 175e. In this case, a protrusion 173 may be formed at a region of the GSL 170a' adjacent to the separation layer pattern 109a as illustrated in FIG. 32F. The separation layer pattern 109a may be sandwiched by a pair of the protrusions 173 in the second direction.

Figure 19A:
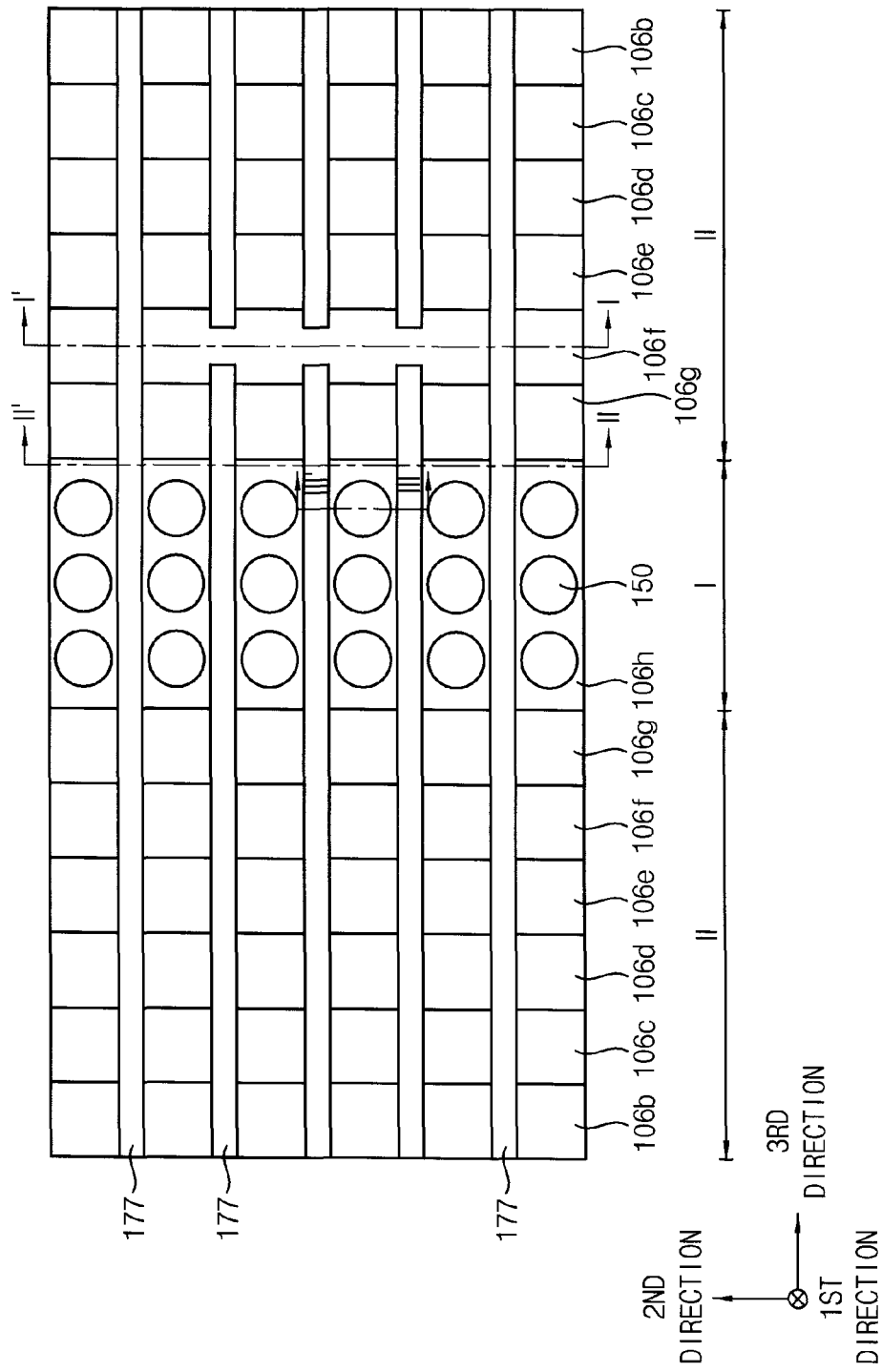
Figure 19B:
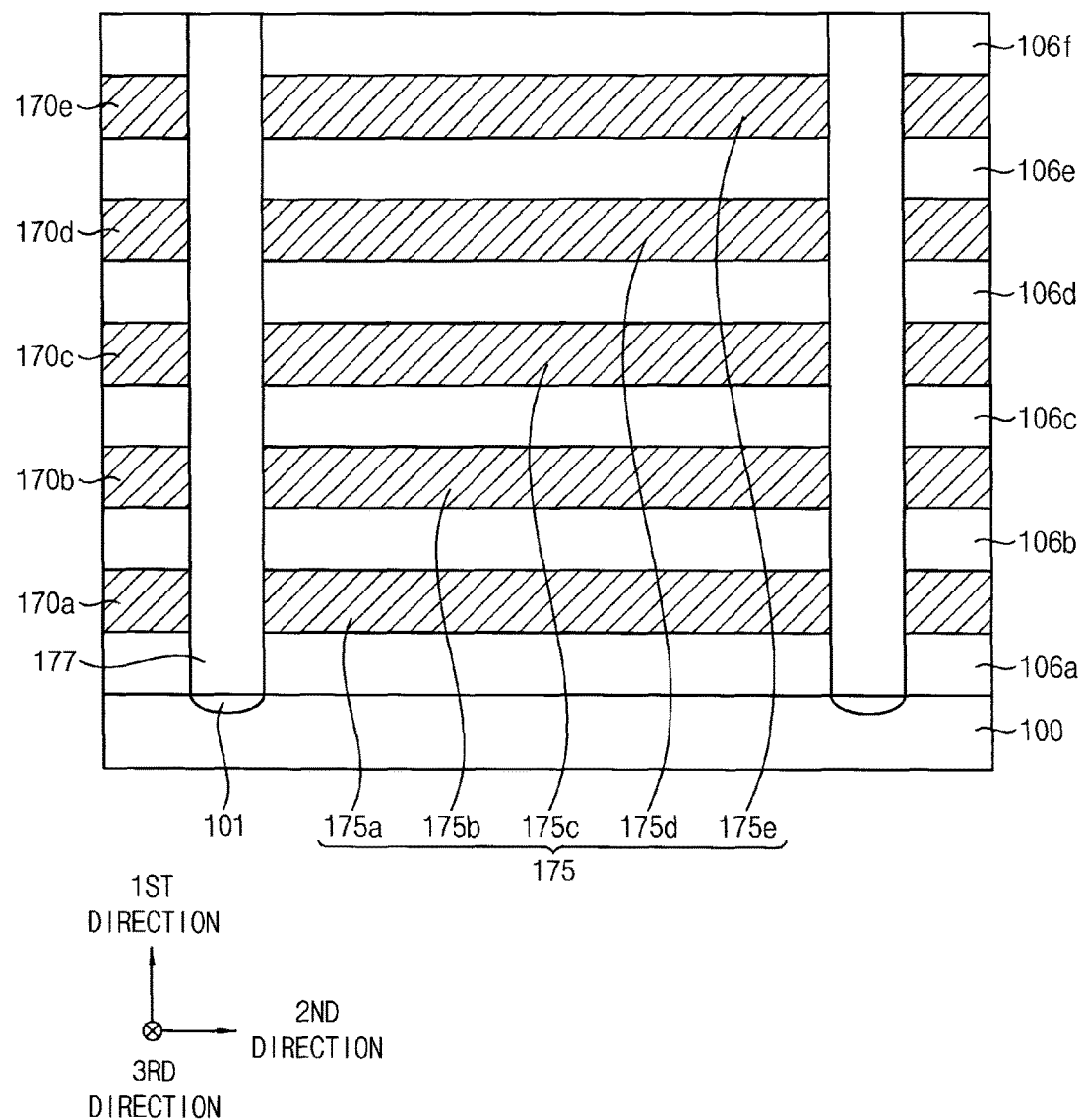
Figure 19C:
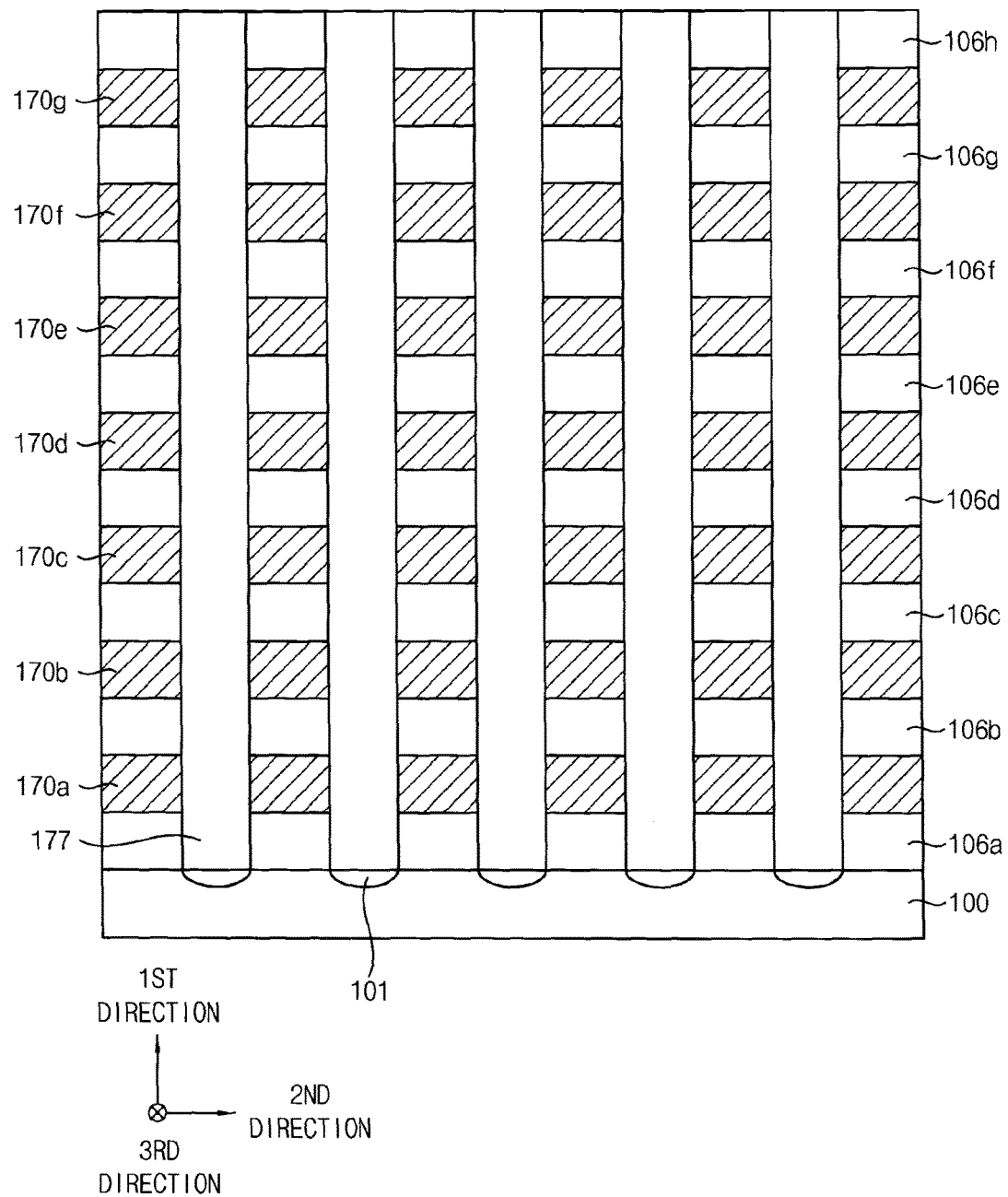
Figure 19D:
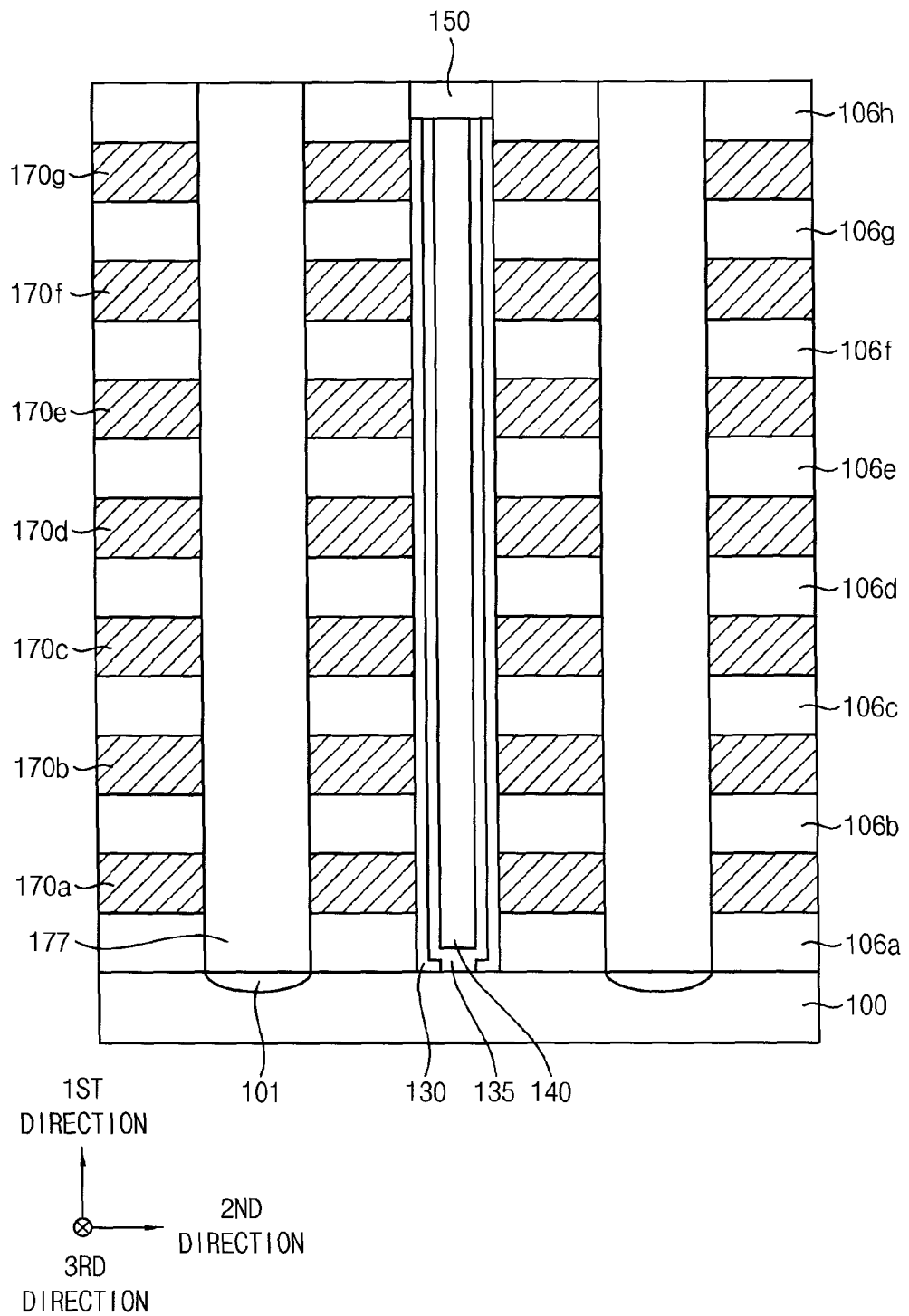

Processes substantially the same as or similar to those illustrated with reference to FIGS. 19A and 20B may be performed to obtain the vertical memory device illustrated in FIGS. 21 to 24B. For example, an impurity region 101 serving as a CSL may be formed on an upper portion of the substrate 100 exposed by the opening 155. A second filling layer pattern 177 filling the opening 155 may be formed on the impurity region 101. A bit line contact 190 may be formed to be in contact with the pad 150. A bit line 195 may be formed to be electrically connected to a plurality of the bit line contacts.

As described above, the separation layer patterns 109 and 109a may be formed in the sacrificial layer 104 that may be replaced with the GSL 170a' before completing the mold structure 105a. When the sacrificial layer patterns 108 are removed after forming the fence structure 159, the separation layer patterns 109 and 109a may not be removed to remain in the fence structure 159. Thus, the GSLs 170a' may be separated from each other by the separation layer patterns 109 and 109a. The SSLs 170g and 170f, and the GSLs 170a' may be separated from each other at each level, and the word lines 170b, 170c, 170d and 170e may be connected to or merged with each other by the connecting portions 175b, 175c, 175d and 175e. Therefore, a reliability of a circuit design and a circuit operation may be improved.

Figure 33:
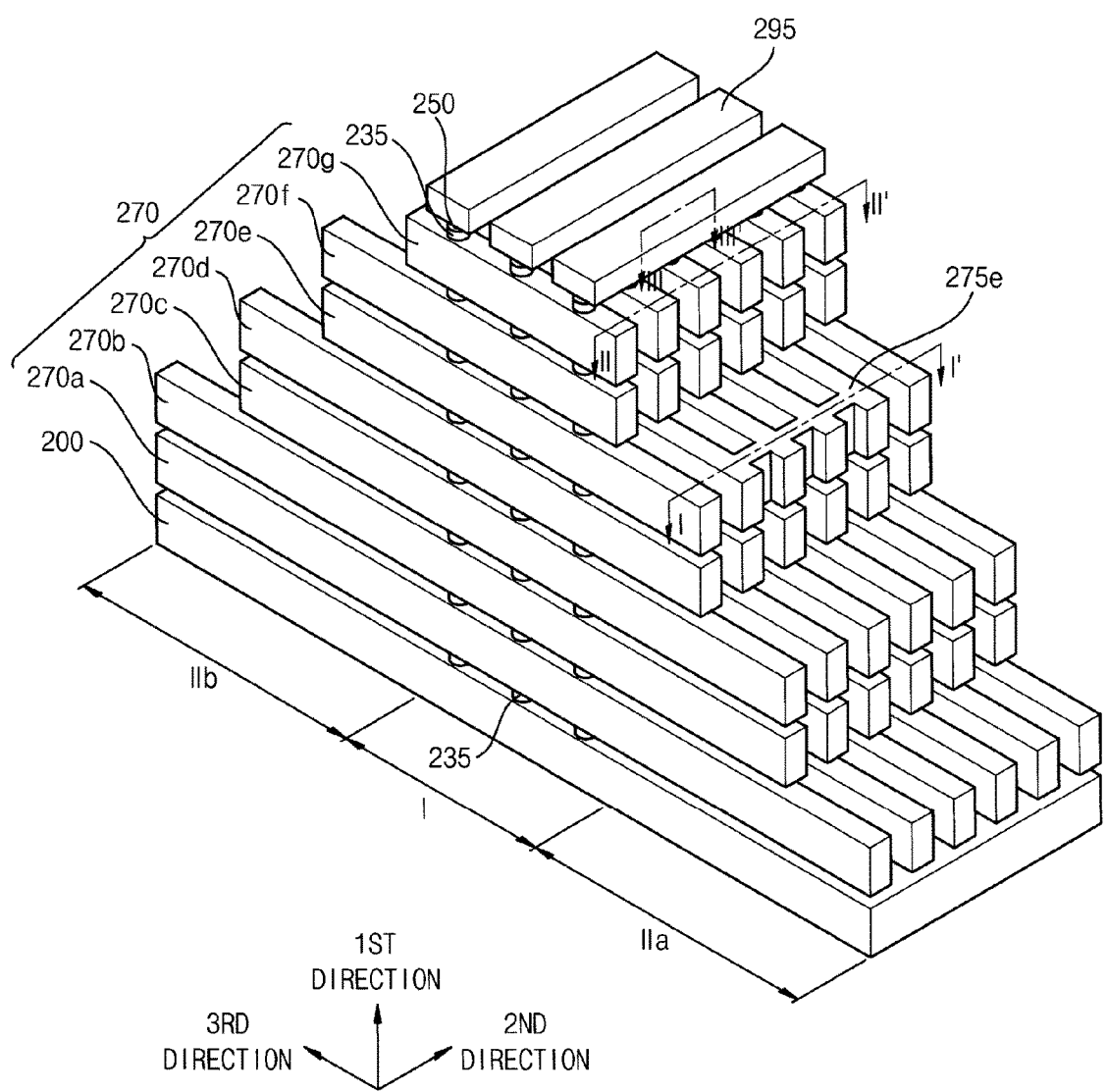
FIG. 33 is a perspective view illustrating a vertical memory device in accordance with example embodiments.
Figure 34:
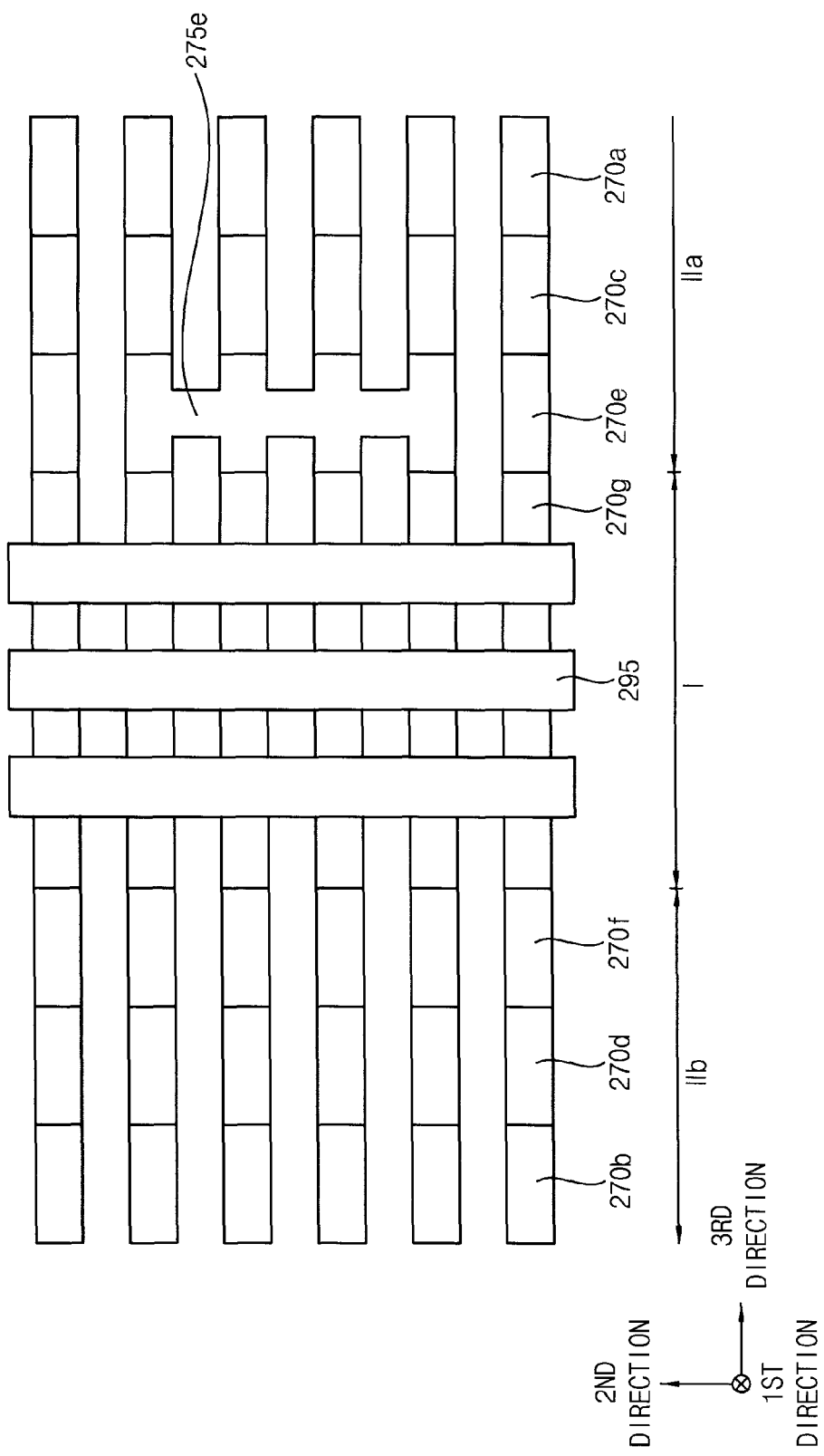
FIG. 34 is an exemplary top plan view illustrating the vertical memory device of FIG. 33, according to one embodiment.
Figure 35:
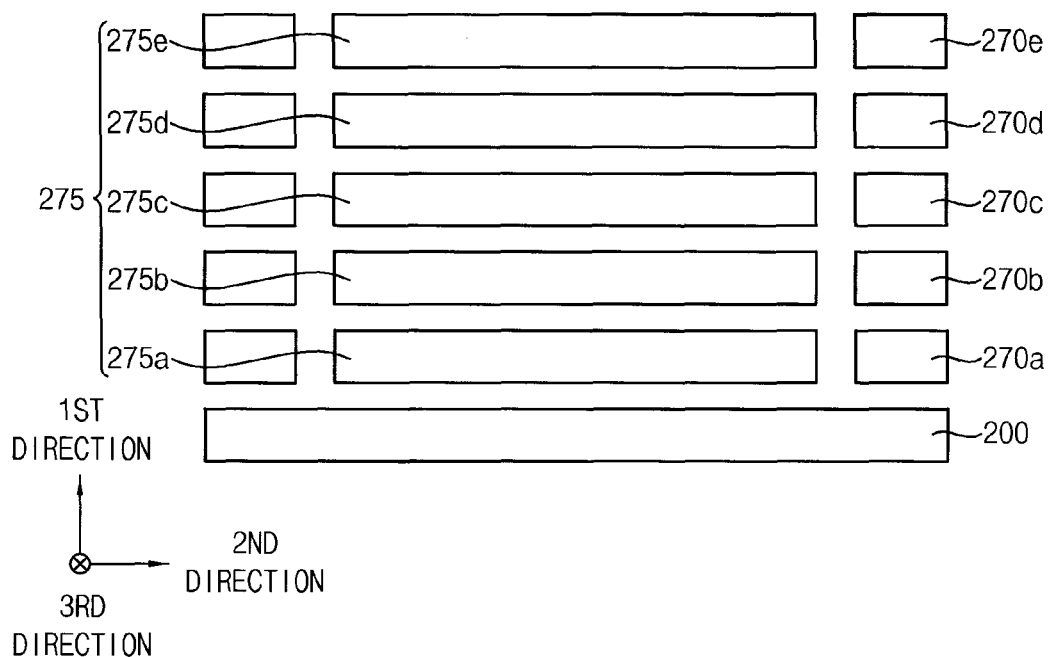
FIGS. 35 to 37 are exemplary cross-sectional views taken along lines I-I', II-II' and III-III' of FIG. 33, respectively, according to certain embodiments.
Figure 36:
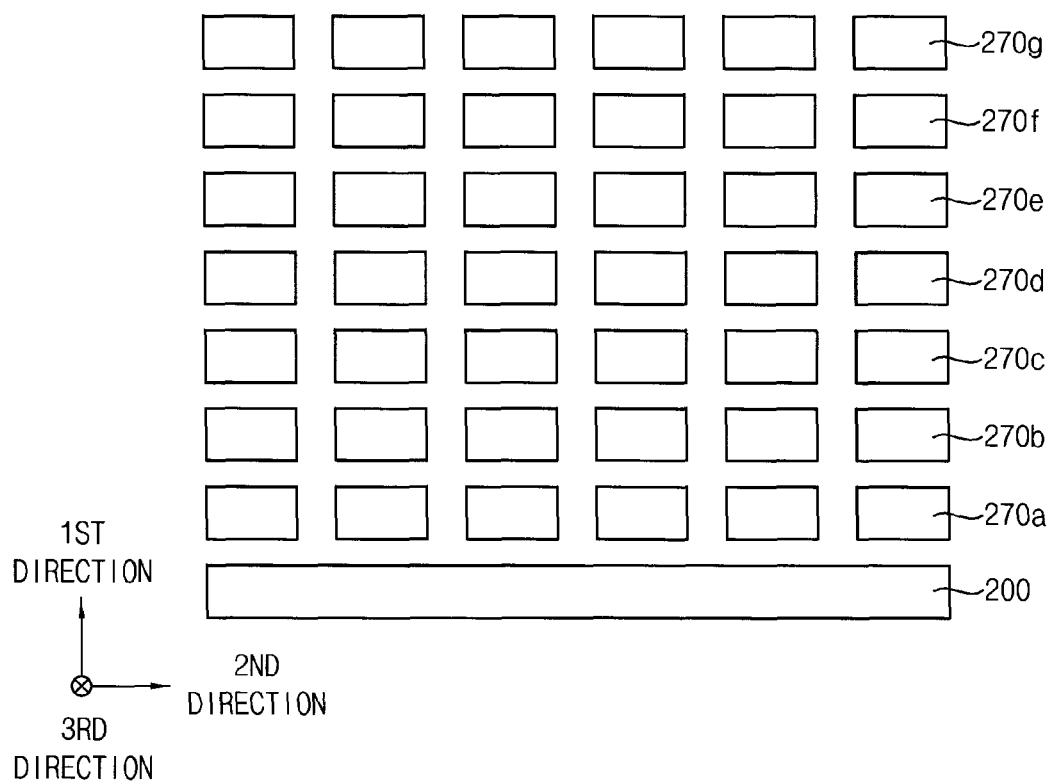
Figure 37:
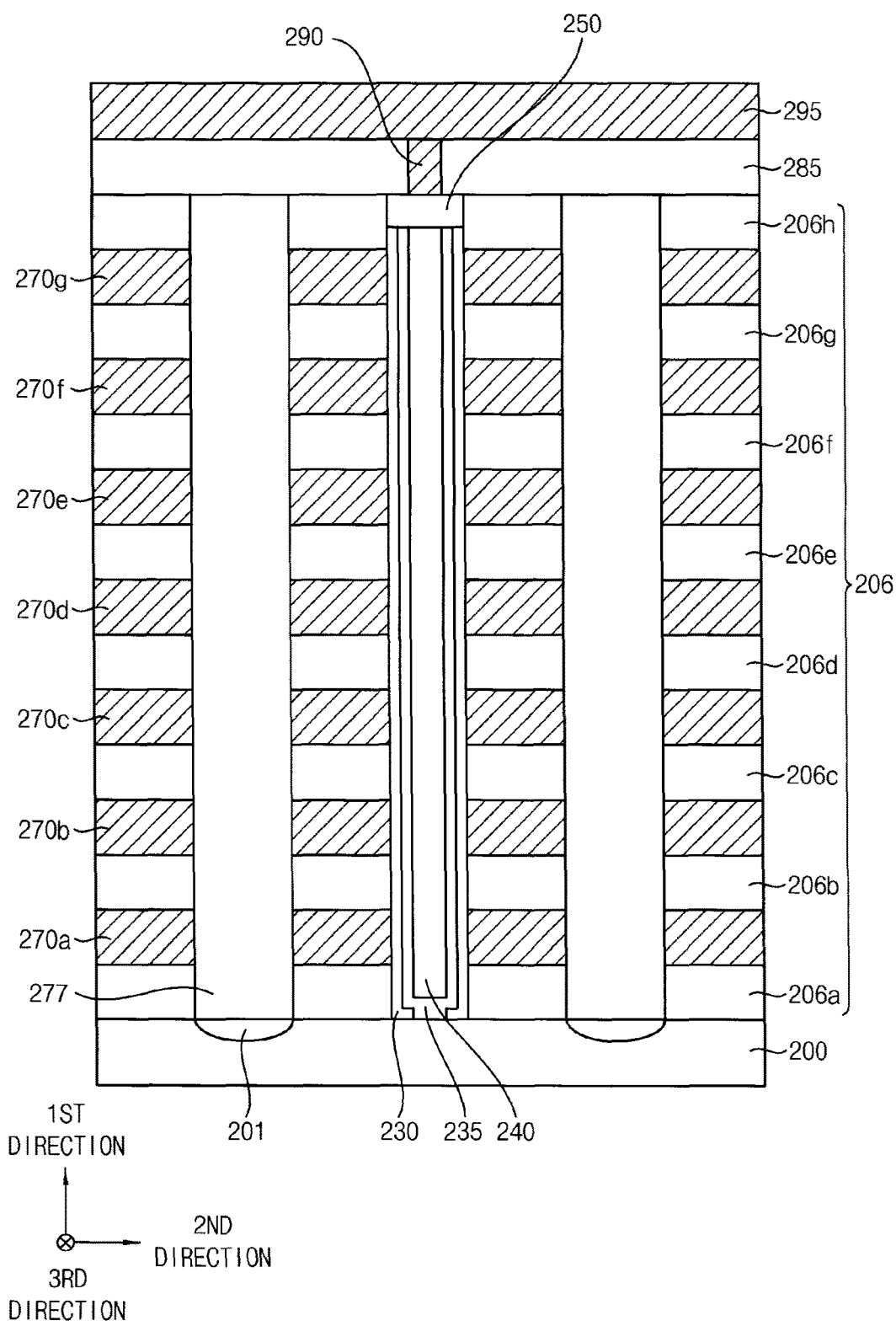

FIGS. 33 to 37 are a perspective view, a top plan view and cross-sectional views illustrating a vertical memory device in accordance with example embodiments. Specifically, FIG. 33 is a perspective view illustrating the vertical memory device. FIG. 34 is a top plan view illustrating the vertical memory device of FIG. 33. FIGS. 35 to 37 are cross-sectional views taken along lines I-I', II-II' and III-III' of FIG. 33, respectively.

For the convenience of explanation, FIGS. 33 to 36 do not show all elements of the vertical semiconductor device, but only shows some elements thereof, e.g., a substrate, a channel, a gate line, a pad and a bit line.

Detailed description on elements and/or constructions substantially the same as or similar to those illustrated with reference to FIGS. 1 to 6B are omitted. Like reference numerals are used to indicate like elements.

Referring to FIGS. 33 to 37, the vertical memory device may include a channel 235 protruding from a substrate 200 in the first direction, a dielectric layer structure 230 surrounding an outer sidewall of the channel 235, and gate lines 270 spaced apart from each other in the first direction and surrounding the dielectric layer structure 230 and the channel 235. A first filling layer pattern 240 may be formed in the channel 235. A pad 250 may be disposed on the dielectric layer structure 230, the channel 235 and the first filling layer pattern 240. A bit line contact 290 in contact with the pad 250 and a bit line 295 electrically connected to the bit line contact 290 may be disposed at an upper portion of the vertical memory device.

In example embodiments, the substrate 200 may include a cell region I and an extension region. The extension region may include a first extension region IIa and a second extension region IIb at both lateral portions of the cell region I.

In the vertical memory device of FIG. 1 to FIG. 6B, the steps or the stairs of the gate lines 170 may be symmetrically arranged with respect to the cell region I. However, according to example embodiments illustrated in FIGS. 33 to 37, the steps or the stairs of the gate lines 270 may be asymmetrically arranged at the first extension region IIa and the second extension region IIb.

In example embodiments, extension portions of the gate lines 270 may alternately protrude in the third direction on the first extension region IIa and the second extension region IIb. For example, as illustrated in FIGS. 33 and 34, a top surface of a seventh gate line 270a may be exposed on the first extension region IIa, a top surface of a sixth gate line 270b may be exposed on the second extension region IIb, and a top surface of a fifth gate line 270c may be exposed on the first extension region IIa. Likewise, top surfaces of remaining gate lines 270d, 270e, 270f and 270g may be exposed alternately on the second extension region IIb and the first extension region IIa. Therefore, the extension portions of the gate lines 270 may form the steps or the stairs alternately protruding or exposed on the first and second extension regions IIa and IIb in a zigzag arrangement.

In example embodiments, the lowermost seventh gate line 270a may serve as a GSL of the vertical memory device, and the gate lines 270b, 270c, 270d, 270e at 4 levels on the GSL may serve as word lines. The gate lines 270f and 270g at 2 levels on the word lines may serve as SSLs. The number of the SSL, the word line and the SSL may be adjusted in consideration of a circuit design and an integration degree of the vertical memory device.

In example embodiments, the word lines 270b, 270c, 270d and 270e may be connected to or merged with each other at each level by connecting portions 275 in the second direction. For example, first word lines 270e, second word lines 270d, third word lines 270c and fourth word lines 270b may be connected by a first connecting portion 275e, a second connecting portion 275d, a third connecting portion 275c and a fourth connecting portion 275b, respectively. The GSLs 270a may be also connected to each other by a fifth connecting portion 275a. The connecting portion 275 may be diverged from the gate line 270 and may be integral with the gate line 270. The SSLs 270f and 270g may be physically separated from each other at each level and extend in the third direction.

FIGS. 33 to 35 illustrate that four gate lines 270 may be connected by the connecting portion 275 to form a gate line group or a word line group. However, the number of the gate lines 170 included in one gate line group or one word line group is not specifically limited, and may be properly adjusted in consideration of a circuit construction of the vertical memory device.

In example embodiments, the connecting portions 275 may be located on the extension region. The connecting portions 275 may be located on the first extension region IIa as illustrated in FIGS. 33 and 34. However, the connecting portions 275 may be located on the second extension region IIb. In example embodiments, the connecting portions 275 may be located on at least one of the first extension region IIa and the second extension region IIb.

As illustrated in FIG. 37, insulating interlayer patterns 206 may be disposed between the gate lines 270 adjacent in the first direction. An impurity region 201 may be formed at an upper portion of the substrate 200 between adjacent strings. A second filling layer pattern 277 may be formed on the impurity region 201 to serve as a gate line cut pattern. An upper insulation layer 285 may be formed on an uppermost insulating interlayer pattern 206h, the pad 250 and the second filling layer pattern 277. The bit line contact 290 may be formed through the upper insulation layer 285 to be in contact with the pad 250. The bit line 295 may be formed on the upper insulation layer 285 to be electrically connected to the pad 250 via the bit line contact 290. The bit line 295 may extend in the second direction on the cell region I to be electrically connected to a plurality of the channels 235 or the pads 250.

As illustrated in FIGS. 33 and 34, in the case that the gate lines 270 have the zigzag arrangement alternately on the first and second extension regions IIa and IIb, contact or wiring structures for grouping the gate lines 270 or the word lines are not capable of being formed on one of the extension regions. However, according to example embodiments, the word lines 270e, 270d, 270c and 270b may be connected to or merged with each other at each level by the connecting portions 275 diverged from the gate lines 270, so that gate line groups or word line groups may be formed without the contact or wiring structures.

Figure 38:
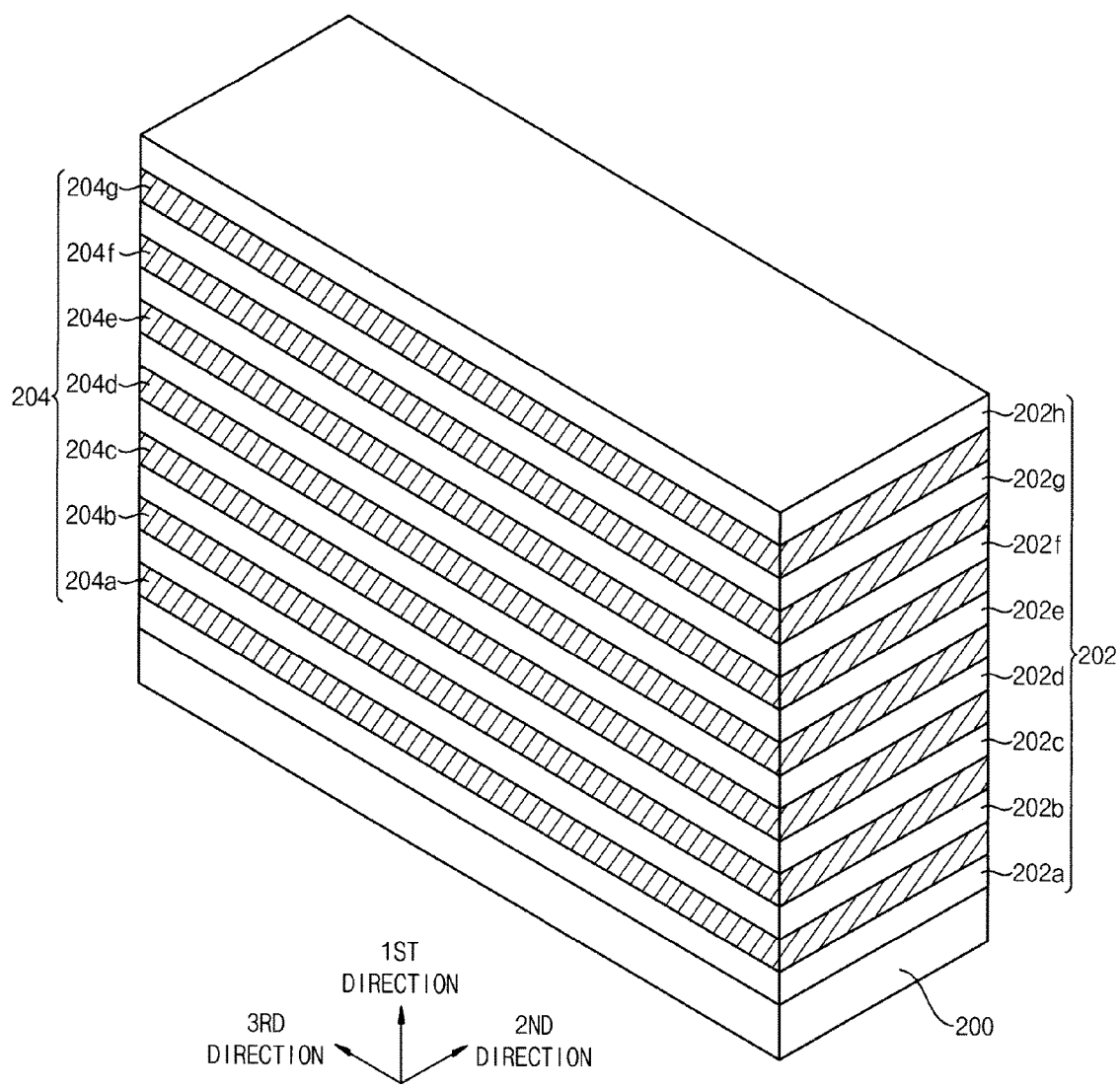
FIGS. 38 to 42D are perspective views, a top plan view and cross-sectional views illustrating a method of manufacturing a vertical memory device in accordance with example embodiments.
Figure 39:
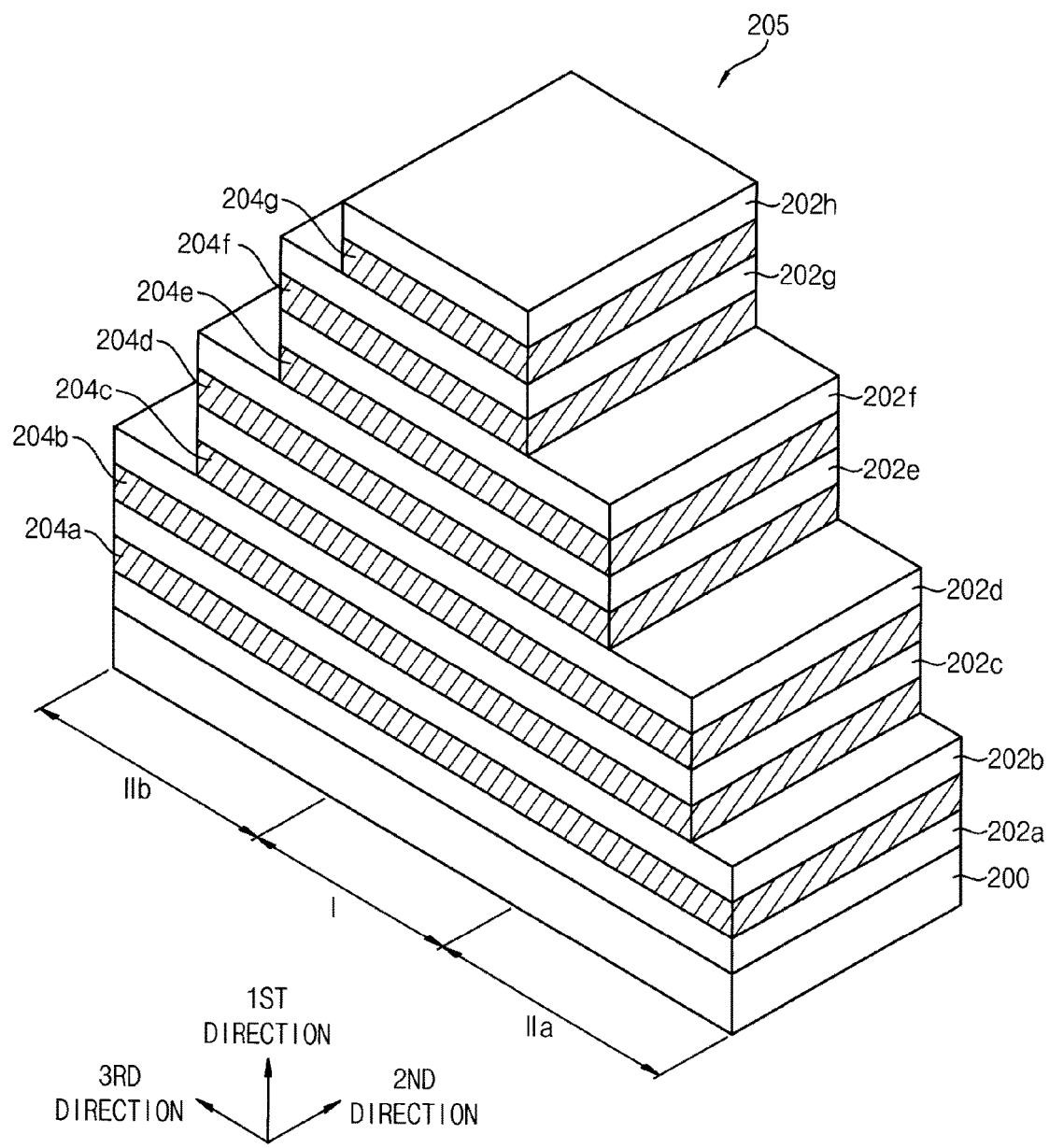
Figure 42A:
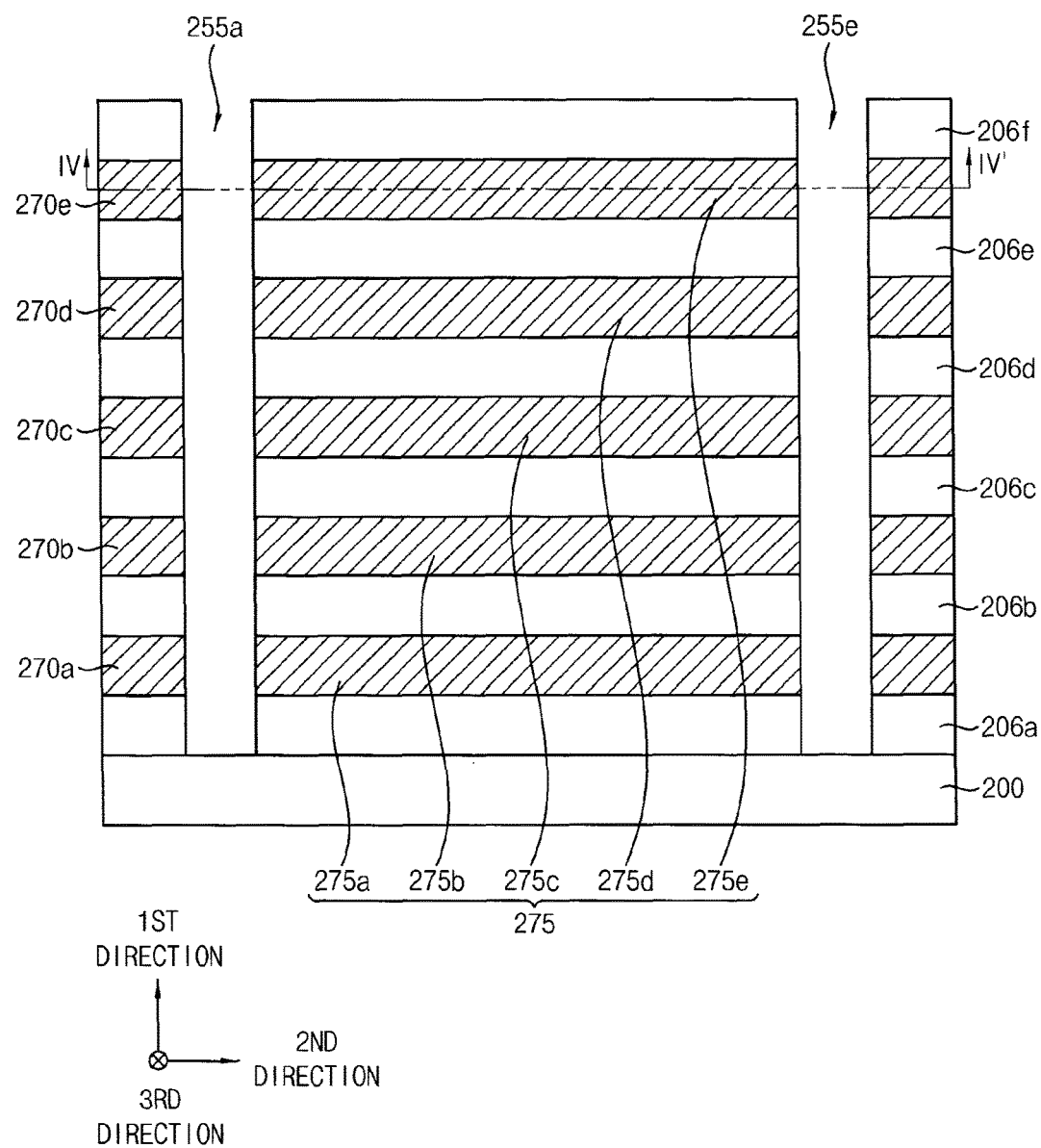
Figure 42B:
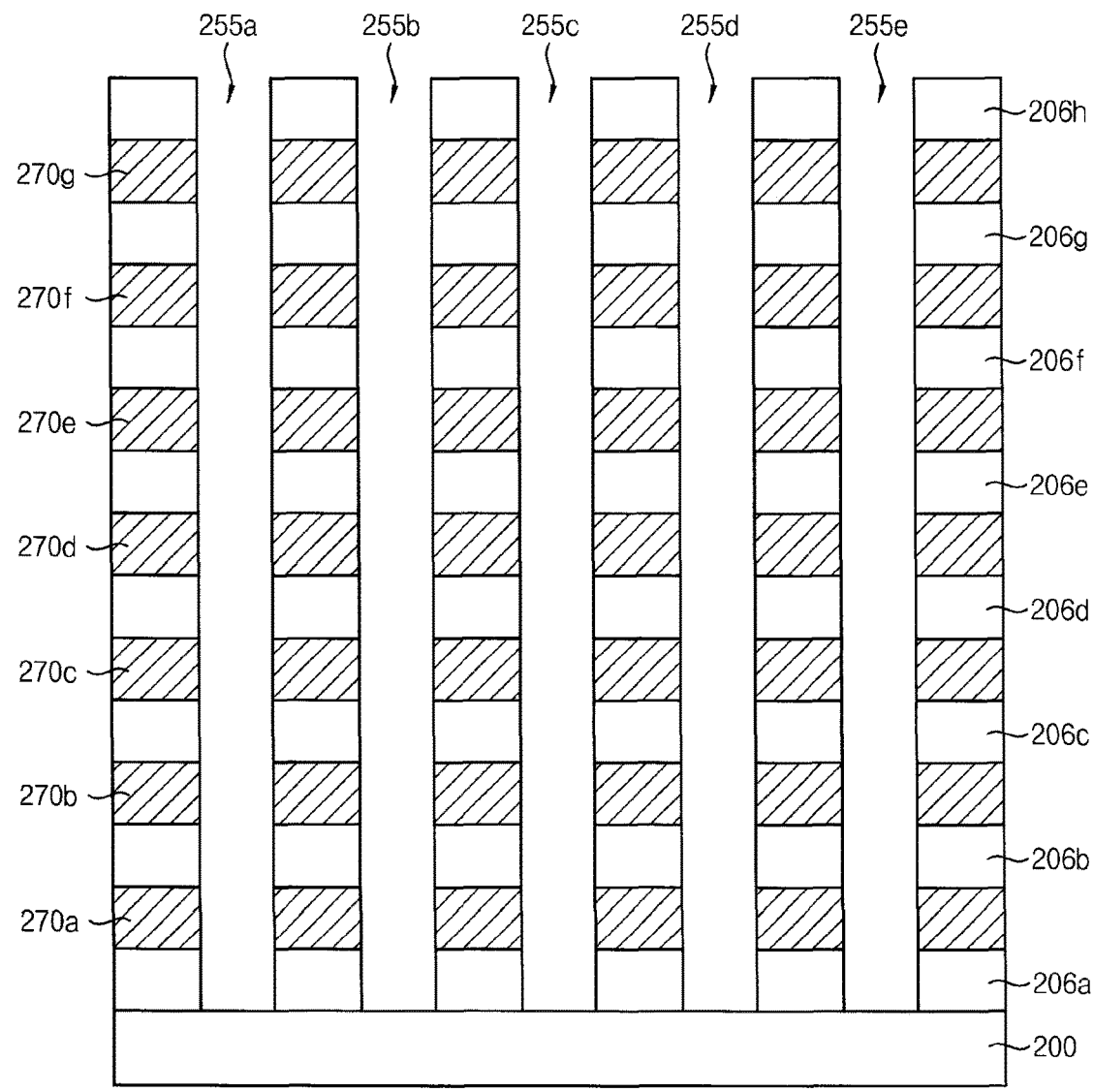
Figure 42C:
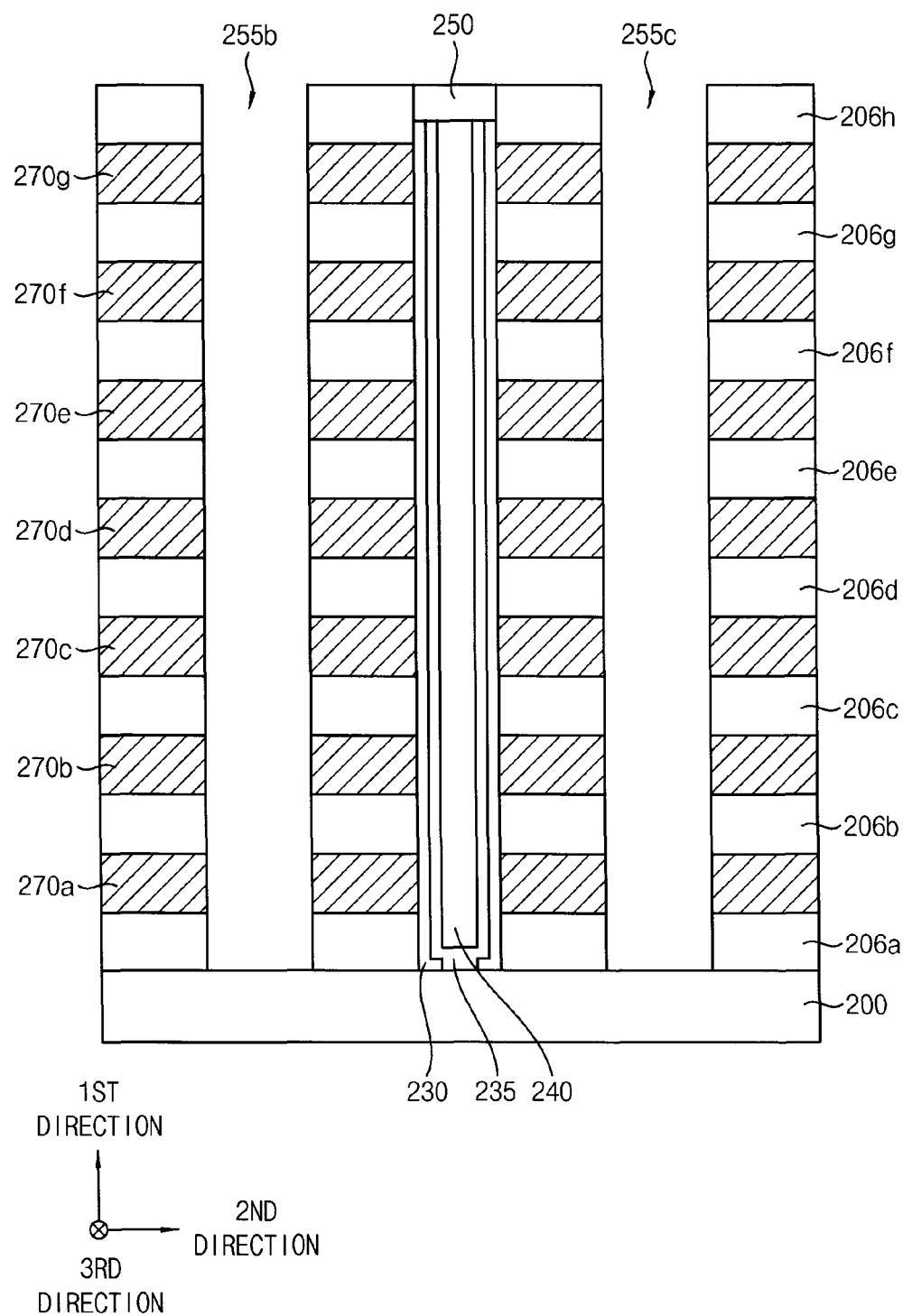
Figure 42D:
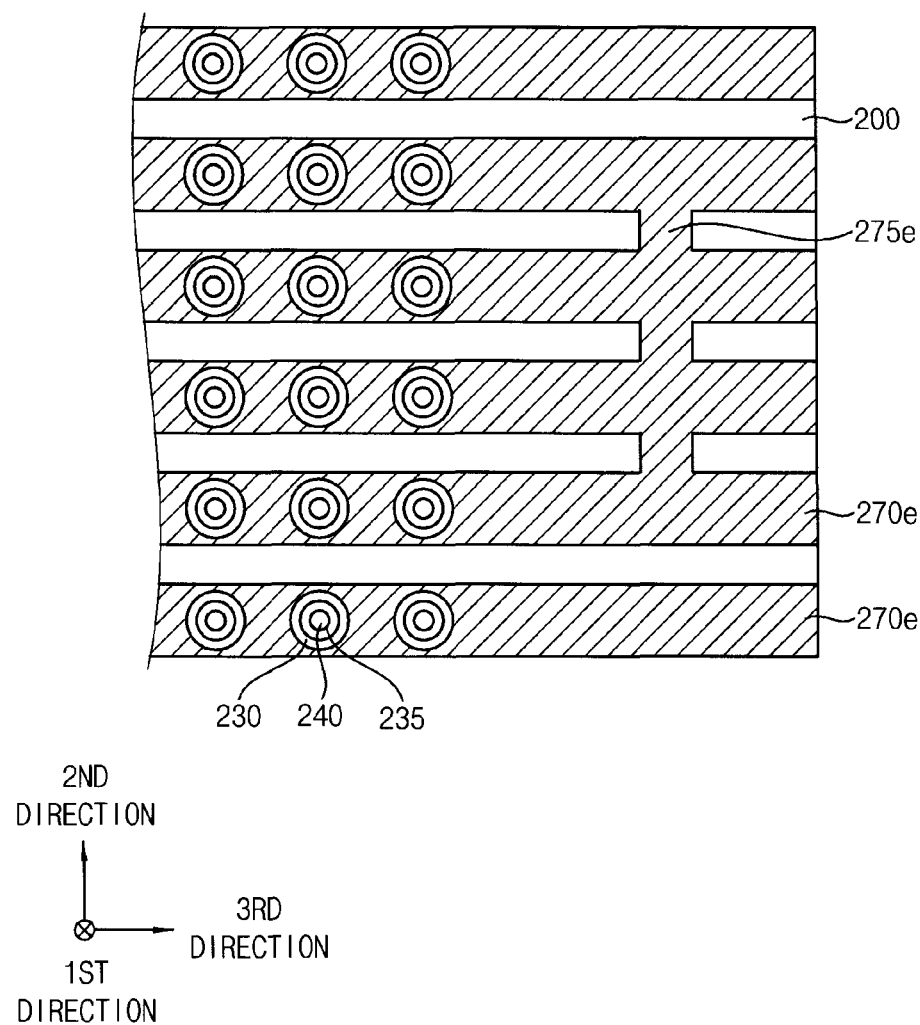

FIGS. 38 to 42D are perspective views, a top plan view and cross-sectional views illustrating a method of manufacturing a vertical memory device in accordance with example embodiments. Specifically, FIGS. 38, 39 and 40A are perspective views illustrating the method of manufacturing the vertical memory device. FIG. 41A is a top plan view illustrating the method of manufacturing the vertical memory device. FIGS. 41B and 42A are cross-sectional views taken along a line I-I' in the first direction. FIGS. 41C and 42B are cross-sectional views taken along a line II-II' in the first direction. FIGS. 40B, 41D and 42C are cross-sectional views taken along a line III-III' in the first direction. FIG. 42D is a cross-sectional view taken along a line IV-IV' of FIG. 42A.

Detailed descriptions on processes and/or materials substantially the same as or similar to those illustrated with reference to FIGS. 7 to 20B are omitted.

Processes for a formation of a mold structure or gate lines having steps of the zigzag arrangement are further described in Korean Patent Application No. 10-2012-0091920 which is incorporated by reference herein in its entirety.

Referring to FIG. 38, a process substantially the same as or similar to that illustrated with reference to FIG. 7 may be performed to alternately and repeatedly form insulating interlayers 202 and sacrificial layers 204 on a substrate 200.

Referring to FIG. 39, both lateral portions of the insulating interlayers 202 and the sacrificial layers 204 may be etched to form a mold structure 205 having steps of a zigzag arrangement.

In example embodiments, a photoresist pattern (not illustrated) partially covering an uppermost insulating interlayer 202h may be formed on the uppermost insulating interlayer 202h. Portions of the insulating interlayers 202h, 202g, 202f, 202e, 202d and 202c, and the sacrificial layers 204g, 204f, 204e, 204d, 204c and 204b on a first extension region IIa may be removed using the photoresist pattern as an etching mask. A portion of the photoresist pattern covering a second extension region IIb may be partially removed such that a width of the photoresist pattern may be reduced. Portions of the insulating interlayers 202h, 202g, 202f, 202e and 202d, and the sacrificial layers 204g, 204f, 204e, 204d and 204c on the second extension region IIb may be removed using the photoresist pattern as an etching mask. Likewise, the etching process may be repeated alternately on the first extension region IIa and the second extension region IIb to obtain the mold structure 205 of FIG. 39.

In the etching process described with reference to FIG. 8, the insulating interlayers 102 and the sacrificial layers 104 on both extension regions II may be etched simultaneously in a single etching step. However, in the process described with reference to FIG. 39, the single etching step may be performed on one region of the first extension region IIa and the second extension region IIb. Thus, a total etching amount may be reduced so that a damage of the photoresist pattern may be prevented.

Figure 40A:
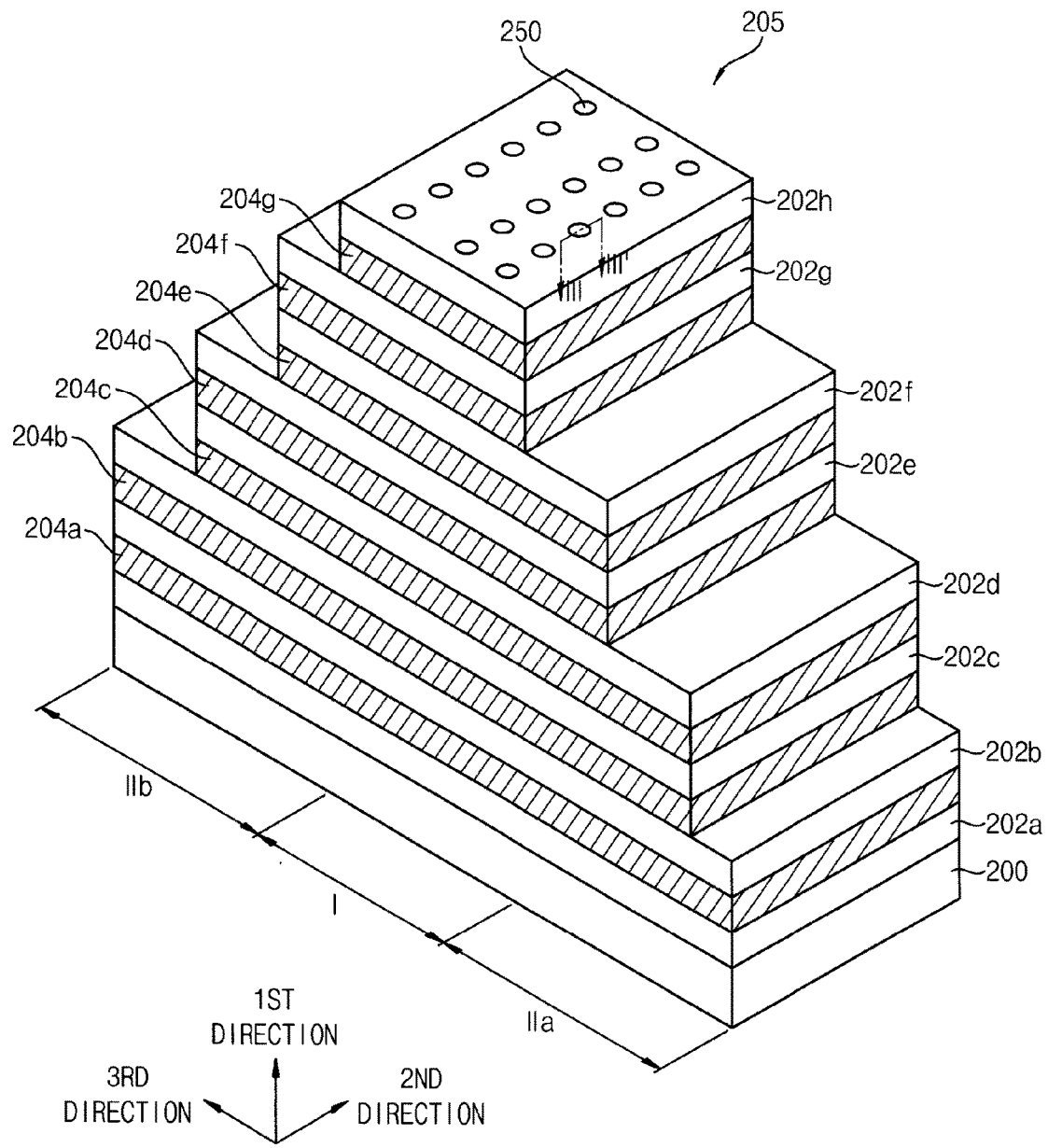
Figure 40B:
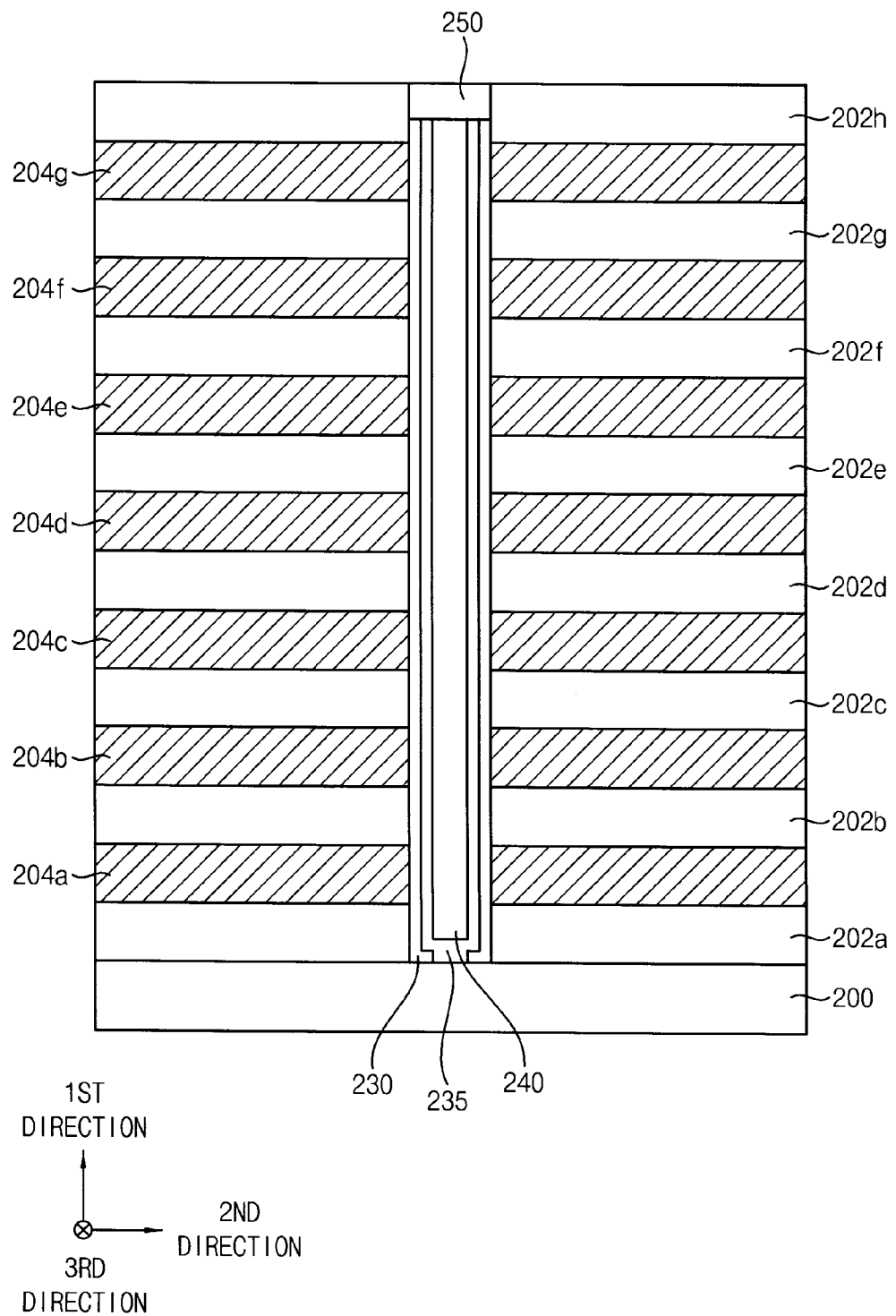
Figure 41A:
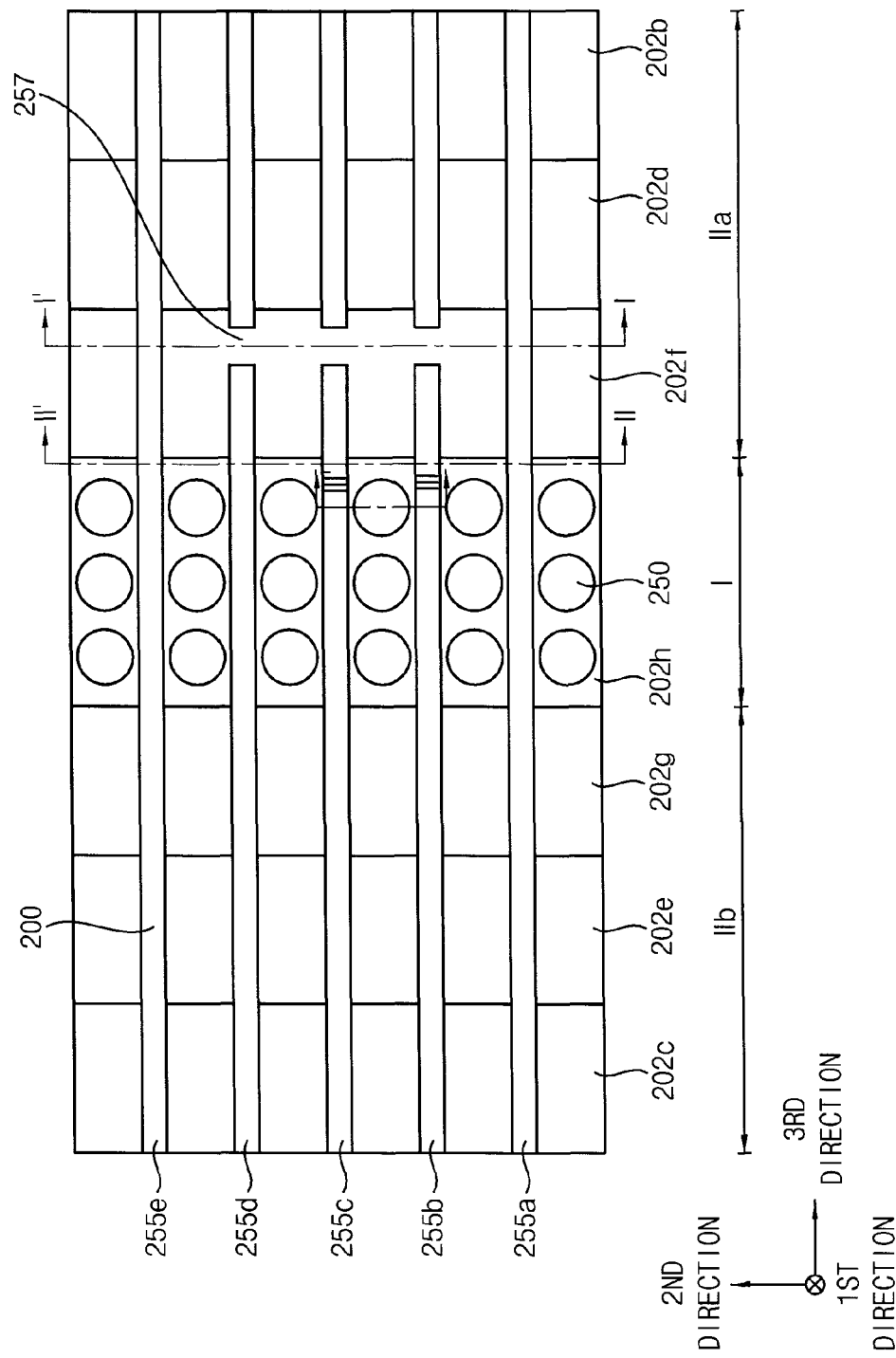
Figure 41C:
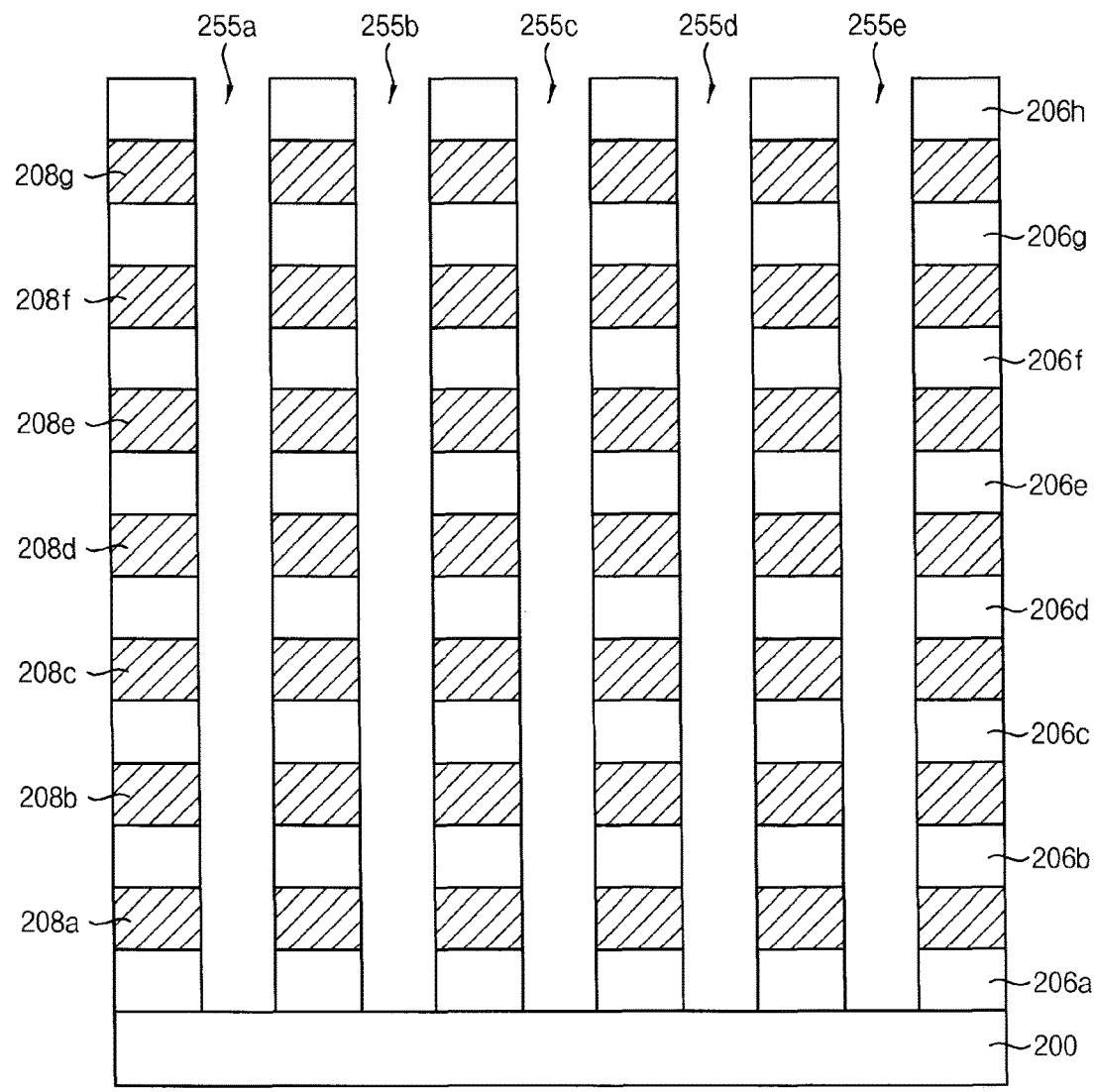
Figure 41D:
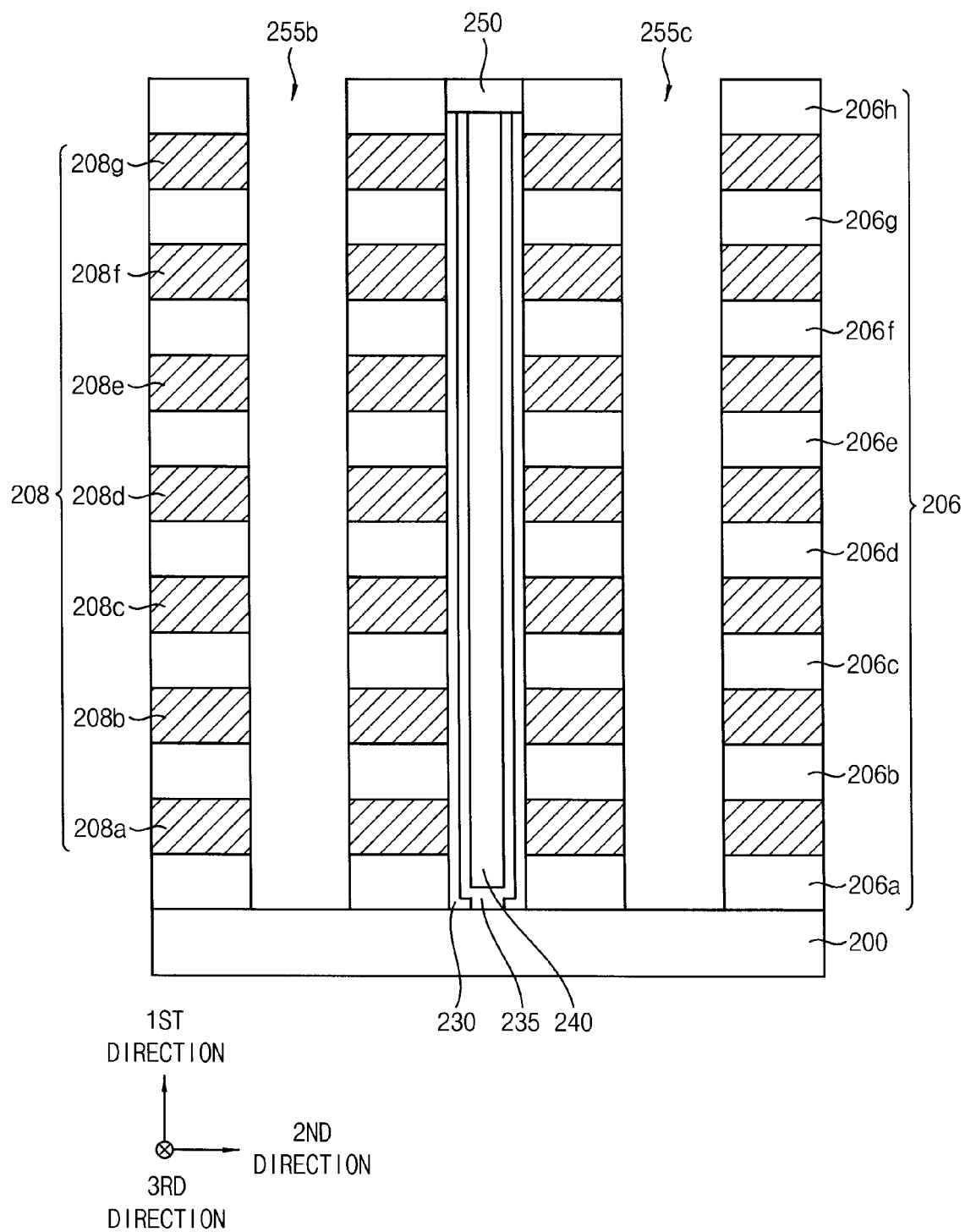

Referring to FIGS. 40A and 40B, processes substantially the same as or similar to those illustrated with reference to FIGS. 9A to 14B may be performed. Accordingly, a dielectric layer structure 230, a channel 235 and a first filling layer pattern 240 may be formed through the mold structure 205 on a cell region I. A pad 250 may be formed on the dielectric layer structure 230, the channel 235 and the first filling layer pattern 240.

Referring to FIGS. 41A to 41D, processes substantially the same as or similar to those illustrated with reference to FIGS. 15A to 15D may be performed.

Accordingly, openings 255 may be formed through the insulating interlayers 202 and the sacrificial layers 204 between adjacent channel rows. The insulating interlayers 202 and the sacrificial layers 204 may be changed into insulating interlayer patterns 206 and sacrificial layer patterns 208 by a formation of the openings 255. A fence structure 257 may be formed on the first extension region IIa to cut or block the openings 255b, 255c and 255d in-between. As illustrated in FIG. 41B, the fence structure 257 may include the insulating interlayer patterns 206a, 206b, 206c, 206d, 206e and 206f, the sacrificial layer patterns 208a, 208b, 208c, 208d and 208e, alternately and sequentially stacked from a top surface of the substrate 200.

In one example embodiment, the fence structure 257 may be formed on the second extension region IIb.

Referring to FIGS. 42A to 42D, processes substantially the same as or similar to those illustrated with reference to FIGS. 15A to 18E may be performed. Accordingly, the sacrificial layer patterns 208 exposed by the openings 255 may be removed, and gate lines 270 may be formed at spaces from which the sacrificial layer patterns 208 are removed. In example embodiments, two uppermost gate lines 207g and 207f may serve as SSLs, and the gate lines 270e, 270d, 270c and 270b at four levels under the SSLs may serve as word lines. A lowermost gate line 270a may serve as a GSL. As illustrated in FIGS. 42A and 42D, connecting portions 275e, 275d, 275c and 275b may be formed at spaces from which the sacrificial layer patterns 208 of the fence structure 257 are removed, such that the word lines 270e, 270d, 270c and 270b at each level may be connected to or merged with each other in the second direction. The GSLs 270a may be also connected to each other by a connecting portion 275a.

Processes substantially the same as or similar to those illustrated with reference to FIGS. 19A to 20B may be performed to obtain the vertical memory device illustrated in FIGS. 33 to 37. For example, an impurity region 201 serving as a CSL may be formed at an upper portion of the substrate 200 exposed by the opening 255. A second filling layer pattern 277 may be formed to fill the opening 255. A bit line contact 290 may be formed on the pad 250, and a bit line 295 may be formed on the bit line contact 290 to be electrically connected thereto.

In one example embodiment, as illustrated with reference to FIGS. 21 to 24B, the GSLs 270a may be separated from each other in the second direction to extend in the third direction. In this case, processes substantially the same as or similar to those illustrated with reference to FIGS. 25 to 32F may be performed such that the GSLs 270a may be separated from each other. In one example embodiment, separation layer patterns overlapping the connecting portions 275 may be formed in the first sacrificial layer 204a. The GSLs 270a may be separated by the separation layer patterns.

According to example embodiments, the word lines 270b, 270c, 270d and 270e at each level may be connected to or merged with each other by the connecting portions 275b, 275c, 275d and 275e in the gate line structure having a zigzag and asymmetrical arrangement. The GSLs 270a may be optionally connected to each other by the connecting portion 275a or separated from each other by the separation layer pattern in consideration of a circuit design.

Figure 43:
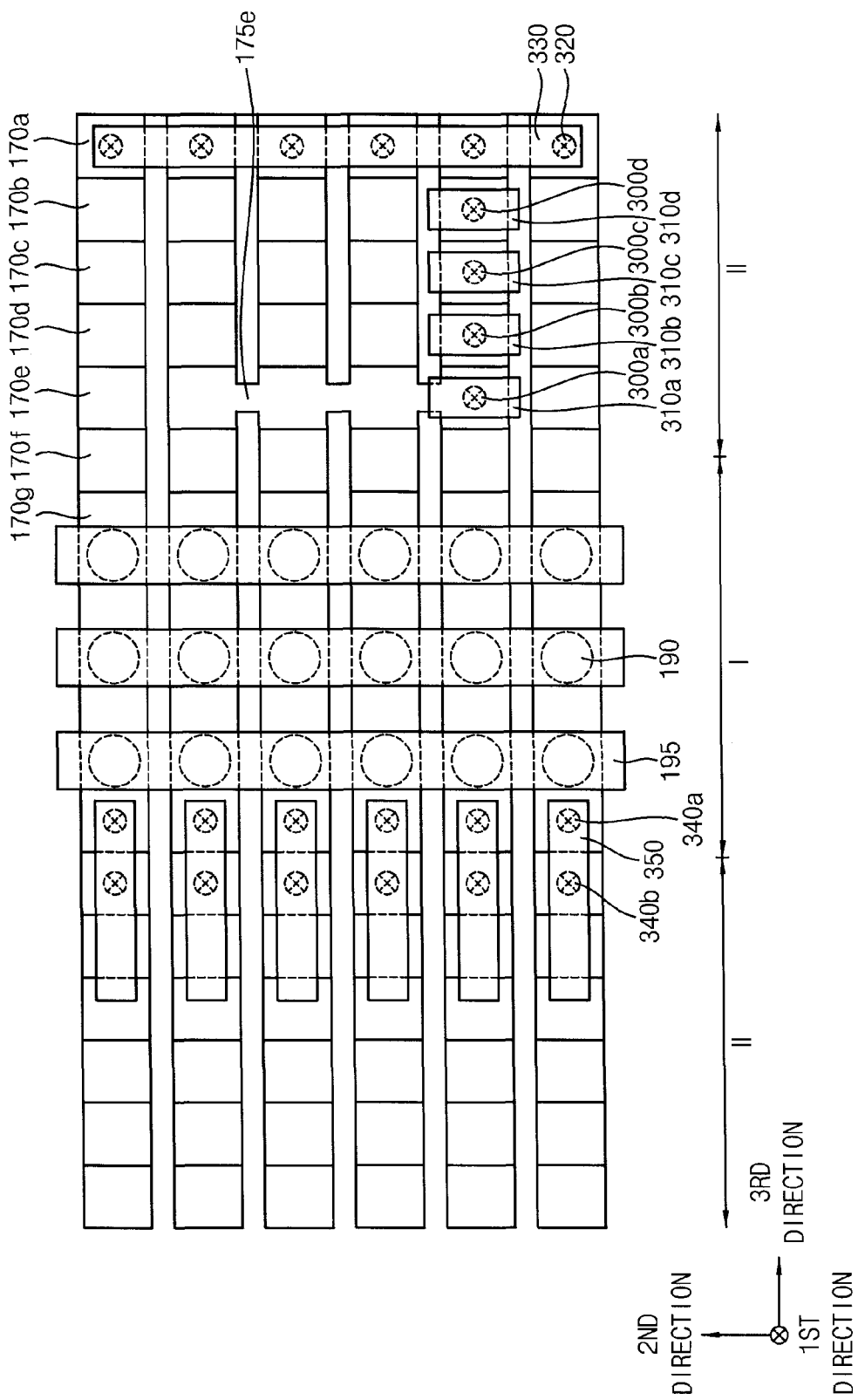
FIGS. 43 to 45 are top plan views illustrating vertical memory devices in accordance with example embodiments.
Figure 44:
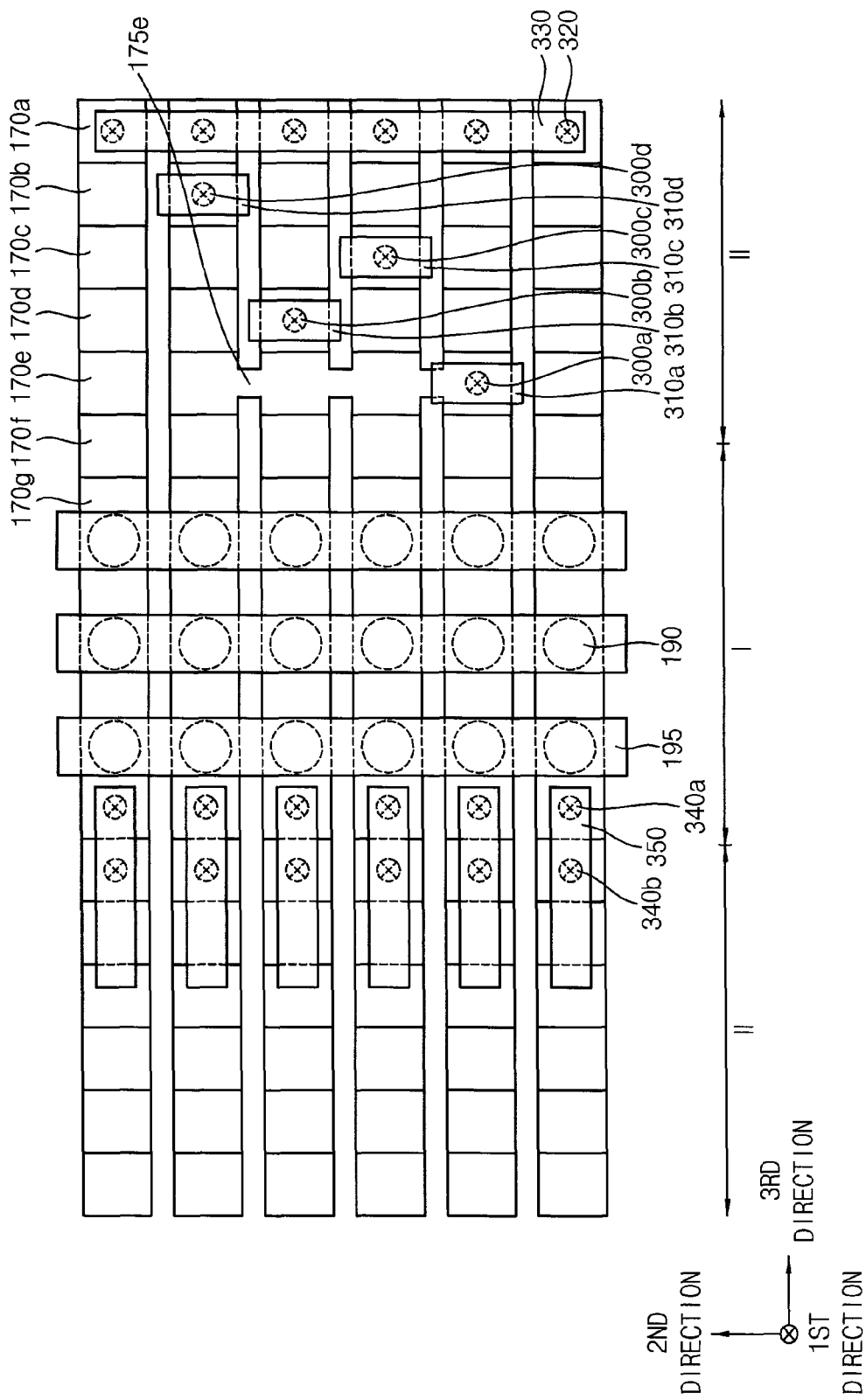
Figure 45:
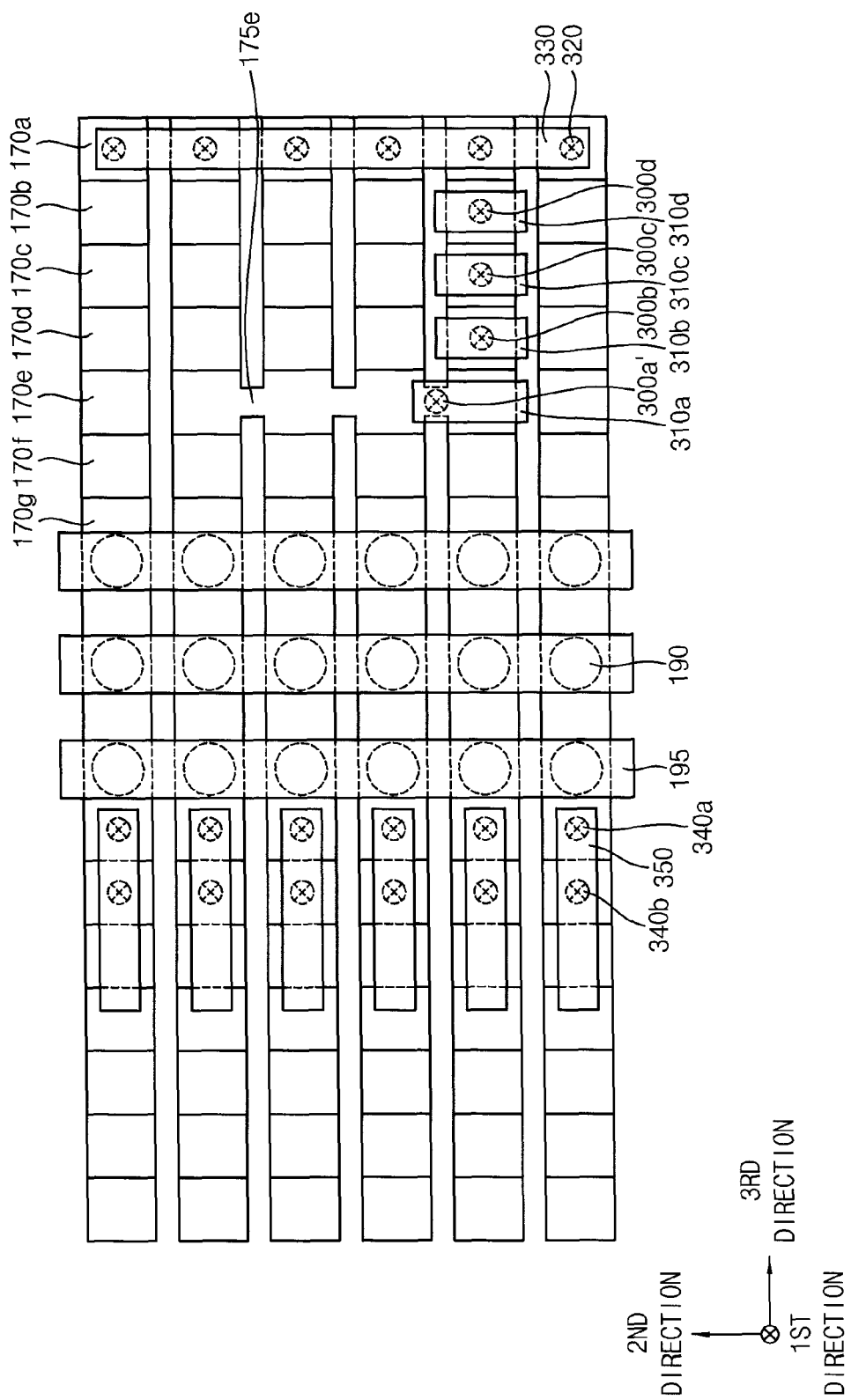

FIGS. 43 to 45 are top plan views illustrating vertical memory devices in accordance with example embodiments.

The vertical memory devices of FIGS. 43 to 45 may have elements and/or constructions substantially the same as or similar to those illustrated with reference to FIGS. 1 to 6B or FIGS. 21 to 24B except for an addition of contacts and wiring structures. Thus, repeated descriptions thereon are omitted. For the convenience of explanation, FIGS. 43 to 45 do not show all elements of the vertical semiconductor devices, but only show some elements thereof, e.g., a gate line, a bit line contact, a bit line, the contact and the wiring structure.

Referring to FIG. 43, the vertical memory device may include word line contacts 300a, 300b, 300c and 300d electrically connected to word lines 170e, 170d, 170c and 170b, a GSL contact 320 electrically connected to a GSL 170a, and SSL contacts 340a and 340b electrically connected to SSLs 170g and 170f. Word line wirings 310a, 310b, 310c and 310d, a GSL wiring 330, and an SSL wiring 350 may be electrically connected to word lines 170e, 170d, 170c and 170b, the GSL 170, and the SSLs 170g and 170f, respectively, via the word line contacts 300a, 300b, 300c and 300d, the GSL contact 320, and the SSL contacts 340a and 340b.

In example embodiments, the GSLs 170a at the same level may be separated from each other by the separation layer pattern 109 in the second direction to extend in the third direction as described above. The SSLs 170g and 170f may be also separated from each other at each level to extend in the third direction. The predetermined number of the word lines 170e, 170d, 170c and 170b at each level may be connected to or merged with each other by the connecting portion 175.

Accordingly, the number of the word line contacts 300 at one level may be smaller than the number of the GSL contacts 320 at one level and/or the number of the SSL contacts 340 at one level.

For example, the SSLs 170g and 170f, and the GSLs 170a may be separated from each other at each level. Thus, the SSL contact 340 and the GSL contact 320 may be provided on each individual SSL 170g and 170f, and each individual GSL 170a. However, the word lines 170e, 170d, 170c and 170b may be connected to each other by the connecting portion at each level so that a contact may not be formed on each individual word line. In example embodiments, one word line contact 300 may be provided on one word line group (e.g., including a set of word lines) formed by the connecting portion 175 at each level.

Therefore, the number of the contacts and/or the wiring structures may be reduced in a circuit design of the vertical memory device so that a circuit construction and a patterning process may be simplified.

The SSL contacts 340 may be provided on a different extension region from that of the word line contacts 300 and the GSL contacts 320. Thus, a density of the contacts and/or the wiring structures in a unit area may be reduced.

In example embodiments, the SSL wiring 350 may extend in a different direction from that of the word line wiring 310 and the GSL wiring 330. For example, the word line wiring 310 and the GSL wiring 330 may extend in substantially the same direction as that of the bit line 195 as illustrated in FIG. 43. The SSL wiring 350 may extend in the third direction.

FIG. 43 illustrates that the word line contacts 300a, 300b, 300c and 300d are arranged along the same line in the top plan view. However, the word line contacts 300a, 300b, 300c and 300d may be provided on any word line 170e, 170d, 170c and 170b included the one word line group. In one example embodiment, the word line contacts 300a, 300b, 300c and 300d and/or the word line wirings 310a, 310b, 310c and 310d may be provided in a staggered arrangement or a zigzag arrangement in the top plan view as illustrated in FIG. 44. In this case, a process margin for patterning the word line contacts and/or the word line wirings may be increased.

As illustrated in FIG. 45, the word line contact 300a' for the uppermost word line 170e may be provided on the connecting portion 175e. Thus, a process margin for patterning the word line contact 300a' may be additionally achieved by the connecting portion 175e.

FIGS. 46 to 52 are cross-sectional views and top plan views illustrating a method of manufacturing vertical memory devices in accordance with example embodiments. Specifically, FIGS. 46, 47A, 48A, 50A, 51A and 52 are cross-sectional views taken along the first direction. FIGS.

47B, 48B, 49A, 50B and 51B are top-plan views of the vertical memory device. FIGS. 49B, 49C, 50C and 50D are cross-sectional views taken along a line I-I' of FIG. 49A.

Detailed descriptions on processed and/or materials substantially the same as or similar to those illustrated with reference to FIGS. 7 to 20B or FIGS. 25 to 32F are omitted.

Referring to FIG. 46, processes substantially the same as or similar to those illustrated with reference to FIGS. 7 and 8 may be performed to obtain a mold structure 105 including insulating interlayers 102 and sacrificial layers 104 alternately and repeatedly stacked on a substrate 100. The mold structure 105 may have a pyramidal shape or a stepped shape including a plurality of steps or stairs. In one example embodiment, processes substantially the same as or similar to those illustrated with reference to FIGS. 25 to 27 may be performed to form separation layer patterns in a lowermost sacrificial layer 104a.

Referring to FIGS. 47A and 47B, a mold protection layer 142 covering the steps or the stairs of the mold structure 105 may be formed on the substrate 100.

In example embodiments, an insulation layer covering the mold structure 105 may be formed on the substrate 100. For example, the insulation layer may be formed using silicon oxide by a CVD process. An upper portion of the insulating layer may be planarized until an uppermost insulating interlayer 102h is exposed to form the mold protection layer 142. The planarization process may include a CMP process and/or an etch-back process.

Referring to FIGS. 48A and 48B, processes substantially the same as or similar to those illustrated with reference to FIGS. 9A to 14B may be performed. Accordingly, a dielectric layer structure 130, a channel 135 and a first filling layer pattern 140 may be formed through the mold structure 105 on a cell region I. A pad 150 may be formed on the dielectric layer structure 130, the channel 135 and the first filling layer pattern 140. A top surface of the pad 150 may be coplanar with a top surface of the uppermost insulating interlayer 102h.

Figure 49B:
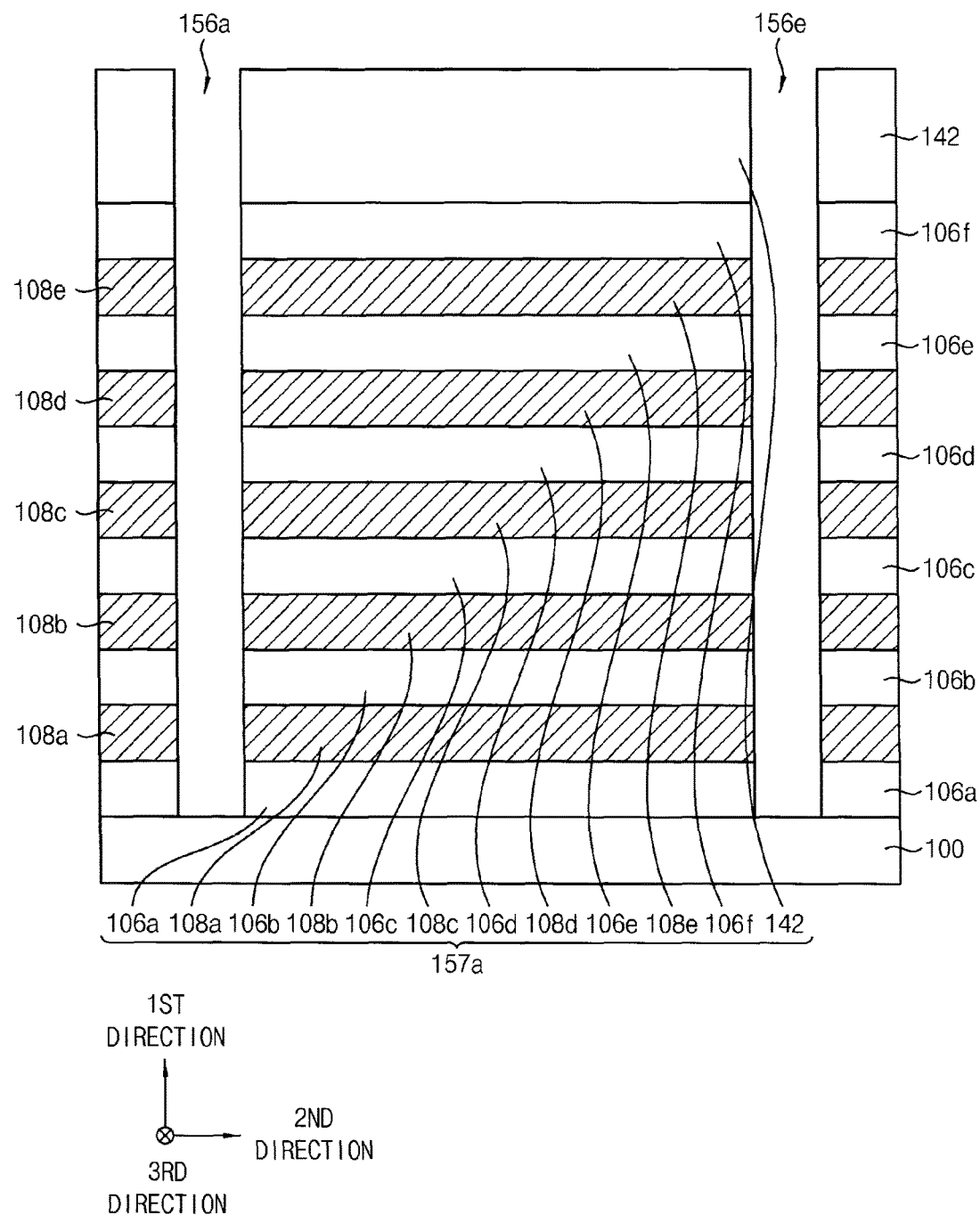
Figure 49C:
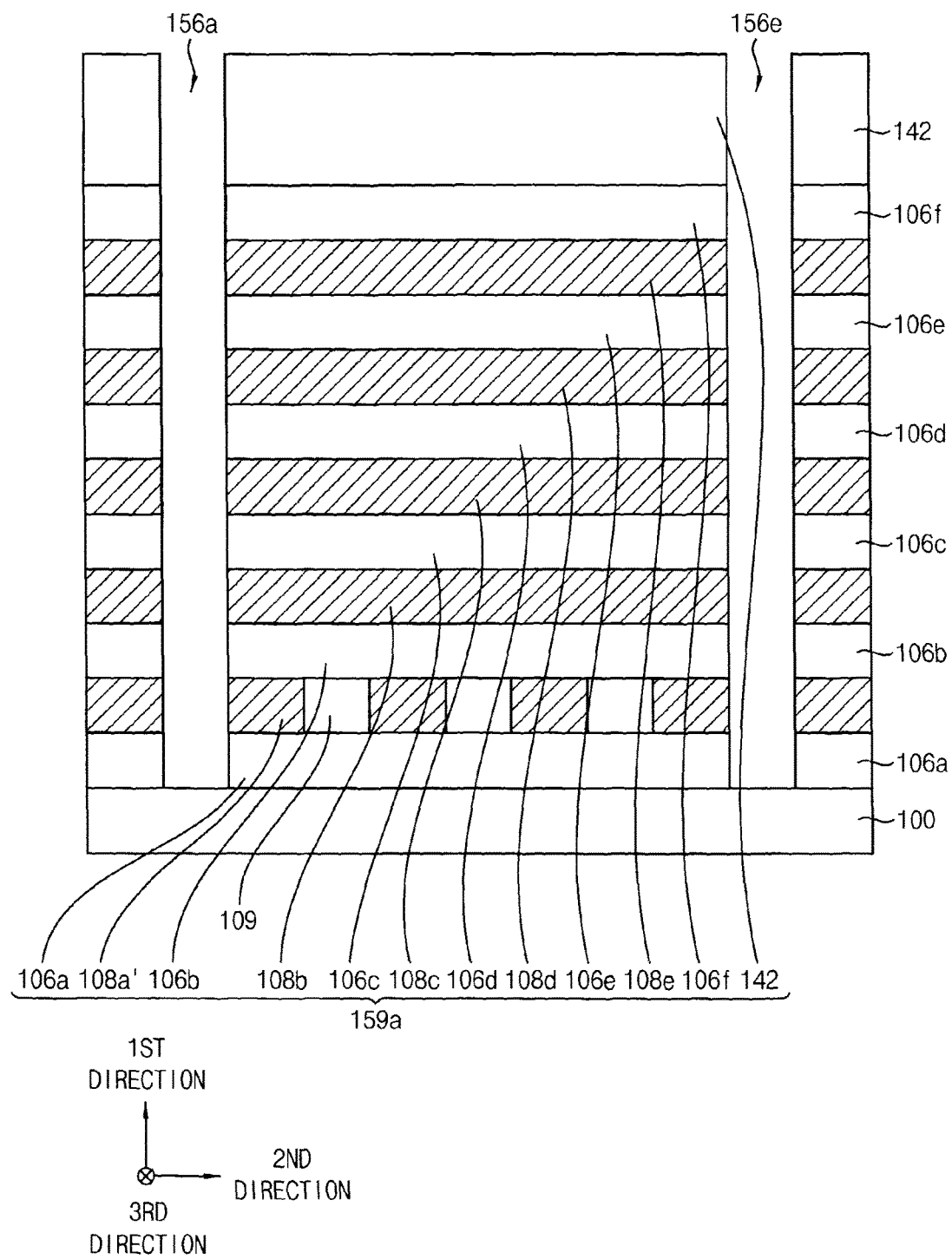

Referring to FIGS. 49A to 49C, processes substantially the same as or similar to those illustrated with reference to FIGS. 15A to 15D may be performed.

Accordingly, the mold protection layer 142, the insulating interlayers 102 and the sacrificial layers 104 may be partially etched to form openings 156 between channel rows adjacent in the second direction. A top surface of the substrate 100 may be exposed by the opening 156. The insulating interlayers 102 and the sacrificial layers 104 may be changed into insulating interlayer patterns 106 and sacrificial layer patterns 108, respectively, by a formation of the openings 156. A fence structure 157a and 159a may be formed on an extension region II of the substrate 100 to cut or block the openings 156b, 156c and 156d in-between.

As illustrated in FIG. 49B, the fence structure 157a may include the insulating interlayer patterns 106a, 106b, 106c, 106d, 106e and 106f, the sacrificial layer patterns 108a, 108b, 108c, 108d and 108e, and the mold protection layer 142, alternately and sequentially stacked from the top surface of the substrate 100. In the case that the separation layer patterns 109 are formed in a lowermost sacrificial layer 104a, the fence structure 159a may include the separation layer patterns 109 between two lowermost sacrificial layer patterns 106a and 106b as illustrated in FIG. 49C.

Referring to FIGS. 50A to 50D, processes substantially the same as or similar to those illustrated with reference to FIGS. 16A to 19D may be performed.

Accordingly, the sacrificial layer patterns 108 may be replaced with gate lines 170. An impurity region 101 may be formed at an upper portion of the substrate 100 exposed by the opening 156. A second filling layer pattern 177 may be formed on the impurity region 101 to fill the opening 156.

Figure 50D:
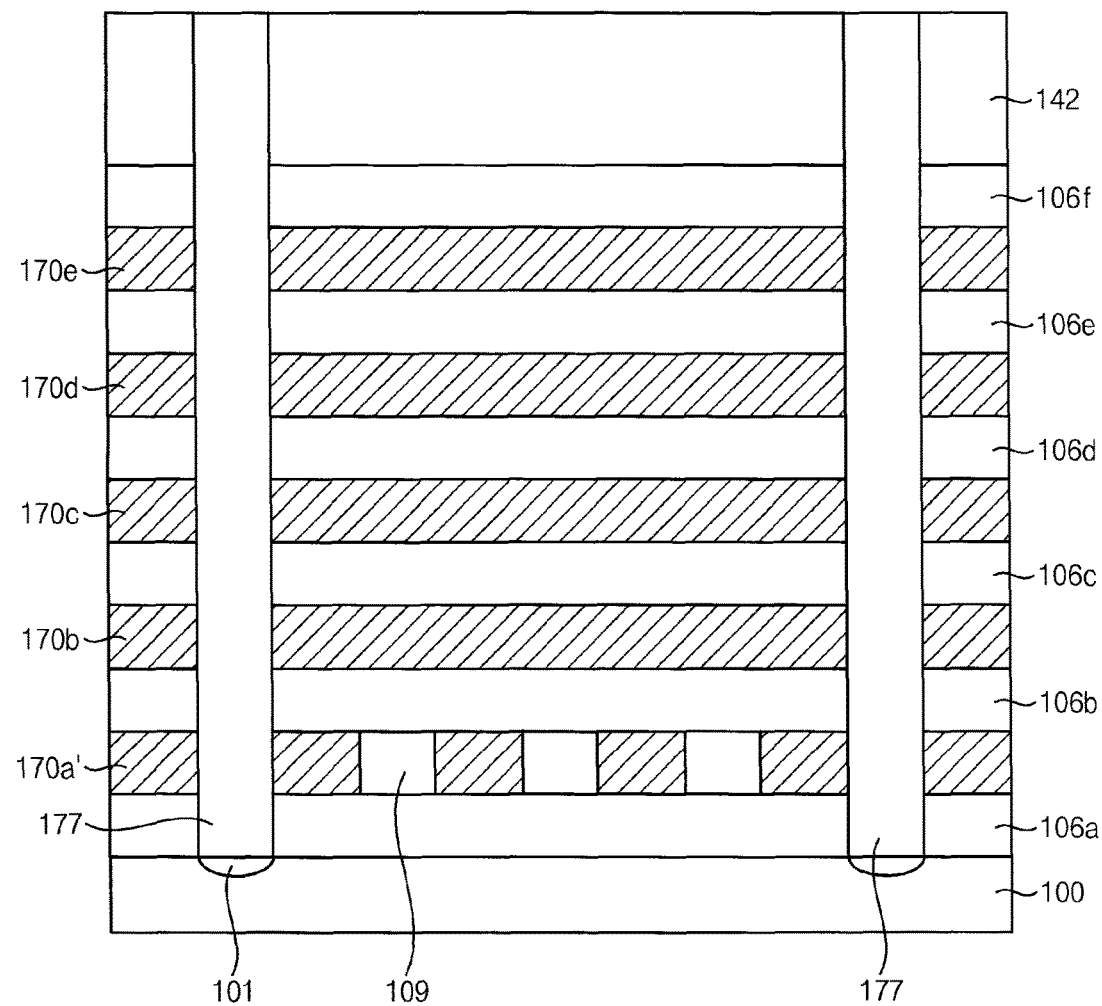

The gate lines 170 may include a GSL 170a, word lines 170b, 170c, 170d and 170e, and SSLs 170f and 170g sequentially stacked from the top surface of the substrate 100. As illustrated in FIG. 50C, the predetermined number of the word lines 170b, 170c, 170d and 170e at each level may be connected to or merged with each other by connecting portions 175. In one example embodiment, the GSLs 170a' may be separated from each other in the second direction by the separation layer patterns 109 as illustrated in FIG. 50D.

Figure 51A:
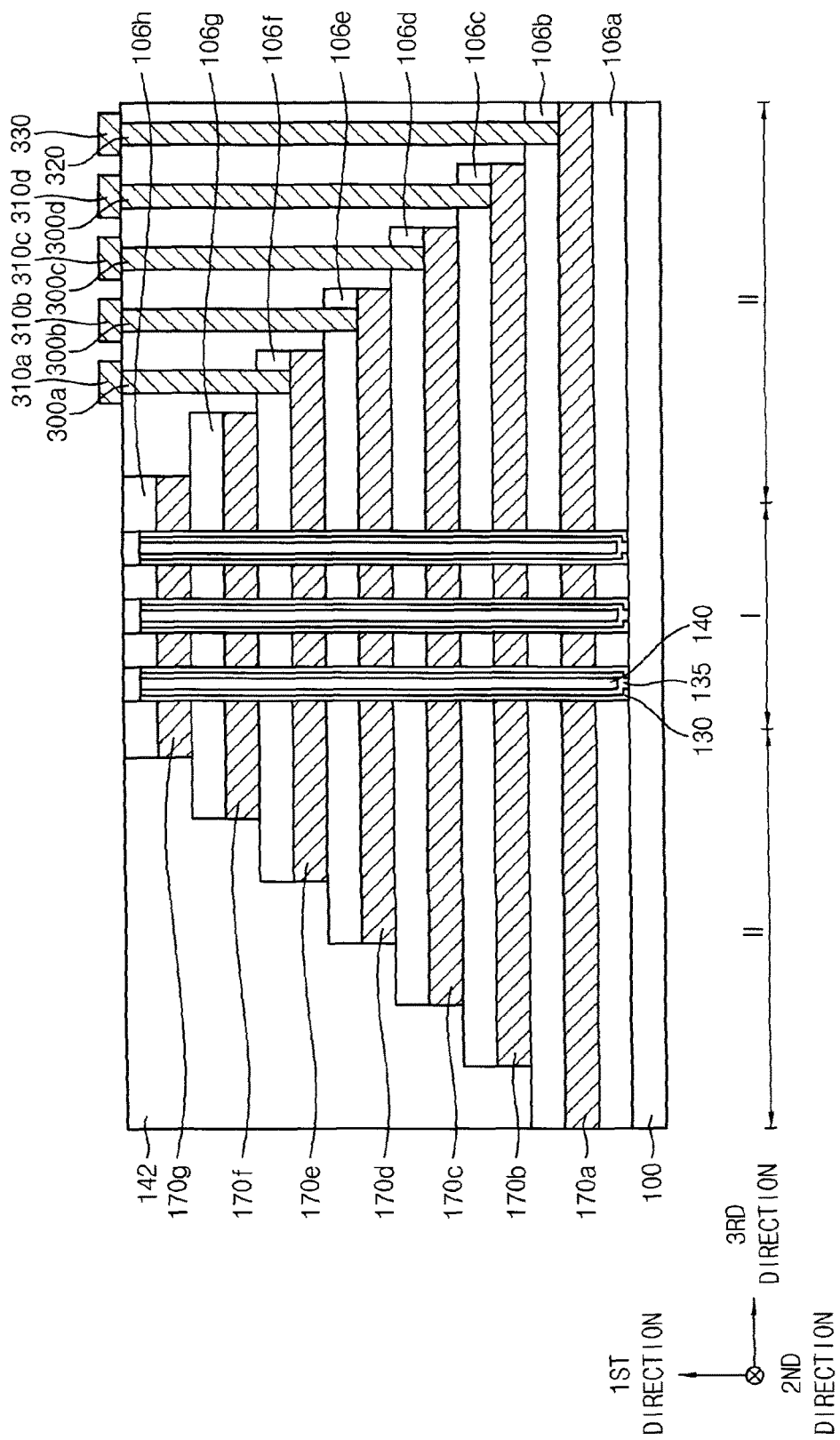
Figure 51B:
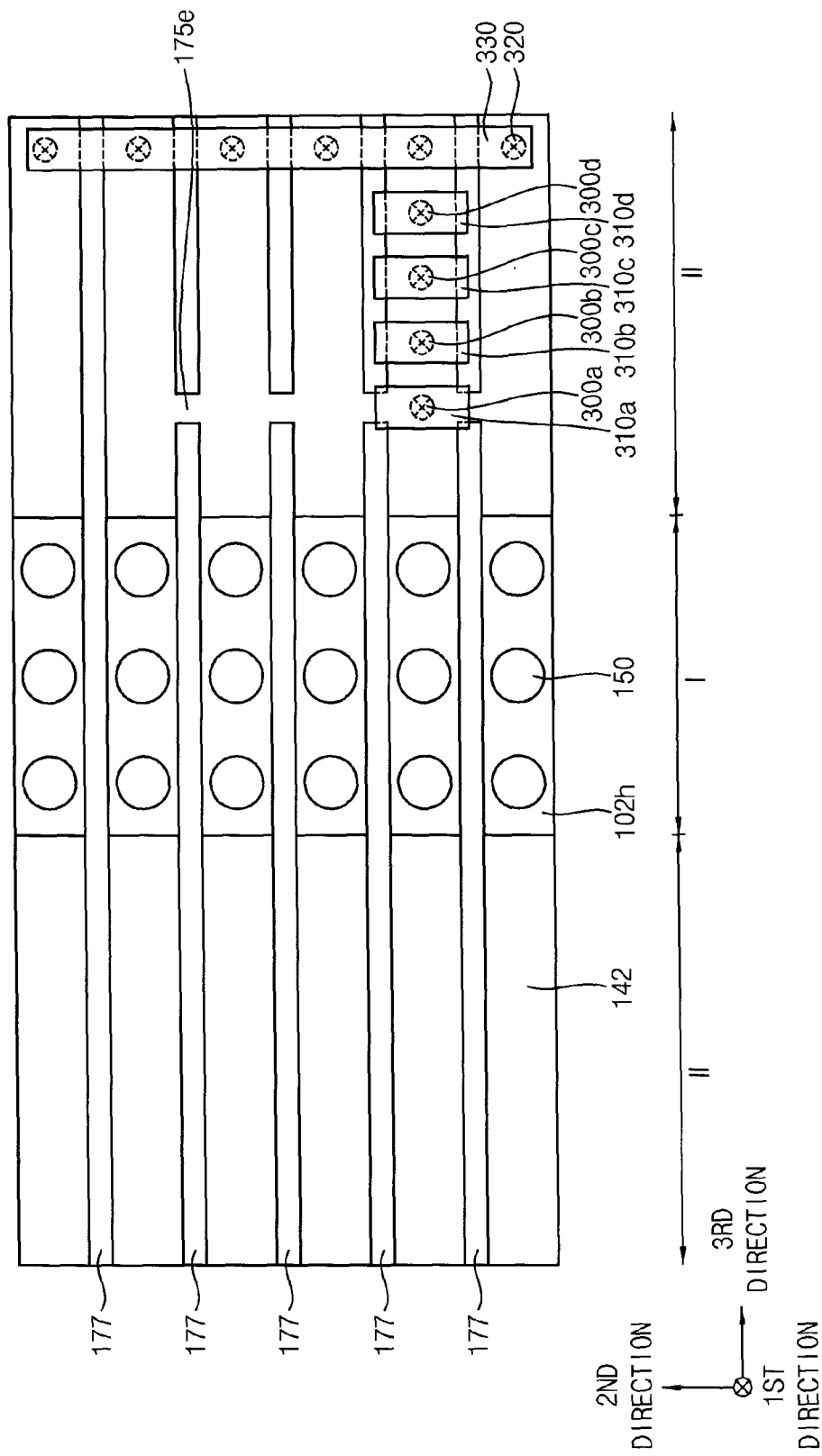

Referring to FIGS. 51A and 51B, word line contacts 300d, 300c, 300b and 300a, and a GSL contact 320 may be formed through the mold protection layer 142 and the insulating interlayer patterns 106 to be in contact with the word lines 170b, 170c, 170d, and 170e, and the GSL 170a, respectively.

In example embodiments, the mold protection layer 142 and the insulation interlayer patterns 106 may be partially etched to form contact holes exposing the word lines 170b, 170c, 170d and 170e, and the GSL 170a. A first conductive layer filling the contact holes may be formed on the word lines 170b, 170c, 170d and 170e, and the GSL 170a. An upper portion of the first conductive layer may be planarized by a CMP process and/or an etch-back process until a top surface of the mold protection layer 142 is exposed to form the word line contacts 300d, 300c, 300b and 300a and the GSL contact 320. The first conductive layer may be formed using, for example, a metal, a metal nitride or doped polysilicon by, e.g., a CVD process, an ALD process or a sputtering process.

As described with reference to FIG. 43, the number of the word line contacts 300 at one level may be smaller than the number of the GSL contacts 320 at one level. For example, the GSL contact 320 may be provided on each GSL 170a. However, one word line contact 300 may be provided per one word line group defined by the connecting portion 175.

As illustrated in FIG. 44, the word line contacts 300a, 300b, 300c and 300d may be formed in a zigzag arrangement. As illustrated in FIG. 45, the uppermost word line contact 300a may be formed on the connecting portion 175e.

A second conductive layer may be formed on the mold protection layer 142, and then the second conductive layer may be patterned to form word line wirings 310a, 310b, 310c and 310d, and a GSL wiring 330 electrically connected to the word line contacts 300a, 300b, 300c and 300d, and the GSL contact 320, respectively. For example, the second conductive layer may be formed using a metal, a metal nitride or doped polysilicon by a CVD process, an ALD process or a sputtering process.

The word line wirings 310 and the GSL wiring 330 may extend in the second direction.

Figure 52:
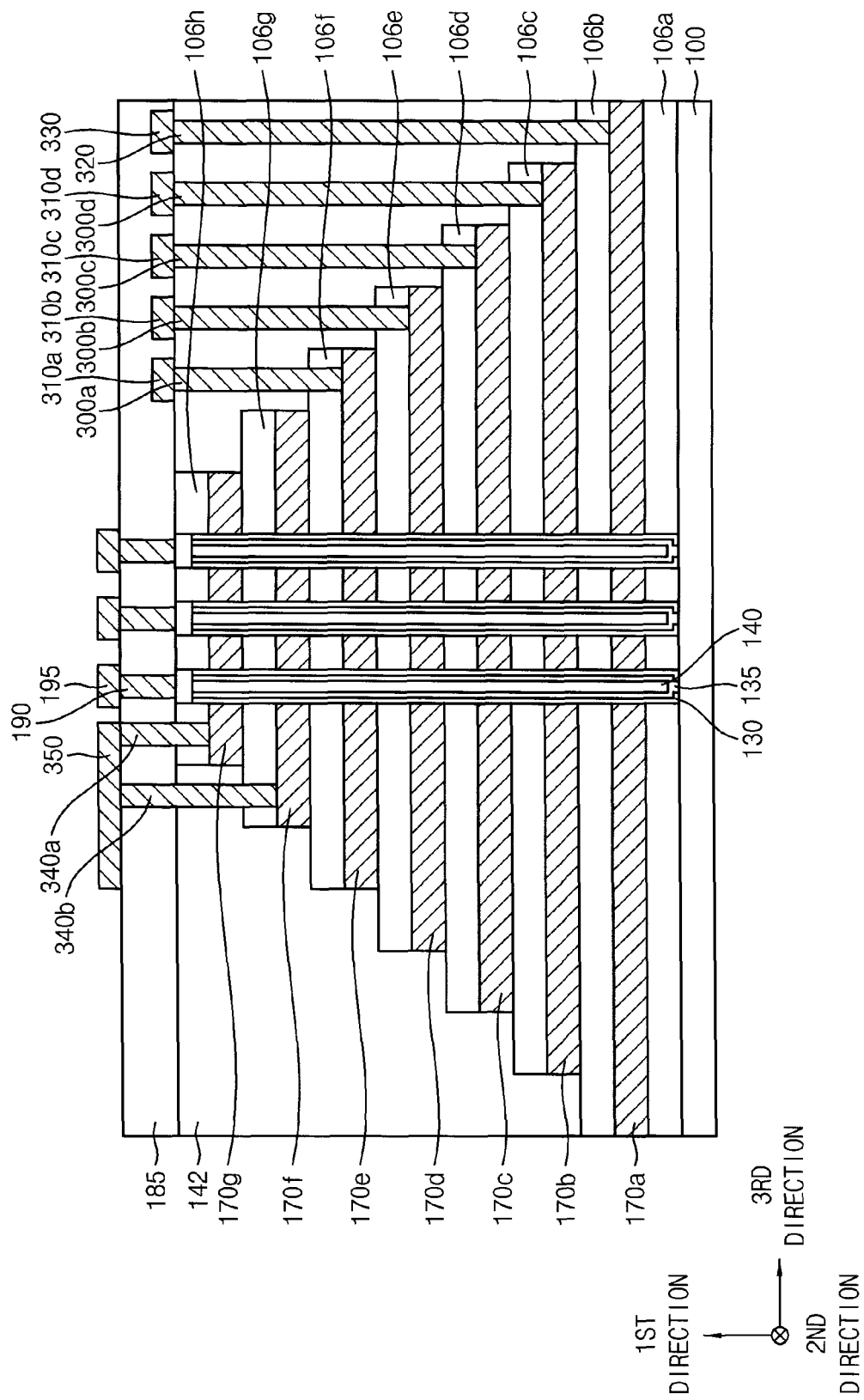

Referring to FIG. 52, a process substantially the same as or similar to that illustrated with reference to FIGS. 20A and 20B may be performed.

Accordingly, a bit line contact 190 may be formed through an upper insulation layer 185 to be in contact with the pad 150. A bit line 195 may be formed on the upper insulation layer 185 to be electrically connected to the bit line contact 190. The bit line 195 may extend in the second direction to be electrically connected to a plurality of the channels 135.

SSL contacts 340a and 340b may be formed through the upper insulation layer 185, the mold protection layer 142 and the insulating interlayer pattern 106 to be in contact with the SSLs 170g and 170f. The SSL contacts 340a and 340b may be formed simultaneously with the bit line contact 190. In example embodiments, the SSL contacts 340a and 340b may be formed on the different extension region II from that of the word line contacts 300 and the GSL contact 320.

An SSL wiring 350 may be formed on the upper insulation layer 185 to be electrically connected to the SSL contacts 340a and 340b. In example embodiments, the SSL wiring 350 may extend in the third direction.

As illustrated with reference to FIGS. 43 to 45, the SSL contacts 340a and 340b may be provided per the individual SSLs 170f and 170g. Therefore, the number of the SSL contacts 340a and 340b at one level may be greater than the number of the word line contacts 300 at one level.

As illustrated in FIG. 52, the word line wirings 310 and the GSL wiring 330 may be formed on a different level from that of the SSL wiring 350. However, the word line wirings 310, the GSL wiring 330 and the SSL wiring 350 may be formed on the same level. For example, all of the word line wirings 310, the GSL wiring 330 and the SSL wiring 350 may be formed on the mold protection layer 142 or the upper insulation layer 185.

Figure 53:
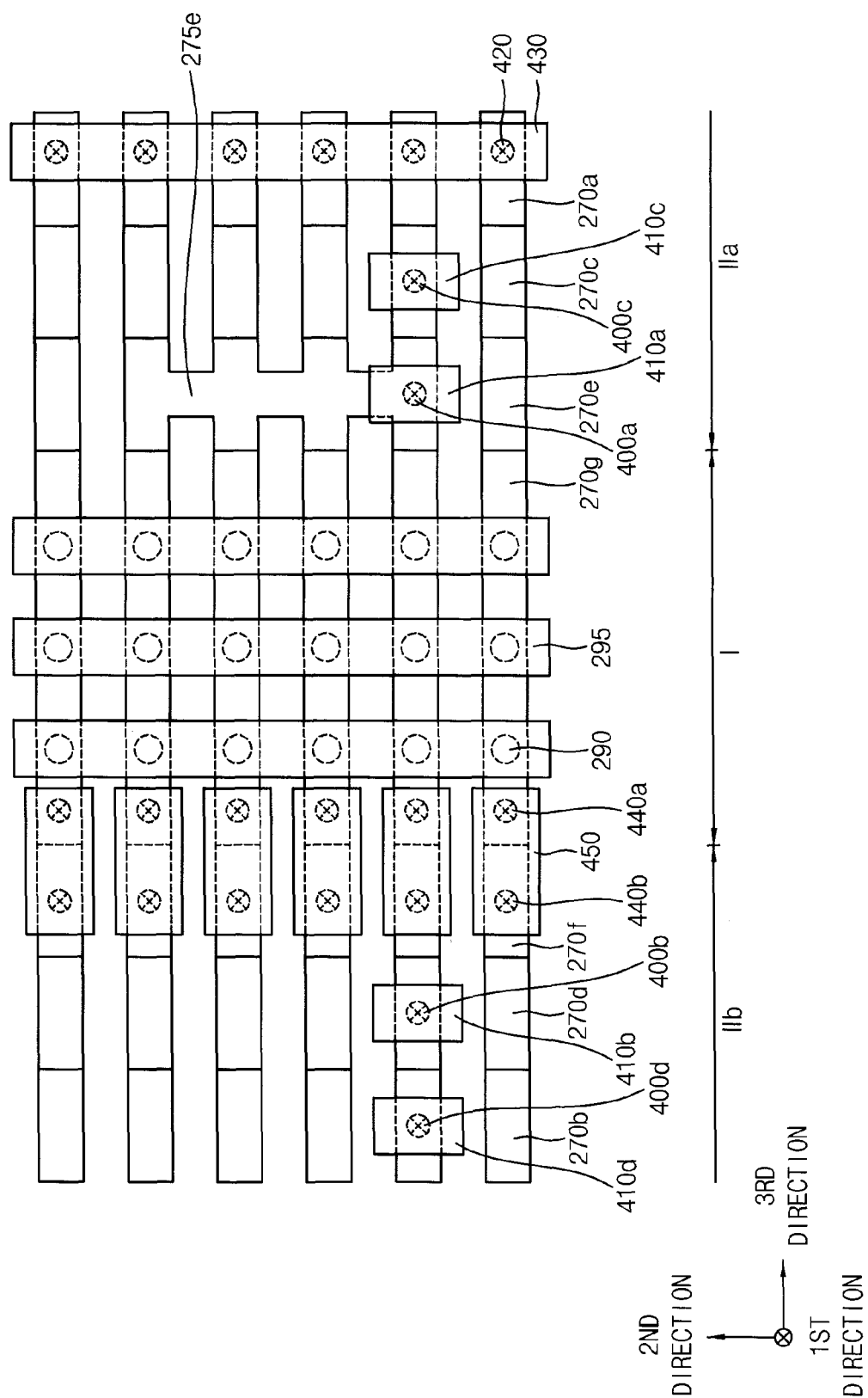
FIG. 53 is a top plan view illustrating a vertical memory device in accordance with example embodiments.

FIG. 53 is a top plan view illustrating a vertical memory device in accordance with example embodiments.

The vertical memory device of FIG. 53 may have elements and/or constructions substantially the same as or similar to those illustrated with reference to FIGS. 33 to 37 except for an addition of contacts and wiring structures. Thus, repeated descriptions thereon are omitted. For the convenience of explanation, FIG. 53 do not show all elements of the vertical semiconductor devices, but only shows some elements thereof, e.g., a gate line, a bit line contact, a bit line, the contact and the wiring structure.

Referring to FIG. 53, the vertical memory device may include gate lines 270 stacked in a zigzag arrangement along the first direction as illustrated in FIGS. 33 to 37. In example embodiments, the gate lines 270 may protrude in the third direction alternately on a first extension region IIa and a second extension region IIb. Accordingly, the contacts electrically connected to the gate lines 270 may be also provided alternately on the first extension region IIa and the second extension region IIb.

For example, GSL contacts 420 formed at a lowermost level may be provided on the first extension region IIa. The GSL contact 420 may be provided on each individual GSL 270a. A GSL wiring 430 may be electrically connected to a plurality of the GSL contacts 420 to extend in the second direction.

As illustrated in FIG. 53, a first word line contact 400d connected to a lowermost word line 270b may be provided on the second extension region IIb. A second word line contact 400c may be provided on the first extension region IIa, a third word line contact 400b may be provided on the second extension region IIb, and a fourth word line contact 400a may be provided on the first extension region IIa. In one example embodiment, one word line contact 400 may be provided per one word line group formed by a connecting portion 275.

Word line wirings 410a, 410b, 410c and 410d may be electrically connected to the word line contacts 400a, 400b, 400c and 400d, respectively, to extend in the second direction.

SSL contacts 440a and 440b may be electrically connected to SSLs 270f and 270g. SSL wirings 450 may be electrically connected to the SSL contacts 440a and 440b to extend in the third direction. The SSL contact 440 may be provided on each individual SSL 270f and 270g.

In one example embodiment, as illustrated in FIG. 44, the word line contact 400 may be electrically connected to any word line included in the word line group. As illustrated in FIG. 45, the uppermost word line contact 400a may be formed on the connecting portion 275e.

FIGS. 54 to 58 are cross-sectional views and top plan views illustrating a method of manufacturing a vertical memory device in accordance with example embodiments.

Specifically, FIGS. 54, 55, 56A, 57A and 58 are cross-sectional views taken along the first direction. FIGS. 56B and 57B are top-plan views of the vertical memory device. FIGS. 56C, 56D, 57C and 57D are cross-sectional views taken along a line I-I'.

Detailed descriptions on processes and/or materials substantially the same as or similar to those illustrated with reference to FIGS. 7 to 20B, FIGS. 25 to 32F, FIGS. 38 to 42D, or FIGS. 46 to 52 are omitted.

Figure 54:
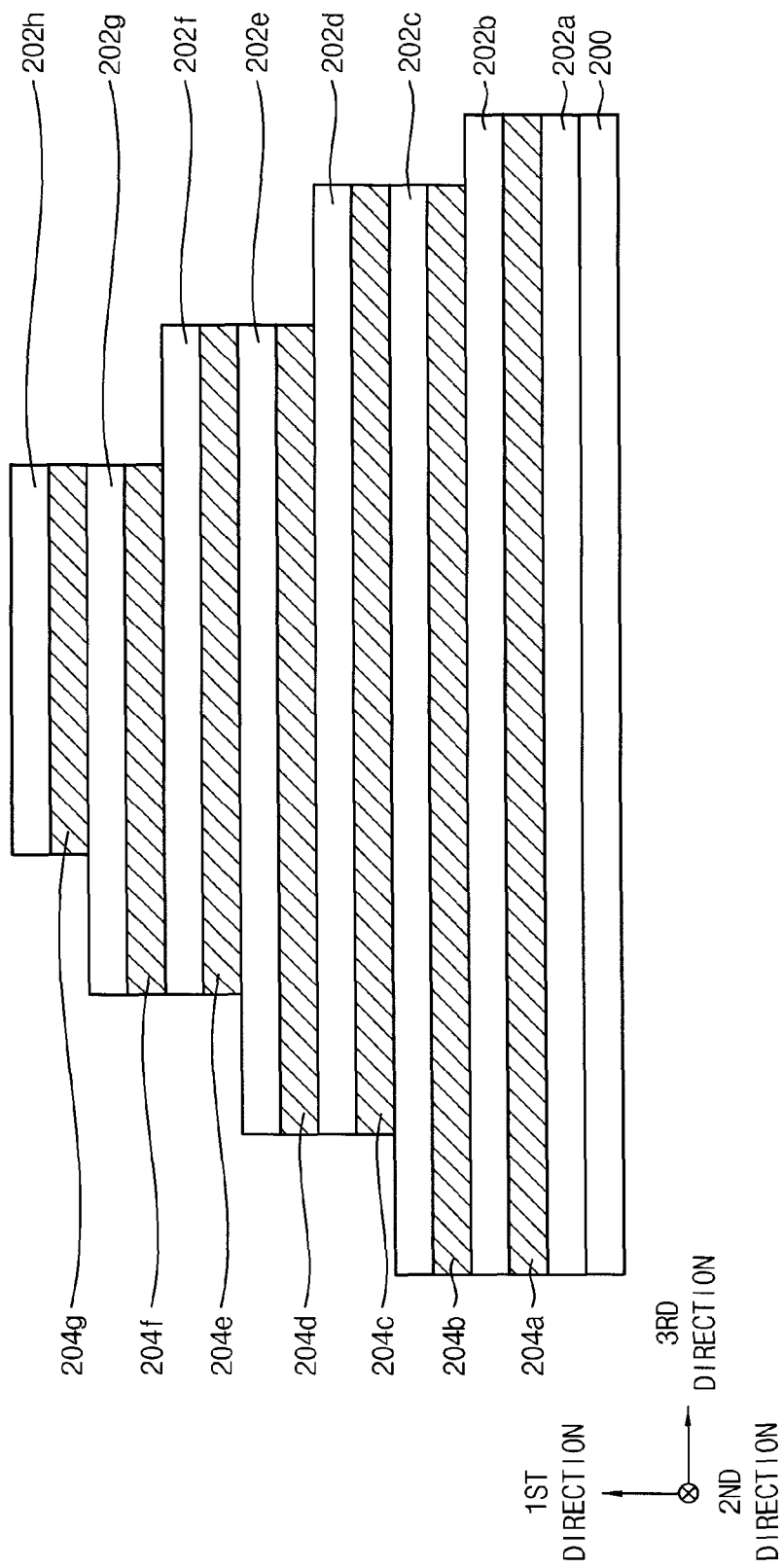
FIGS. 54 to 58 are cross-sectional views and top plan views illustrating a method of manufacturing a vertical memory device in accordance with example embodiments.

Referring to FIG. 54, processes substantially the same as or similar to those illustrated with reference to FIGS. 38 and 39 may be performed to form a mold structure 205 including insulating interlayers 202 and sacrificial layers 204 which are alternately and repeatedly stacked in a zigzag arrangement along the first direction.

Figure 55:
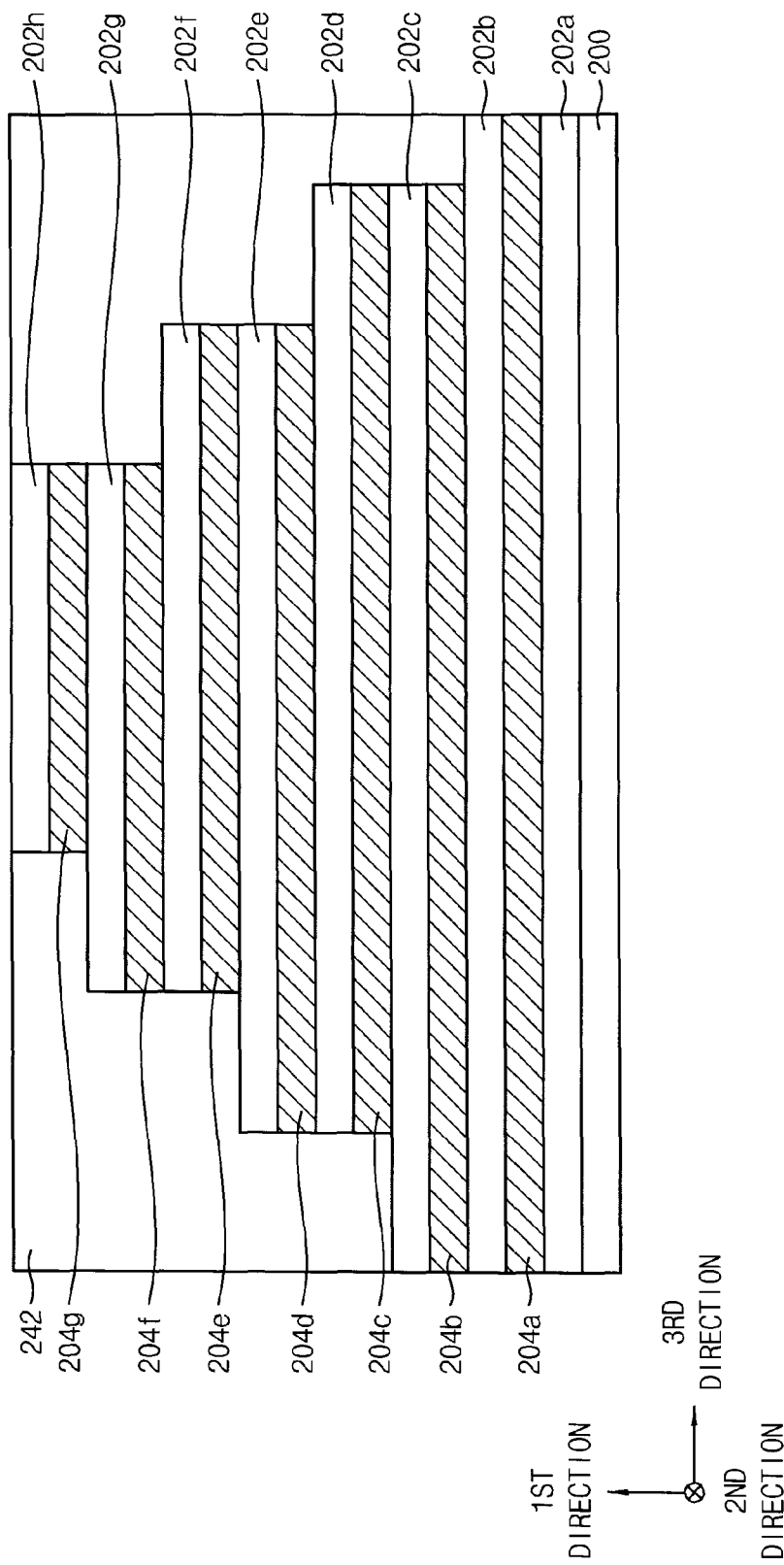

Referring to FIG. 55, a process substantially the same as or similar to that illustrated with reference to FIGS. 47A and 47B may be performed to form a mold protection layer 242 covering steps or stairs of the mold structure 205.

Referring to FIGS. 56A to 56D, processes substantially the same as or similar to those illustrated with reference to FIGS. 40A to 41D or FIGS. 48A to 49C may be performed.

Accordingly, a dielectric layer structure 230, a channel 235 and a first filling layer pattern 240 may be formed through the mold structure 205. A pad 250 may be formed on the dielectric layer structure 230, the channel 235 and the first filling layer pattern 240.

The mold protection layer 242, the insulating interlayers 202 and the sacrificial layers 204 may be partially etched to form openings 256 between channel rows adjacent in the second direction. The insulating interlayers 202 and the sacrificial layers 204 may be changed into insulating interlayer patterns 206 and sacrificial layer patterns 208 by a formation of the opening 256. A fence structure 257a and 259a may be formed on a first extension region IIa or a second extension region IIb to cut or block the openings 256b, 256c and 256d in-between.

Figure 56A:
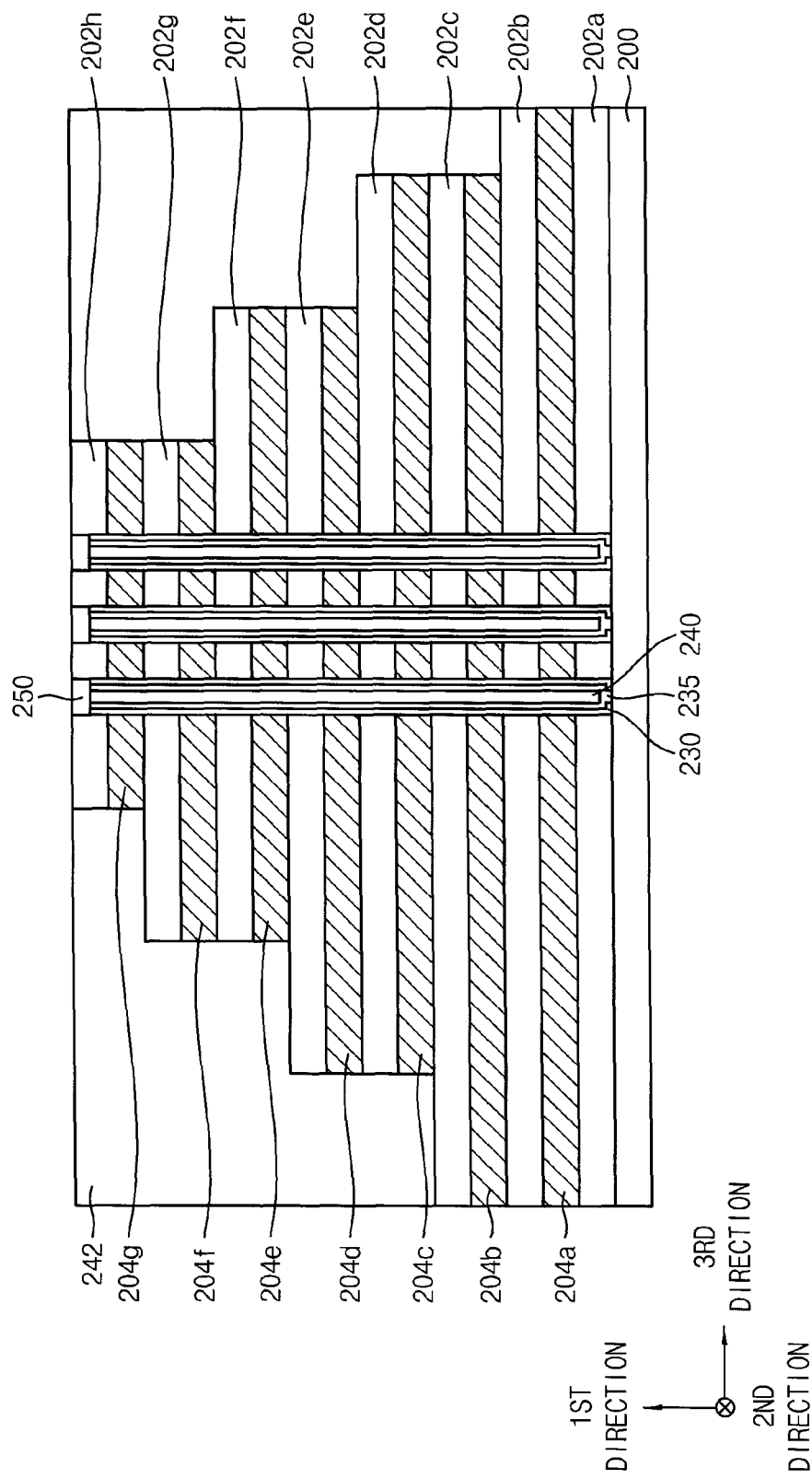
Figure 56C:
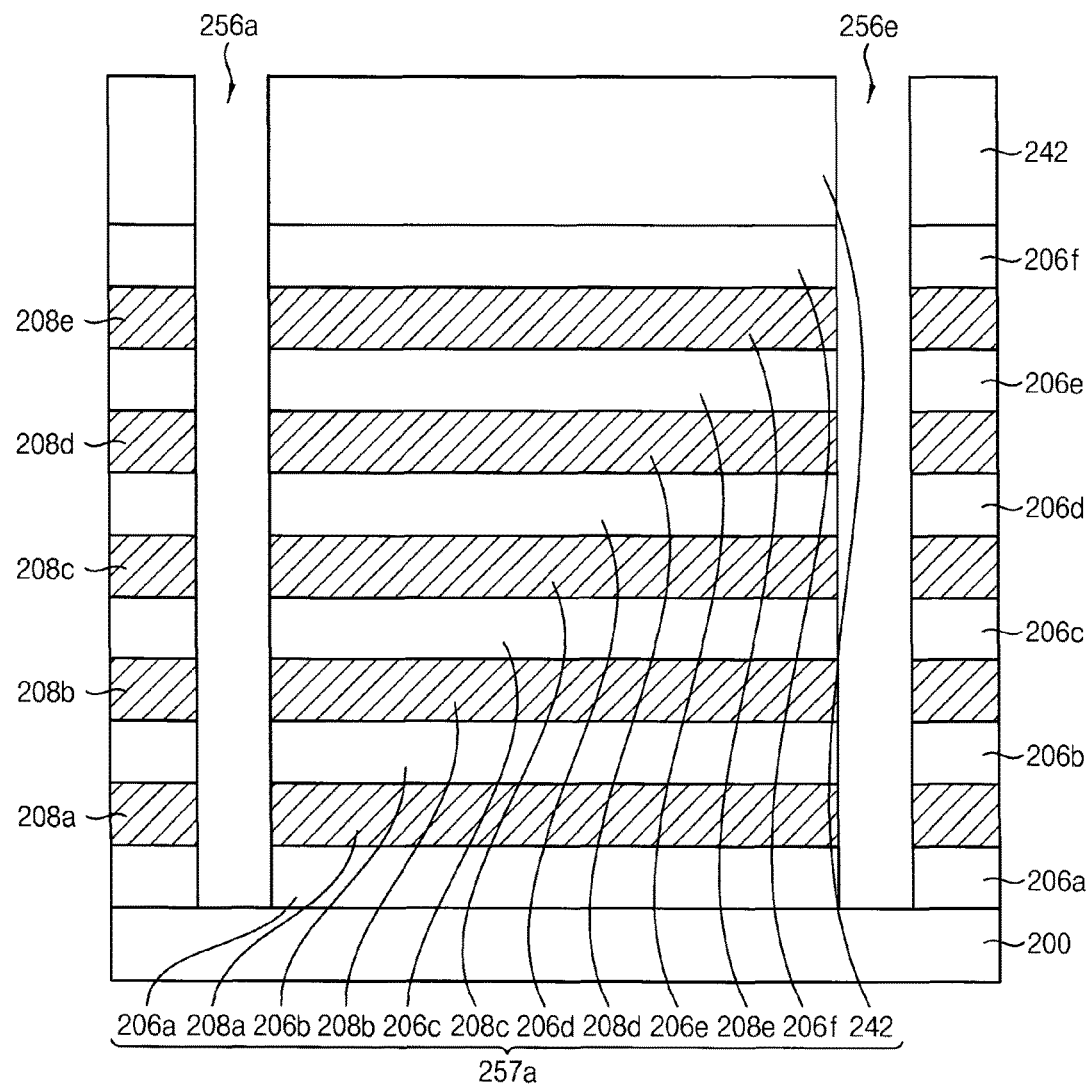
Figure 56D:
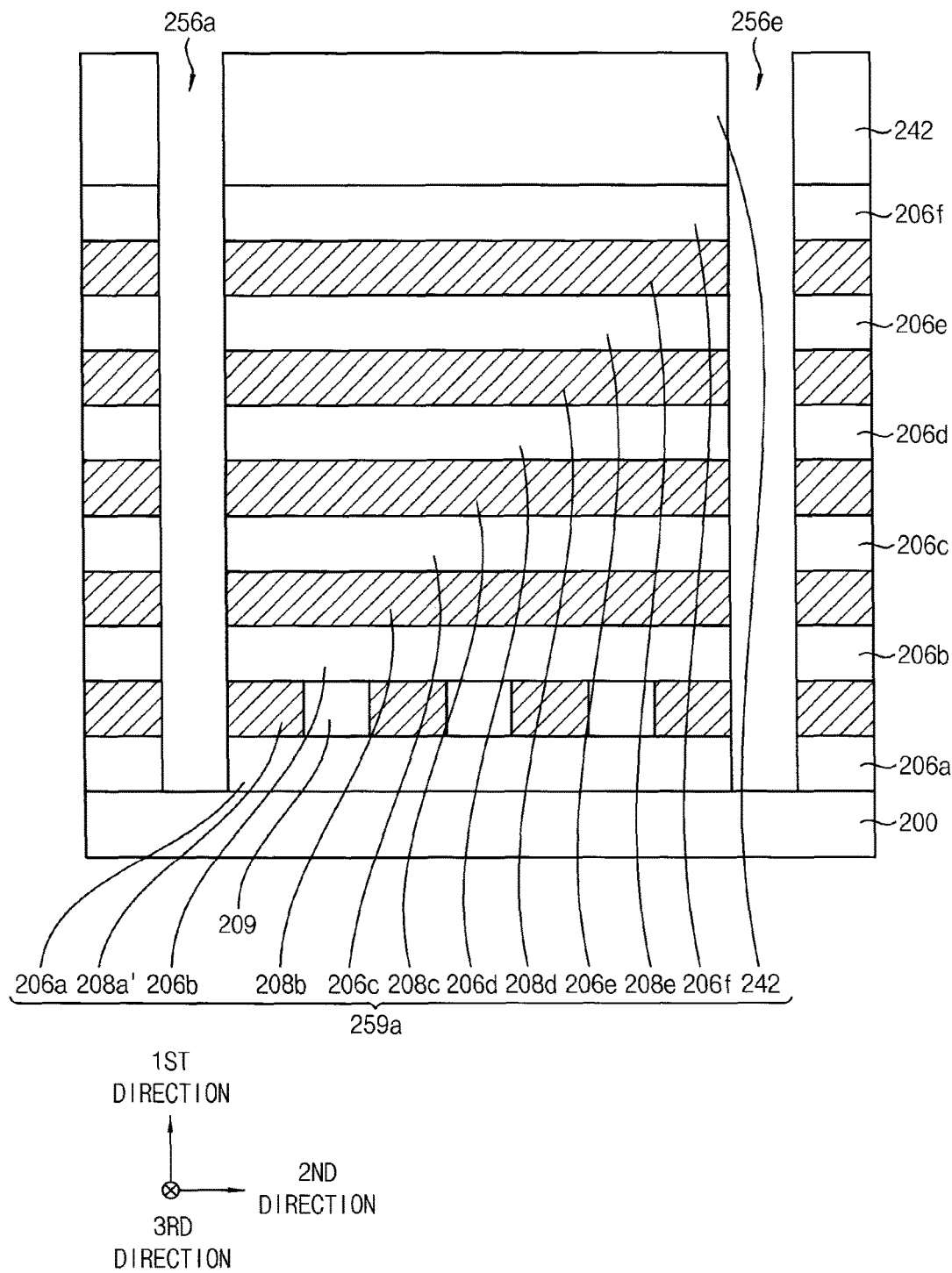

As illustrated in FIG. 56C, the fence structure 257a may include the insulating interlayer patterns 206a, 206b, 206c, 206d, 206e and 206f, the sacrificial layer patterns 208a, 208b, 208c, 208d and 208e, and the mold protection layer 242, alternately and sequentially stacked from the top surface of the substrate 200. In the case that the separation layer patterns 209 are formed in a lowermost sacrificial layer 204a, the fence structure 259a may include the separation layer patterns 209 between two lowermost sacrificial layer patterns 206a and 206b as illustrated in FIG. 56D.

Referring to FIGS. 57A to 57D, processes substantially the same as or similar to those illustrated with reference to FIGS. 16A to 19D, or FIGS. 50A to 50D may be performed.

Accordingly, the sacrificial layer patterns 208 may be replaced with gate lines 270. An impurity region 201 may be formed at an upper portion of the substrate 200 exposed by the opening 256. A second filling layer pattern 277 may be formed on the impurity region 201 to fill the opening 256.

Figure 57A:
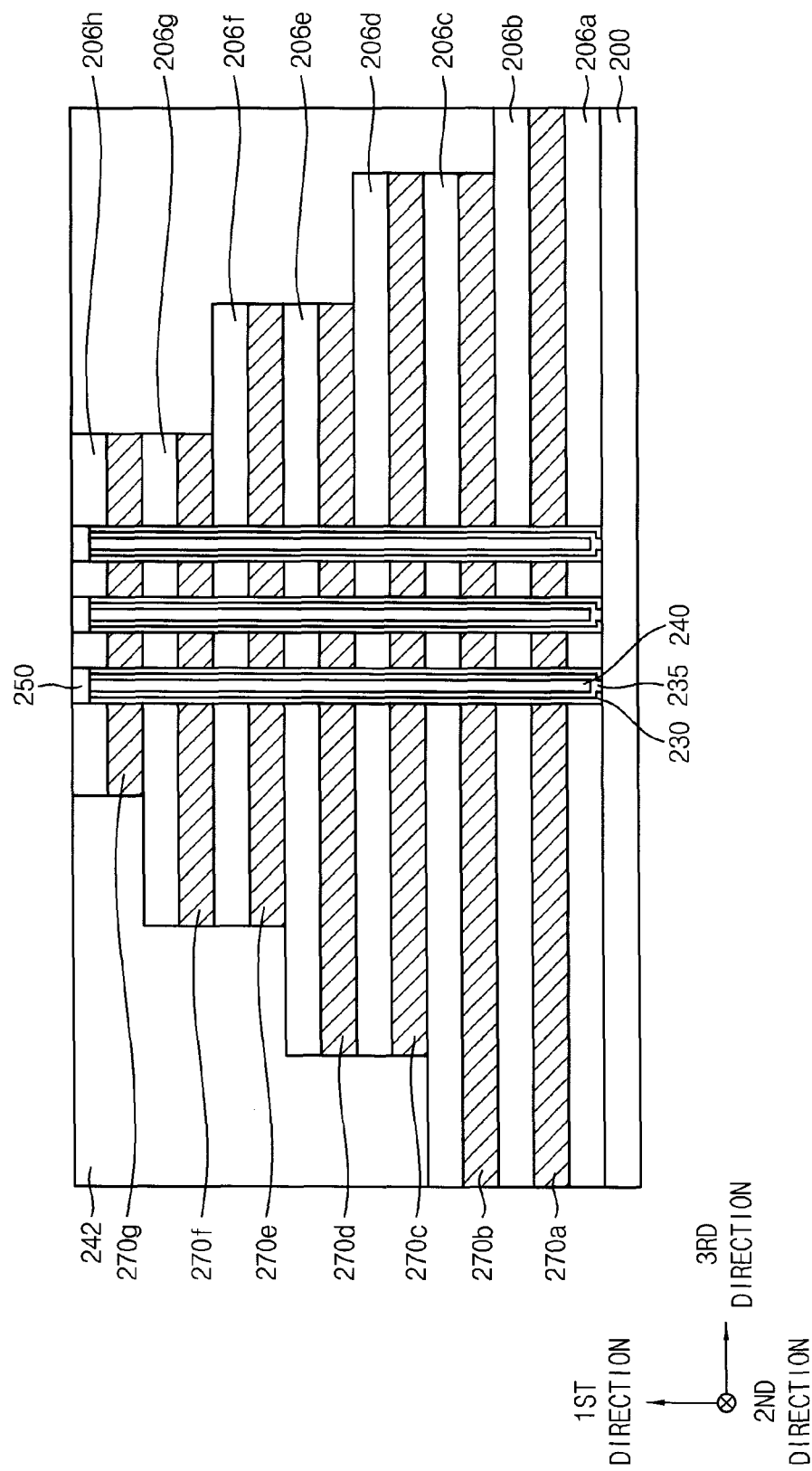
Figure 57C:
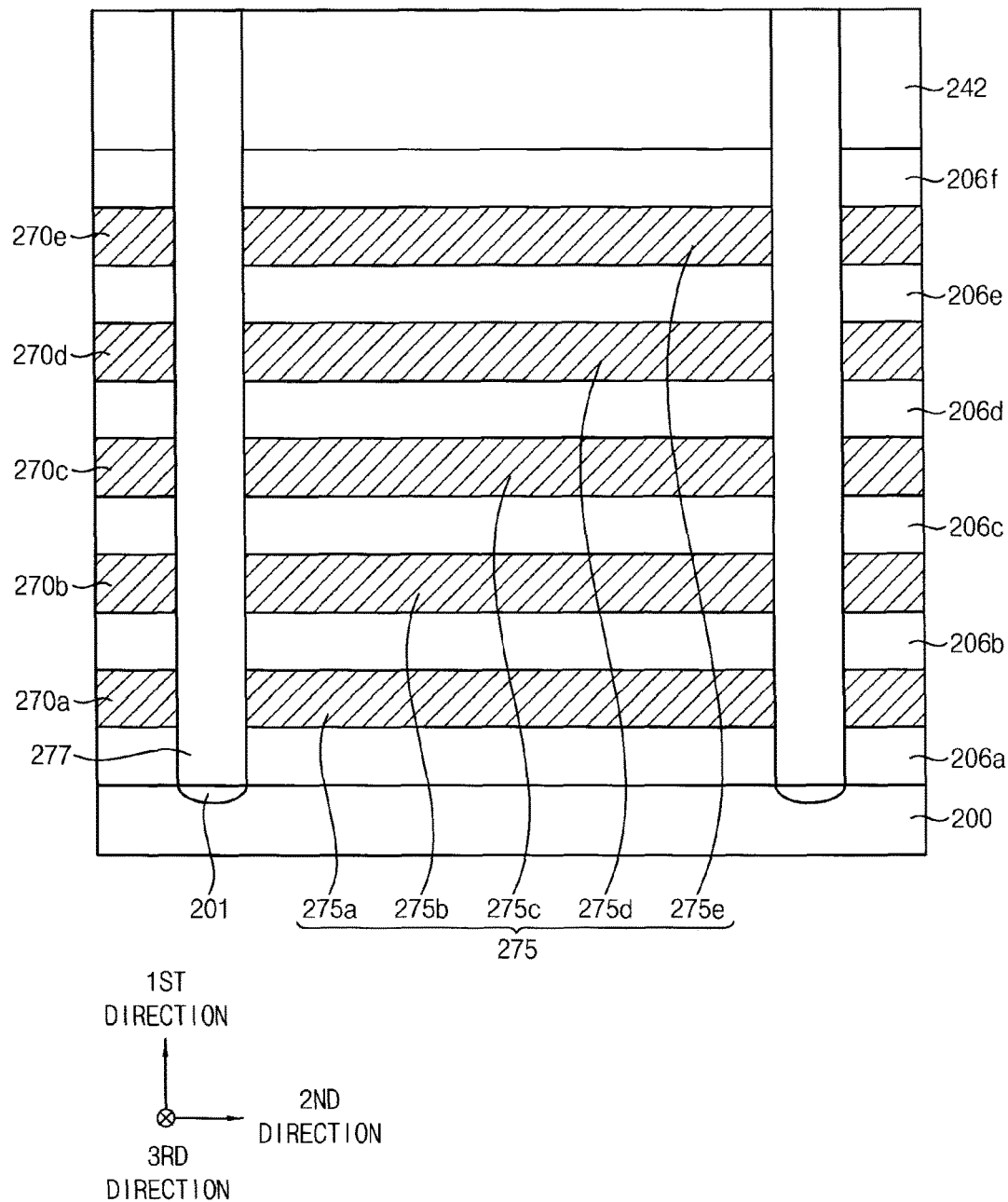

The gate lines 270 may include a GSL 270a, word lines 270b, 270c, 270d and 270e, and SSLs 270f and 270g sequentially stacked from the top surface of the substrate 200. As illustrated in FIG. 57C, the predetermined number of the word lines 270b, 270c, 270d and 270e at each level may be connected to or merged with each other by connecting portions 275. In one example embodiment, the GSLs 270a' may be separated from each other in the second direction by the separation layer patterns 209 as illustrated in FIG. 57D.

Figure 58:
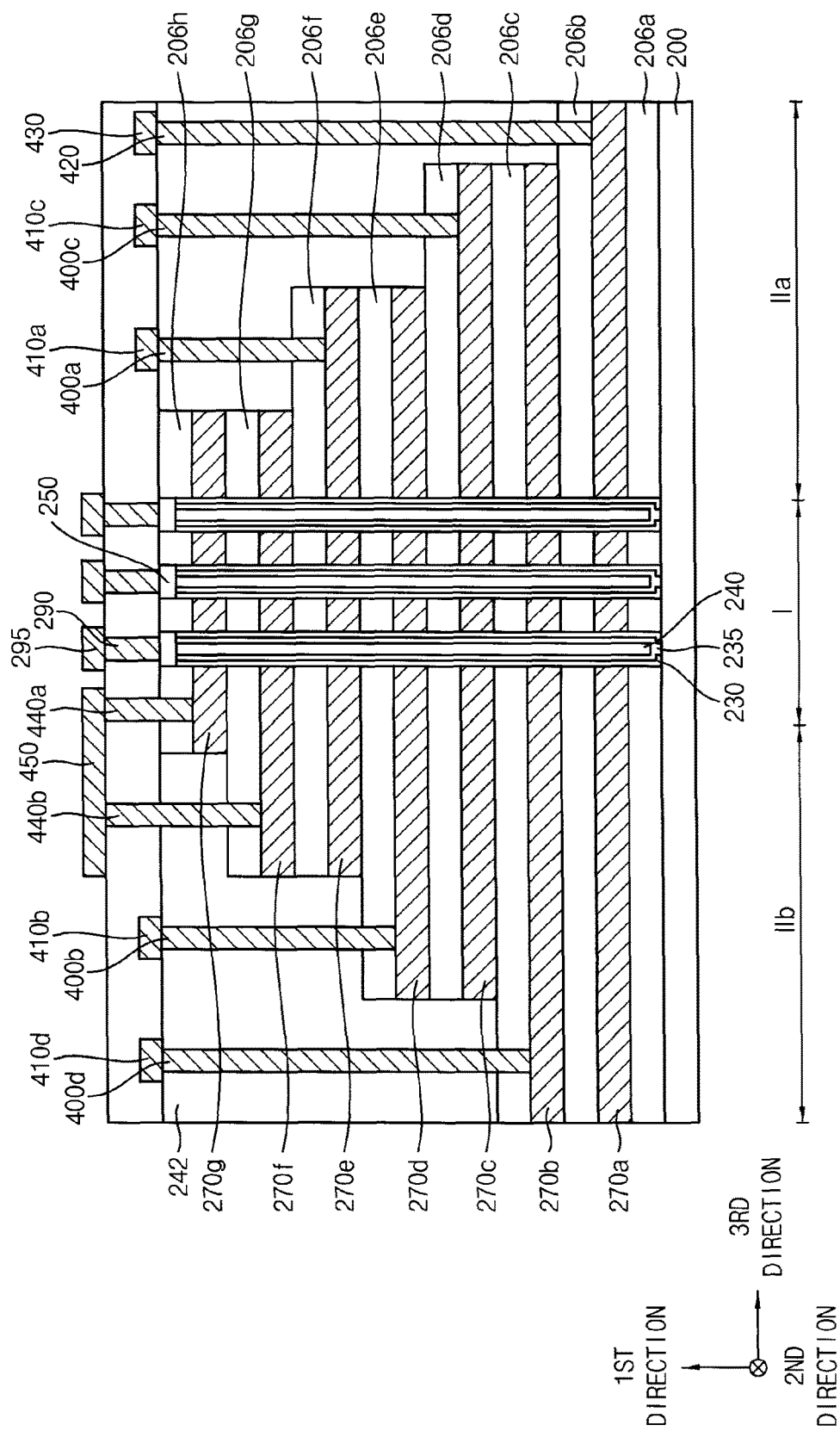

Referring to FIG. 58, processes substantially the same as or similar to those illustrated with reference to FIGS. 51A to 52 may be performed.

Accordingly, word line contacts 400d, 400c, 400b and 400a, and a GSL contact 420 may be formed through the mold protection layer 242 and the insulating interlayer patterns 206 be in contact with the word lines 270b, 270c, 270d, and 270e, and the GSL 270a, respectively.

As illustrated in FIG. 53, the contacts electrically connected to the gate lines 270 may be formed alternately on a first extension region IIa and a second extension region IIb. For example, the GSL contact 420 formed at a lowermost level may be formed on the first extension region IIa. The first word line contact 400d connected to the lowermost word line 270b may be formed on the second extension region IIb. The second word line contact 400c may be formed on the first extension region IIa, the third word line contact 400b may be formed on the second extension region IIb, and the fourth word line contact 400a may be formed on the first extension region IIa.

In example embodiments, the contacts may be distributed alternately on both extension regions IIa and IIb, so that a process margin for forming the contacts and the wiring structures may be additionally achieved.

As illustrated in FIG. 53, the GSL contact 420 may be formed on each individual GSL 270a, and the word line contact 400 may be formed on each word line group defined by the connecting portion 275 at each level.

A GSL wiring 430 may be formed on the mold protection layer 242 to be in contact with a plurality of the GSL contacts 420 and extend in the second direction. Word line wirings 410a, 410b, 410c and 410d may be in contact with the word line contacts 400a, 400b, 400c and 400d to extend in the second direction.

An upper insulation layer 285 covering the word line wirings 410 and the GSL wiring 430 may be formed on the mold protection layer 242. SSL contacts 440a and 440b, and bit line contacts 290 may be formed through the upper insulation layer to be electrically connected to the SSLs 270g and 270f, and the pads 250, respectively. A bit line 295 and an SSL wiring 450 may be formed on the upper insulation layer 285 to be electrically connected to the bit line contact 290 and the SSL contacts 440a and 440b, respectively. In example embodiments, the bit line 295 and the SSL wiring 450 may be patterned to extend in the second direction and the third direction, respectively.

In example embodiments, the SSL contact 440a and 440b may be formed on each individual SSL 270f and 270g.

FIG. 58 illustrates that the SSL wiring 450 is formed on the upper insulation layer 285. However, the SSL wiring 450 may be formed on the mold protection layer 242. In one example embodiment, all of the word line wiring 410, the GSL wiring 430 and the SSL wiring 450 may be formed on the upper insulation layer 285.

Figure 59:
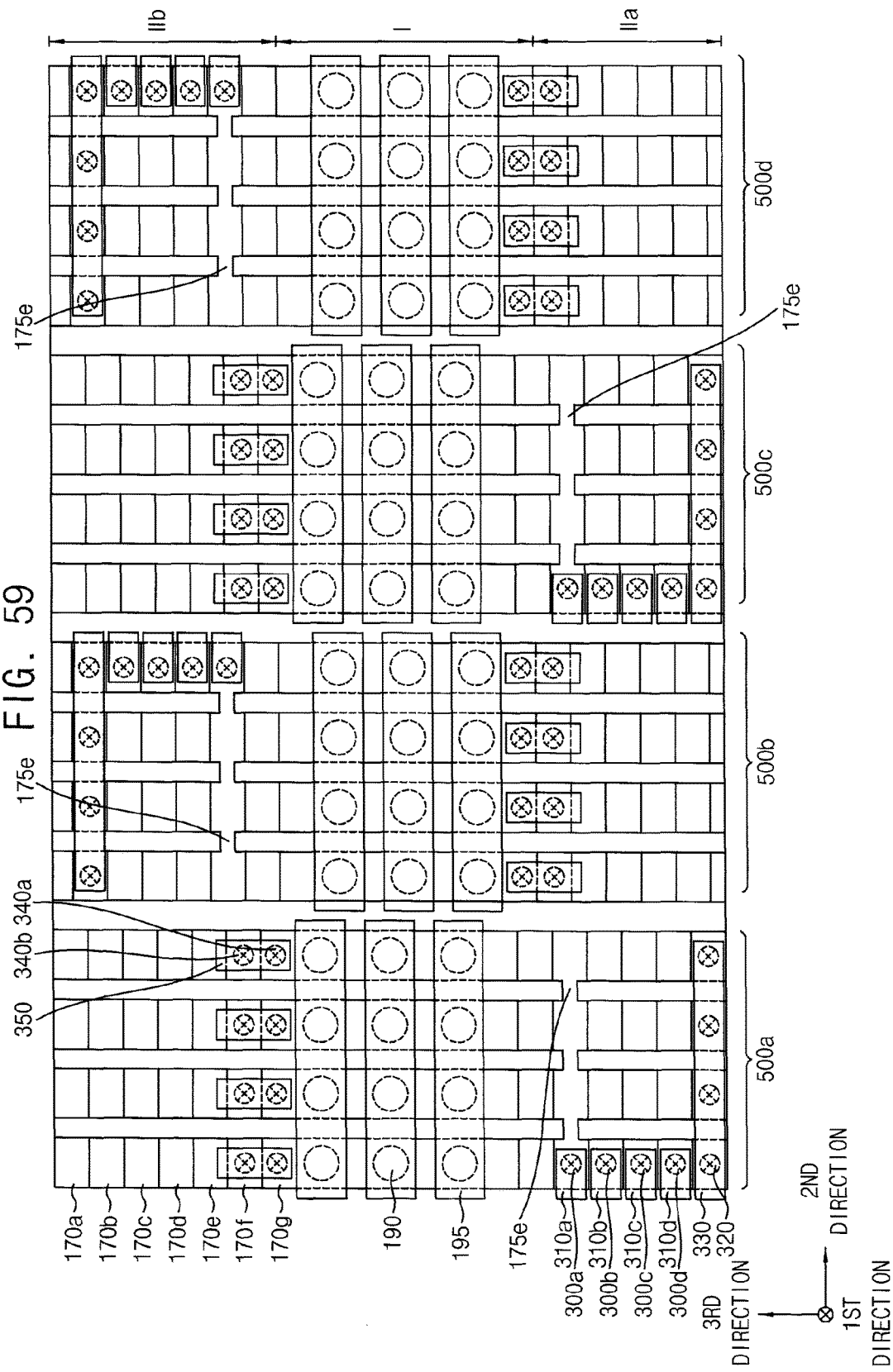

FIG. 59 is a top plan view illustrating a vertical memory device in accordance with example embodiments. For the convenience of explanation, FIG. 59 illustrates only conductive structures including, e.g., gate lines, bit lines, wirings or contacts.

Referring to FIG. 59, the vertical memory device may include a plurality of cell blocks 500 disposed on a substrate.

The substrate may include a cell region I and an extension region. The extension region may include a first extension region IIa and a second extension region IIb at both lateral portions of the cell region I in the third direction.

In example embodiments, the plurality of the cell blocks 500 are arranged in the second direction. The first extension region IIa and the second extension region IIb may face each other with respect to the cell region I. For example, when viewed from a plan view, an inner boundary separating the first extension region IIa from the cell region I may face an inner boundary separating the second extension region IIb from the cell region I.

Gate lines 170 may be stacked in a pyramidal shape including a plurality of steps along the first direction as illustrated in FIGS. 1 and 2, or FIG. 21. In one example embodiment, the gate lines may be stacked in a zigzag arrangement as illustrated in FIGS. 33 and 34.

The gate lines 170 may include a GSL 170a, word lines 170b, 170c, 170d and 170e, and SSLs 170f and 170g sequentially stacked from a top surface of the substrate.

The cell blocks 500a, 500b, 500c and 500d may include the gate lines 170 connected to each other by connecting portions 175. As illustrated n FIG. 59, the word lines 170b, 170c, 170d and 170e extending in the third direction may be connected to each other at each level by the connecting portions 175 to form word line groups. The word line group may include, e.g., four word lines at each level. The cell block 500 may include a plurality of the word line groups stacked in the first direction. The connecting portions 175b, 175c, 175d and 175e included in one cell block may overlap each other in the first direction.

In one example embodiment, the GSLs 170a may be separated from each other in the second direction by separation layer patterns as illustrated in FIGS. 21 to 24B.

The cell block 500 may include contacts and wirings electrically connected to the gate lines 170. Word line contacts 300a, 300b, 300c and 300d, and word line wirings 310a, 310b, 310c and 310d may be provided on the word lines 170b, 170c, 170d and 170e. A GSL contact 320 and a GSL wiring 330 may be provided on the GSL 170a. SSL contacts 340a and 340b and an SSL wiring 350 may be provided on the SSLs 170g and 340f.

In example embodiments, the number of the GSL contacts 320 and the number of the SSL contacts 340 at one level may be greater than the number of the word line contacts 300 at one level. For example, the GSL contact 320 and the SSL contact 340 may be provided on each individual GSL 170a and the SSL 170f and 170g, respectively. However, the word line contact 300 may be provided on each word line group defined by the connecting portion 175.

In example embodiments, the connecting portions 175 may be provided in a zigzag arrangement. For example, the connecting portions 175 may be arranged alternately on the first extension region IIa and the second extension region IIb along the second direction. As illustrated in FIG. 59, the connecting portion 175 of the first cell block 500a may be located on the first extension region IIa, and the connecting portion 175 of the second cell block 500b adjacent to the first cell block 500a in the second direction may be located on the second extension region IIb. The connecting portion 175 of the third cell block 500c may be located on the first extension region IIa, and the connecting portion 175 of the fourth cell block 500d adjacent to the third cell block 500c in the second direction may be located on the second extension region IIb.

Accordingly, top surfaces of the uppermost connecting portions 175e included in the cell blocks 500a, 500b, 500c and 500d may be exposed alternately on the first and second extension regions IIa and IIb in a top plan view.

In example embodiments, the word line contacts 300 and the word line wirings 310 of the cell blocks 500 may be disposed on the extension regions on which the connecting portions 175 are formed. For example, the word line contacts 300 and the word line wirings 310 of the first cell block 500a may be disposed on the first extension region IIa. The word line contacts 300 and the word line wirings 310 of the second cell block 500b may be disposed on the second extension region IIb. The word line contacts 300 and the word line wirings 310 of the third cell block 500c may be disposed on the first extension region IIa. The word line contacts 300 and the word line wirings 310 of the fourth cell block 500d may be disposed on the second extension region IIb.

Accordingly, the word line contacts 300 and the word line wirings 310 may be also distributed throughout both extension regions IIa and IIb, so that a process margin and a contact area may be increased, and an additional circuit area may be achieved.

FIG. 59 illustrates that the GSL contact 320 and the GSL wiring 330 are disposed on the same extension region as that of the word line contact 300 and the word line wiring 310, and the SSL contact 340 and the SSL wiring 350 are disposed on the different extension region from that of the word line contact 300 and the word line wiring 310. However, arrangements and/or locations of the contacts and the wirings may be adjusted in consideration of, e.g., a circuit design of the vertical memory device. For example, the GSL contact 320, the GSL wiring 330, the SSL contact 340 and the SSL wiring 350 of each cell block 500 may be disposed on the different extension region from that of the word line contact 300 and the word line wiring 310.

Bit line contacts 190 and bit lines 195 electrically connected to channels and/or pads included in each cell block may be disposed on the SSL 170g. As illustrated in FIG. 59, the bit line 195 may extend in the same direction as that of the GSL wiring 330 and word line wiring 310, e.g., the second direction.

According to example embodiments of the present invention, word lines of vertical memory device at each level may be connected to or merged with each other by a connecting portion. Thus, the number of contact and wiring structures for grouping the word lines may be reduced. Therefore, the vertical memory device may be utilized for a non-volatile memory device having large capacity and integration degree.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A vertical memory device, comprising:
a substrate;
a plurality of channels extending in a first direction which is vertical to a top surface of the substrate;
a plurality of gate lines stacked in the first direction to be spaced apart from each other and extending in a second, lengthwise direction, each gate line intersecting a set of channels and surrounding outer sidewalls of each channel of the set of channels, wherein the plurality of gate lines form a stepped structure in which, for a plurality of vertical levels, all gate lines of a first set of consecutive gate lines at a first vertical level are shorter than all gate lines of a second set of consecutive gate lines at a second vertical level lower than the first vertical level, the second set of consecutive gate lines vertically overlapping the first set of consecutive gate lines;
a plurality of gate line cut patterns extending in the second direction between neighboring gate lines of the plurality of gate lines;
a connecting portion which connects a group of consecutive gate lines of the plurality of gate lines located at the same vertical level, the connecting portion diverging from the second direction in which the gate lines of the group of consecutive gate lines extend, and including connecting pieces between gate lines of the group of gate lines, wherein the gate line cut patterns are blocked by the connecting pieces in the stepped structure; and
a contact connected to the group of gate lines and adjacent to the connecting portion,
wherein the connecting portion is inside outermost ends of all gate lines of the group of consecutive gate lines in the second direction and is integral with the group of consecutive gate lines.

2. The vertical memory device of claim 1, wherein the substrate includes a cell region and an extension region at a lateral portion of the cell region, and
wherein the connecting portion is disposed on the extension region.

3. The vertical memory device of claim 2, wherein a plurality of the connecting portions are provided at different vertical levels and overlap each other in the first direction.

4. The vertical memory device of claim 2, wherein the extension region includes a first extension region and a second extension region at both lateral portions of the cell region, and
wherein the plurality of gate lines are stacked in the first direction such that top surfaces of the plurality of gate lines are exposed alternately on the first extension region and the second extension region.

5. The vertical memory device of claim 4, wherein a plurality of contacts are arranged alternately on the first extension region and the second extension region.

6. The vertical memory device of claim 1, wherein the plurality of gate lines include ground selection lines (GSLs), word lines, and string selection lines (SSLs), and
wherein the SSLs at the same vertical level are separated from each other, and insulated from each other by the gate line cut patterns.

7. The vertical memory device of claim 6, wherein the GSLs at the same vertical level are insulated from each other.

8. The vertical memory device of claim 6, wherein the group of gate lines connected by the connecting portion includes a group of word lines of the word lines.

9. The vertical memory device of claim 1, wherein the plurality of gate line cut patterns are formed in a respective one of a plurality of openings extending through the stepped structure.

10. The vertical memory device of claim 9, wherein the plurality of openings extend in the second direction, and are blocked by the connecting pieces.

11. The vertical memory device claim 1, wherein the contact is directly on the connecting portion.

12. The vertical memory device claim 1, wherein channels of the plurality of the channels are arranged in the second direction to form a channel row,
wherein a plurality of channel rows are arranged in a third direction perpendicular to the second direction, and
wherein a gate line surrounds channels of the channel row.

13. A vertical memory device, comprising:
a substrate;
a plurality of channels extending in a first direction which is vertical to a top surface of the substrate;
a plurality of sets of gate lines stacked in the first direction, each set of gate lines including a group of consecutive gate lines at a same vertical level and extending in a second direction perpendicular to the first direction, the group of consecutive gate lines parallel to each other and separated from each other in a third direction perpendicular to the first direction and different from the second direction,
wherein the gate lines are defined by a plurality of openings extending in the second direction,
wherein each gate line of each group of consecutive gate lines intersects channels of the plurality of channels, and
wherein the plurality of sets of gate lines form a stepped structure which includes a plurality of vertical levels wherein, for each vertical level, each gate line of the set of gate lines at that vertical level has a shorter length than each gate line of the set of gate lines at a lower vertical level; and
at least a first connecting portion connecting consecutive gate lines of a first gate line group of the plurality of groups of gate lines, the connecting portion integrally formed to connect the consecutive gate lines of the first gate line group and extending in an extension direction different from the second direction,
wherein some of the plurality of openings are blocked by the first connecting portion; and
wherein the first connecting portion is inside outermost ends of all the consecutive gate lines of the first gate line group in the second direction.

14. The vertical memory device of claim 13, wherein:
the plurality of channels are formed at a central region of the vertical memory device; and
the first connecting portion is formed in an outer region of the vertical memory device where the channels are not formed.

15. The vertical memory device of claim 14, further comprising:
at least a second connecting portion connecting consecutive gate lines of a second gate line group of the plurality of groups of gate lines, the second gate line group at a different vertical level from the first gate line group, the second connecting portion integrally formed to connect the consecutive gate lines of the second gate line group and extending in the extension direction different from the second direction,
wherein the second connecting portion vertically overlaps the first connecting portion.

16. The vertical memory device of claim 13, further comprising:
a word line contact shared among the consecutive gate lines of the first gate line group.

17. A vertical memory device, comprising:
a substrate including:
a cell region; and
a first extension region and a second extension region at opposite lateral portions of the cell region;
a plurality of cell blocks on the substrate, each cell block including:
a plurality of channels extending in a first direction which is vertical to a top surface of the substrate;
a plurality of gate lines, each gate line surrounding outer sidewalls of a set of channels of the plurality of channels and extending in a second, lengthwise direction perpendicular to the first direction, the plurality of gate lines including at least two groups of gate lines of the plurality of gate lines, the groups stacked in the first direction to be spaced apart from each other, wherein a length in the second direction of each gate line of a first group of consecutive gate lines at a first vertical level is smaller along the first direction compared to a length in the second direction of each gate line of a second group of consecutive gates lines at a second vertical level lower than the first vertical level, wherein the second group of consecutive gate lines overlap the first group of consecutive gate lines in the first direction, so that the at least two groups of gate lines form a stepped structure, and wherein the gate lines are defined by a plurality of openings extending in the second direction; and
a connecting portion which connects consecutive gate lines of the plurality of gate lines located at the same vertical level, the connecting portion including a plurality of connecting pieces protruding from the consecutive gate lines in a third direction different from the lengthwise direction, wherein the openings are blocked by the connecting pieces in between adjacent gate lines; and
a contact connected to one of the gate lines adjacent to one of the connecting pieces.

18. The vertical memory device of claim 17, wherein the cell blocks are arranged in the third direction which is parallel to the top surface of the substrate, and
wherein the first extension region and the second extension region are disposed at opposite sides of a cell region in the second direction, the second direction being parallel to the top surface of the substrate and perpendicular to the third direction.

19. The vertical memory device of claim 18,
wherein the connecting portions of the cell blocks are arranged alternately on the first extension region and the second extension region in the third direction, and
wherein a plurality of contacts are arranged alternately on the first extension region and the second extension region in the third direction.

* * * * *